(12) United States Patent
Han et al.

(10) Patent No.: US 12,144,243 B2
(45) Date of Patent: Nov. 12, 2024

(54) ORGANOMETALLIC COMPOUND, LIGHT-EMITTING DEVICE INCLUDING SAME, AND ELECTRONIC APPARATUS INCLUDING THE LIGHT-EMITTING DEVICE

(71) Applicant: Samsung Display Co., Ltd., Yongin-si (KR)

(72) Inventors: Junghoon Han, Yongin-si (KR); Hyunjung Lee, Yongin-si (KR); Soobyung Ko, Yongin-si (KR); Sungbum Kim, Yongin-si (KR); Jaesung Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 602 days.

(21) Appl. No.: 17/447,547

(22) Filed: Sep. 13, 2021

(65) Prior Publication Data
US 2022/0085303 A1    Mar. 17, 2022

(30) Foreign Application Priority Data
Sep. 16, 2020 (KR) .......... 10-2020-0119381

(51) Int. Cl.
*H10K 85/30* (2023.01)
*C07F 15/00* (2006.01)
*C09K 11/06* (2006.01)
*H10K 50/11* (2023.01)
*H10K 101/10* (2023.01)

(52) U.S. Cl.
CPC ....... *H10K 85/346* (2023.02); *C07F 15/0086* (2013.01); *C09K 11/06* (2013.01); *C09K 2211/1044* (2013.01); *C09K 2211/185* (2013.01); *H10K 50/11* (2023.02); *H10K 2101/10* (2023.02)

(58) Field of Classification Search
CPC .................... H10K 85/346; C07F 15/0086
See application file for complete search history.

(56) References Cited

U.S. PATENT DOCUMENTS

| | | |
|---|---|---|
| 7,381,479 B2 | 6/2008 | Lamansky et al. |
| 7,393,599 B2 | 7/2008 | Thompson et al. |

(Continued)

FOREIGN PATENT DOCUMENTS

| | | |
|---|---|---|
| CN | 102449108 A | 5/2012 |
| CN | 104370974 A | 2/2015 |

(Continued)

OTHER PUBLICATIONS

Guijie Li et al., "Efficient and Stable White Organic Light-Emitting Diodes Employing a Single Emitter", Advanced Materials, 2014, pp. 2931-2936, vol. 26, Wiley Online Library.

*Primary Examiner* — Vu A Nguyen
(74) *Attorney, Agent, or Firm* — Lewis Roca Rothgerber Christie LLP

(57) ABSTRACT

Provided is an organometallic compound, a light-emitting device including the same, and an electronic apparatus including the light-emitting device. The light-emitting device includes: a first electrode; a second electrode facing the first electrode; and an interlayer between the first electrode and the second electrode and including an emission layer, wherein the light-emitting device includes at least one organometallic compound represented by Formula 1.

20 Claims, 3 Drawing Sheets

(56) References Cited

U.S. PATENT DOCUMENTS

| | | |
|---|---|---|
| 7,585,573 B2 | 9/2009 | Lee et al. |
| 7,776,458 B2 | 8/2010 | Ragini et al. |
| 8,106,199 B2 | 1/2012 | Jabbour et al. |
| 8,389,725 B2 | 3/2013 | Li et al. |
| 8,669,364 B2 | 3/2014 | Li et al. |
| 8,680,760 B2 | 3/2014 | Cheng et al. |
| 8,816,080 B2 | 8/2014 | Li et al. |
| 8,846,940 B2 | 9/2014 | Li et al. |
| 8,946,417 B2 | 2/2015 | Jian et al. |
| 9,051,344 B2 | 6/2015 | Lin et al. |
| 9,076,974 B2 | 7/2015 | Li et al. |
| 9,203,039 B2 | 12/2015 | Li et al. |
| 9,221,857 B2 | 12/2015 | Li et al. |
| 9,224,963 B2 | 12/2015 | Li et al. |
| 9,238,668 B2 | 1/2016 | Li et al. |
| 9,312,502 B2 | 4/2016 | Li et al. |
| 9,324,957 B2 | 4/2016 | Li et al. |
| 9,382,273 B2 | 7/2016 | Li et al. |
| 9,425,415 B2 | 8/2016 | Li et al. |
| 9,698,359 B2 | 7/2017 | Li et al. |
| 9,899,614 B2 | 2/2018 | Li et al. |
| 11,552,261 B2 | 1/2023 | Chen et al. |
| 2005/0287394 A1 | 12/2005 | Yang et al. |
| 2008/0018221 A1 | 1/2008 | Egen et al. |
| 2012/0095232 A1 | 4/2012 | Li et al. |
| 2014/0309428 A1 | 10/2014 | Egen et al. |
| 2018/0219161 A1* | 8/2018 | Li .................. C07F 15/0086 |
| 2019/0036040 A1 | 1/2019 | Su et al. |
| 2019/0109287 A1 | 4/2019 | Wu et al. |
| 2019/0189937 A1 | 6/2019 | Djurovich et al. |
| 2019/0194237 A1 | 6/2019 | Choi et al. |
| 2019/0221759 A1 | 7/2019 | Lin et al. |
| 2019/0334100 A1 | 10/2019 | Han et al. |

FOREIGN PATENT DOCUMENTS

| | | |
|---|---|---|
| CN | 109111487 A | 1/2019 |
| CN | 110407882 A | 11/2019 |
| JP | 2007-045742 A | 2/2007 |
| KR | 10-0730115 B1 | 6/2007 |
| KR | 10-2016-0012941 A | 2/2016 |
| KR | 10-2019-0076708 A | 7/2019 |
| KR | 10-2003060 B1 | 7/2019 |
| WO | WO 2012/121936 A2 | 9/2012 |

* cited by examiner

ORGANOMETALLIC COMPOUND, LIGHT-EMITTING DEVICE INCLUDING SAME, AND ELECTRONIC APPARATUS INCLUDING THE LIGHT-EMITTING DEVICE

CROSS-REFERENCE TO RELATED APPLICATION

This application claims priority to and the benefit of Korean Patent Application No. 10-2020-0119381, filed on Sep. 16, 2020, in the Korean Intellectual Property Office, the entire content of which is hereby incorporated by reference.

BACKGROUND

1. Field

One or more embodiments of the present disclosure relate to an organometallic compound, a light-emitting device including the same, and an electronic apparatus including the light-emitting device.

2. Description of Related Art

Organic light-emitting devices are self-emission devices that, as compared with other devices in the art, have wide viewing angles, high contrast ratios, short response times, and excellent characteristics in terms of luminance, driving voltage, and response speed, and produce full-color images.

The organic light-emitting devices may include a first electrode on a substrate, and a hole transport region, an emission layer, an electron transport region, and a second electrode sequentially stacked on the first electrode. Holes provided from the first electrode may move toward the emission layer through the hole transport region, and electrons provided from the second electrode may move toward the emission layer through the electron transport region. Carriers, such as the holes and the electrons, recombine in the emission layer to produce excitons. These excitons transition from an excited state to a ground state to thereby generate light.

SUMMARY

Provided are an organometallic compound, a light-emitting device including the same, and an electronic apparatus including the light-emitting device.

Additional aspects of embodiments of the present disclosure will be set forth in part in the description which follows and, in part, will be apparent from the description, or may be learned by practice of the presented embodiments of the disclosure.

According to an aspect of an embodiment, provided is an organometallic compound represented by Formula 1.

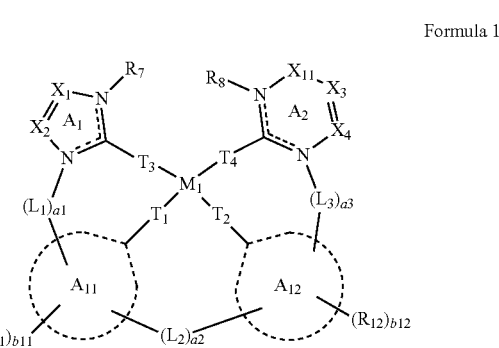

Formula 1

In Formula 1, $M_1$ is selected from platinum (Pt), palladium (Pd), copper (Cu), silver (Ag), gold (Au), rhodium (Rh), iridium (Ir), ruthenium (Ru), osmium (Os), titanium (Ti), zirconium (Zr), hafnium (Hf), europium (Eu), Terbium (Tb), and thulium (Tm), $Y_1$ and $Y_2$ are each independently selected from a carbon atom (C) and a nitrogen atom (N), $T_1$ to $T_4$ are each independently a chemical bond, O, S, B(R'), N(R'), P(R'), C(R')(R''), Si(R')(R''), Ge(R')(R''), C(=O), B(R')(R''), N(R')(R''), or P(R')(R''), wherein, when $T_1$ is a chemical bond, $Y_1$ and $M_1$ are directly bonded to each other, when $T_2$ is a chemical bond, $Y_2$ and $M_1$ are directly bonded to each other, when $T_3$ is a chemical bond, C in ring $A_1$ is directly bonded to $M_1$, and when $T_4$ is a chemical bond, C in ring $A_2$ is directly bonded to $M_1$, two bonds of a bond between $Y_1$ or $T_1$ and $M_1$, a bond between $Y_2$ or $T_2$ and $M_1$, a bond between C in ring $A_1$ or $T_3$ and $M_1$, and a bond between C in ring $A_2$ or $T_4$ and $M_1$ are each a coordinate bond, and the other two bonds are each a covalent bond, $X_1$ is $C(R_1)$ or N, $X_2$ is $C(R_2)$ or N, $X_3$ is $C(R_3)$ or N, $X_4$ is $C(R_4)$ or N, and $X_{11}$ is $C(R_5)(R_6)$ or $N(R_5)$, ring $A_{11}$ and ring $A_{12}$ are each independently selected from a $C_5$-$C_{60}$ carbocyclic group and a $C_1$-$C_{60}$ heterocyclic group, $L_1$ to $L_3$ are each independently selected from a single bond, a double bond, *—N($R_9$)—*', *—B($R_9$)—*', *—P($R_9$)—*', *—C($R_9$)($R_{10}$)—*', *—Si($R_9$)($R_{10}$)—*', *—Ge($R_9$)($R_{10}$)—*', *—S—*', *—Se—*', *—*', *—C(=O)—*', *—S(=O)—*', *—S(=O)$_2$—*', *—C($R_9$)=*', *=C($R_9$)—*', *—C($R_9$)=C($R_{10}$)—*', *—C(=S)—*', and *—C≡C—*', a1 to a3 are each independently an integer from 0 to 3, when a1 is 0, $A_1$ and $A_{11}$ are not linked to each other, when a2 is 0, $A_{11}$ and $A_{12}$ are not linked to each other, and when a3 is 0, $A_2$ and $A_{12}$ are not linked to each other, R', R'', and $R_1$ to $R_{12}$ are each independently selected from hydrogen, deuterium, —F, —$C_1$, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si$(Q_1)(Q_2)(Q_3)$, —B$(Q_1)(Q_2)$, —N$(Q_1)(Q_2)$, —P$(Q_1)(Q_2)$, —C(=O)$(Q_1)$, —S(=O)$(Q_1)$, —S(=O)$_2(Q_1)$, —P(=O)$(Q_1)(Q_2)$, and —P(=S)$(Q_1)$ $(Q_2)$, b11 and b12 are each independently an integer from 0 to 20, two neighboring groups of $R_1$ to $R_{12}$ are optionally bonded to form a $C_5$-$C_{60}$ carbocyclic group unsubstituted or substituted with at least one $R_{10a}$ or a $C_1$-$C_{60}$ heterocyclic group unsubstituted or substituted with at least one $R_{10a}$, and*' each indicate a binding site to a neighboring atom, and $R_{10a}$ is deuterium (-D), —F, —C$_1$, —Br, —I, a hydroxyl group, a cyano group, or a nitro group, a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —C$_1$, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si $(Q_{11})(Q_{12})(Q_{13})$, —N$(Q_{11})(Q_{12})$, —B$(Q_{11})(Q_{12})$, —C(=O)$(Q_{11})$, —S(=O)$_2(Q_{11})$, —P(=O)$(Q_{11})$ $(Q_{12})$, or any combination thereof, a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —C$_1$, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si$(Q_{21})(Q_{22})(Q_{23})$, —N$(Q_{21})(Q_{22})$, —B$(Q_{21})(Q_{22})$, —C(=O)$(Q_{21})$, —S(=O)$_2(Q_{21})$, —P(=O)$(Q_{21})$ $(Q_{22})$, or any combination thereof, or —Si$(Q_{31})(Q_{32})(Q_{33})$, —N$(Q_{31})(Q_{32})$, —B$(Q_{31})(Q_{32})$, —C(=O)$(Q_{31})$, —S(=O)$_2(Q_{31})$, or —P(=O)$(Q_{31})$ $(Q_{32})$, wherein $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —C$_1$; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

According to another aspect of an embodiment, provided is a light-emitting device including a first electrode, a second electrode facing the first electrode, and an interlayer between the first electrode and the second electrode and including an emission layer, wherein the light-emitting device includes at least one organometallic compound represented by Formula 1.

According to another aspect of an embodiment, provided is an electronic apparatus including the light-emitting device.

BRIEF DESCRIPTION OF THE DRAWINGS

The above and other aspects and features of certain embodiments of the disclosure will be more apparent from the following description taken in conjunction with the accompanying drawings, in which.

DETAILED DESCRIPTION

Figure 1:
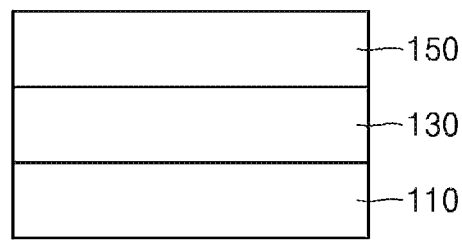
FIG. 1 schematically shows a cross-sectional view of a light-emitting device according to an embodiment of the present disclosure.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of embodiments of the present description. As used herein, the term "and/or" includes any and all combinations of one or more of the associated listed items. Throughout the disclosure, the expression "at least one of a, b and c" indicates only a, only b, only c, both a and b, both a and c, both b and c, all of a, b, and c, or variations thereof.

The organometallic compound is represented by Formula 1:

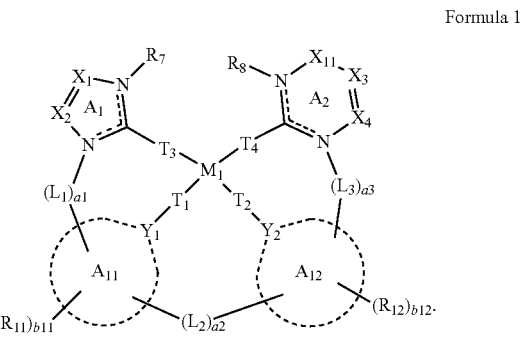

Formula 1

$M_1$ in Formula 1 is selected from platinum (Pt), palladium (Pd), copper (Cu), silver (Ag), gold (Au), rhodium (Rh), iridium (Ir), ruthenium (Ru), osmium (Os), titanium (Ti), zirconium (Zr), hafnium (Hf), europium (Eu), Terbium (Tb), and thulium (Tm).

In an embodiment, $M_1$ may be selected from Pt, Pd, Cu, Ag, Au, Rh, Ir, Ru, and Os.

In an embodiment, $M_1$ may be Pt or Pd, but embodiments of the present disclosure are not limited thereto.

In Formula 1, $Y_1$ and $Y_2$ are each independently selected from a carbon atom (C) and a nitrogen atom (N), $T_1$ to $T_4$ are each independently a chemical bond, O, S, B(R'), N(R'), P(R'), C(R')(R'), Si(R')(R'), Ge(R')(R'), C(=O), B(R')(R'), N(R')(R'), or P(R')(R'), wherein, when $T_1$ is a chemical bond, $Y_1$ and $M_1$ are directly bonded to each other, when $T_2$ is a chemical bond, $Y_2$ and $M_1$ are directly bonded to each other, when $T_3$ is a chemical bond, C in ring $A_1$ is directly bonded to $M_1$, and when $T_4$ is a chemical bond, C in ring $A_2$ is directly bonded to $M_1$, and two bonds of a bond between $Y_1$ or $T_1$ and $M_1$, a bond between $Y_2$ or $T_2$ and $M_1$, a bond between C in ring $A_1$ or $T_3$ and $M_1$, and a bond between C in ring $A_2$ or $T_4$ and $M_1$ are each a coordinate bond, and the other two bonds are each a covalent bond. As used herein, the term "chemical bond" may refer to a covalent bond (e.g., a single bond or single covalent bond), a coordinate bond (e.g., a coordinate covalent bond or a dative bond), or an ionic bond.

In an embodiment, $T_1$ to $T_4$ may each be a chemical bond.

In an embodiment, $Y_1$ and $Y_2$ may each be C, but embodiments of the present disclosure are not limited thereto.

In Formula 1, $X_1$ is $C(R_1)$ or N, $X_2$ is $C(R_2)$ or N, $X_3$ is $C(R_3)$ or N, $X_4$ is $C(R_4)$ or N, and $X_{11}$ is $C(R_5)(R_6)$ or $N(R_5)$.

In an embodiment, $X_1$ may be $C(R_1)$ or N, $X_2$ may be $C(R_2)$, $X_3$ may be $C(R_3)$, and $X_4$ may be $C(R_4)$.

In an embodiment, $X_{11}$ may be $C(R_5)(R_6)$.

In an embodiment, ring $A_1$ may be a group represented by one of Formulae 2-1 and 2-2, and ring $A_2$ may be a group represented by one of Formulae 2-3 and 2-4:

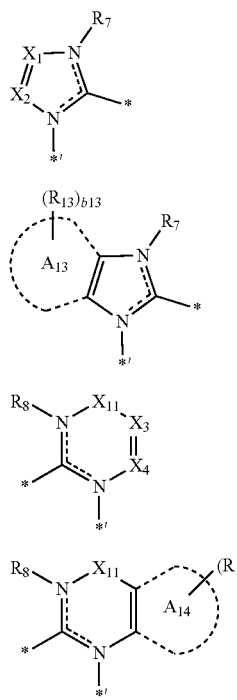

2-1

2-2

2-3

2-4

In Formulae 2-1 to 2-4, $X_1$ to $X_4$, $X_{11}$, $R_7$, and $R_8$ are the same as described above, ring $A_{13}$ and ring $A_{14}$ are each independently selected from a $C_5$-$C_{60}$ carbocyclic group and a $C_1$-$C_{60}$ heterocyclic group, $R_{13}$, $R_{14}$, b13, and b14 are the same as described in connection with R', R', $R_1$ to $R_{12}$, b11, and b12 in the present specification, and indicates a binding site to neighboring $T_3$ or $T_4$, and *' indicates a binding site to neighboring $L_1$ or $L_3$.

In an embodiment, ring $A_1$ may be a group represented by one of Formulae 2A-1 to 2A-4, ring $A_2$ may be a group represented by one of Formulae 2B-1 to 2B-4:

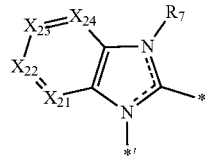

2A-1

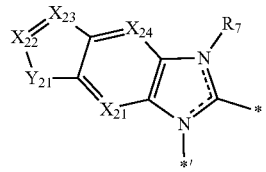

2A-2

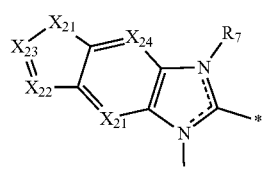

2A-3

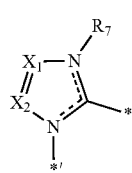

2A-4

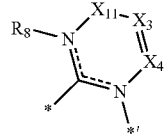

2B-1

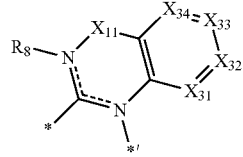

2B-2

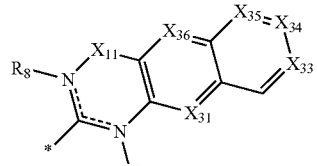

2B-3

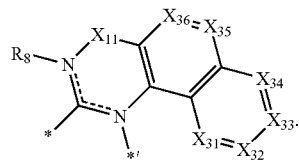

2B-4

In Formulae 2A-1 to 2A-4 and 2B-1 to 2B-4, $X_1$ to $X_4$, $X_{11}$, $R_7$, and $R_8$ are the same as described above, $X_{21}$ is $C(R_{21})$ or N, $X_{22}$ is $C(R_{22})$ or N, $X_{23}$ is $C(R_{23})$ or N, and $X_{24}$ is $C(R_{24})$ or N, $Y_{21}$ is $C(R_{25})(R_{26})$, $N(R_{25})$, O, or S, $X_{31}$ is $C(R_{31})$ or N, $X_{32}$ is $C(R_{32})$ or N, $X_{33}$ is $C(R_{33})$ or N, $X_{34}$ is $C(R_{34})$ or N, $X_{35}$ is $C(R_{35})$ or N, and $X_{36}$ is $C(R_{36})$ or N, $R_{21}$ to $R_{26}$ and $R_{31}$ to $R_{36}$ are the same as described in connection with R', R', and $R_1$ to $R_{12}$ in the present specification, and indicates a binding site to neighboring $T_3$ or $T_4$, and *' indicates a binding site to neighboring $L_1$ or $L_3$.

In Formula 1, ring $A_{11}$ and ring $A_{12}$ are each independently selected from a $C_5$-$C_{60}$ carbocyclic group and a $C_1$-$C_{60}$ heterocyclic group.

In an embodiment, ring $A_{11}$ and ring $A_{12}$ may each independently be selected from:

a benzene group, a naphthalene group, an anthracene group, a phenanthrene group, a triphenylene group, a pyrene group, a chrysene group, a cyclopentane group, a cyclopentadiene group, a cyclohexane group, a cyclohexene group, a 1,2,3,4-tetrahydronaphthalene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an indenopyridine group, an indolopyridine group, a benzofuropyridine group, a benzothienopyridine group, a benzosilolopyridine group, an indenopyrimidine group, an indolopyrimidine group, a benzofuropyrimidine group, a benzothienopyrimidine group, a benzosilolopyrimidine group, a dihydropyridine group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a 2,3-dihydroimidazole group, a triazole group, a 1,2,4-triazole group, a tetrazole group, a 2,3-dihydrotriazole group, an azasilole group, a diazasilole group, a triazasilole group, an oxazole group, an isoxazole group, a thiazole group, an isothiazole group, an oxadiazole group, a thiadiazole group, a benzopyrazole group, a benzimidazole group, a 2,3-dihydrobenzimidazole group, an imidazopyridine group, a 2,3-dihydroimidazopyridine group, an imidazopyrimidine group, a 2,3-dihydroimidazopyrimidine group, an imidazopyrazine group, a 2,3-dihydroimidazopyrazine group, a benzoxazole group, a benzothiazole group, a benzoxadiazole group, a benzothiadiazole group, a pyridopyrrolopyridine group, a dihydropyranoindole group, a dibenzoxaborinine group, a dihydrodibenzoazaborinine group, a 5,6,7,8-tetrahydroisoquinoline group, and a 5,6,7,8-tetrahydroquinoline group.

In an embodiment, ring $A_{11}$ and ring $A_{12}$ may each independently be selected from:

a benzene group, a naphthalene group, a carbazole group, a dibenzofuran group, a pyridine group, an indolopyrimidine group, a pyridopyrrolopyridine group, a dihydropyranoindole group, a dibenzoxaborinine group, and a dihydrodibenzoazaborinine group.

In Formula 1, $L_1$ to $L_3$ are each independently selected from a single bond (e.g., a single covalent bond), a double bond (e.g., a double covalent bond),*—N($R_9$)—*',*—B($R_9$)—*',*—P($R_9$)—*',*—C($R_9$)($R_{10}$)—*',*—Si($R_9$)($R_{10}$)—*',*—Ge($R_9$)($R_{10}$)—*',*—S—*',*—Se—*',*—O—*' *—C(=O)—*',*—S(=O)—*',*—S(=O)$_2$—*',*—C($R_9$)=*',*=C($R_9$)—*' *—C($R_9$)=C($R_{10}$)—*',*—C(=S)—*', and*—C≡C—*', a1 to a3 are each independently selected from an integer from 0 to 3, when a1 is 0, $A_1$ and $A_{11}$ are not linked to each other, when a2 is 0, $A_{11}$ and $A_{12}$ are not linked to each other, when a3 is 0, $A_2$ and $A_{12}$ are not liked to each other, and*and*' each indicate a binding site to a neighboring atom.

In an embodiment, a1 to a3 may each be 1, $L_1$ and $L_3$ may each be a single bond, and $L_2$ may be*—N($R_9$)—*',*—B($R_9$)—*',*—C($R_9$)($R_{10}$)—*',*—Si($R_9$)($R_{10}$)*',*—S*', or*—O—*'.

In Formula 1, R', R', and $R_1$ to $R_{12}$ may each independently be hydrogen, deuterium, —F, —$C_1$, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —B($Q_1$)($Q_2$), —N($Q_1$)($Q_2$), —P($Q_1$)($Q_2$), —C(=O)($Q_1$), —S(=O)($Q_1$), —S(=O)$_2$($Q_1$), —P(=O)($Q_1$)($Q_2$), and —P(=S)($Q_1$)($Q_2$), b11 and b12 may each independently be an integer from 0 to 20, and two neighboring groups of $R_1$ to $R_{12}$ may optionally be bonded to form a $C_5$-$C_{60}$ carbocyclic group unsubstituted or substituted with at least one $R_{10a}$ or a $C_1$-$C_{60}$ heterocyclic group unsubstituted or substituted with at least one $R_{10a}$.

In an embodiment, R', R', and $R_1$ to $R_{12}$ may each independently be selected from: hydrogen, deuterium, —F, —$C_1$, —Br, —I, a hydroxyl group, a cyano group, a nitro group, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —$C_1$, —Br, —I, a hydroxyl group, a cyano group, a nitro group, a $C_1$-$C_{20}$ alkyl group, and a $C_1$-$C_{20}$ alkoxy group;

a cyclopentyl group, a cyclohexyl group, an adamantanyl group, a norbornanyl group, a norbornenyl group, a phenyl group, a naphthyl group, a pyridinyl group, a pyrimidinyl group, a pyrazinyl group, a pyridazinyl group, a pyrrolyl group, an indolyl group, an isoindolyl group, an indazolyl group, a quinolinyl group, an isoquinolinyl group, a quinoxalinyl group, a quinazolinyl group, a cinnolinyl group, a triazinyl group, a pyridopyrrolopyridinyl group, a dihydropyranoindolyl group, a dibenzoxabolinyl group, and a dihydrodibenzoazaborinyl group;

a cyclopentyl group, a cyclohexyl group, an adamantanyl group, a norbornanyl group, a norbornenyl group, a phenyl group, a naphthyl group, a pyridinyl group, a pyrimidinyl group, a pyrazinyl group, a pyridazinyl group, an indolyl group, an isoindolyl group, an indazolyl group, a quinolinyl group, an isoquinolinyl group, a quinoxalinyl group, a quinazolinyl group, a cinnolinyl group, a triazinyl group, a pyridopyrrolopyridinyl group, a dihydropyranoindolyl group, a dibenzoxabolinyl group, and a dihydrodibenzoazaborinyl group, each substituted with at least one selected from deuterium, —F, —$C_1$, —Br, —I, a hydroxyl group, a cyano group, a nitro group, a $C_1$-$C_{20}$ alkyl group, a $C_1$-$C_{20}$ alkoxy group, a cyclopentyl group, a cyclohexyl group, an adamantanyl group, a norbornanyl group, a norbornenyl group, a phenyl group, a naphthyl group, a pyridinyl group, a pyrimidinyl group, a pyrazinyl group, a pyridazinyl group, an indolyl group, an isoindolyl group, an indazolyl group, a quinolinyl group, an isoquinolinyl group, a quinoxalinyl group, a quinazolinyl group, a cinnolinyl group, a triazinyl group, a pyridopyrrolopyridinyl group, a dihydropyranoindolyl group, a dibenzoxabolinyl group, a dihydrodibenzoazaborinyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$);

a cyclopentyl group, a cyclohexyl group, an adamantanyl group, a norbornanyl group, a norbornenyl group, a phenyl group, a naphthyl group, a pyridinyl group, a pyrimidinyl group, a pyrazinyl group, a pyridazinyl group, an indolyl group, an isoindolyl group, an indazolyl group, a quinolinyl group, an isoquinolinyl group, a quinoxalinyl group, a quinazolinyl group, a cinnolinyl group, a triazinyl group, a pyridopyrrolopyridinyl group, a dihydropyranoindolyl group, a dibenzoxabolinyl group, and a dihydrodibenzoazaborinyl group, each substituted with at least one selected from a $C_1$-$C_{20}$ alkyl group, a $C_1$-$C_{20}$ alkoxy group, a cyclopentyl group, a cyclohexyl group, an adamantanyl group, a norbornanyl group, a norbornenyl group, a phenyl group, a naphthyl group, a pyridinyl group, a pyrimidinyl group, a pyrazinyl group, a pyridazinyl group, an indolyl group, an isoindolyl group, an indazolyl group, a quinolinyl group, an isoquinolinyl group, a quinoxalinyl group, a quinazolinyl group, a cinnolinyl group, a triazinyl group, a pyridopyrrolopyridinyl group, a dihydropyranoindolyl group, a dibenzoxabolinyl group, and a dihydrodibenzoazaborinyl group, each substituted with at least one selected from deuterium, —F, —$C_1$, —Br, —I, a hydroxyl group, a cyano group, a nitro group, a $C_1$-$C_{20}$ alkyl group, a $C_1$-$C_{20}$ alkoxy group, a cyclopentyl group, a cyclohexyl group, an adamantanyl group, a norbornanyl group, a norbornenyl group, a phenyl group, a naphthyl group, a pyridinyl group, a pyrimidinyl group, a pyrazinyl group, a pyridazinyl group, an indolyl group, an isoindolyl group, an indazolyl group, a quinolinyl group, an isoquinolinyl group, a quinoxalinyl group, a quinazolinyl group, a cinnolinyl group, a triazinyl group, a pyridopyrrolopyridinyl group, a dihydropyranoindolyl group, a dibenzoxabolinyl group, and a dihydrodibenzoazaborinyl group, —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, and —$P(=O)(Q_{31})(Q_{32})$; and $Si(Q_1)(Q_2)(Q_3)$, —$N(Q_1)(Q_2)$, —$B(Q_1)(Q_2)$, —$C(=O)(Q_1)$, —$S(=O)_2(Q_1)$, —$P(=O)(Q_1)(Q_2)$, and —$P(=S)(Q_1)(Q_2)$, wherein $Q_1$ to $Q_3$ and $Q_{31}$ to $Q_{33}$ may each independently be selected from:

hydrogen, deuterium, —F, —$C_1$, —Br, —I, a cyano group, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{20}$ aryl group, a $C_1$-$C_{20}$ heteroaryl group, a monovalent non-aromatic condensed polycyclic group, and a monovalent non-aromatic condensed heteropolycyclic group.

In an embodiment, the organometallic compound represented by Formula 1 may be an organometallic compound represented by Formula 1-1:

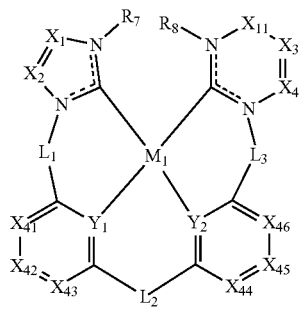

Formula 1-1

In Formula 1-1, $M_1$, $X_1$ to $X_4$, $X_{11}$, $Y_1$, $Y_2$, $L_1$ to $L_3$, $R_7$, and $R_8$ are the same as described above, $X_{41}$ is $C(R_{41})$ or N, $X_{42}$ is $C(R_{42})$ or N, $X_{43}$ is $C(R_{43})$ or N, $X_{44}$ is $C(R_{44})$ or N, $X_{45}$ is $C(R_{45})$ or N, and $X_{46}$ is $C(R_{46})$ or N, and $R_{41}$ to $R_{46}$ are the same as described in connection with R', R", and $R_1$ to $R_{12}$ described above.

In an embodiment, in Formula 1-1, two neighboring groups of $R_1$ to $R_{12}$ and $R_{41}$ to $R_{46}$ may optionally bonded to each other to form a $C_5$-$C_{60}$ carbocyclic group unsubstituted or substituted with at least one $R_{10a}$ or a $C_1$-$C_{60}$ heterocyclic group unsubstituted or substituted with at least one $R_{10a}$.

In an embodiment, the organometallic compound represented by Formula 1 may be selected from Compounds 1 to 120, but embodiments of the present disclosure are not limited thereto:

1

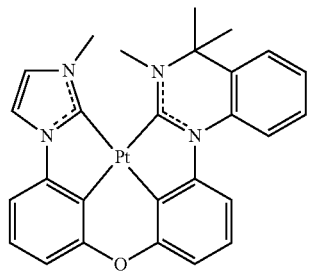

2

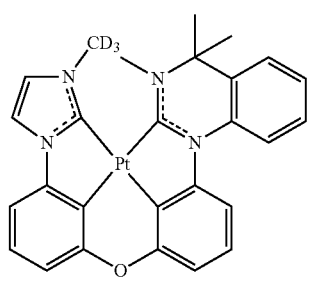

3

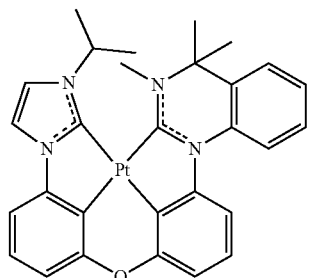

4

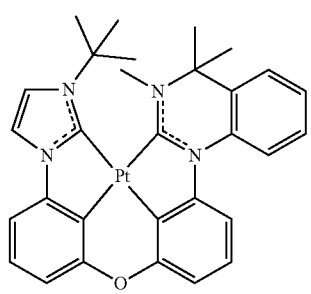

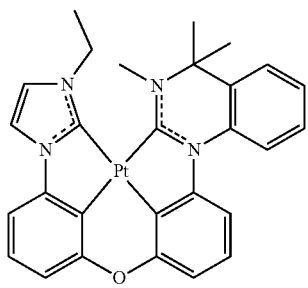
5
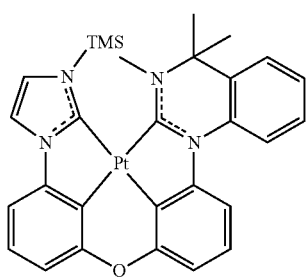
6
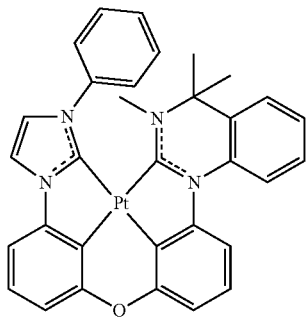
7
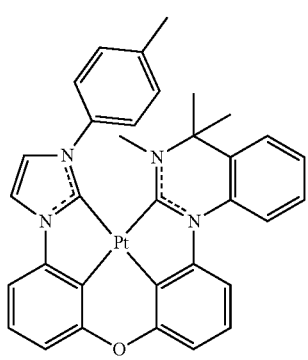
8
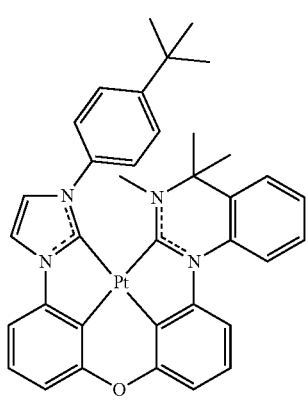
9
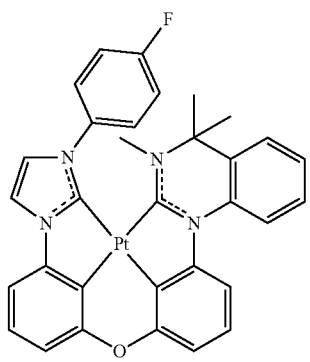
10
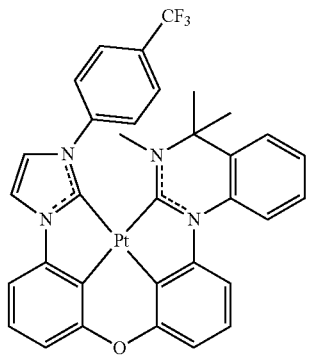
11
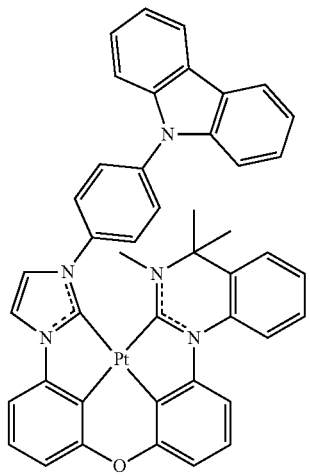
12
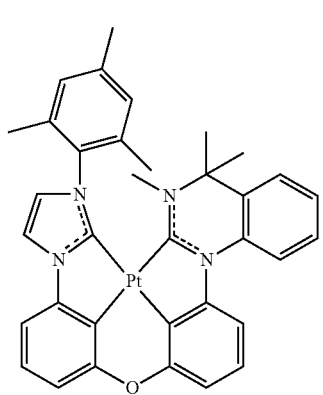
13

13
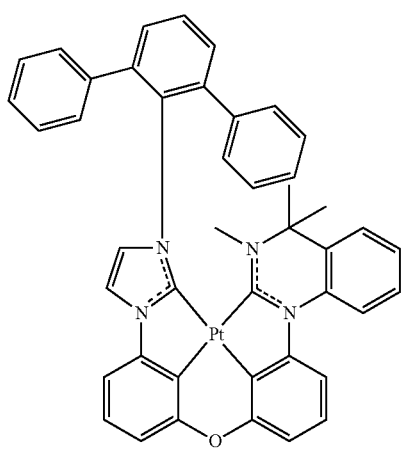
15
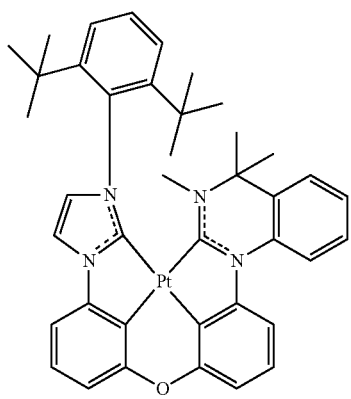
16
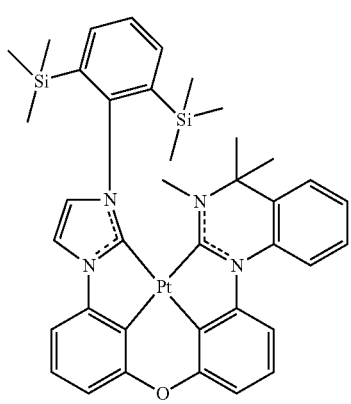
14
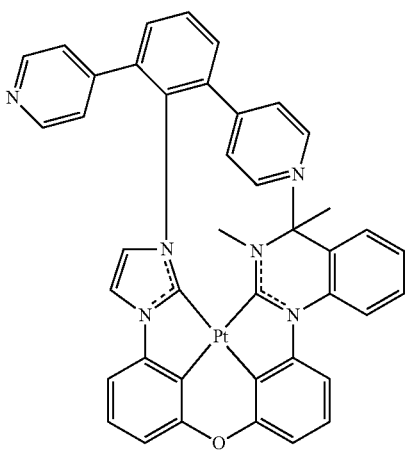
17
18
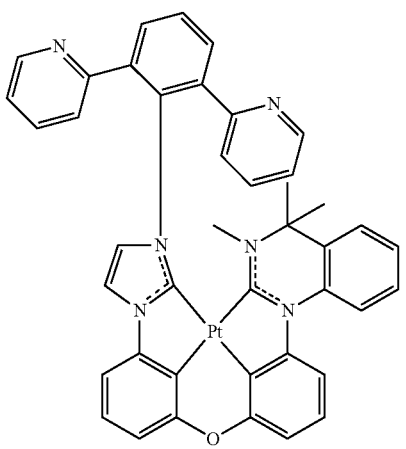
19

15
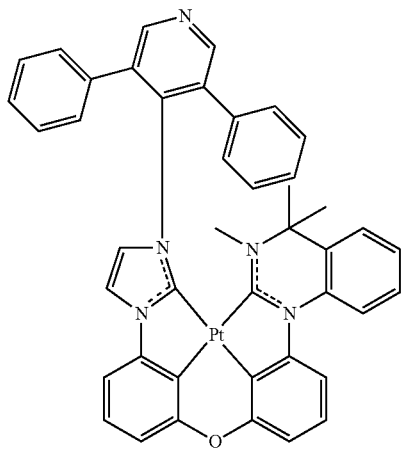
20
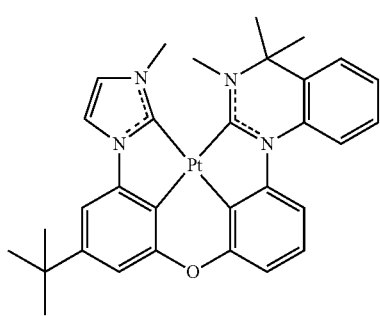
21
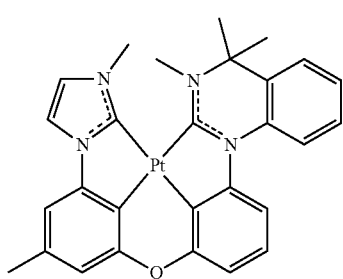
22
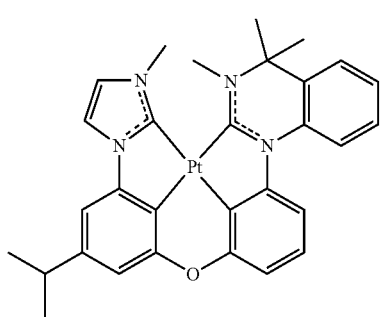
23
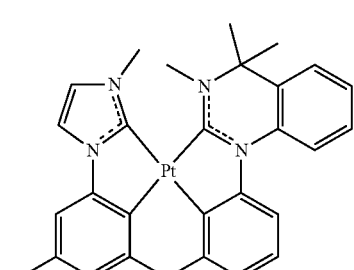
24
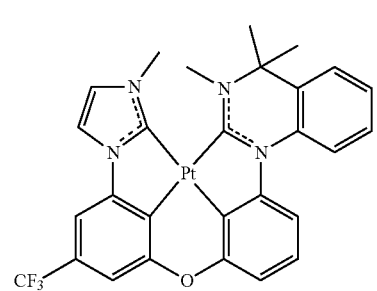
25
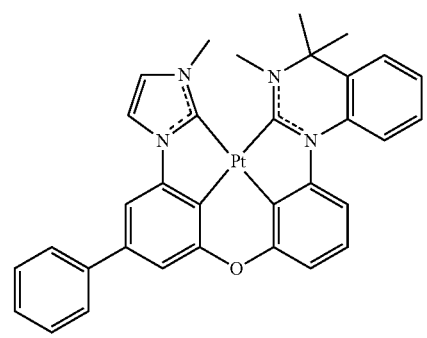
26
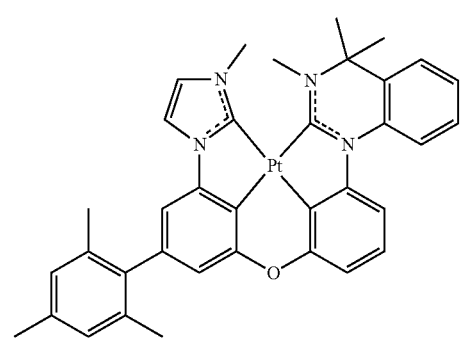
27
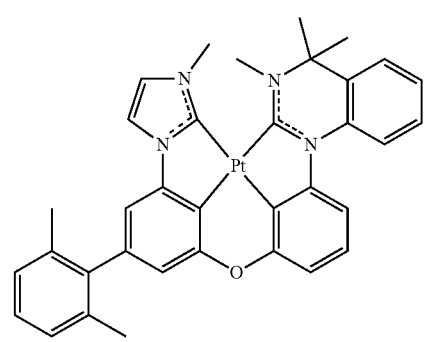
28

29
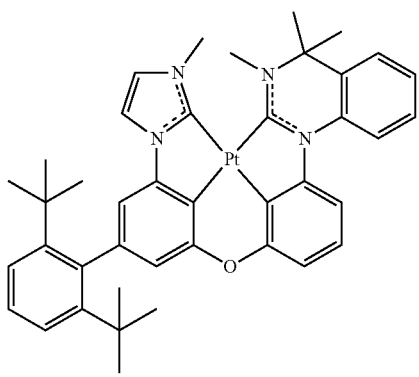
30
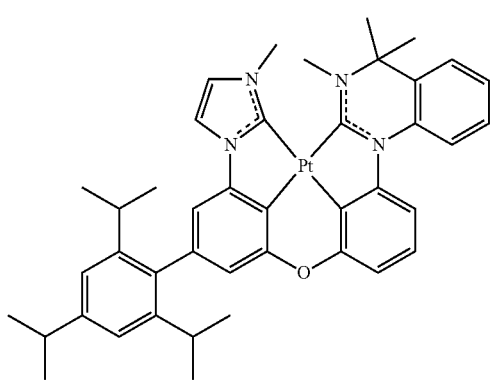
31
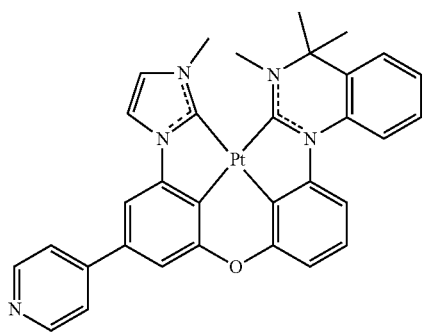
32
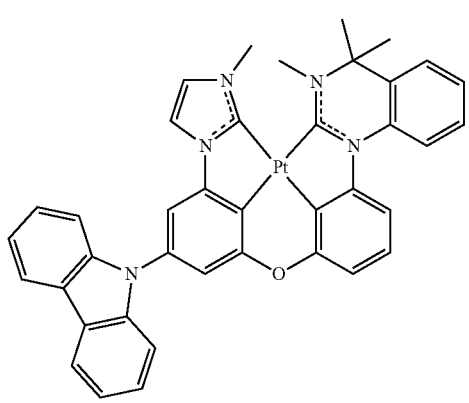
33
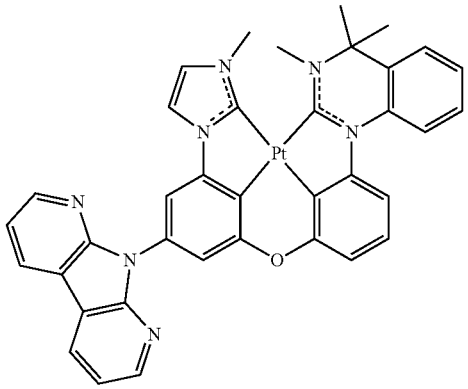
34
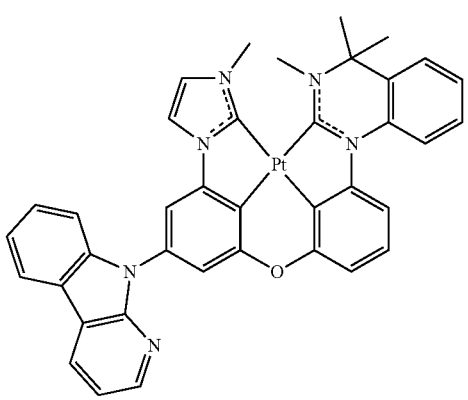
35
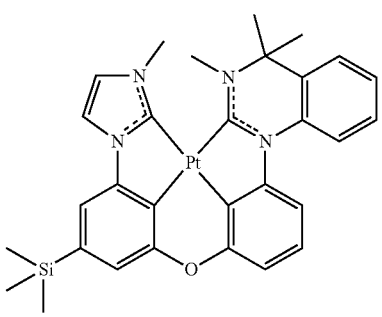
36
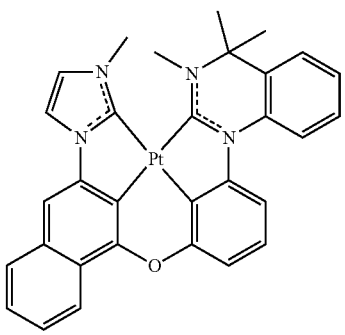

37
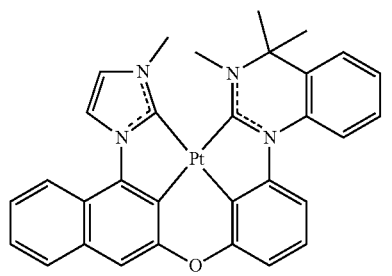
38
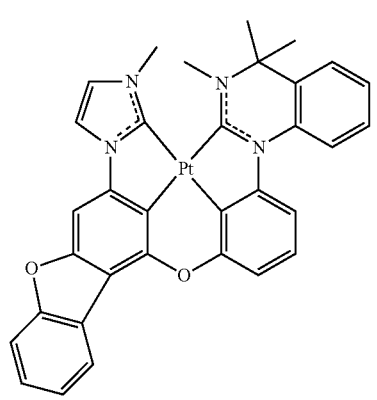
39
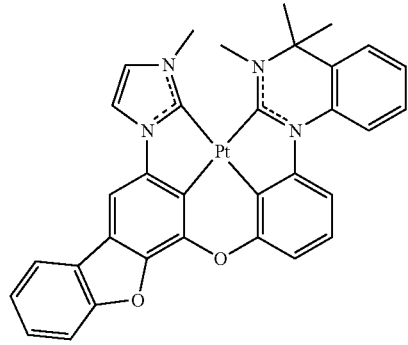
40
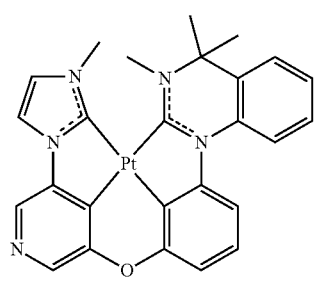
41
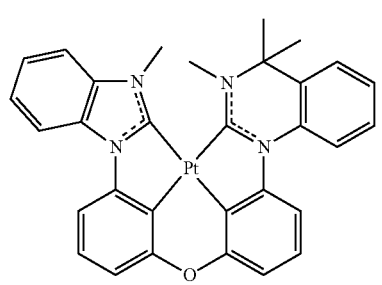
42
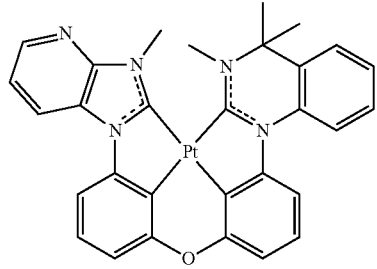
43
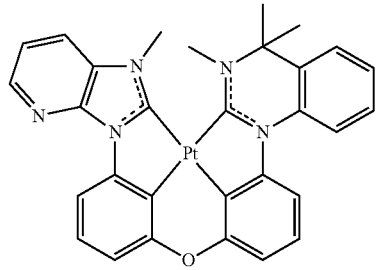
44
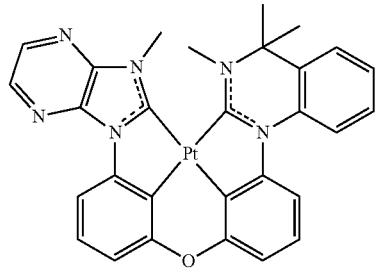
45
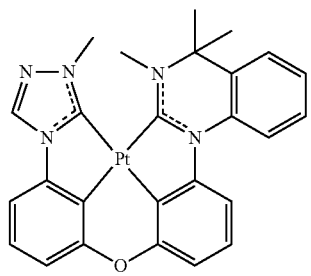
46
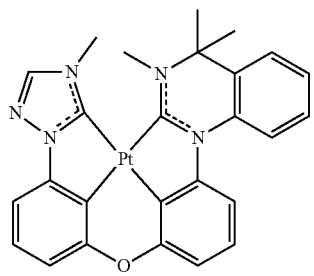

47
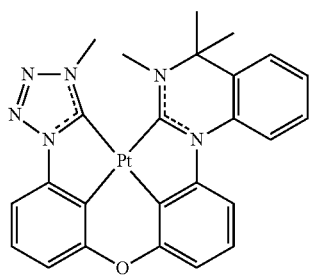
48
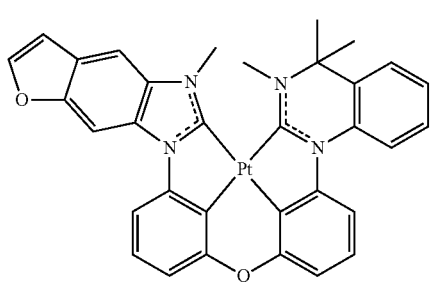
49
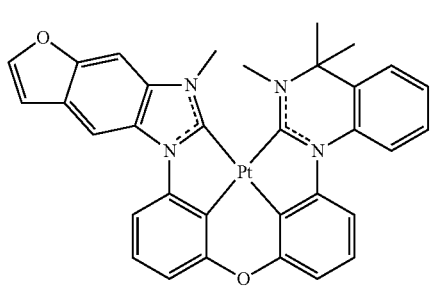
50
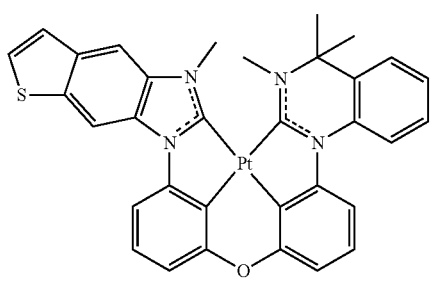
51
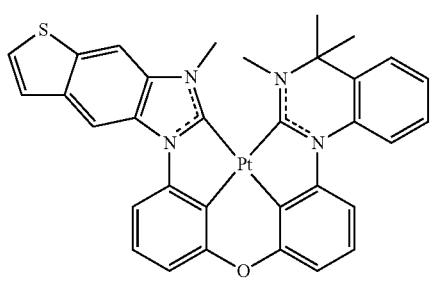
52
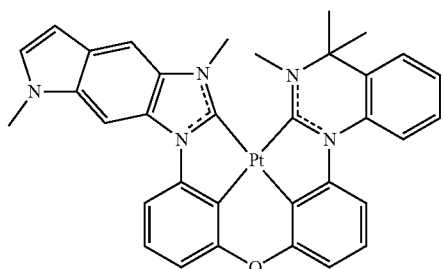
53
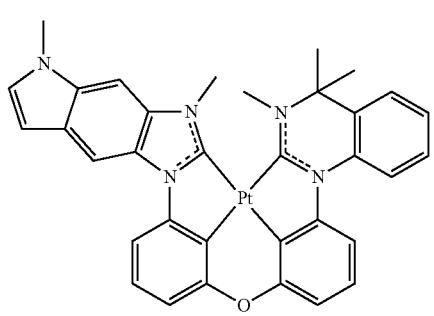
54
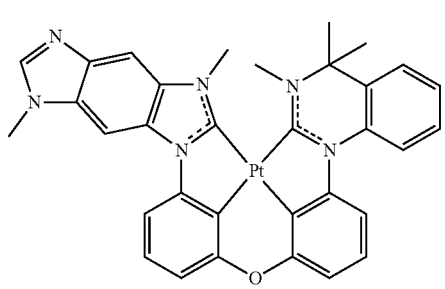
55
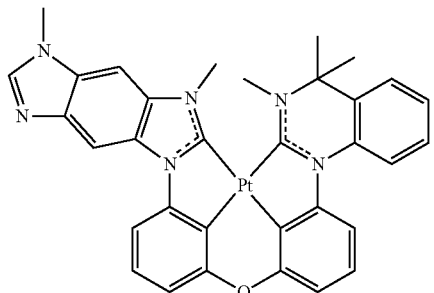
56
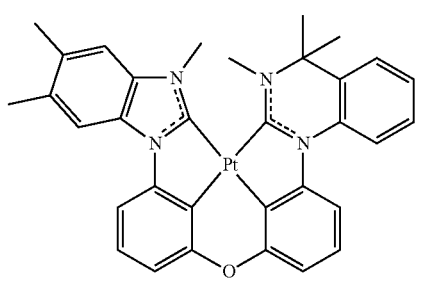

57
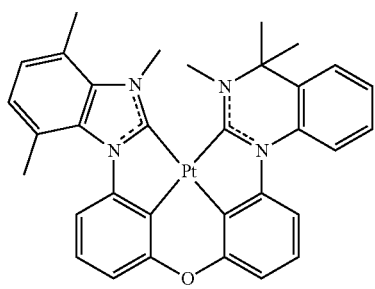
58
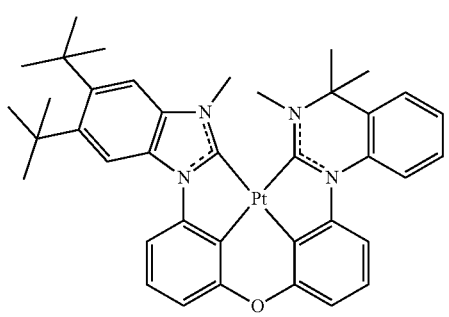
59
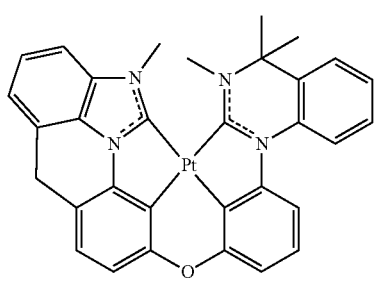
60
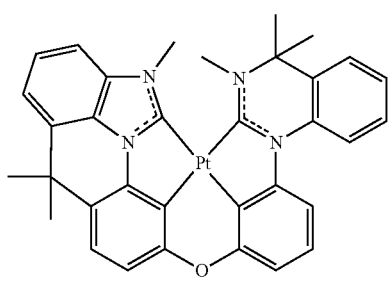
61
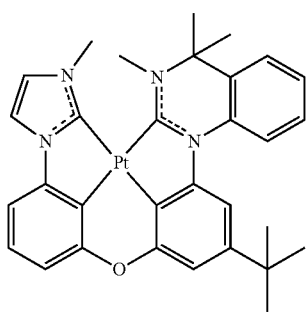
62
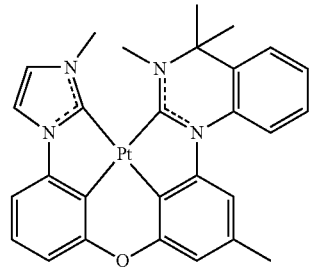
63
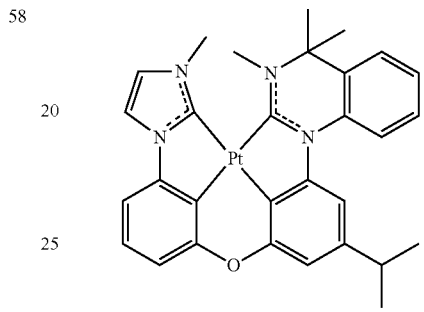
64
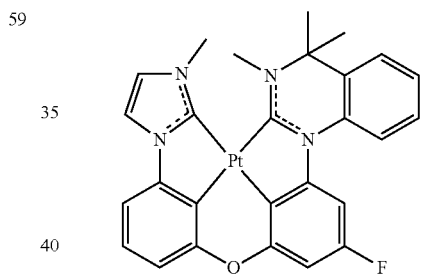
65
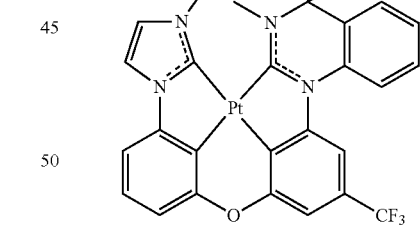
66
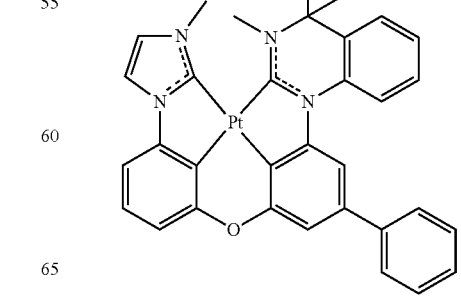

67
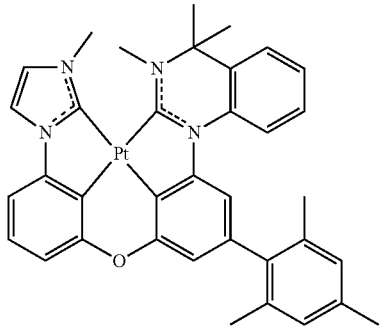
68
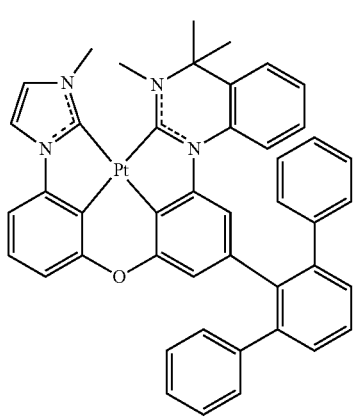
69
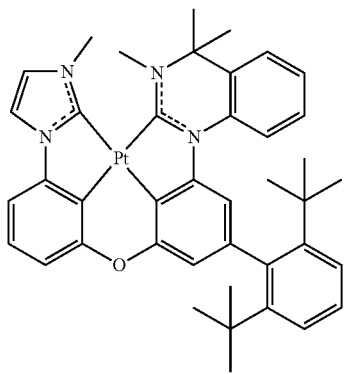
70
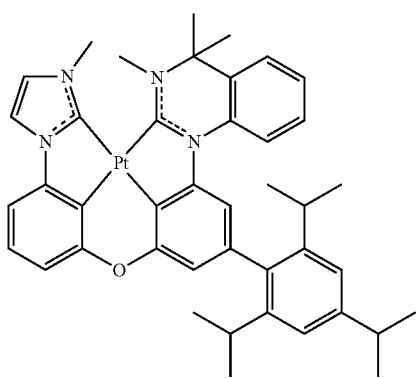
71
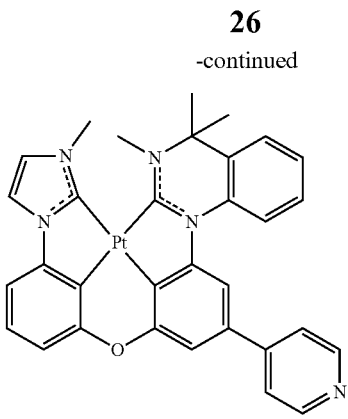
72
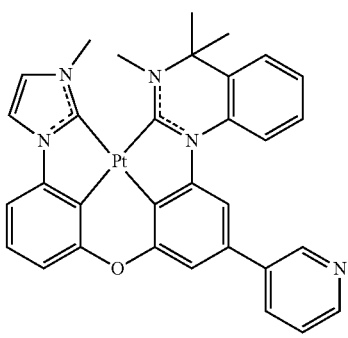
73
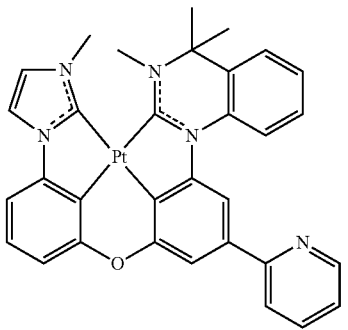
74
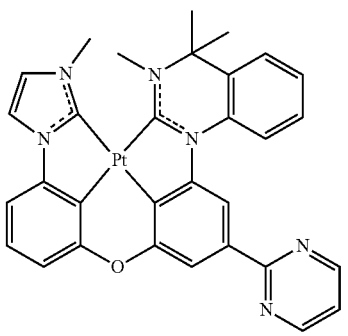

75
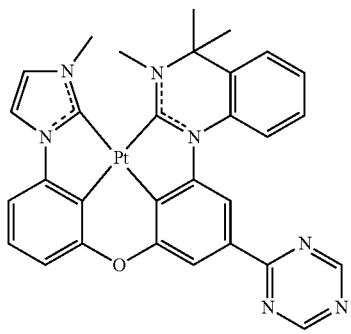
76
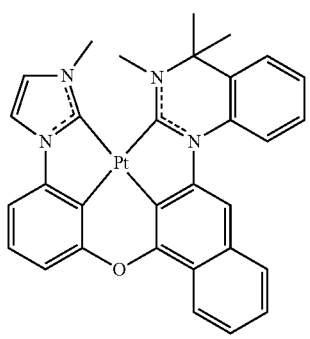
77
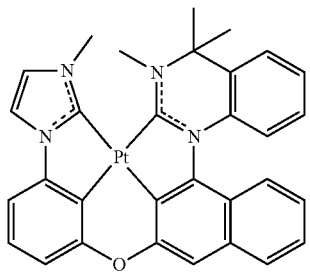
78
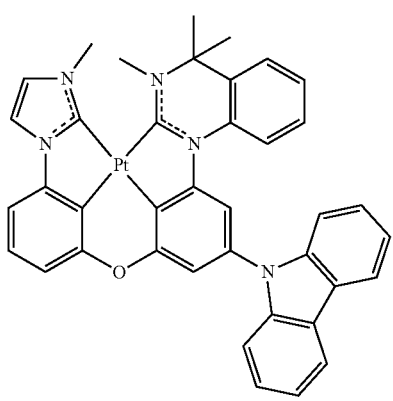
79
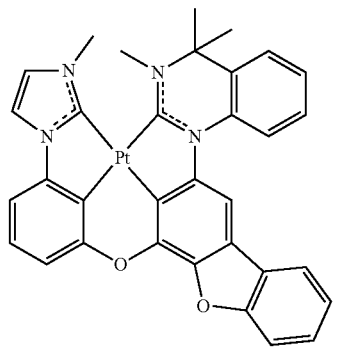
80
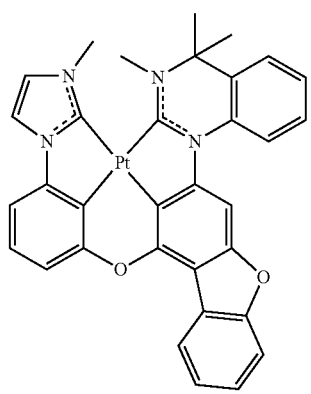
81
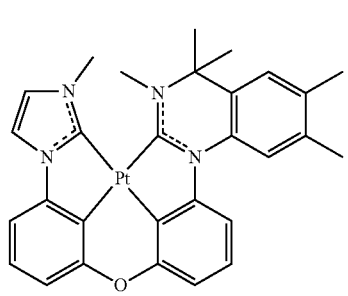
82
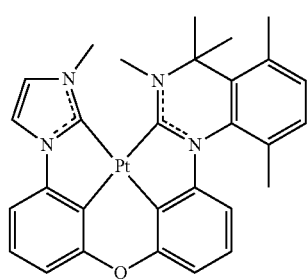
83
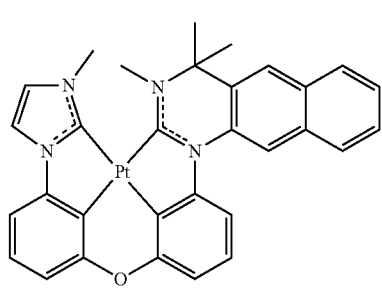

84
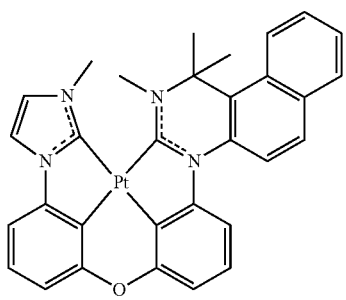
85
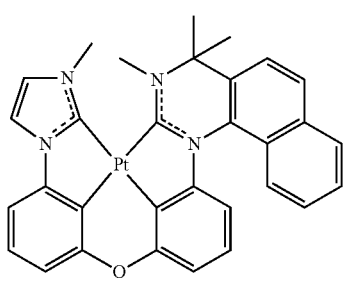
86
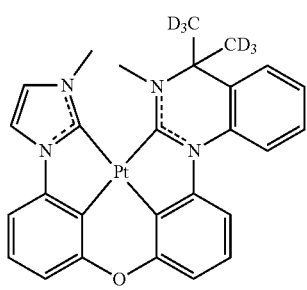
87
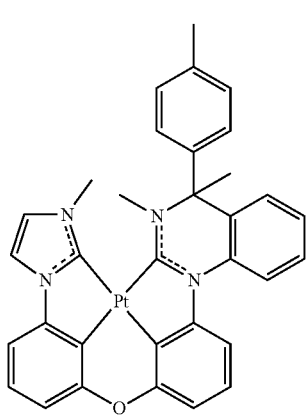
88
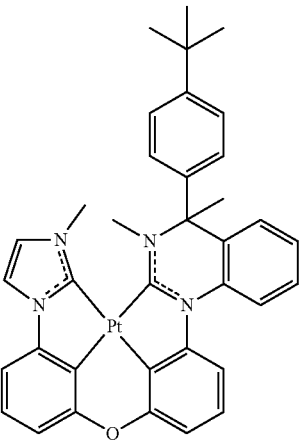
89
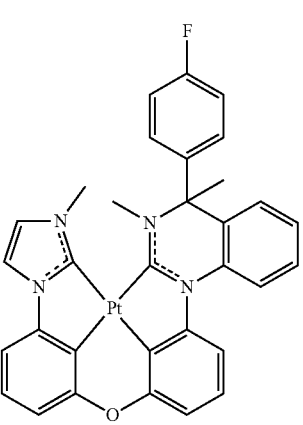
90
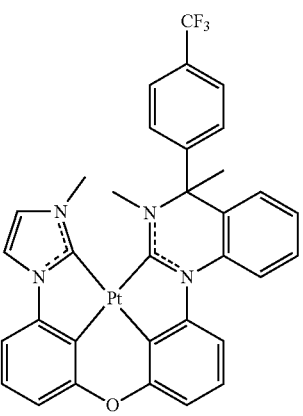
91
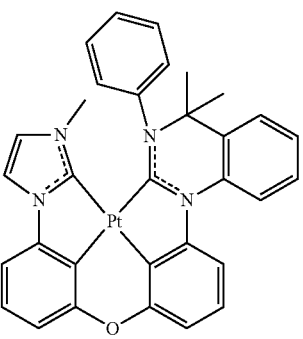

92
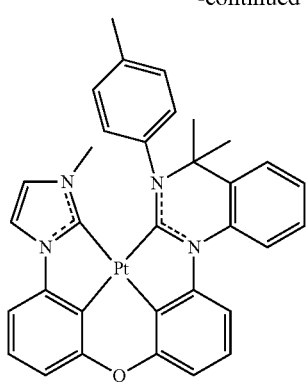
93
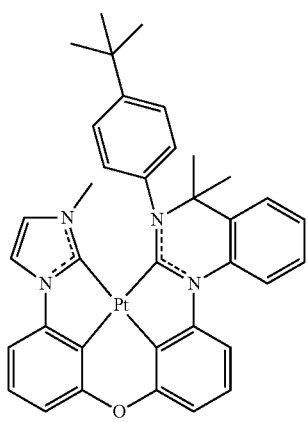
94
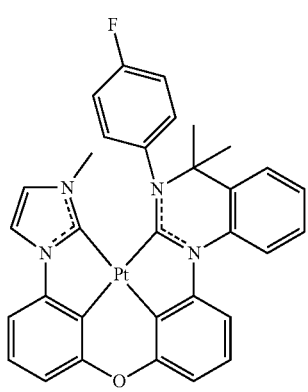
95
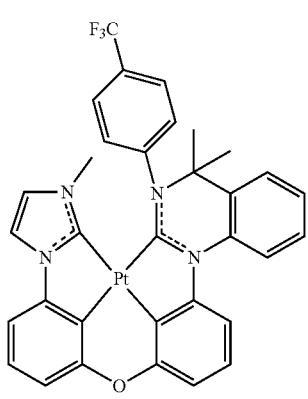
96
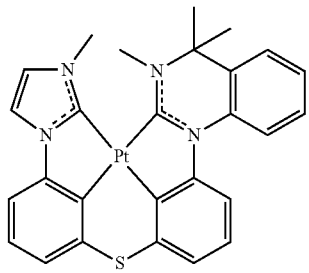
97
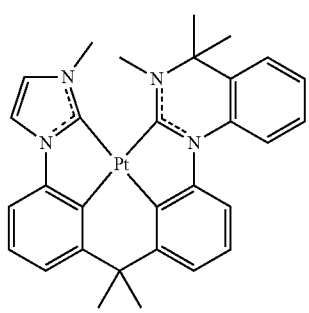
98
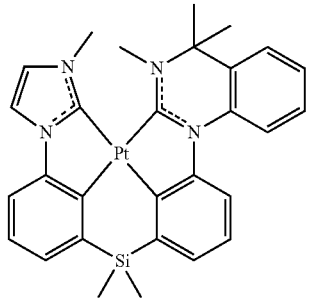
99
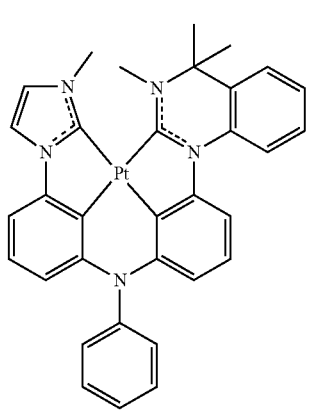

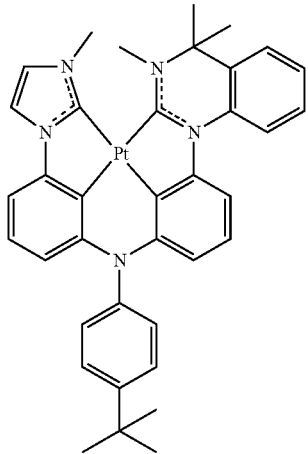
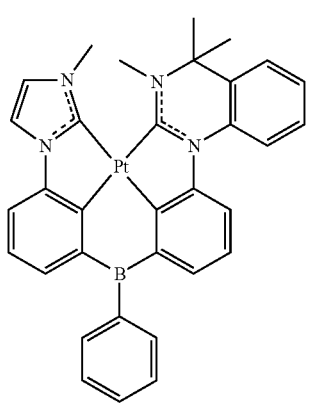
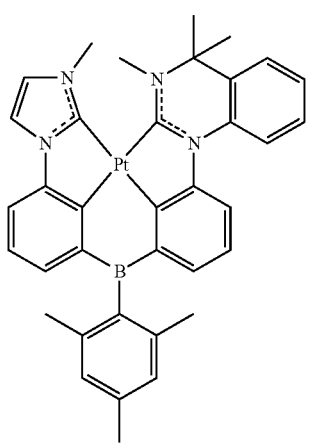
100
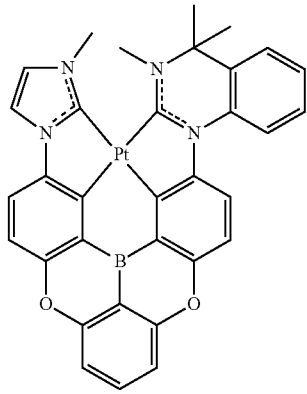
101
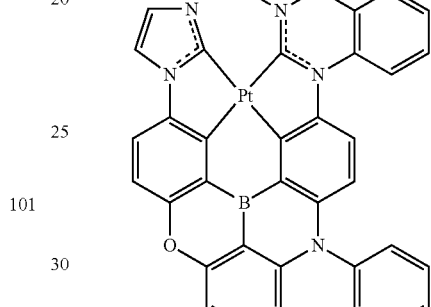
103
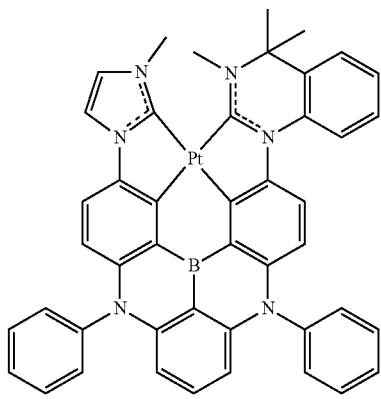
104
105
106
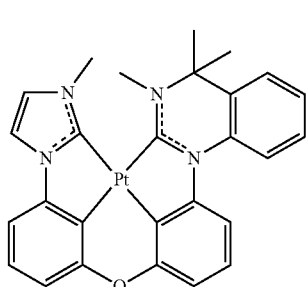

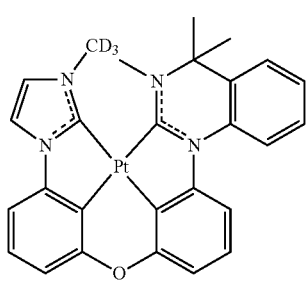
107
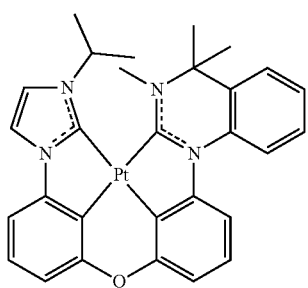
108
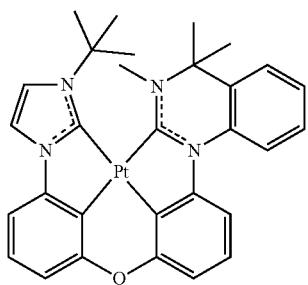
109
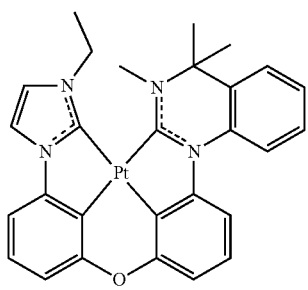
110
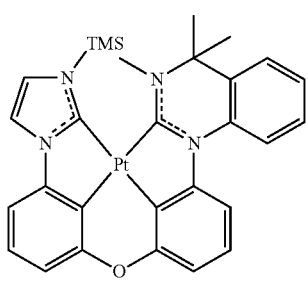
111
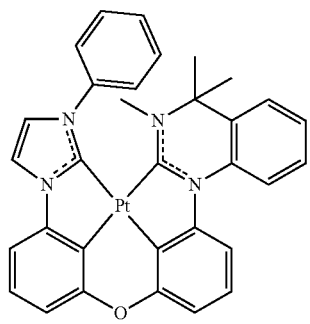
112
113
114
115
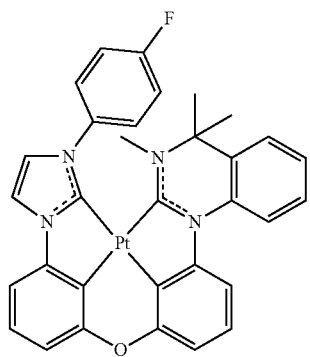

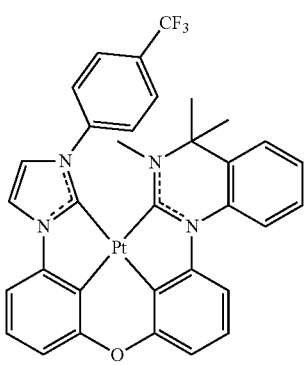

116

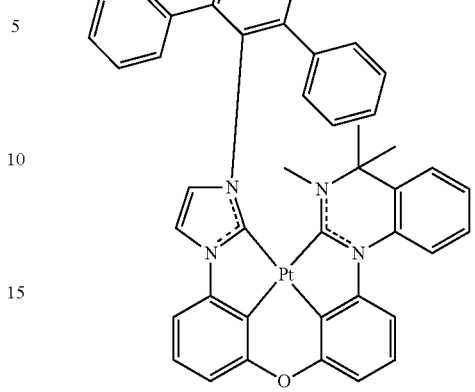

119

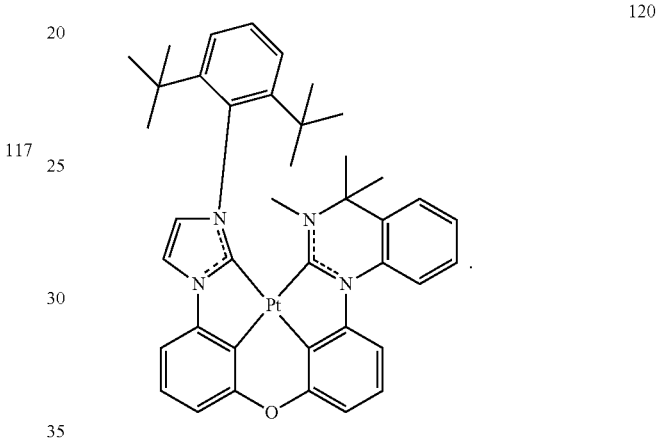

120

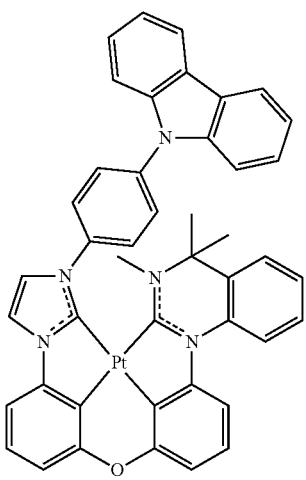

117

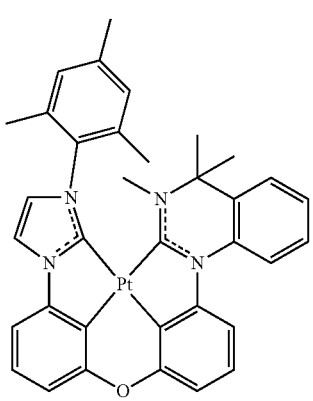

118

Because, in the organometallic compound represented by Formula 1, one of the ligands that is bonded to the central metal ($M_1$ in Formula 1) includes a 6-membered ring carbene ligand, thereby strengthening the binding force between the central metal and the carbene ligand, and thus, rigidity of the organometallic compound may be improved. Therefore, lifespan characteristics of an organic light-emitting device using the organometallic compound may be improved.

Optionally, because the 6-membered ring carbene ligand in the organometallic compound represented by Formula 1 has a condensed cyclic structure, metal-to-ligand charge transfer transition (MLCT) is increased due to an increase in sigma binding force (e.g., due to an increase in the participation of sigma electron orbitals in bonding), and thus, stability of the organic light-emitting device using the organometallic compound may be increased.

Also, because the organometallic compound represented by Formula 1 includes both a 5-membered ring carbene ligand and a 6-membered ring carbene ligand, ligand-to-ligand charge transfer transition (LLCT) may be additionally suppressed or reduced to thereby improve color purity.

As a result, when the organometallic compound is applied to an organic light-emitting device, the phenomenon that a triplet exciton is transferred to the non-emissive $^3$MC state (metal-centered triplet state) due to ligand rupture may be prevented (or an occurrence or likelihood of such a transfer may be reduced), so that the stability in the excited state is excellent and the organic light-emitting device may have excellent lifespan and efficiency characteristics.

The organometallic compound may emit blue light. In an embodiment, the organometallic compound may emit blue light (bottom emission $CIE_{x,y}$ color coordinates x=0.13, and y=0.05 to 0.20) having a maximum emission wavelength of about 410 nm or more and about 500 nm or less, but embodiments of the present disclosure are not limited thereto. Accordingly, the organometallic compound represented by Formula 1 may be useful for manufacturing a light-emitting device that emits blue light.

Synthesis methods of the organometallic compound represented by Formula 1 may be recognizable to one of ordinary skill in the art by referring to the Examples provided below.

At least one of the organometallic compounds represented by Formula 1 may be used in a light-emitting device (for example, an organic light-emitting device). Accordingly, provided is a light-emitting device including: a first electrode; a second electrode facing the first electrode; and an interlayer between the first electrode and the second electrode and including an emission layer, wherein the light-emitting device includes the organometallic compound represented by Formula 1.

In an embodiment,
the interlayer may further include a hole transport region between the first electrode and the emission layer and an electron transport region between the emission layer and the second electrode,
the hole transport region may include a hole injection layer, a hole transport layer, an emission auxiliary layer, an electron blocking layer, or any combination thereof, and
the electron transport region may include a buffer layer, a hole blocking layer, an electron control layer, an electron transport layer, an electron injection layer, or any combination thereof.

In one or more embodiments, the organometallic compound may be included between a pair of electrodes of the light-emitting device. Accordingly, the organometallic compound may be included in the interlayer of the light-emitting device, for example, in the emission layer of the interlayer. The organometallic compound included in the emission layer may act as a dopant. In one or more embodiments, the organometallic compound represented by Formula 1 may be used as a material for a capping layer located outside the pair of electrodes of the light-emitting device.

In one or more embodiments, a second capping layer is on the second electrode, and
the second capping layer may include a material having a refractive index of 1.6 or more at a wavelength of 589 nm.

In an embodiment, the emission layer may include the organometallic compound.

In an embodiment, the emission layer may further include a host, and an amount of the organometallic compound may be from 0.01 parts by weight to 49.99 parts by weight based on 100 parts by weight of the emission layer.

In an embodiment, the host may include a silicon-containing compound, a phosphineoxide-containing compound, or any combination thereof.

In an embodiment, the emission layer may emit blue light having a maximum emission wavelength in a range of 410 nm to 500 nm.

In an embodiment, the electron transport region may include a phosphineoxide-containing compound, a silyl compound, or any combination thereof.

In one or more embodiments, the light-emitting device may further include at least one selected from a first capping layer located outside the first electrode and a second capping layer located outside the second electrode, and at least one selected from the first capping layer and the second capping layer may include the organometallic compound represented by Formula 1. Additional details of the first capping layer and/or second capping layer are the same as described elsewhere in the present specification.

In an embodiment, the light-emitting device may include:
a first capping layer located outside the first electrode and including the organometallic compound represented by Formula 1;
a second capping layer located outside the second electrode and including the organometallic compound represented by Formula 1; or
the first capping layer and the second capping layer.

The wording "(interlayer and/or capping layer) includes the organometallic compound" as used herein may be understood as "(interlayer and/or capping layer) may include one kind of the organometallic compound represented by Formula 1 or two different kinds of the organometallic compounds, each represented by Formula 1."

For example, the interlayer and/or the capping layer may include Compound 1 only as the organometallic compound. In this regard, Compound 1 may exist in the emission layer of the light-emitting device. In one or more embodiments, the interlayer may include, as the organometallic compound, Compound 1 and Compound 2. In this regard, Compound 1 and Compound 2 exist in the same layer (for example, both Compound 1 and Compound 2 may exist in the emission layer) or in different layers (for example, Compound 1 may exist in the emission layer, and Compound 2 may exist in the electron transport region).

The term "interlayer," as used herein, refers to a single or a plurality of layers between a first electrode and a second electrode in the light-emitting device.

Description of FIG. 1

FIG. 1 is a schematic cross-sectional view of a light-emitting device 10 according to an embodiment. The light-emitting device 10 includes a first electrode 110, an interlayer 130, and a second electrode 150.

Hereinafter, a structure of the light-emitting device 10 according to an embodiment and a method of manufacturing the light-emitting device 10 will be described in connection with FIG. 1.

First Electrode 110

In FIG. 1, a substrate may be additionally located under the first electrode 110 or above the second electrode 150. The substrate may be a glass substrate and/or a plastic substrate. The substrate may be a flexible substrate. In one or more embodiments, the substrate may include plastics having excellent heat resistance and/or durability, such as polyimide, polyethylene terephthalate (PET), polycarbonate, polyethylene naphthalate, polyarylate (PAR), polyetherimide, or any combination thereof.

The first electrode 110 may be formed by, for example, depositing and/or sputtering a material for forming the first electrode 110 on the substrate. When the first electrode 110 is an anode, a high work function material that can easily inject holes may be used as a material for forming the first electrode 110.

The first electrode 110 may be a reflective electrode, a semi-transmissive electrode, or a transmissive electrode. When the first electrode 110 is a transmissive electrode, a material for forming the first electrode 110 may include indium tin oxide (ITO), indium zinc oxide (IZO), tin oxide (SnO$_2$), zinc oxide (ZnO), or any combination thereof. In one or more embodiments, when the first electrode 110 is a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or any combination thereof may be used as a material for forming the first electrode 110.

The first electrode 110 may have a single-layered structure including (e.g., consisting of) a single layer or a multi-layered structure including a plurality of layers. In an embodiment, the first electrode 110 may have a three-layered structure of ITO/Ag/ITO.

Interlayer 130

The interlayer 130 is on the first electrode 110. The interlayer 130 includes an emission layer.

The interlayer 130 may further include a hole transport region between the first electrode 110 and the emission layer and an electron transport region between the emission layer and the second electrode 150.

The interlayer 130 may further include metal-containing compounds such as organometallic compounds, inorganic materials such as quantum dots, and/or the like, in addition to various suitable organic materials.

In one or more embodiments, the interlayer 130 may include, i) two or more emitting units sequentially stacked between the first electrode 110 and the second electrode 150 and ii) a charge generation layer between the two emitting units. When the interlayer 130 includes the emitting units and the charge generation layer, the light-emitting device 10 may be a tandem light-emitting device.

Hole Transport Region in Interlayer 130

The hole transport region may have: i) a single-layered structure including (e.g., consisting of) a single layer including (e.g., consisting of) a single material, ii) a single-layered structure including (e.g., consisting of) a single layer including a plurality of different materials, or iii) a multi-layered structure including a plurality of layers including different materials.

The hole transport region may include a hole injection layer, a hole transport layer, an emission auxiliary layer, an electron blocking layer, or any combination thereof.

For example, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein, in each structure, layers are stacked sequentially from the first electrode 110.

The hole transport region may include a compound represented by Formula 201, a compound represented by Formula 202, or any combination thereof:

Formula 201

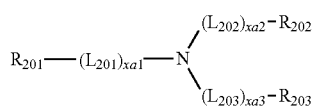

Formula 202

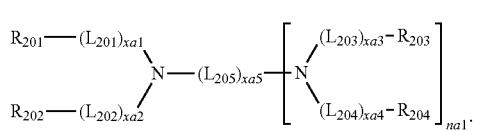

In Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be*—O—*',*—S—*',*—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, and $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$(for example, a carbazole group or the like) (for example, refer to the following Compound HT16), $R_{203}$ and $R_{204}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ poly cyclic group unsubstituted or substituted with at least one $R_{10a}$, and na1 may be an integer from 1 to 4.

In an embodiment, Formulae 201 and 202 may each include at least one selected from groups represented by Formulae CY201 to CY217:

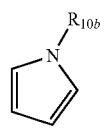

CY201

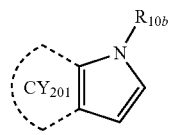

CY202

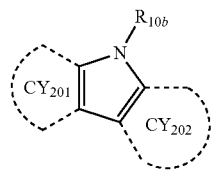

CY203

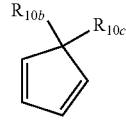

CY204

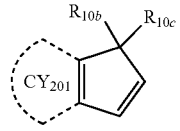

CY205

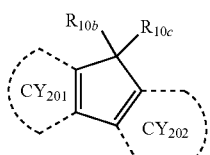
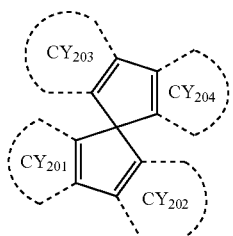
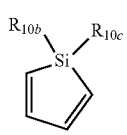
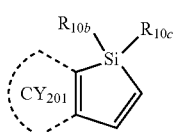
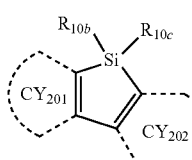
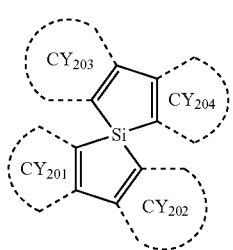
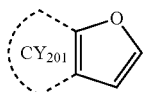
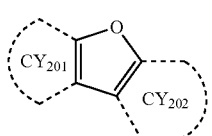

CY206

CY207

CY208

CY209

CY210

CY211

CY212

CY213

CY214

CY215

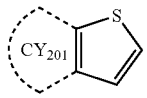

CY216

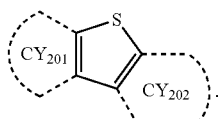

CY217

Regarding Formulae CY201 to CY217, $R_{10b}$ and $R_{10c}$ are the same as described in connection with $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formula CY201 to CY217 may be unsubstituted or substituted with at least one $R_{10a}$ described herein.

In an embodiment, ring $CY_{201}$ to ring $CY_{204}$ in Formulae CY201 to CY217 may each independently be a benzene group, a naphthalene group, a phenanthrene group, or an anthracene group.

In an embodiment, Formulae 201 and 202 may each include at least one of groups represented by Formulae CY201 to CY203.

In one or more embodiments, Formula 201 may include at least one selected from groups represented by Formulae CY201 to CY203 and at least one selected from groups represented by Formulae CY204 to CY217.

In one or more embodiments, in Formula 201, xa1 is 1, $R_{201}$ is a group represented by one selected from Formulae CY201 to CY203, xa2 is 0, $R_{202}$ is a group represented by one selected from Formulae CY204 to CY207.

In one or more embodiments, each of Formulae 201 and 202 may not include a group represented by one selected from Formulae CY201 to CY203.

In one or more embodiments, each of Formulae 201 and 202 may not include a group represented by one selected from Formulae CY201 to CY203 and may include at least one selected from groups represented by Formulae CY204 to CY217.

In an embodiment, each of Formulae 201 and 202 may not include a group represented by one selected from Formulae CY201 to CY217.

In an embodiment, the hole transport region may include one selected from Compounds HT1 to HT44, m-MTDATA, TDATA, 2-TNATA, NPB(NPD), β-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or any combination thereof:

HT1
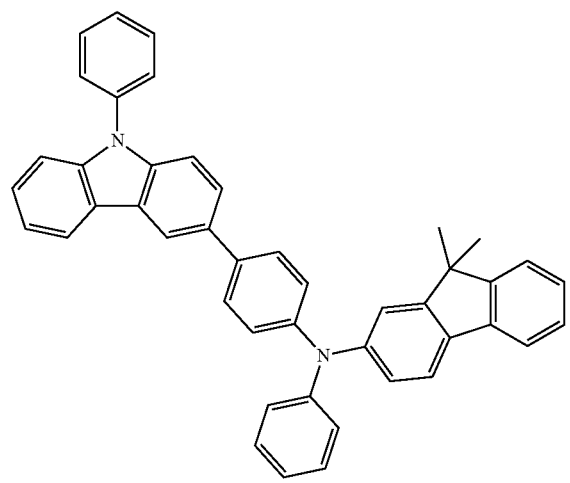
HT3
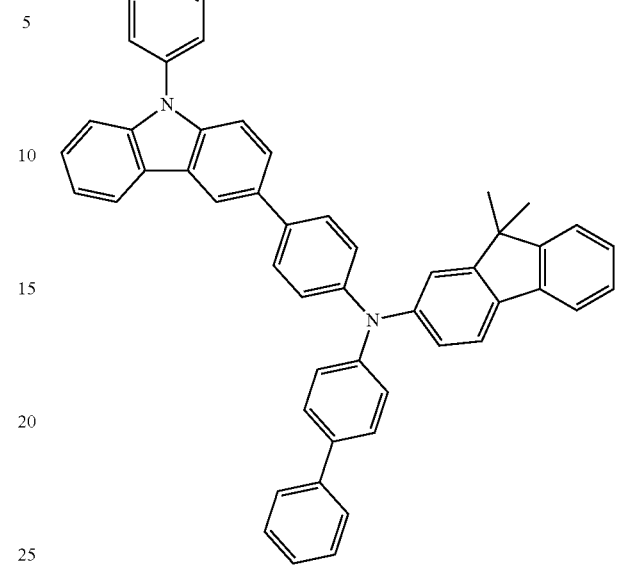
HT2
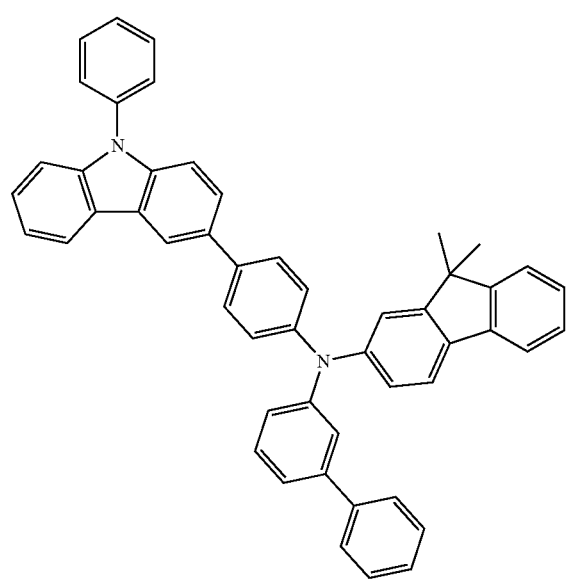
HT4
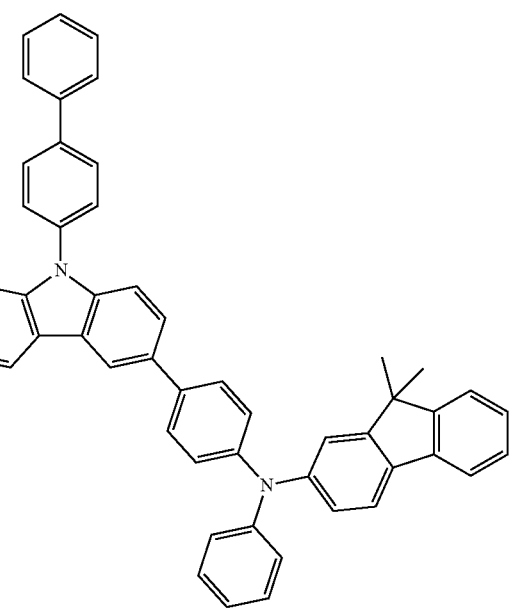

HT5
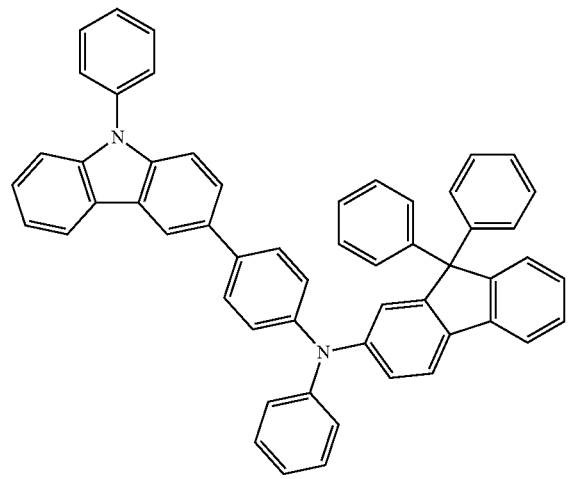
HT7
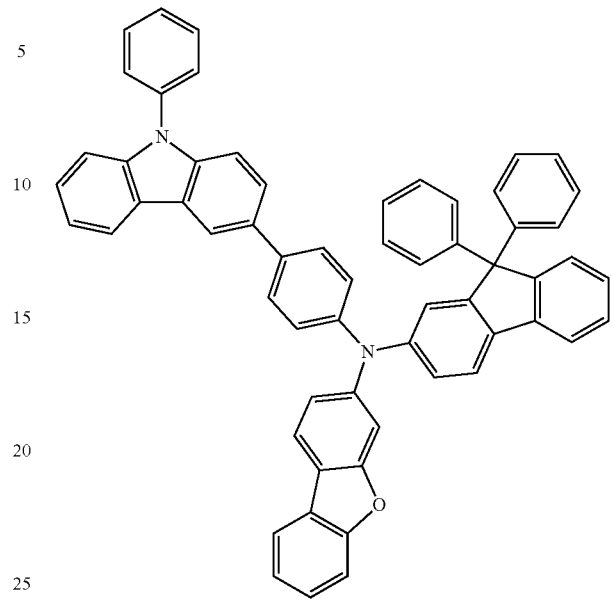
HT6
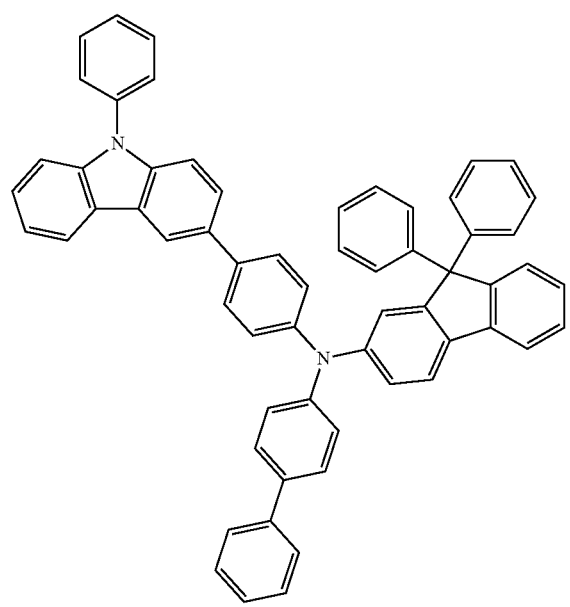
HT8
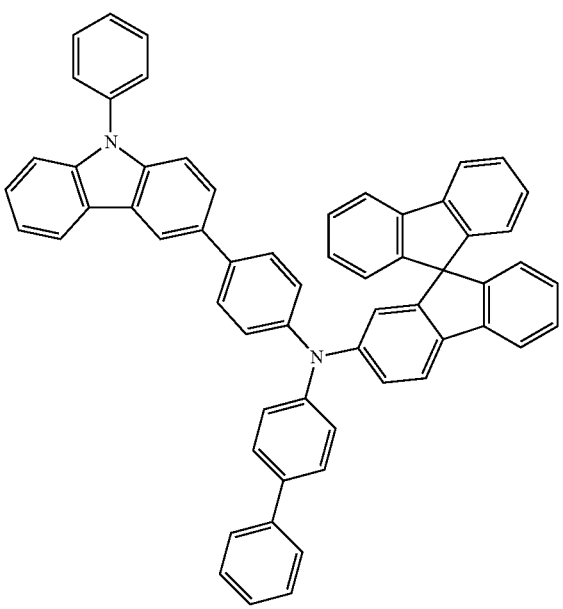

HT9
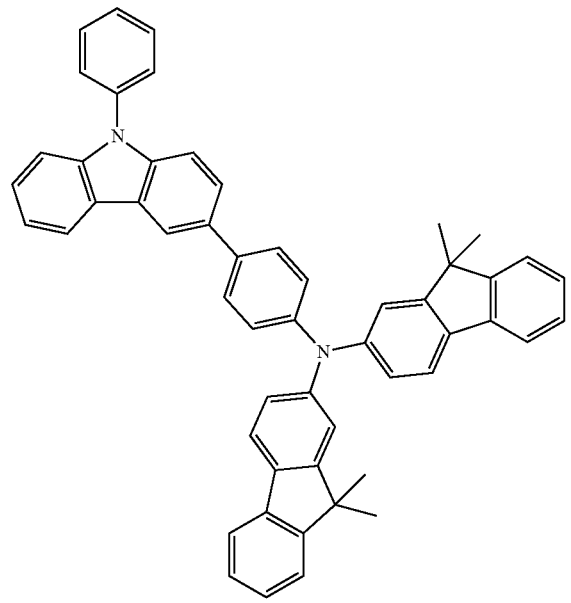
HT11
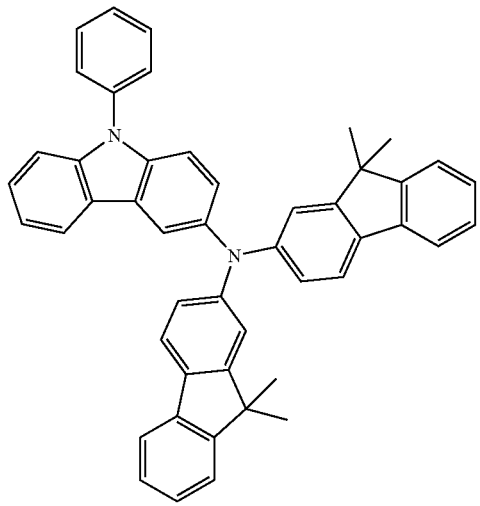
HT12
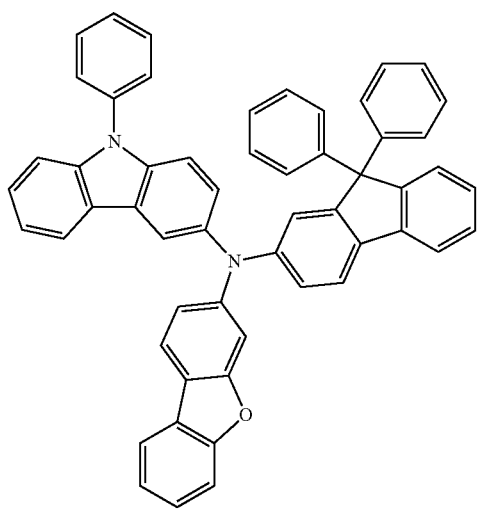
HT10
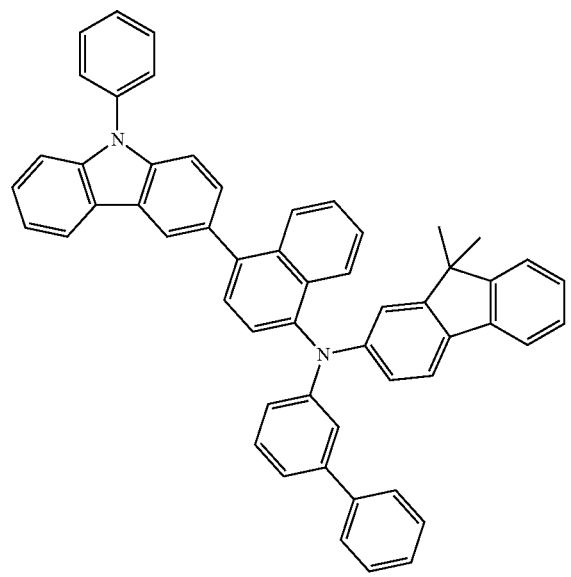
HT13
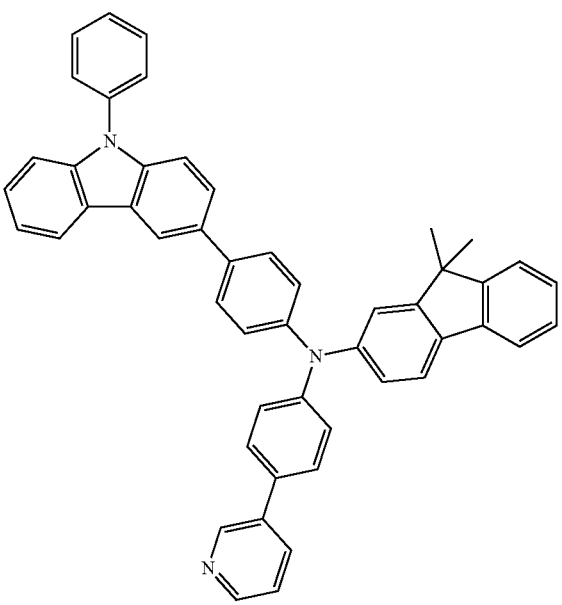

HT14
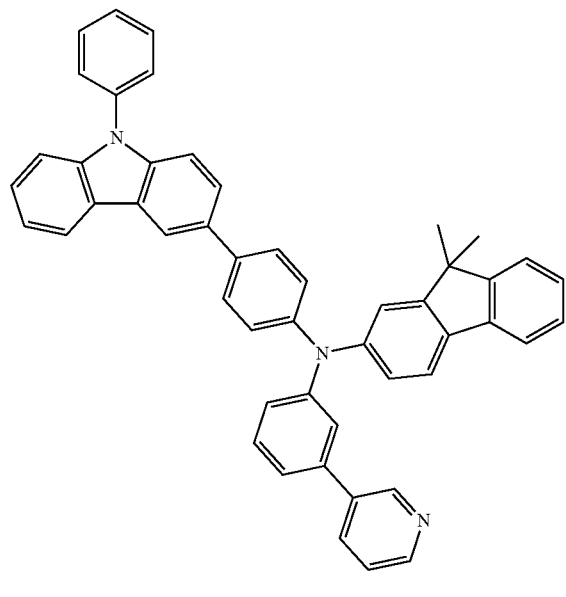
HT15
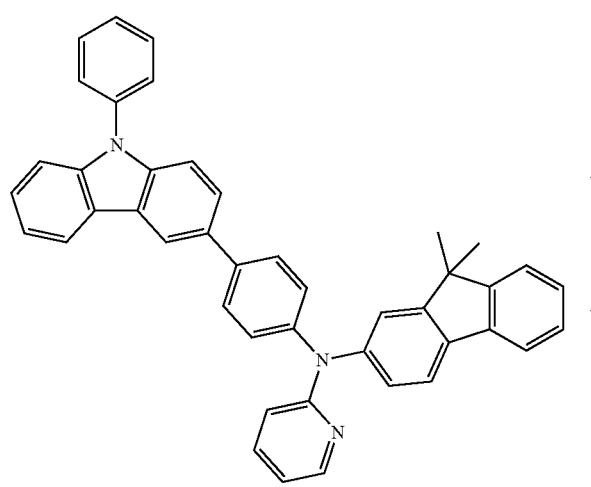
HT16
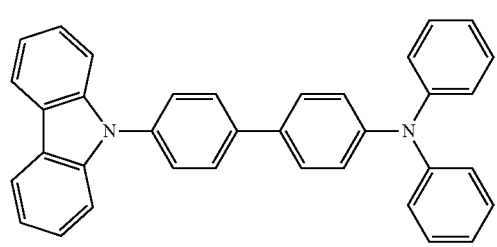
HT17
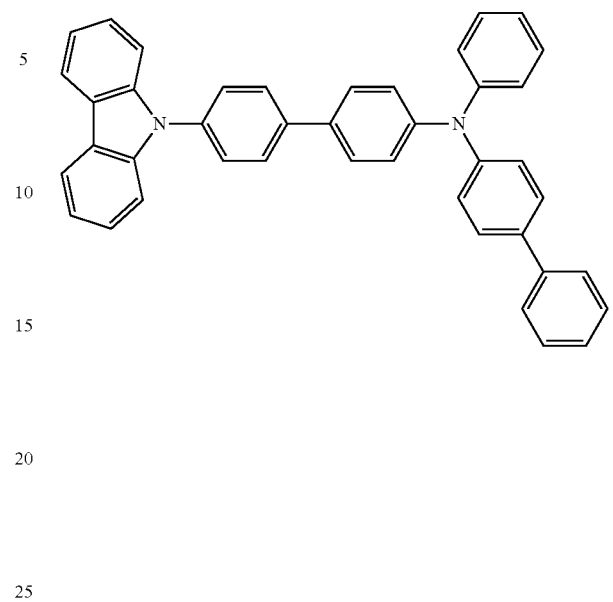
HT18
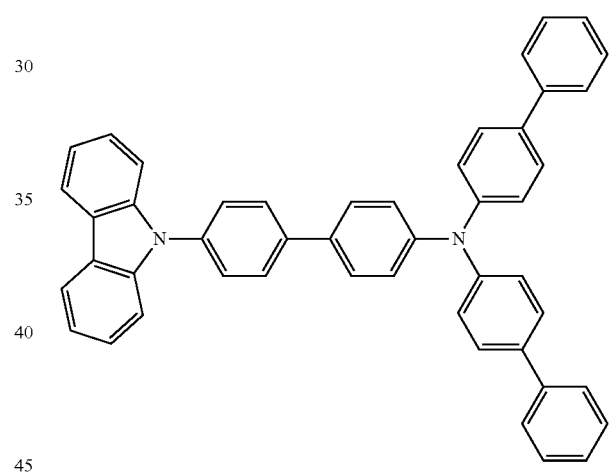
HT19
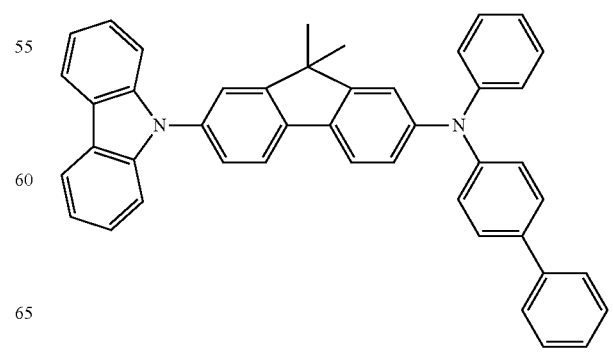

-continued
HT20
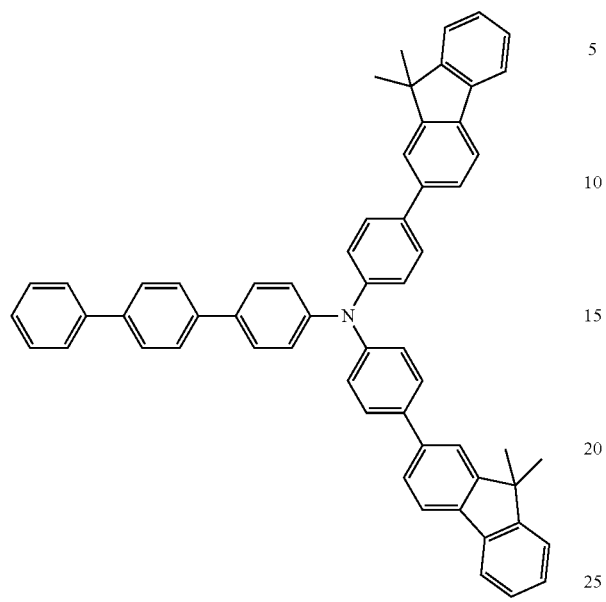
HT23
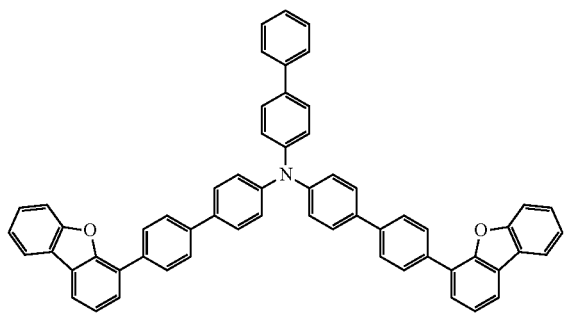
HT21
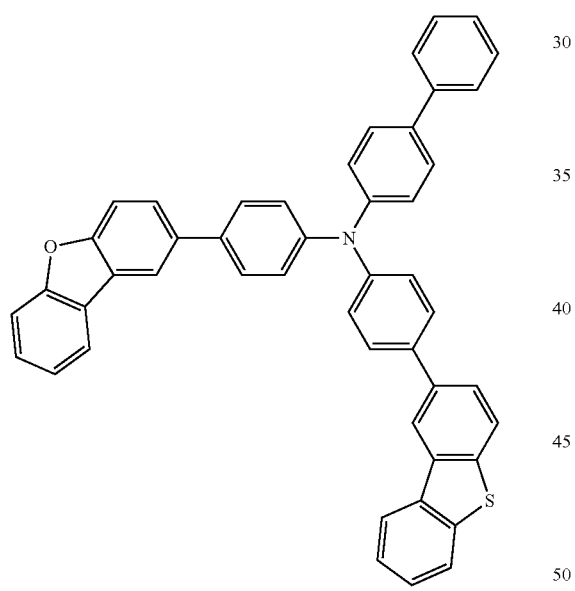
HT24
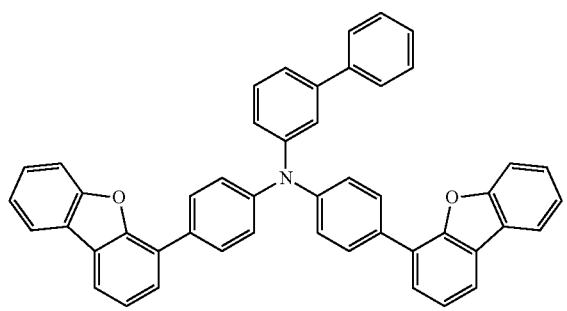
HT22
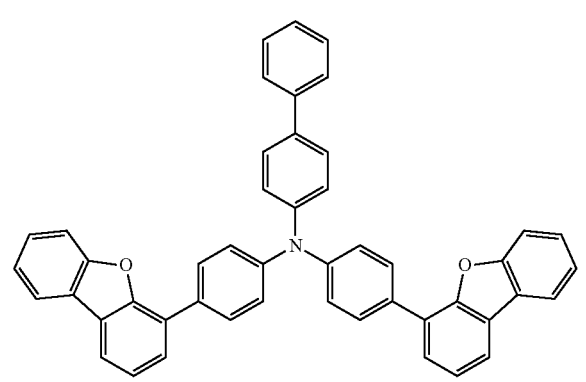
HT25

HT26
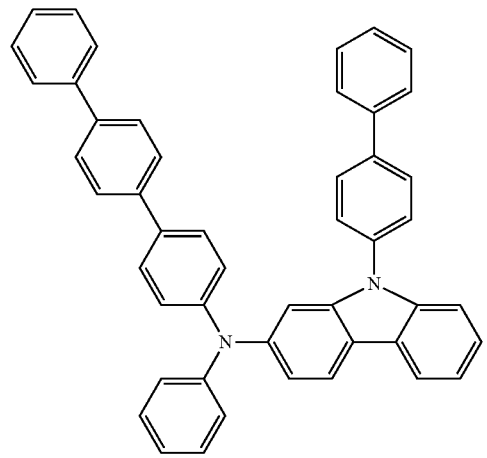
HT29
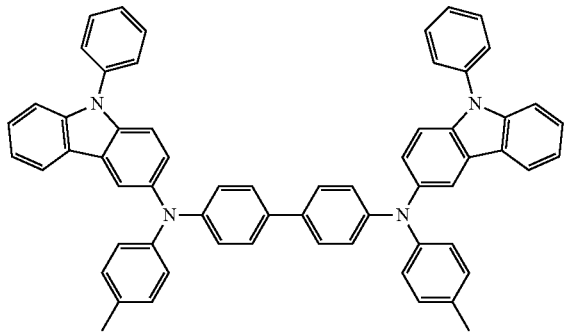
HT27
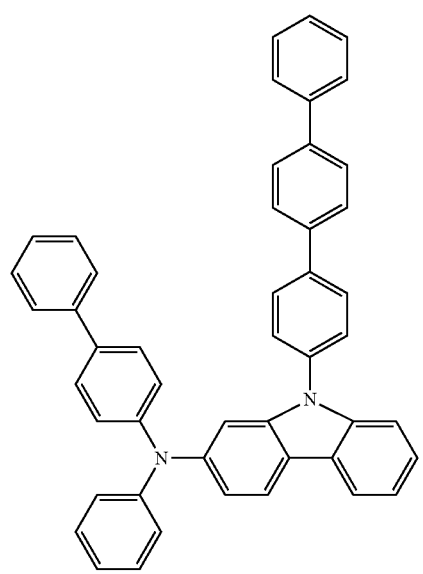
HT30
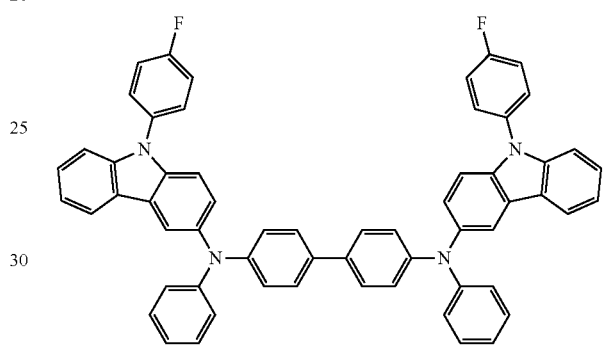
HT31
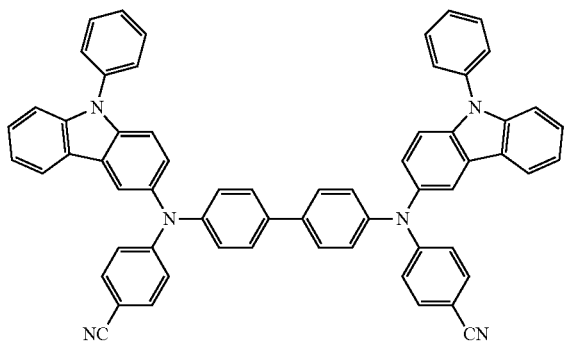
HT28
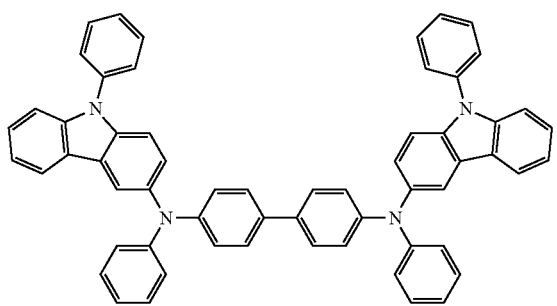
HT32
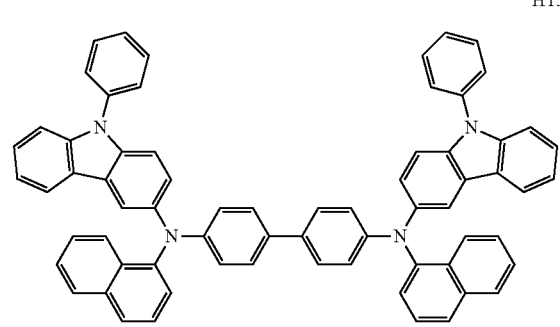

HT33 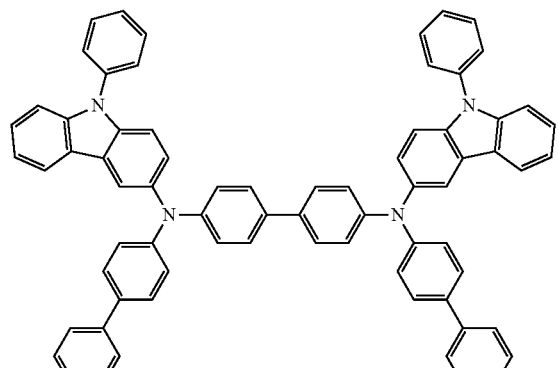
HT36 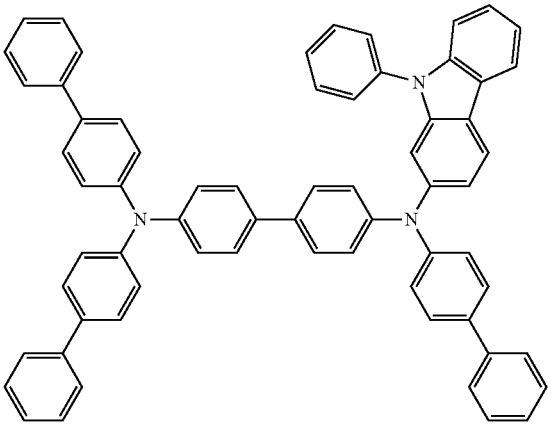
HT34 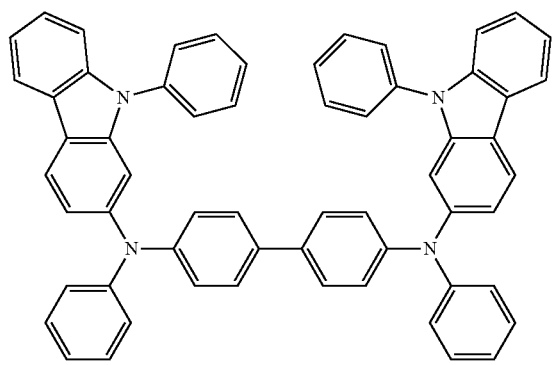
HT37 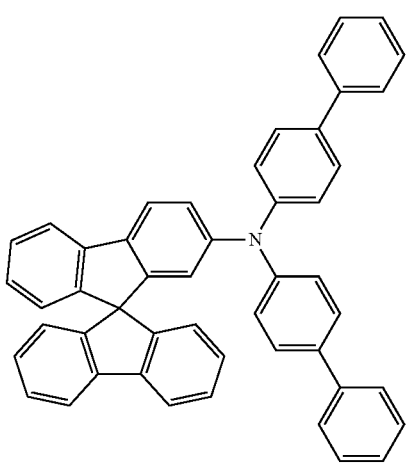
HT35 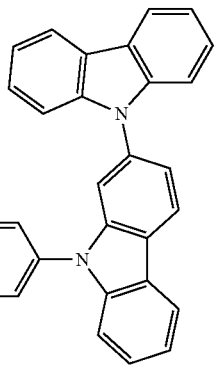
HT38 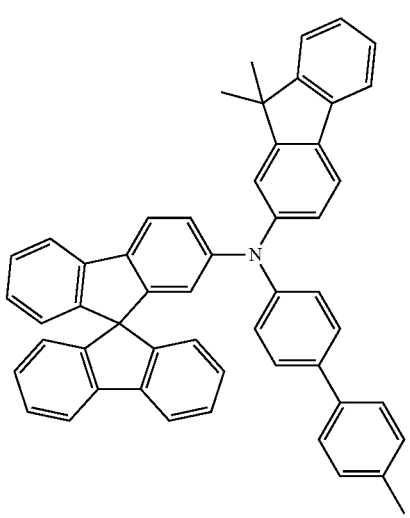

HT39
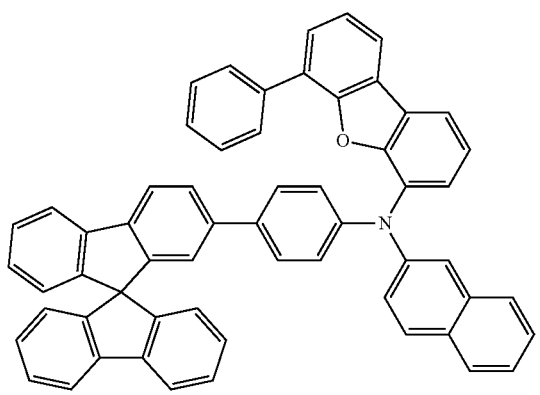
HT40
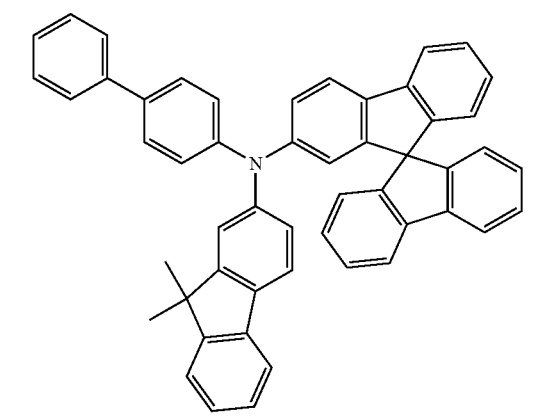
HT41
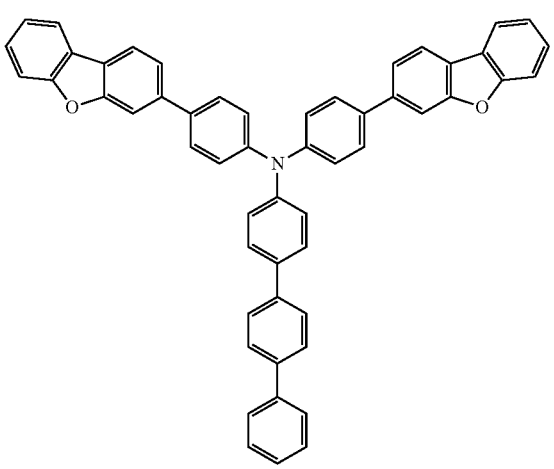
HT42
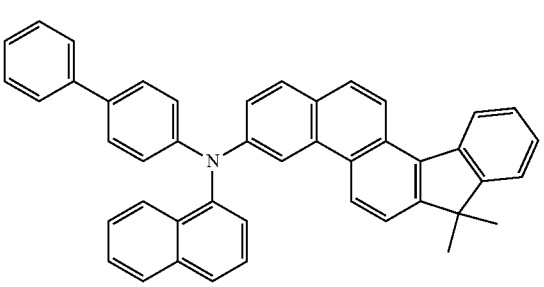
HT43
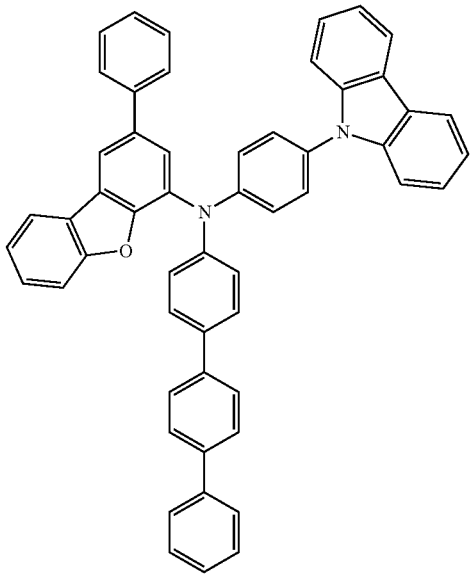
HT44
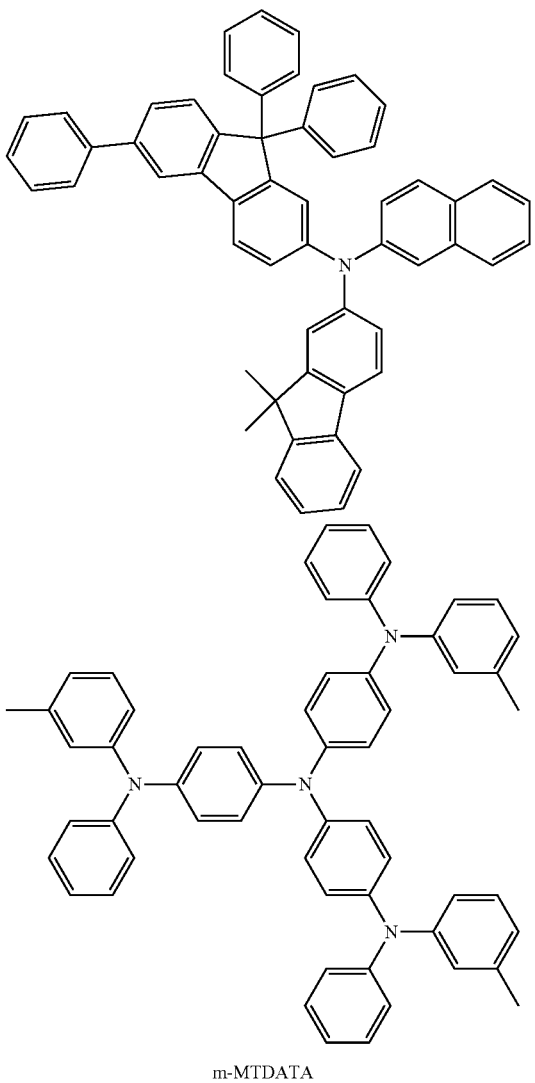
m-MTDATA

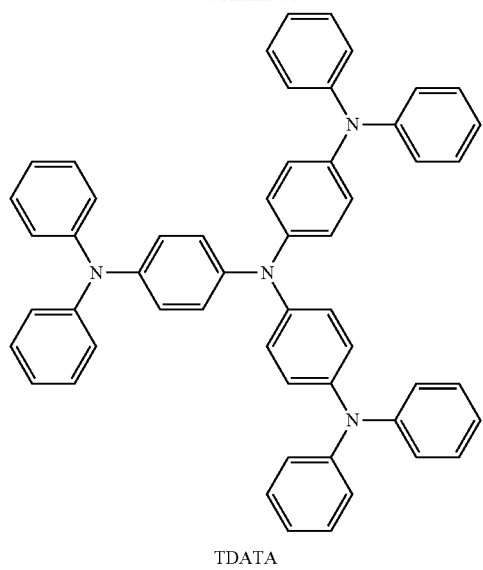
TDATA
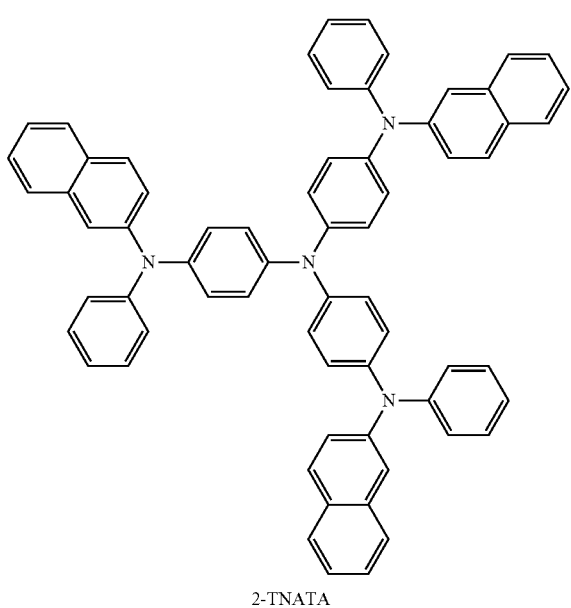
2-TNATA
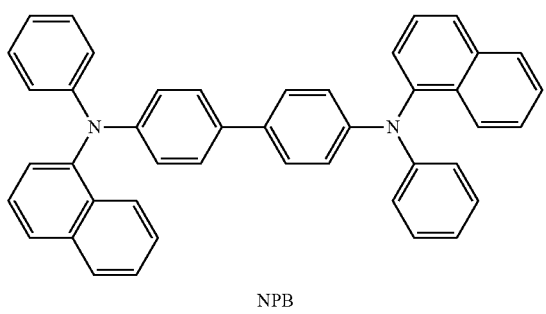
NPB
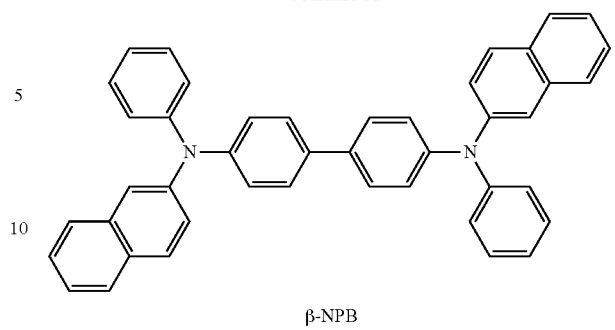
β-NPB
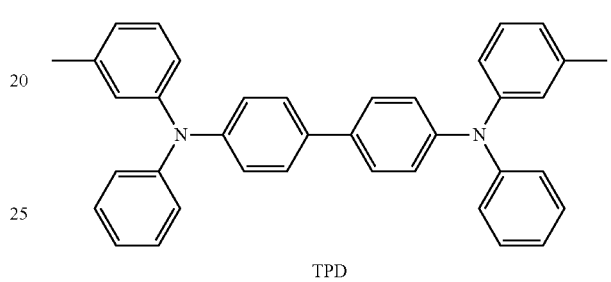
TPD
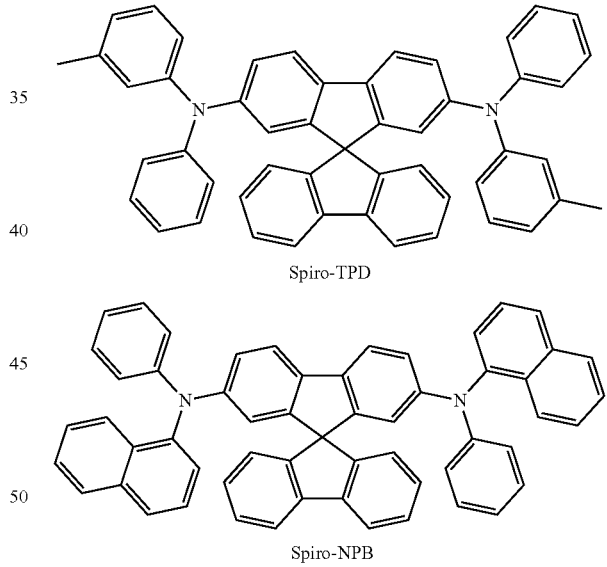
Spiro-TPD
Spiro-NPB
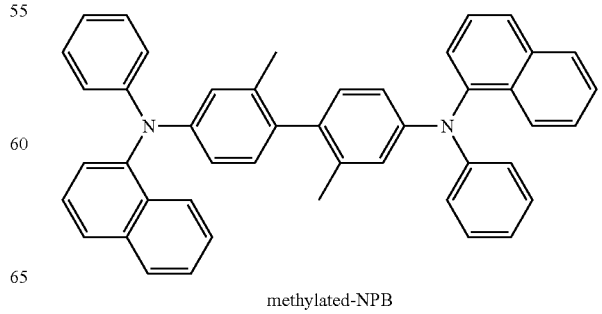
methylated-NPB

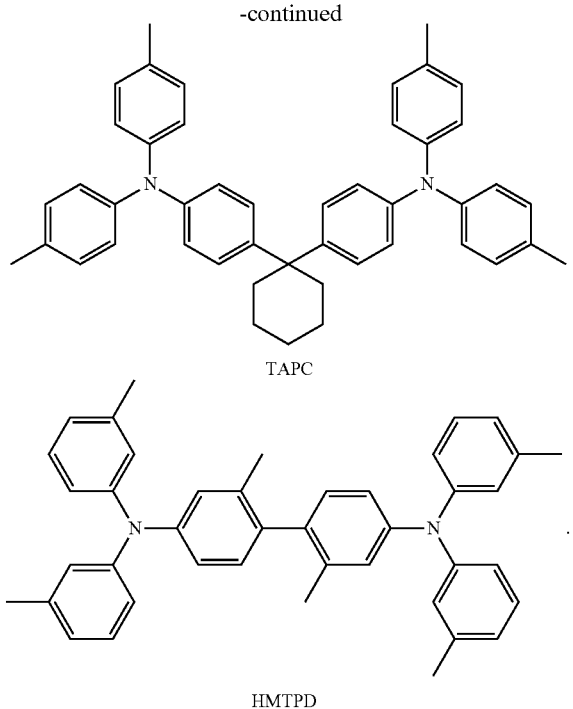

TAPC

HMTPD

A thickness of the hole transport region may be in a range of about 50 Å to about 10,000 Å, for example, about 100 Å to about 4,000 Å. When the hole transport region includes a hole injection layer, a hole transport layer, or any combination thereof, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer, and the hole transport layer are within these ranges, suitable or satisfactory hole transporting characteristics may be obtained without a substantial increase in driving voltage.

The emission auxiliary layer may increase light-emission efficiency by compensating for an optical resonance distance according to the wavelength of light emitted by an emission layer, and the electron blocking layer may block or reduce the flow of electrons from an electron transport region. The emission auxiliary layer and the electron blocking layer may include the materials as described above.

p-Dopant

The hole transport region may further include, in addition to these materials, a charge-generation material for improvement of conductive properties (e.g., electrically conductive properties). The charge-generation material may be uniformly or non-uniformly dispersed in the hole transport region (for example, in the form of a single layer of a charge-generation material).

The charge-generation material may be, for example, a p-dopant.

In an embodiment, a lowest unoccupied molecular orbital (LUMO) energy level of the p-dopant may be −3.5 eV or less.

In an embodiment, the p-dopant may include a quinone derivative, a cyano group-containing compound, a compound containing element EL1 and element EL2, or any combination thereof.

Examples of the quinone derivative may include TCNQ and F4-TCNQ.

Examples of the cyano group-containing compound may include HAT-CN and a compound represented by Formula 221 below.

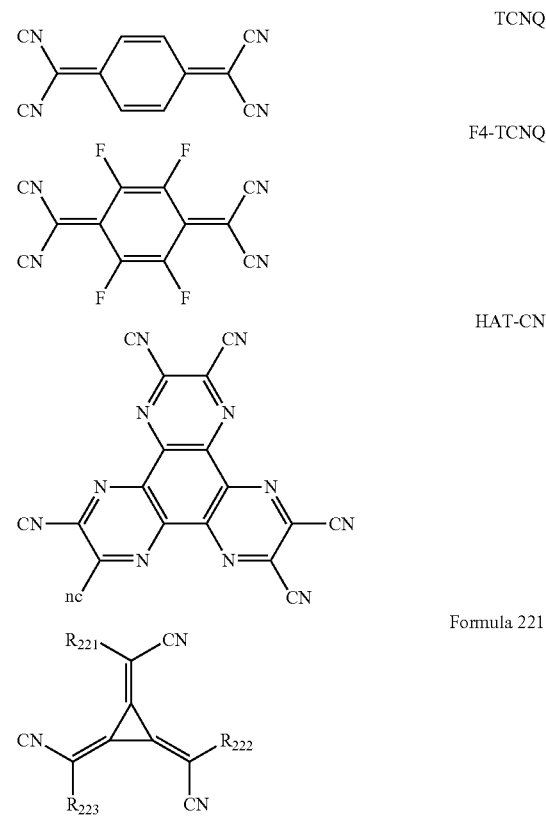

In Formula 221,
$R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and
at least one of $R_{221}$ to $R_{223}$ may each independently be a $C_3$-$C_{60}$ carbocyclic group or a $C_1$-$C_{60}$ heterocyclic group, each substituted with: a cyano group; —F; —Cl; —Br; —I; a $C_1$-$C_{20}$ alkyl group substituted with a cyano group, —F, —Cl, —Br, —I, or any combination thereof; or any combination thereof.

Regarding the compound containing element EL1 and element EL2, element EL1 may be a metal, a metalloid, or a combination thereof, and element EL2 may be a non-metal, a metalloid, or a combination thereof.

Examples of the metal may include: an alkali metal (for example, lithium (Li), sodium (Na), potassium (K), rubidium (Rb), cesium (Cs), and/or the like); an alkaline earth metal (for example, beryllium (Be), magnesium (Mg), calcium (Ca), strontium (Sr), barium (Ba), and/or the like); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper(Cu), silver (Ag), gold (Au), and/or the like); a post-transition metal (for example, zinc (Zn), indium (In), tin (Sn), and/or the like); and a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), and/or the like).

Examples of the metalloid may include silicon (Si), antimony (Sb), and tellurium (Te).

Examples of the non-metal may include oxygen (O) and halogen (for example, F, Cl, Br, I, etc.).

In an embodiment, examples of the compound containing element EL1 and element EL2 may include a metal oxide, a metal halide (for example, a metal fluoride, a metal chloride, a metal bromide, and/or a metal iodide), a metalloid halide (for example, a metalloid fluoride, a metalloid chloride, a metalloid bromide, or a metalloid iodide), a metal telluride, or any combination thereof.

Examples of the metal oxide may include tungsten oxide (for example, WO, $W_2O_3$, $WO_2$, $WO_3$, and/or $W_2O_5$), vanadium oxide (for example, VO, $V_2O_3$, $VO_2$, and/or $V_2O_5$), molybdenum oxide (for example, MoO, $Mo_2O_3$, $MoO_2$, $MoO_3$, and/or $Mo_2O_5$), and rhenium oxide (for example, $ReO_3$).

Examples of the metal halide may include an alkali metal halide, an alkaline earth metal halide, a transition metal halide, a post-transition metal halide, and a lanthanide metal halide.

Examples of the alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, and CsI.

Examples of the alkaline earth metal halide may include $BeF_2$, $MgF_2$, $CaF_2$, $SrF_2$, $BaF_2$, $BeCl_2$, $MgCl_2$, $CaCl_2$), $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and $BaI_2$.

Examples of the transition metal halide may include titanium halide (for example, $TiF_4$, $TiCl_4$, $TiBr_4$, and/or $TiI4$), zirconium halide (for example, $ZrF_4$, $ZrCl_4$, $ZrBr_4$, and/or $ZrI_4$), hafnium halide (for example, $HfF_4$, $HfCl_4$, $HfBr_4$, and/or $HfI_4$), vanadium halide (for example, $VF_3$, $VCl_3$, $VBr_3$, and/or $VI_3$), niobium halide (for example, $NbF_3$, $NbCl_3$, $NbBr_3$, and/or $NbI_3$), tantalum halide (for example, $TaF_3$, $TaCl_3$, $TaBr_3$, and/or $TaI_3$), chromium halide (for example, $CrF_3$, $CrCl_3$, $CrBr_3$, and/or CrI3), molybdenum halide (for example, $MoF_3$, $MoCl_3$, $MoBr_3$, and/or $MoI_3$), tungsten halide (for example, $WF_3$, $WCl_3$, $WBr_3$, and/or $WI_3$), manganese halide (for example, $MnF_2$, $MnCl_2$, $MnBr_2$, and/or $MnI_2$), technetium halide (for example, $TcF_2$, $TcCl_2$, $TcBr_2$, and/or $TcI_2$), rhenium halide (for example, $ReF_2$, $ReCl_2$, $ReBr_2$, and/or $ReI_2$), iron halide (for example, $FeF_2$, $FeCl_2$, $FeBr_2$, and/or $FeI_2$), ruthenium halide (for example, $RuF_2$, $RuCl_2$, $RuBr_2$, and/or $RuI_2$), osmium halide (for example, $OsF_2$, $OsCl_2$, $OsBr_2$, and/or $OsI_2$), cobalt halide (for example, $CoF_2$, $CoCl_2$, $CoBr_2$, and/or $CoI_2$), rhodium halide (for example, $RhF_2$, $RhCl_2$, $RhBr_2$, and/or $RhI_2$), iridium halide (for example, $IrF_2$, $IrCl_2$, $IrBr_2$, and/or $IrI_2$), nickel halide (for example, $NiF_2$, $NiCl_2$, $NiBr_2$, and/or $NiI_2$), palladium halide (for example, $PdF_2$, $PdCl_2$, $PdBr_2$, and/or $PdI_2$), platinum halide (for example, $PtF_2$, $PtCl_2$, $PtBr_2$, and/or $PtI_2$), copper halide (for example, CuF, CuCl, CuBr, and/or CuI), silver halide (for example, AgF, AgCl, AgBr, and/or AgI), and gold halide (for example, AuF, AuCl, AuBr, and/or AuI).

Examples of the post-transition metal halide may include zinc halide (for example, $ZnF_2$, $ZnCl_2$, $ZnBr_2$, and/or $ZnI_2$), indium halide (for example, $InI_3$), and tin halide (for example, $SnI_2$).

Examples of the lanthanide metal halide may include YbF, $YbF_2$, $YbF_3$, $SmF_3$, YbCl, $YbCl_2$, $YbCl_3$, $SmCl_3$, YbBr, $YbBr_2$, $YbBr_3$, $SmBr_3$, YbI, $YbI_2$, $YbI_3$, and $SmI_3$.

Examples of the metalloid halide may include antimony halide (for example, $SbCl_5$).

Examples of the metal telluride may include alkali metal telluride (for example, $Li_2Te$, $Na_2Te$, $K_2Te$, $Rb_2Te$, and/or $Cs_2Te$), alkaline earth metal telluride (for example, BeTe, MgTe, CaTe, SrTe, and/or BaTe), transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, and/or $Au_2Te$), post-transition metal telluride (for example, ZnTe), and lanthanide metal telluride (for example, LaTe, CeTe, PrTe, NdTe, PmTe, EuTe, GdTe, TbTe, DyTe, HoTe, ErTe, TmTe, YbTe, and/or LuTe).

Emission Layer in Interlayer 130

When the light-emitting device 10 is a full-color light-emitting device, the emission layer may be patterned into a red emission layer, a green emission layer, and/or a blue emission layer, according to a sub-pixel. In one or more embodiments, the emission layer may have a stacked structure of two or more layers of a red emission layer, a green emission layer, and a blue emission layer, in which the two or more layers contact (e.g., physically contact) each other or are separated from each other to emit white light. In one or more embodiments, the emission layer may include two or more materials of a red light-emitting material, a green light-emitting material, and a blue light-emitting material, in which the two or more materials are mixed together with each other in a single layer to emit white light.

The emission layer may include a host and a dopant. The dopant may include a phosphorescent dopant, a fluorescent dopant, or any combination thereof.

The amount of the dopant in the emission layer may be in a range from about 0.01 to about 15 parts by weight based on 100 parts by weight of the host.

In one or more embodiments, the emission layer may include a quantum dot.

In some embodiments, the emission layer may include a delayed fluorescent material. The delayed fluorescent material may act as a host or a dopant in the emission layer.

A thickness of the emission layer may be in a range of about 100 Å to about 1,000 Å, for example, about 200 Å to about 600 Å. When the thickness of the emission layer is within this range, excellent light-emission characteristics may be obtained without a substantial increase in driving voltage.

Host

The host may include a silicon-containing compound, a phosphineoxide-containing compound, or any combination thereof, as described above.

In an embodiment, the host may include a compound represented by Formula 301 below:

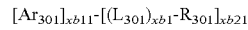    Formula 301

In Formula 301, $Ar_{301}$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —$C_1$, —Br, —I, hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), or —P(=O)($Q_{301}$)($Q_{302}$), xb21 may be an integer from 1 to 5, and $Q_{301}$ to $Q_{303}$ are the same as described in connection with $Q_1$.

In one or more embodiments, when xb11 in Formula 301 is 2 or more, two or more of $Ar_{301}$(s) may be linked to each other via a single bond.

In an embodiment, the host may include a compound represented by Formula 301-1, a compound represented by Formula 301-2, or any combination thereof:

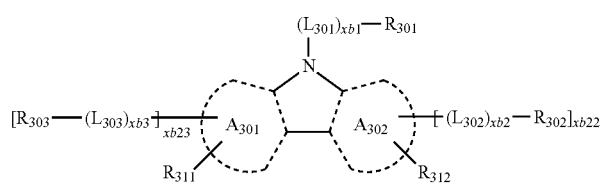

Formula 301-1

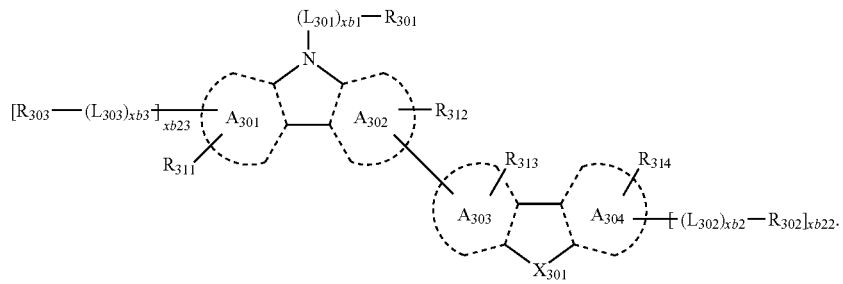

Formula 301-2

In Formulae 301-1 and 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N[($L_{304}$)$_{xb4}$-$R_{304}$], C($R_{304}$)($R_{305}$), or Si($R_{304}$)($R_{305}$), xb22 and xb23 may each independently be 0, 1, or 2, $L_{301}$, xb1, and $R_{301}$ are the same as described in the present specification, $L_{302}$ to $L_{304}$ may each independently the same as described in connection with $L_{301}$, xb2 to xb4 may each independently be the same as described in connection with xb1, and $R_{302}$ to $R_{305}$ and $R_{311}$ to $R_{314}$ are the same as described in connection with $R_{301}$.

In one or more embodiments, the host may include an alkaline earth metal complex. In an embodiment, the host may be a Be complex (for example, Compound H55), a Mg complex, a Zn complex, or any combination thereof.

In one or more embodiments, the host may include one of Compounds H1 to H124, 9,10-di(2-naphthyl)anthracene (ADN), 2-methyl-9,10-bis(naphthalen-2-yl)anthracene (MADN), 9,10-di(2-naphthyl)-2-t-butyl-anthracene (TBADN), 4,4'-bis(N-carbazolyl)-1,1'-biphenyl (CBP), 1,3-di(carbazol-9-yl)benzene (mCP), 1,3,5-tri(carbazol-9-yl)benzene (TCP), 3,3-di(9H-carbazol-9-yl)biphenyl (mCBP), or any combination thereof:

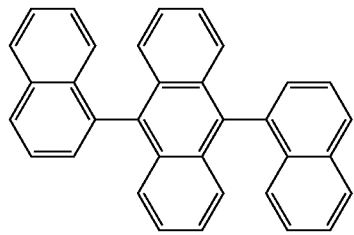

H1

-continued

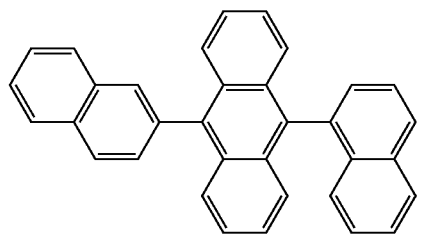

H2

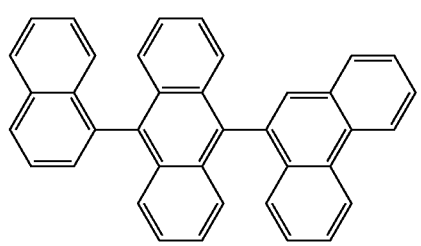

H3

H4
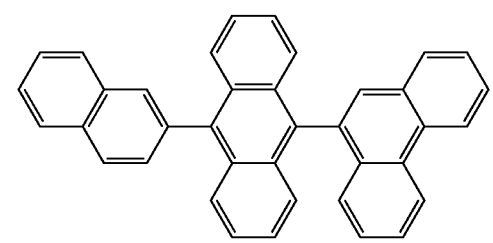
H5
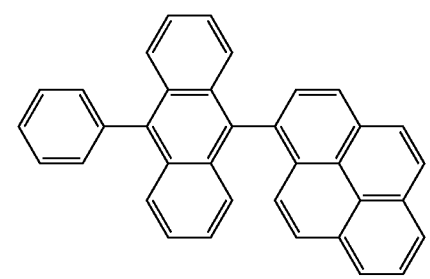
H6
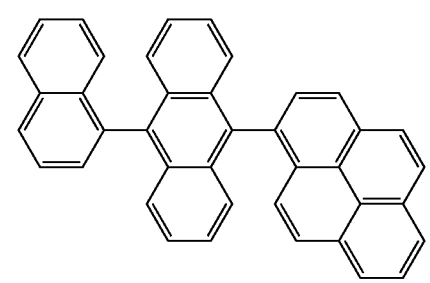
H7
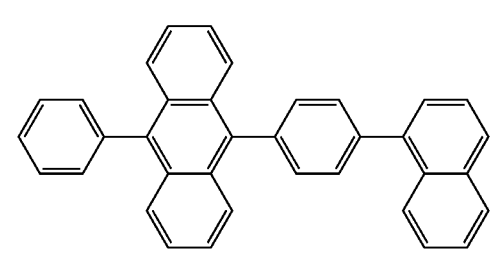
H8
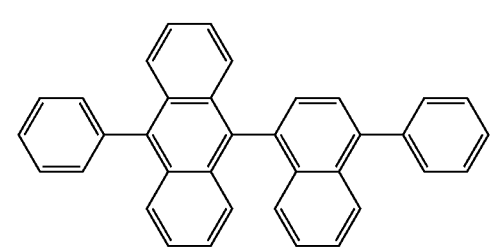
H9
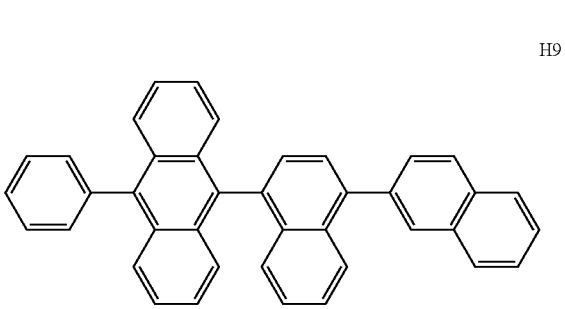
H10
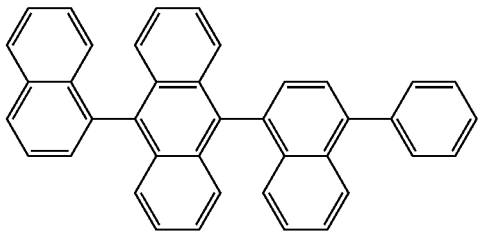
H11
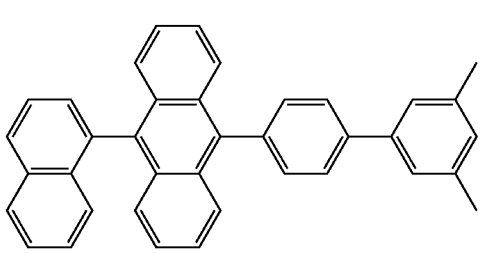
H12
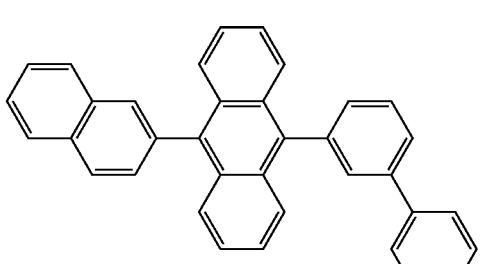
H13
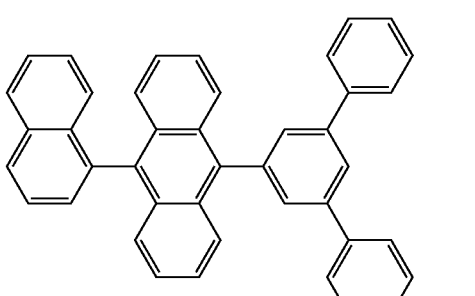
H14
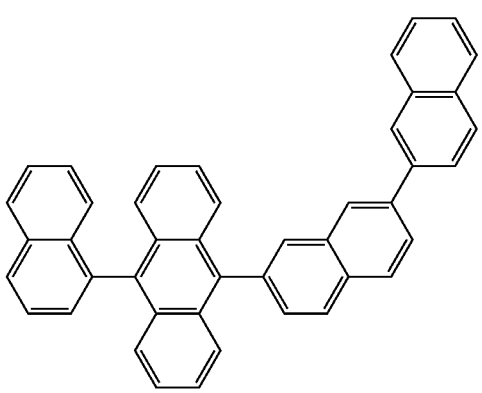

H15
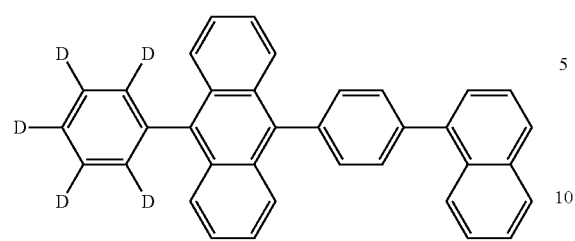
H16
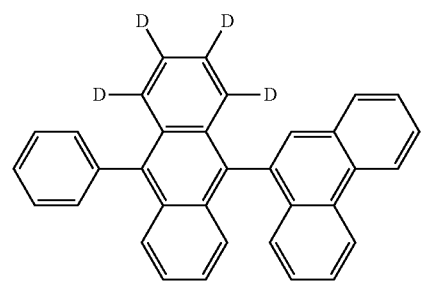
H17
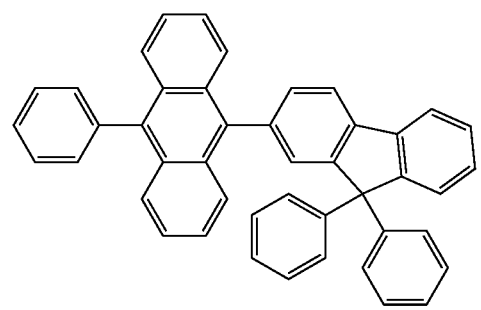
H18
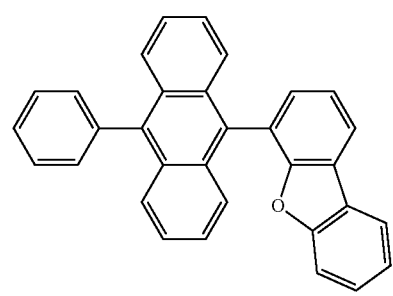
H19
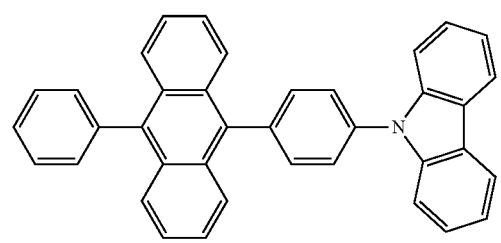
H20
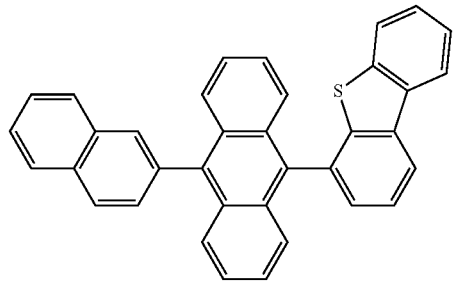
H21
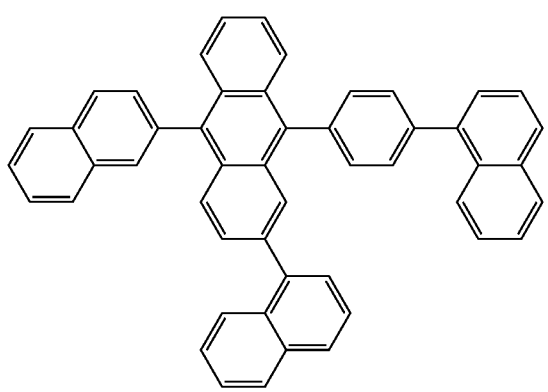
H22
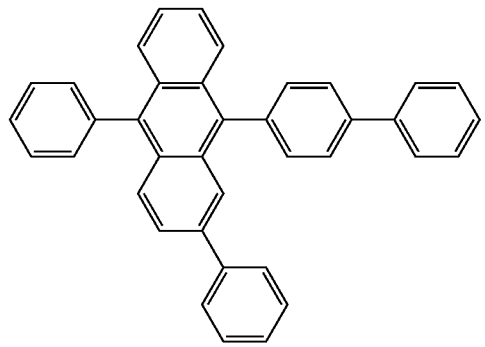
H23
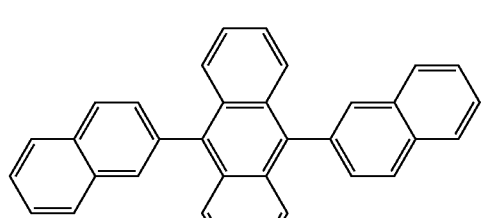

H24
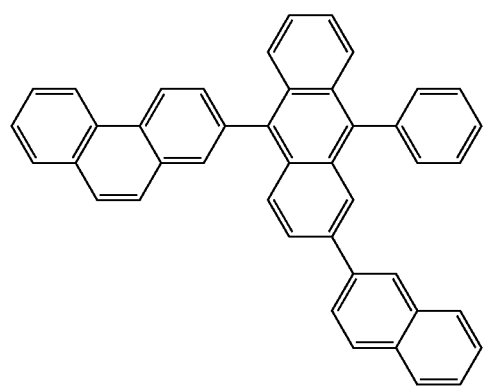
H25
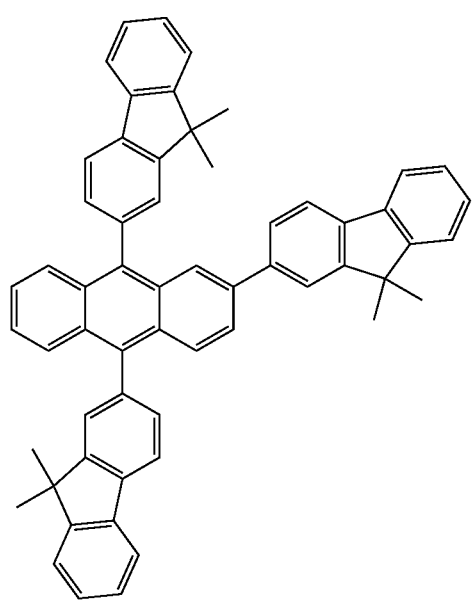
H26
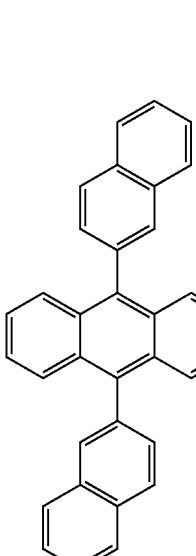
H27
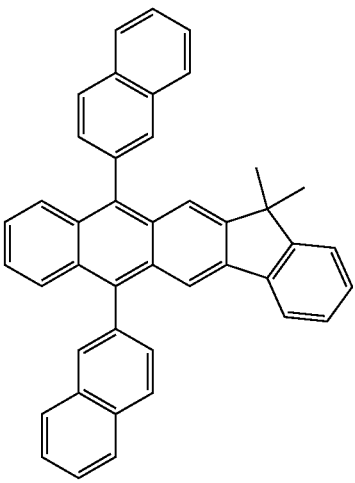
H28
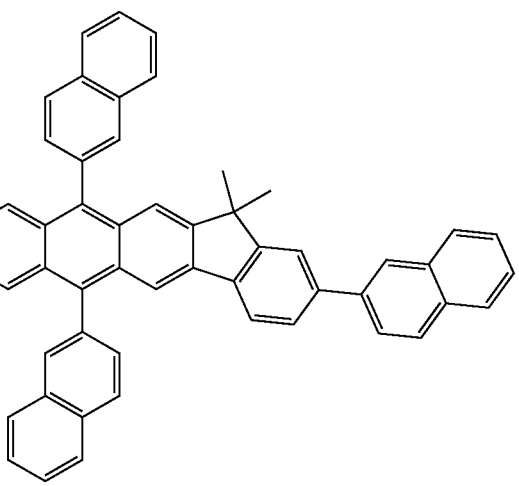
H29

H30 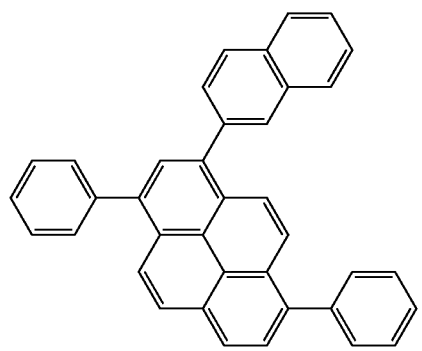
H31 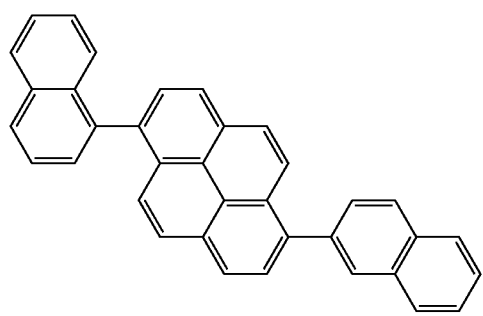
H32 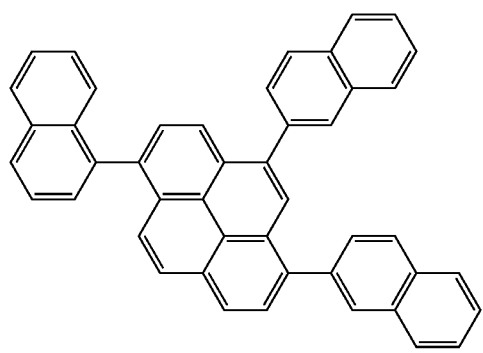
H33 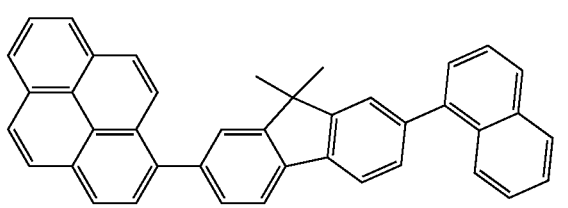
H34 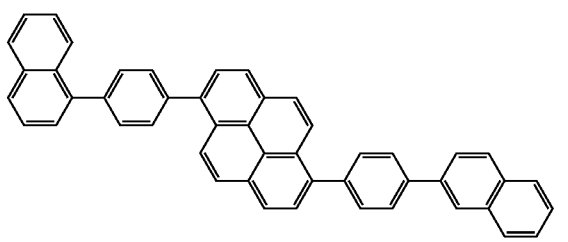
H35 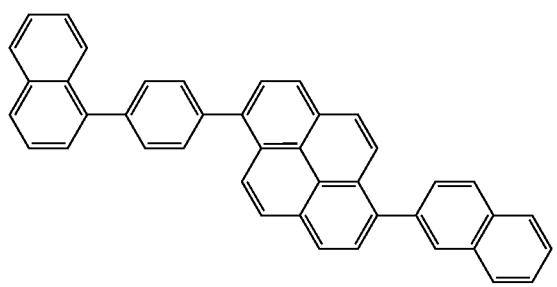
H36 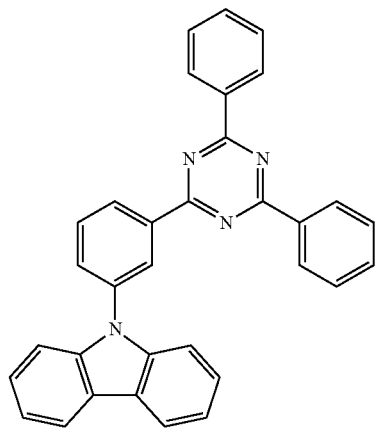
H37 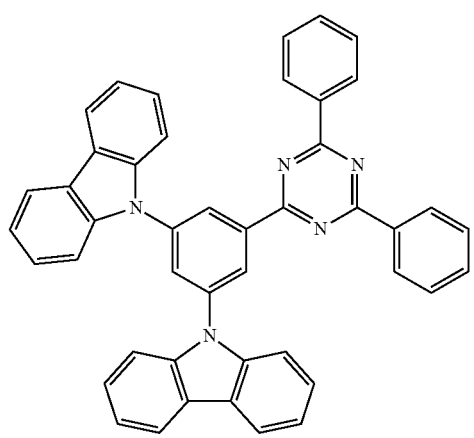
H38 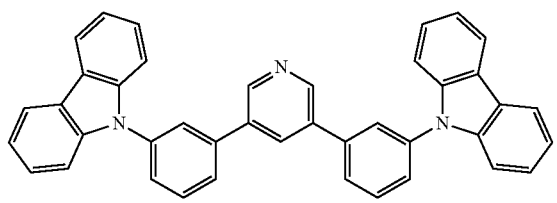

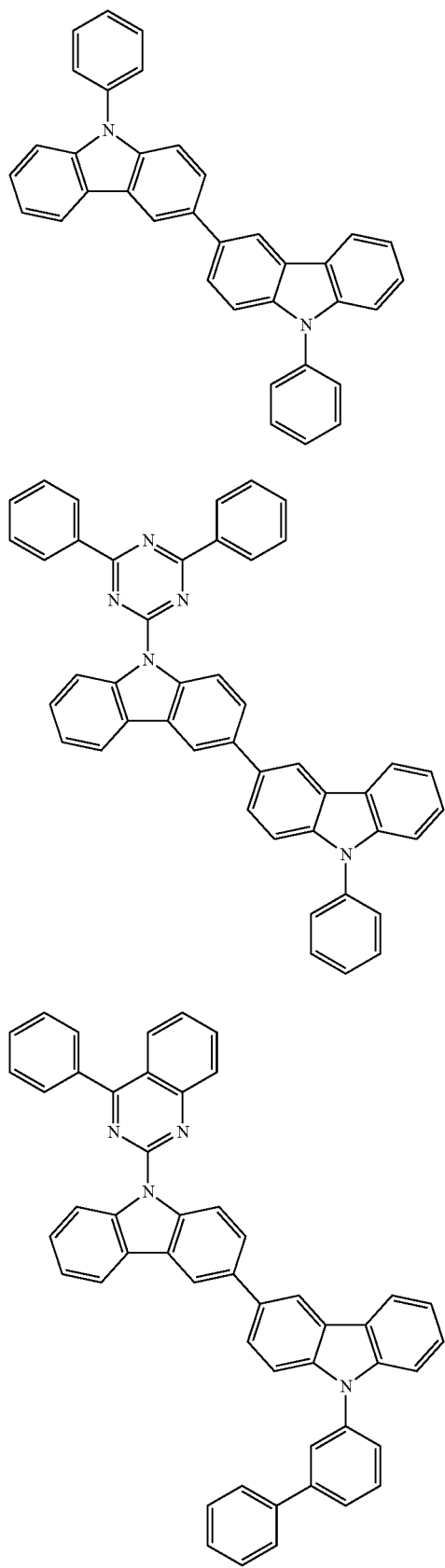
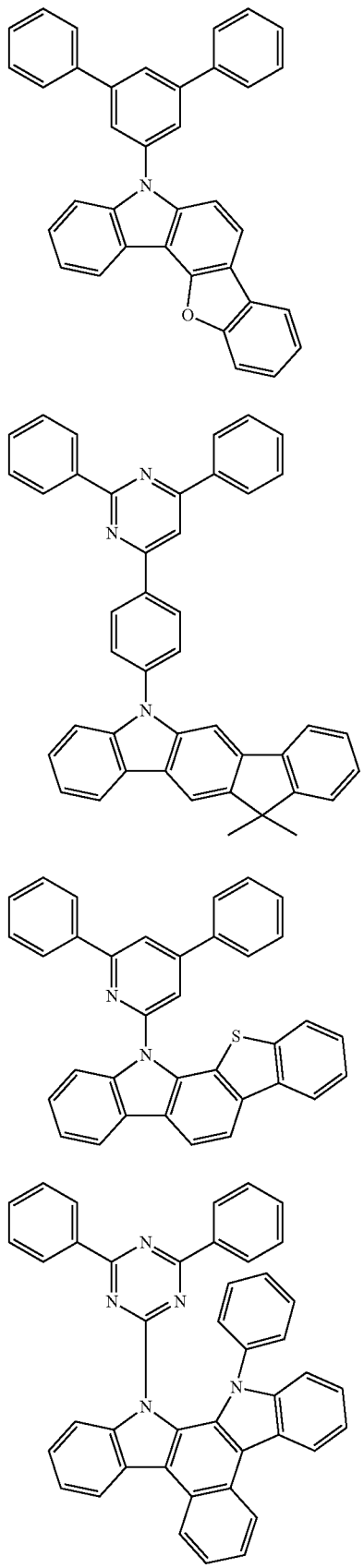

-continued
H46
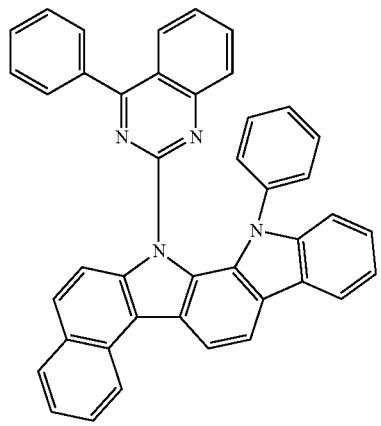
H47
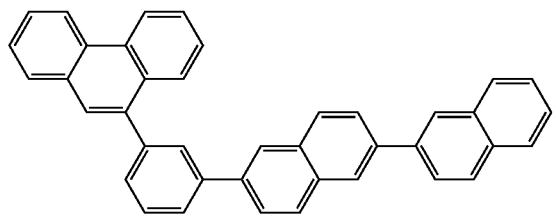
H48
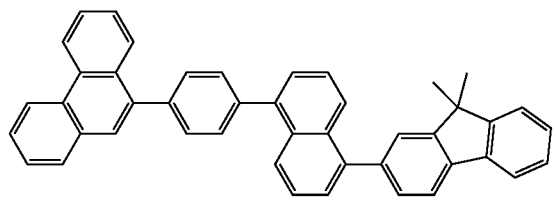
H49
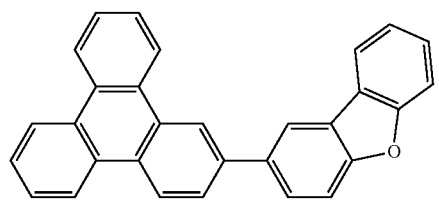
H50
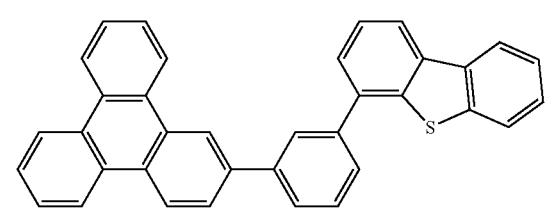
H51
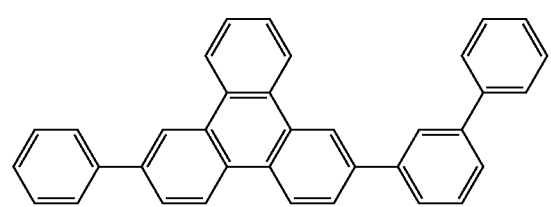
-continued
H52
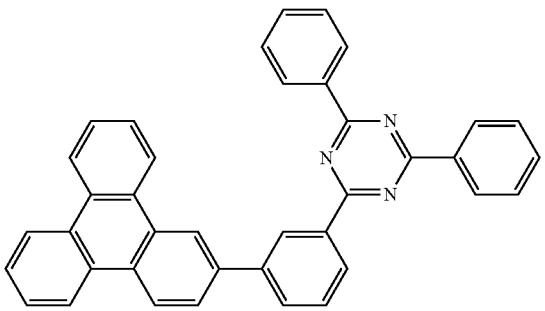
H53
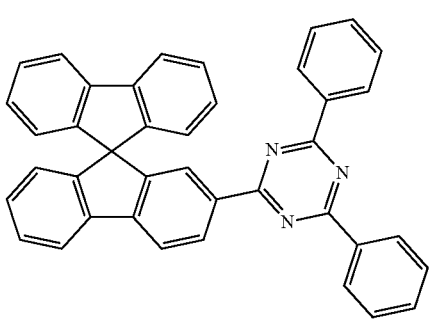
H54
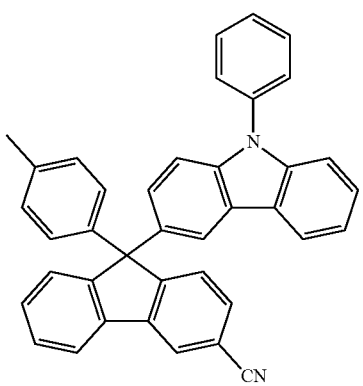
H55
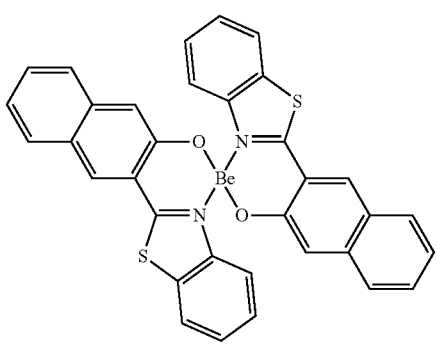

-continued
H56
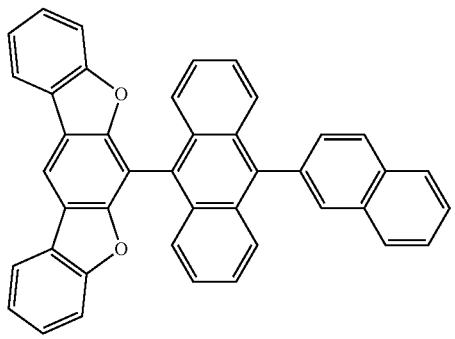
H57
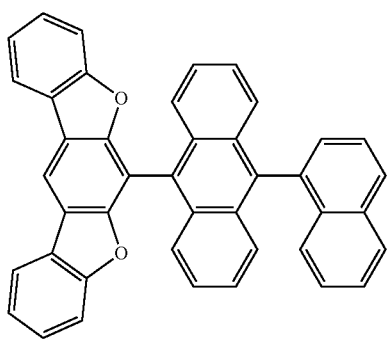
H58
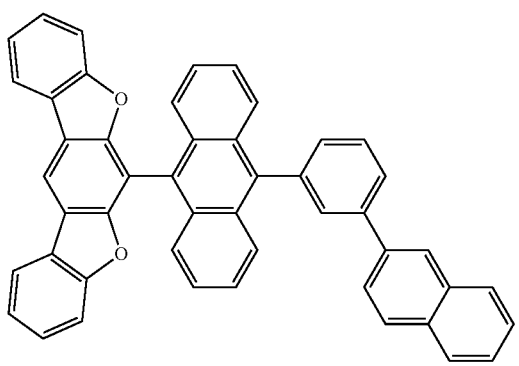
H59
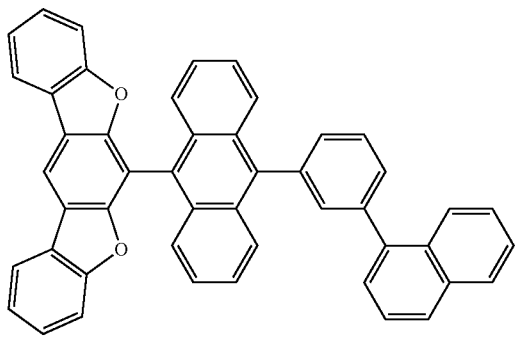
-continued
H60
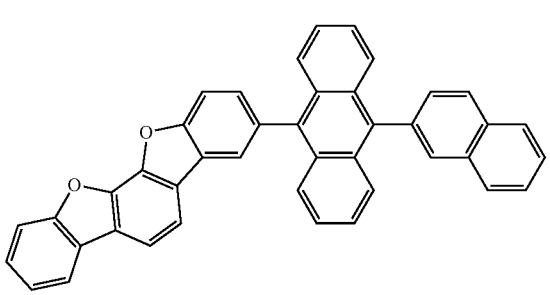
H61
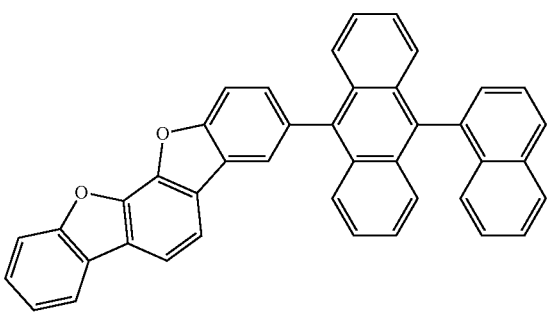
H62
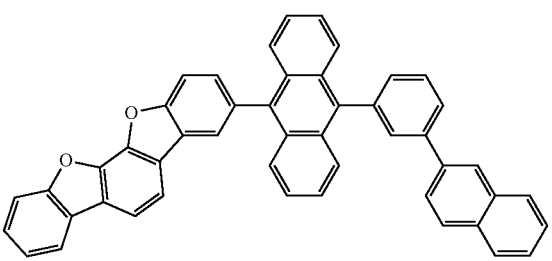
H63
H64
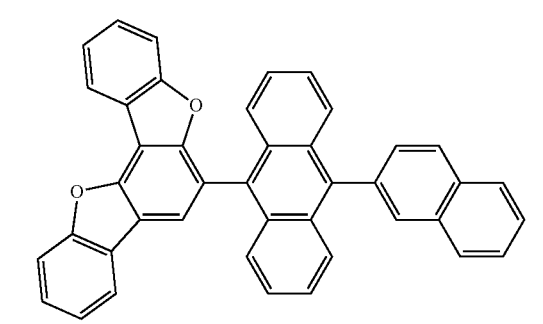

H65
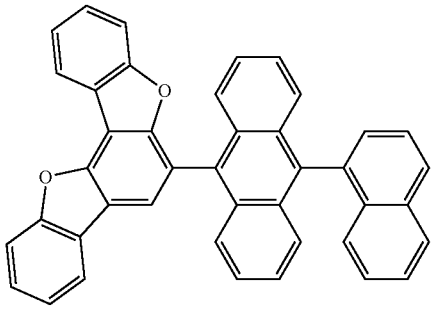
H66
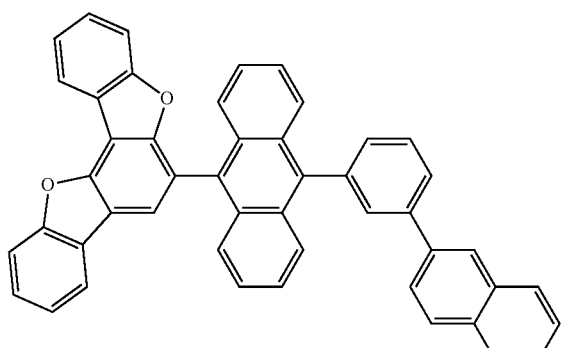
H67
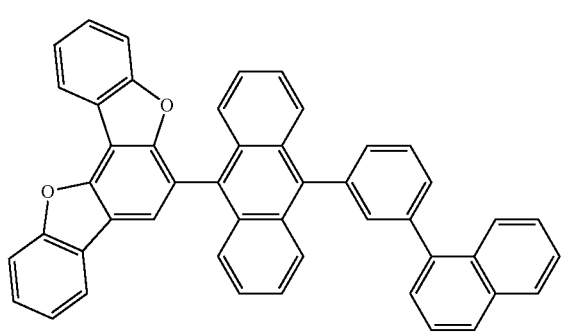
H68
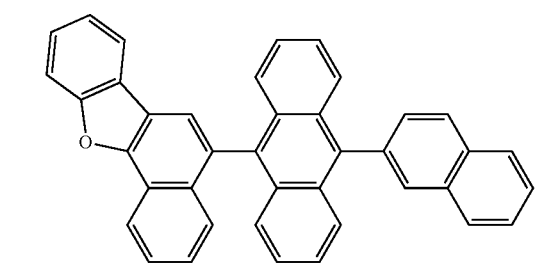
H69
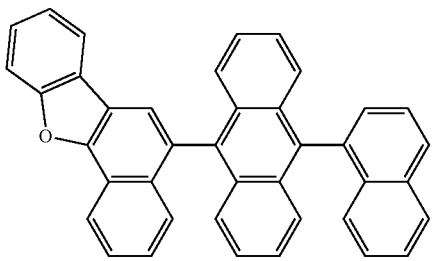
H70
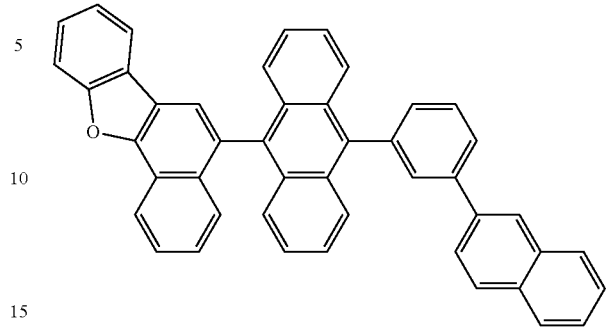
H71
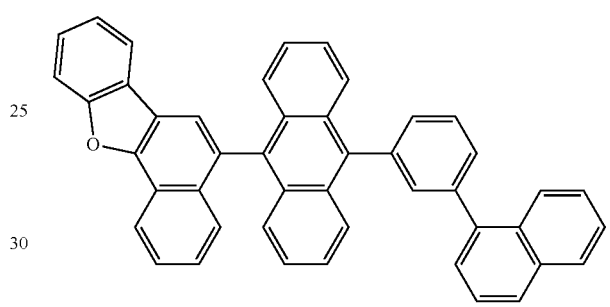
H72
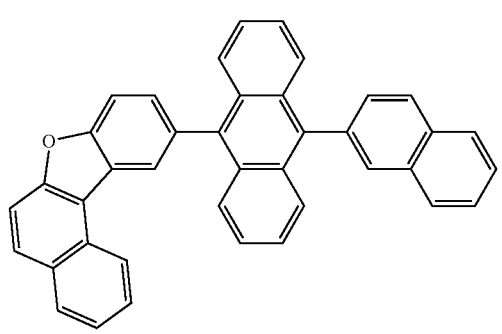
H73
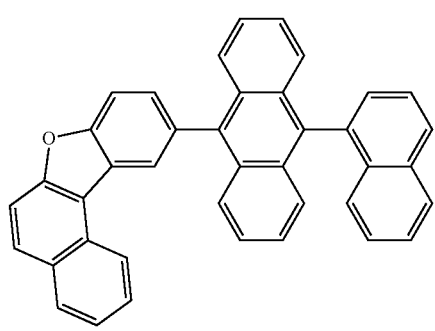

H74
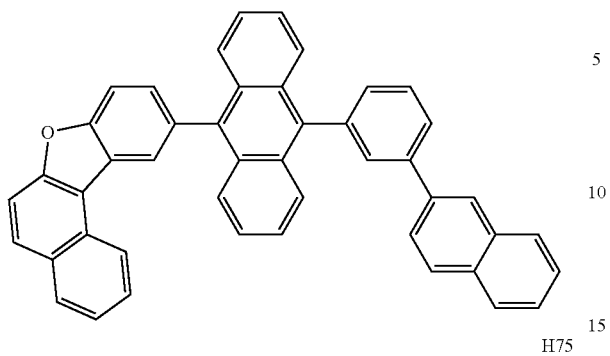
H75
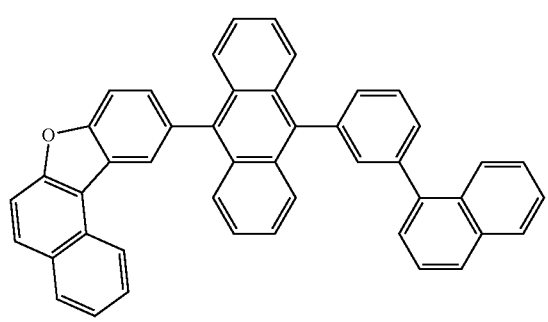
H76
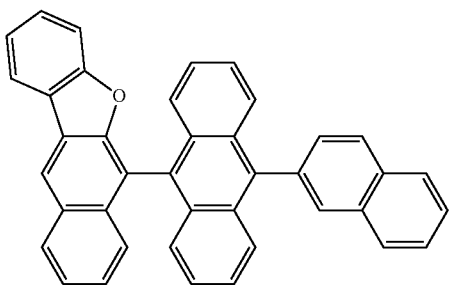
H77
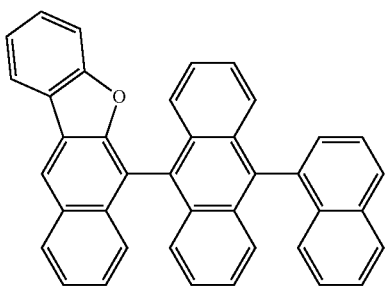
H78
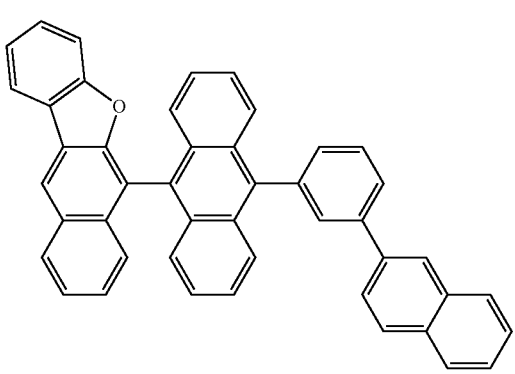
H79
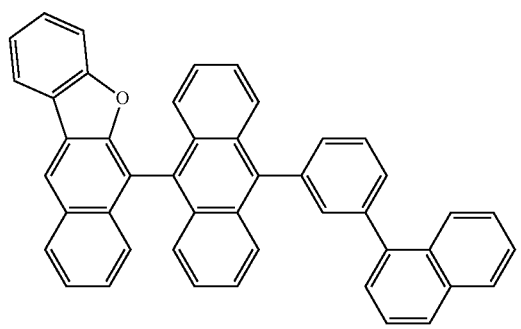
H80
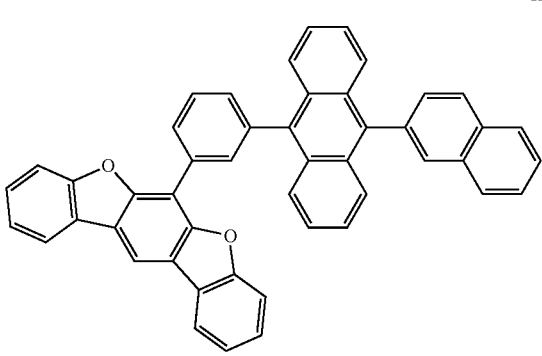
H81
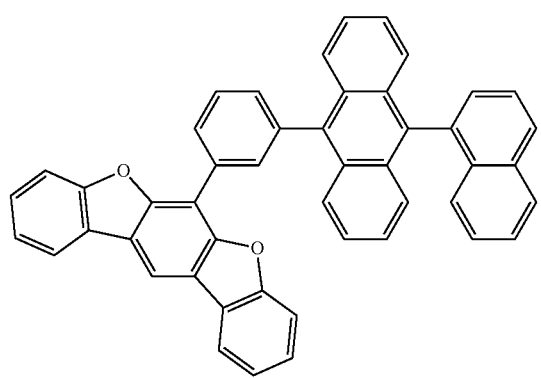
H82
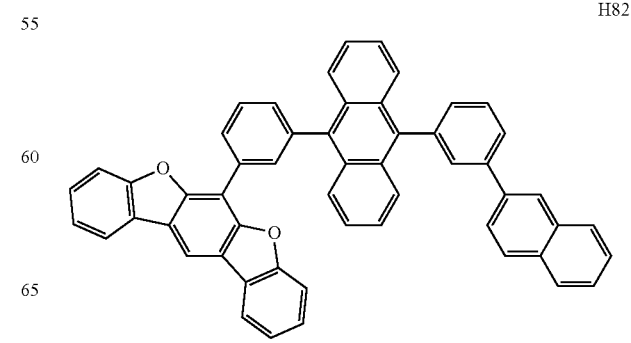

H83
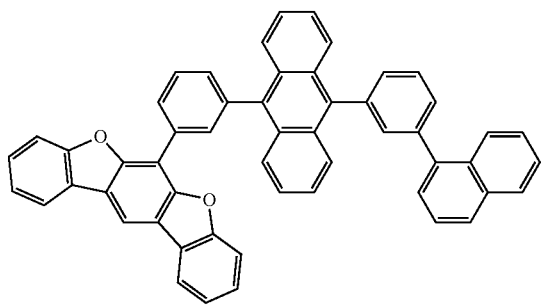
H84
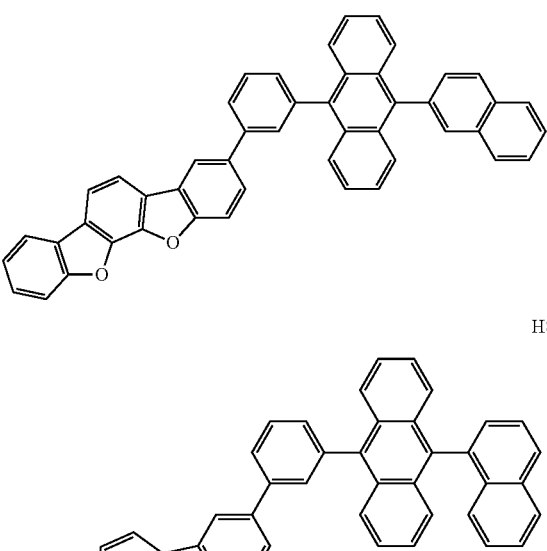
H85
H86
H87
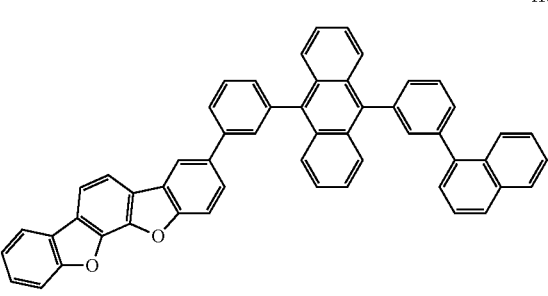
H88
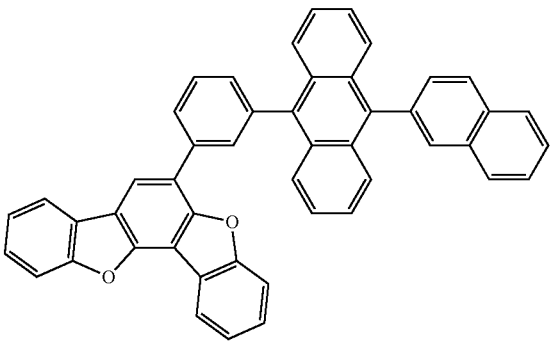
H89
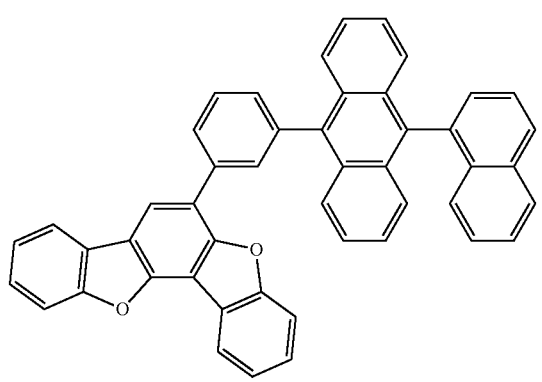
H90
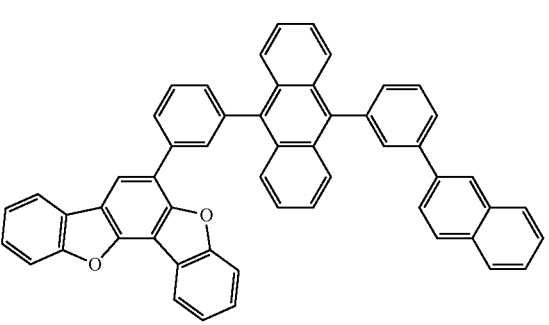
H91
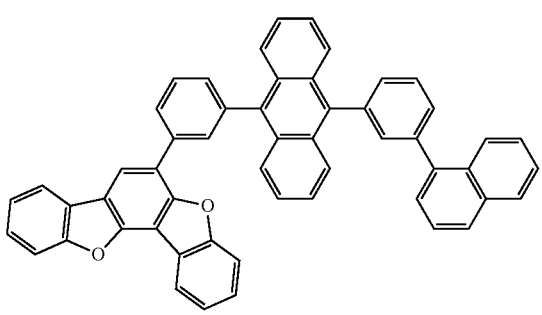

H92 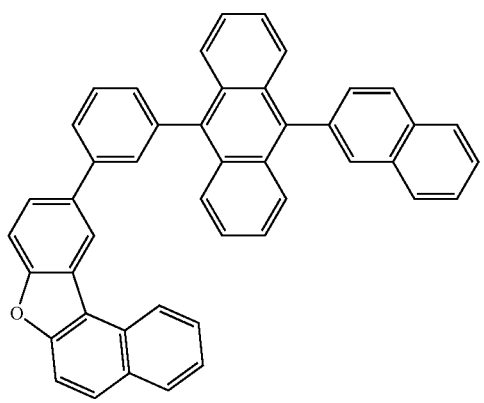
H96 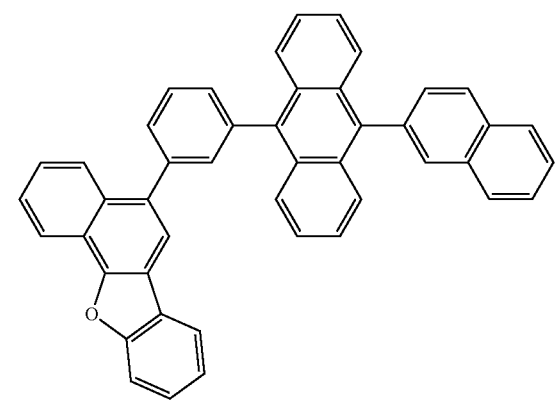
H93 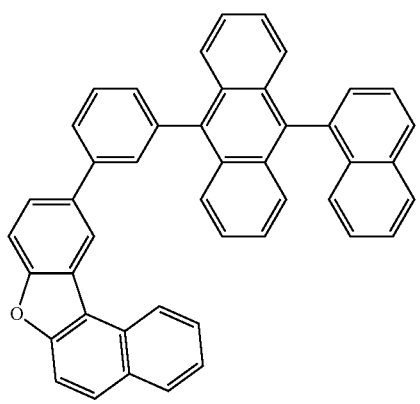
H97 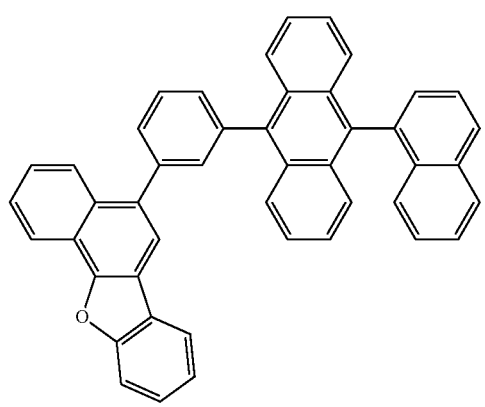
H94 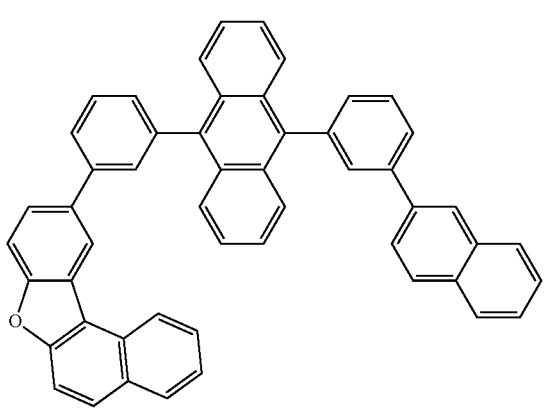
H98 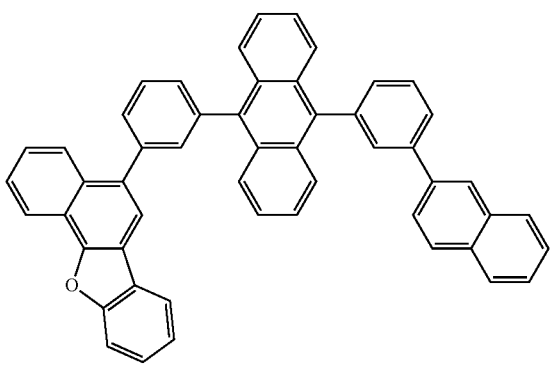
H95 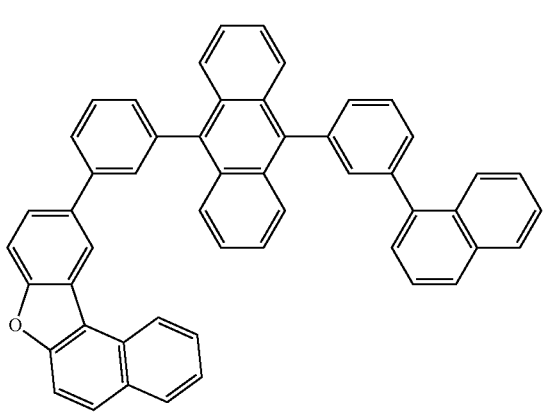
H99 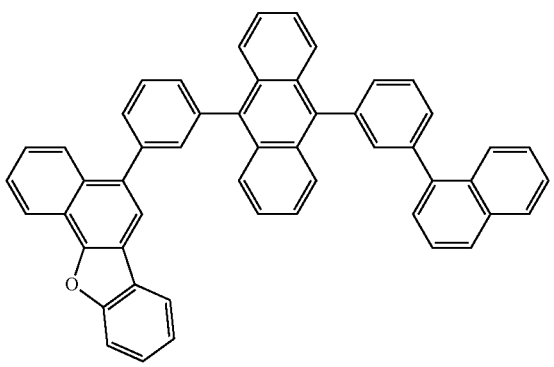

H100
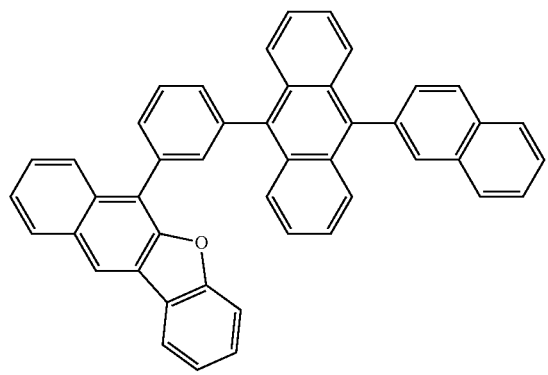
H101
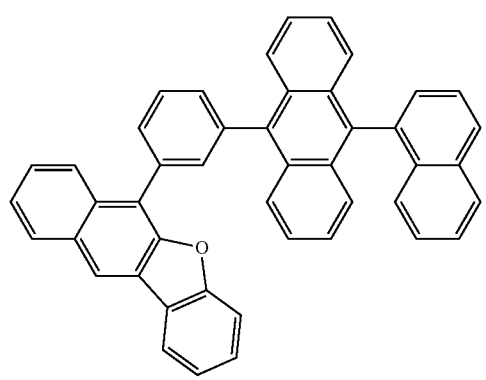
H102
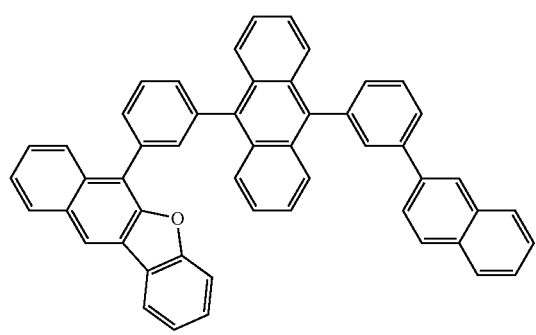
H103
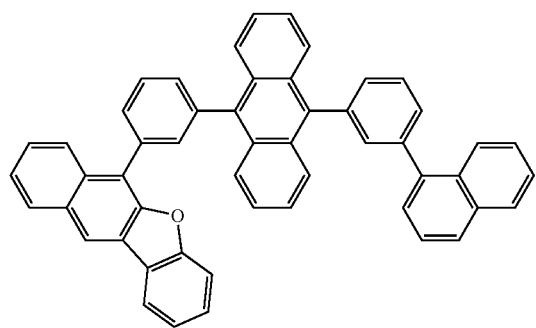
H104
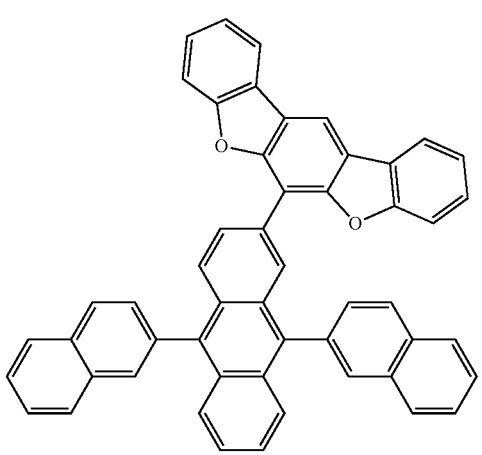
H105
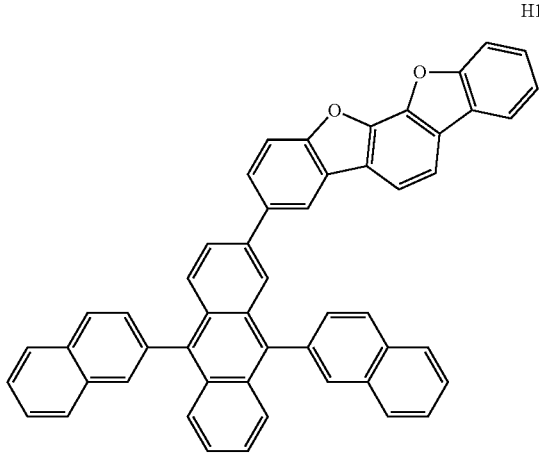
H106
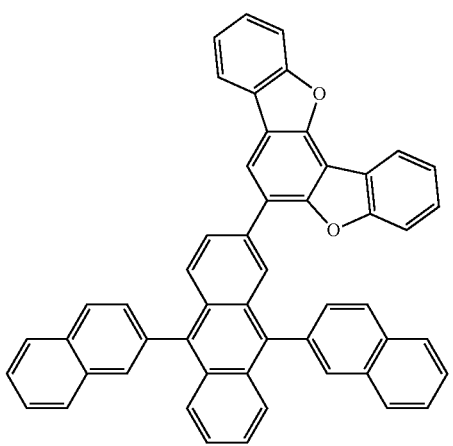

H107
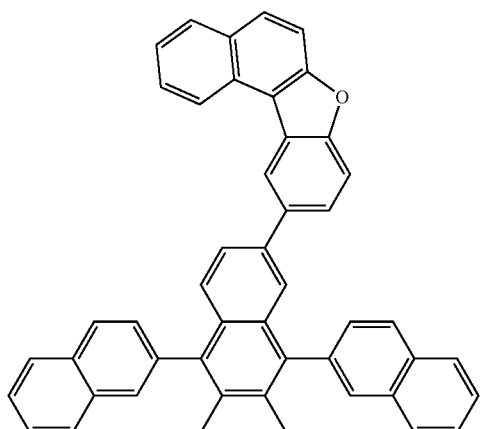
H108
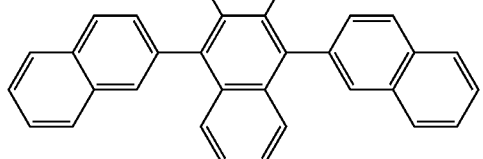
H109
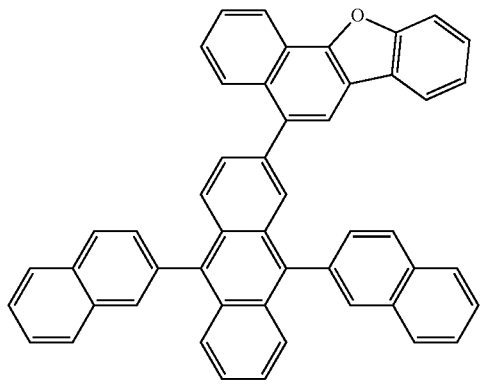
H110
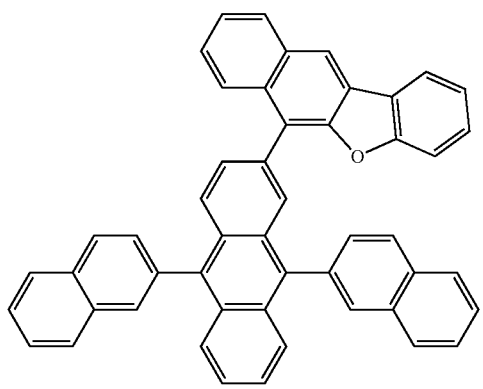
H111
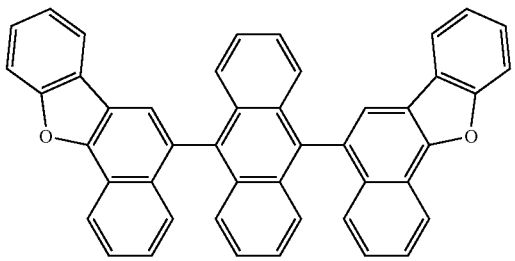
H112
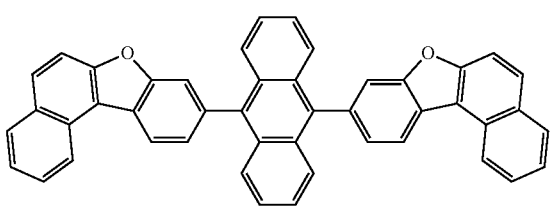
H113
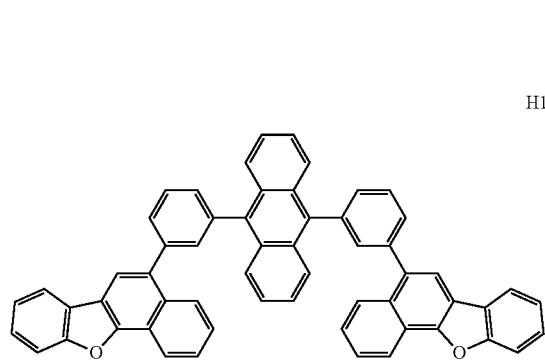
H114
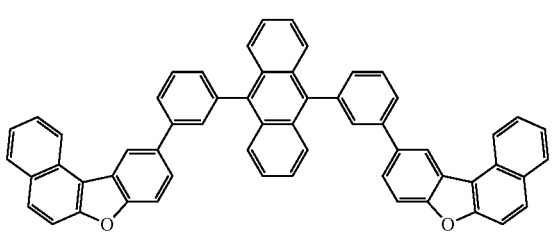
H115
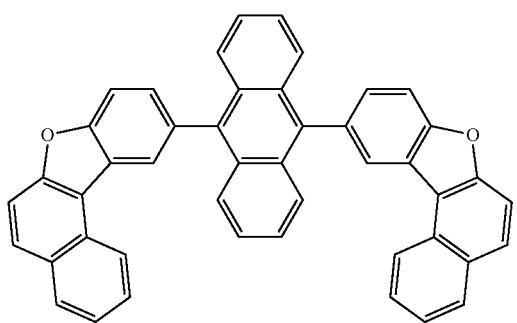
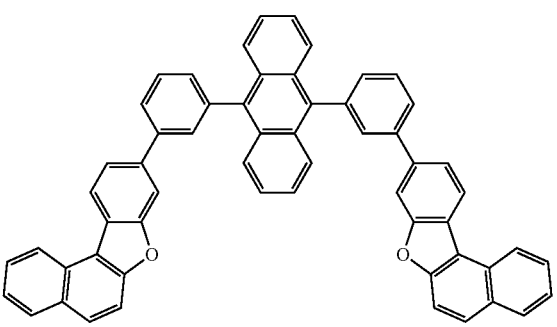

H116
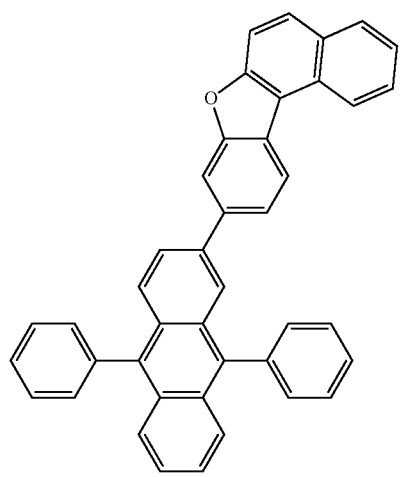
H117
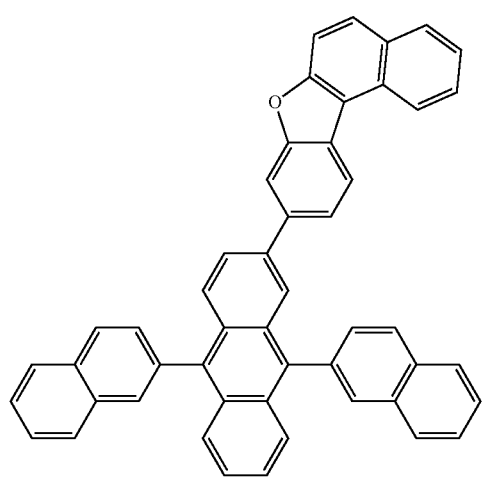
H118
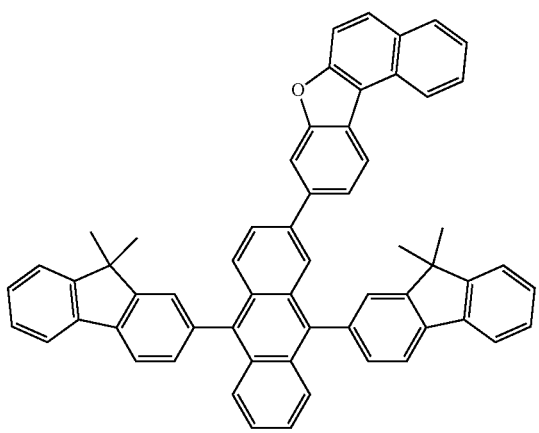
H119
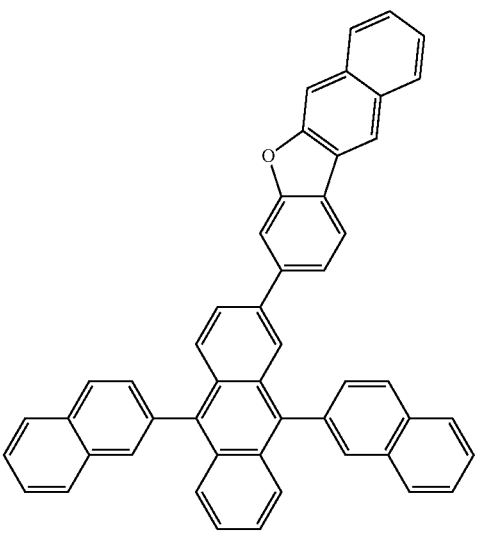
H120
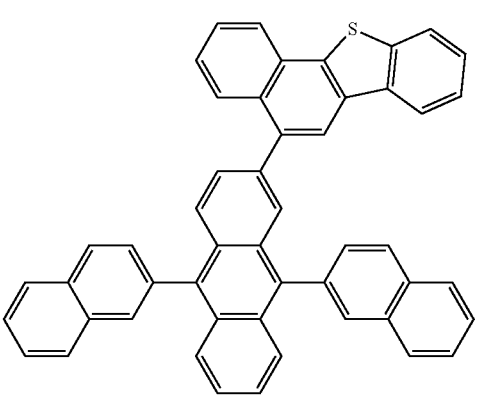
H121
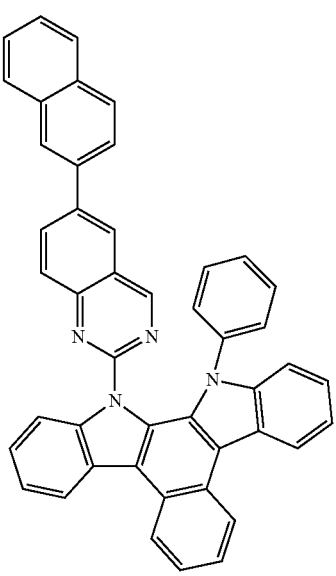

H122

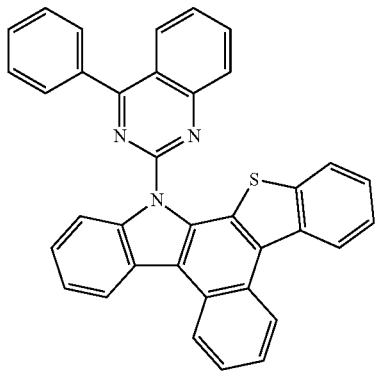

H123

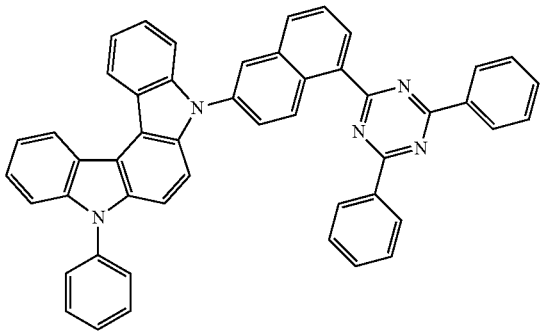

H124

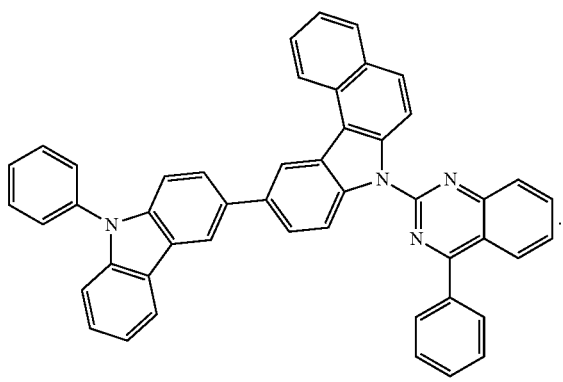

Phosphorescent Dopant

The dopant may include the organometallic compound represented by Formula 1.

In an embodiment, the phosphorescent dopant may include at least one transition metal as a central metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

In one or more embodiments, the phosphorescent dopant may include an organometallic compound represented by Formula 401:

Formula 401
$$M(L_{401})_{xc1}(L_{402})_{xc2}$$

Formula 402

In Formulae 401 and 402,

M may be a transition metal (for example, iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein, when xc1 is 2 or more, two or more of $L_{401}$(s) may be identical to or different from each other, $L_{402}$ may be an organic ligand, and xc2 may be 0, 1, 2, 3, or 4, wherein, when xc2 is 2 or more, two or more of $L_{402}$(s) may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*', *—S—*', *—C(=O)—*', *—N($Q_{411}$)-*', *—C($Q_{411}$)($Q_{412}$)*', *—C($Q_{411}$)=C($Q_{412}$)-*', *—C($Q_{411}$)=*', or *=C=*', $X_{403}$ and $X_{404}$ may each independently be a chemical bond (for example, a single covalent bond or a coordinate bond (e.g., a coordinate covalent bond or a dative bond)), O, S, N($Q_{413}$), B($Q_{413}$), P($Q_{413}$), C(0413)(0414), or Si($Q_{413}$)($Q_{414}$), $Q_{411}$ to $Q_{414}$ are the same as described in connection with $Q_1$, $R_{401}$ and $R_{402}$ may each independently be hydrogen, deuterium, —F, —$C_1$, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)(0402)(0403), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ are the same as described in connection with $Q_1$, xc11 and xc12 may each independently be an integer from 0 to 10, and and *' in Formula 402 each indicate a binding site to M in Formula 401.

In one or more embodiments, in Formula 402, i) $X_{401}$ may be nitrogen, and $X_{402}$ may be carbon, or ii) each of $X_{401}$ and $X_{402}$ may be nitrogen.

In one or more embodiments, when xc1 in Formula 401 is 2 or more, two ring $A_{401}$(s) in two or more $L_{401}$(s) may optionally be linked to each other via $T_{402}$, which is a linking group, or two ring $A_{402}$(s) in two or more $L_{401}$(s) may optionally be linked to each other via $T_{403}$, which is a linking group (see Compounds PD1 to PD4 and PD7). $T_{402}$ and $T_{403}$ are the same as described in connection with $T_{401}$.

$L_{402}$ in Formula 401 may be an organic ligand. In one or more embodiments, $L_{402}$ may be a halogen group, a diketone group (for example, an acetylacetonate group), a carboxylic acid group (for example, a picolinate group), —C(=O), an isonitrile group, a —CN group, a phosphorus group (for example, a phosphine group or a phosphite group), or any combination thereof.

The phosphorescent dopant may include, for example, one of following Compounds PD1 to PD25 or any combination thereof:

PD1

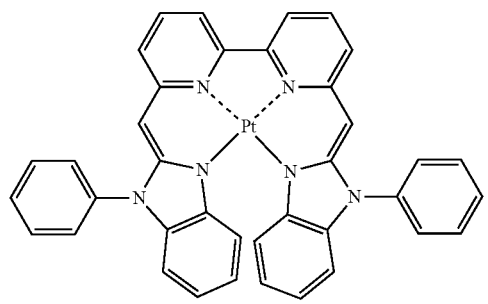

PD2

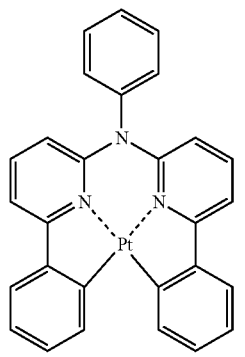

PD3

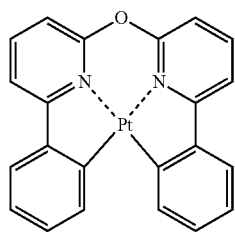

PD4

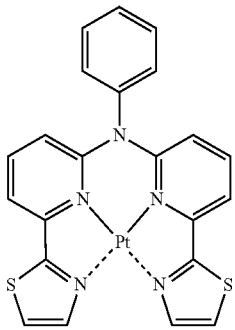

PD5

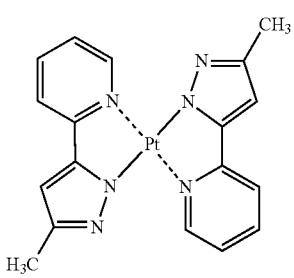

PD6

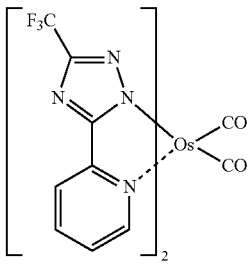

PD7

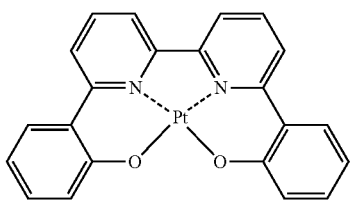

PD8

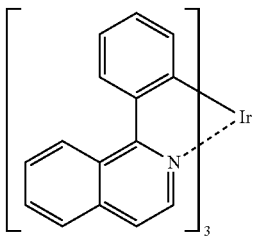

PD9

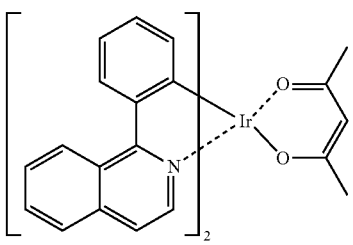

PD10 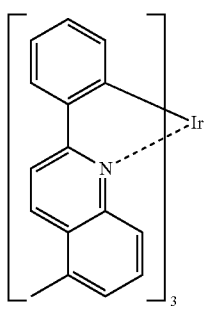
PD11 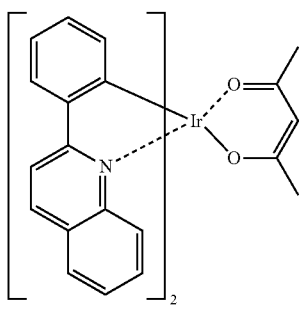
PD12 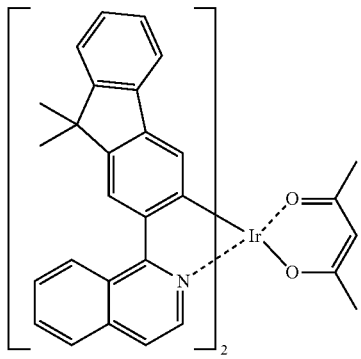
PD13 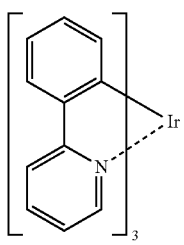
PD14 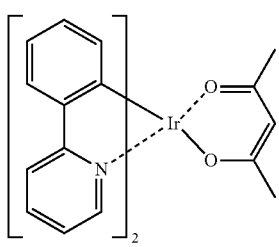
PD15 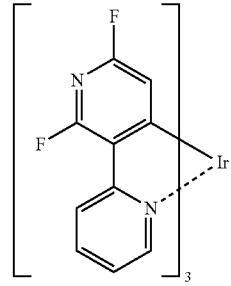
PD16 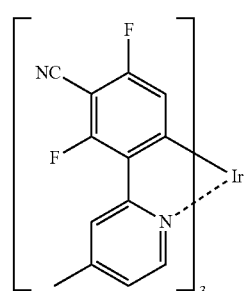
PD17 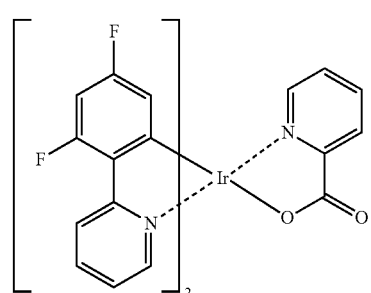
PD18 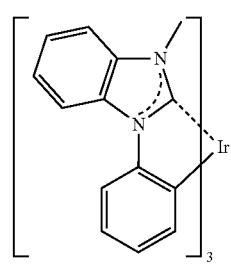
PD19 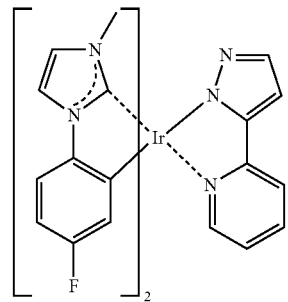

PD20 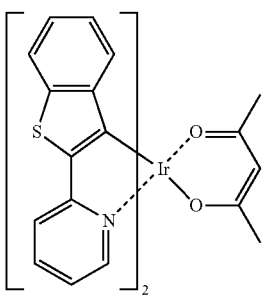

PD21 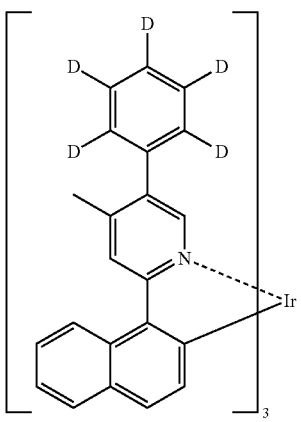

PD22 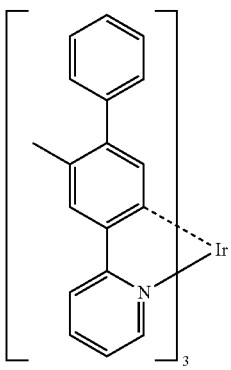

PD23 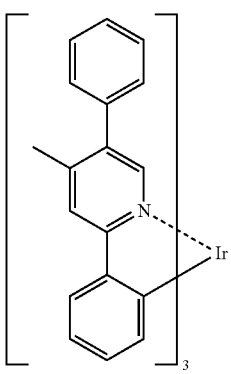

PD24 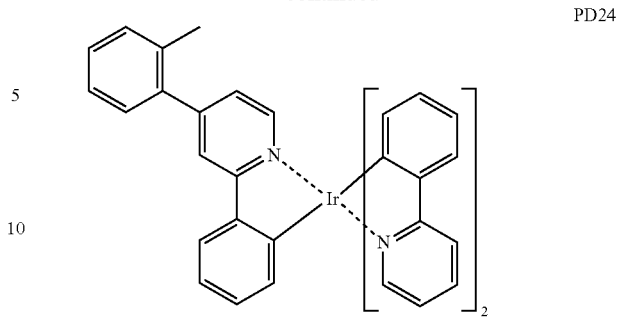

PD25 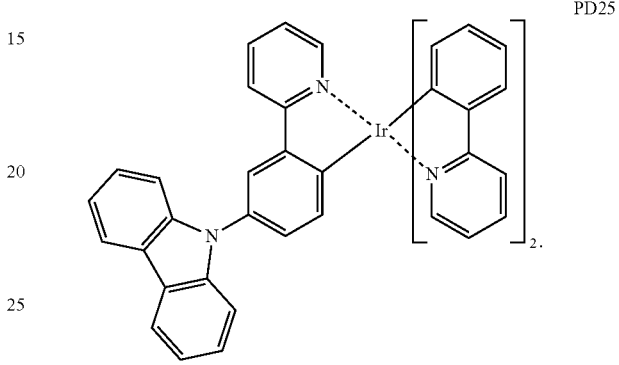

Fluorescent Dopant

The fluorescent dopant may include an amine group-containing compound, a styryl group-containing compound, or any combination thereof.

In one or more embodiments, the fluorescent dopant may include a compound represented by Formula 501:

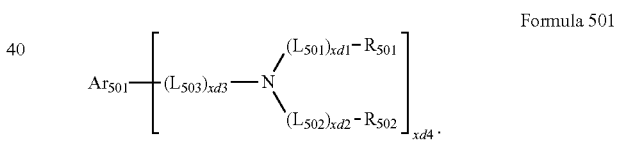

Formula 501

In Formula 501,

Ar$_{501}$, L$_{501}$ to L$_{503}$, R$_{501}$, and R$_{502}$ may each independently be a C$_3$-C$_{60}$ carbocyclic group unsubstituted or substituted with at least one R$_{10a}$ or a C$_1$-C$_{60}$ heterocyclic group unsubstituted or substituted with at least one R$_{10a}$, xd1 to xd3 may each independently be 0, 1, 2, or 3, and xd4 may be 1, 2, 3, 4, 5, or 6.

In one or more embodiments, Ar$_{501}$ in Formula 501 may be a condensed cyclic group (for example, an anthracene group, a chrysene group, or a pyrene group) in which three or more monocyclic groups are condensed with each other (e.g., combined together with each other).

In one or more embodiments, xd4 in Formula 501 may be 2.

In an embodiment, the fluorescent dopant may include one of following Compounds FD1 to FD36, DPVBi, DPAVBi, or any combination thereof:

FD1
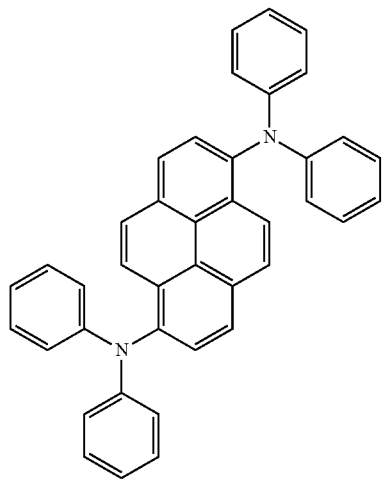
FD2
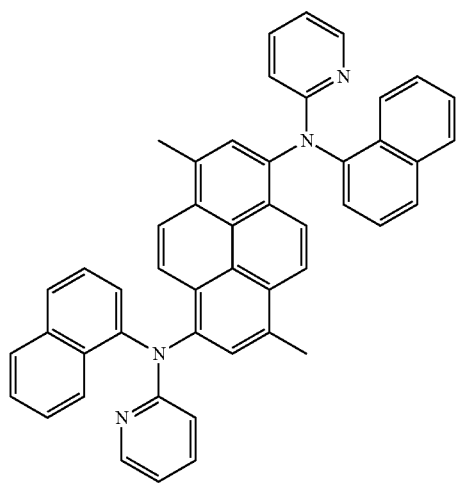
FD3
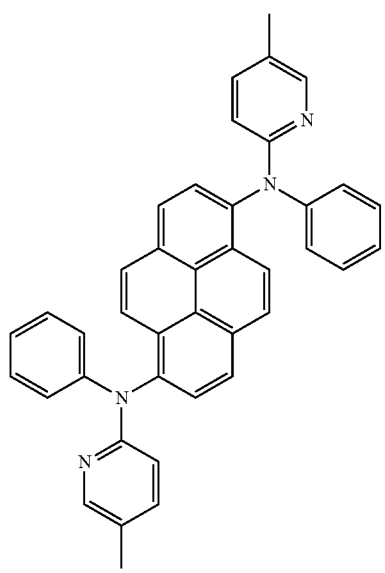
FD4
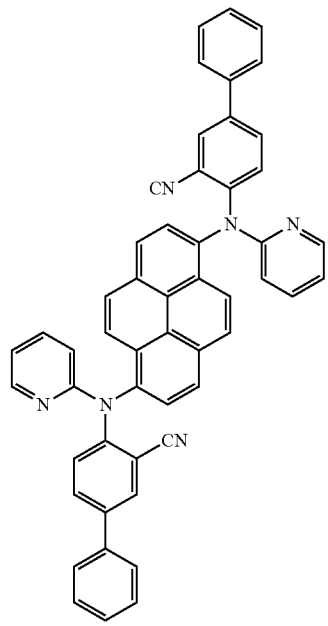
FD5
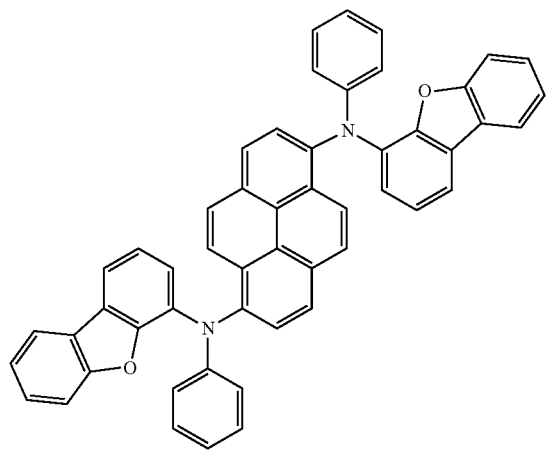
FD6
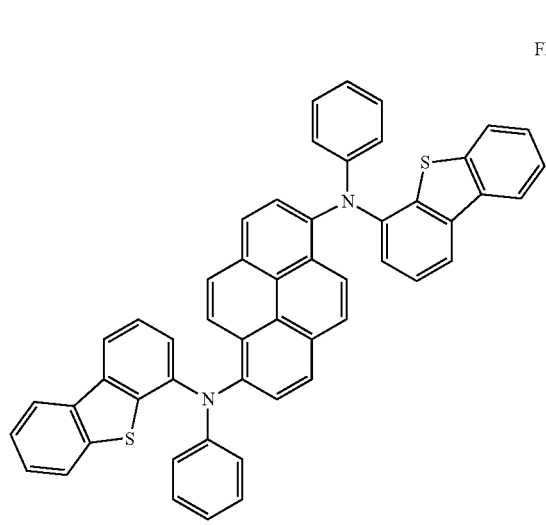

FD7
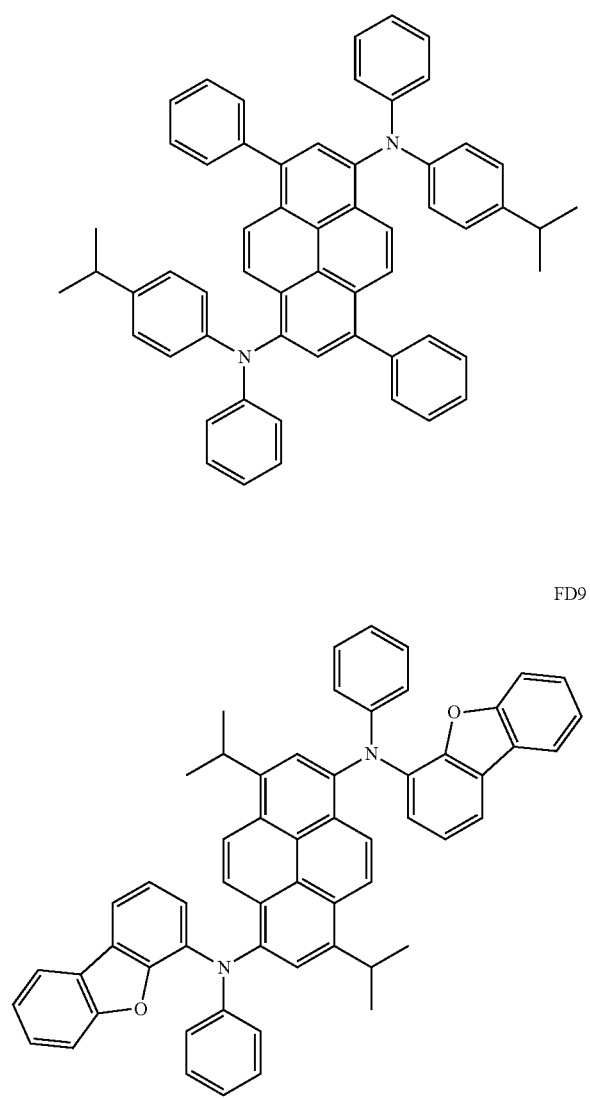
FD8
FD9
FD10
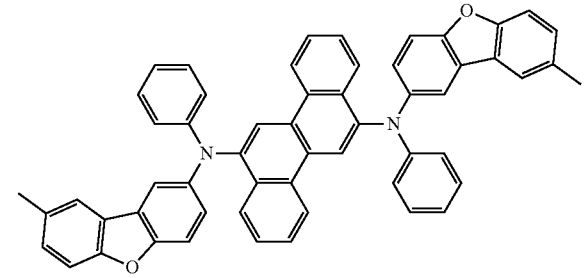
FD11
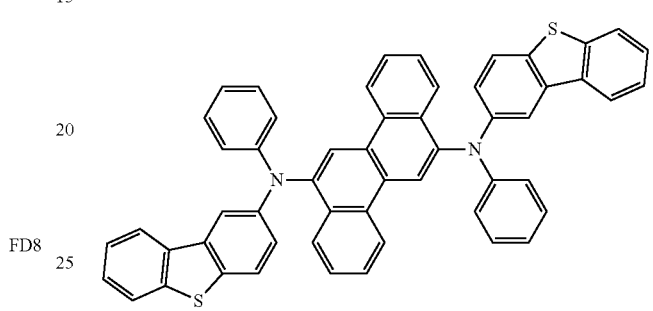
FD12
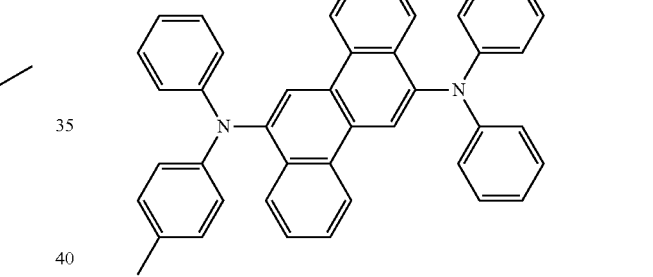
FD13
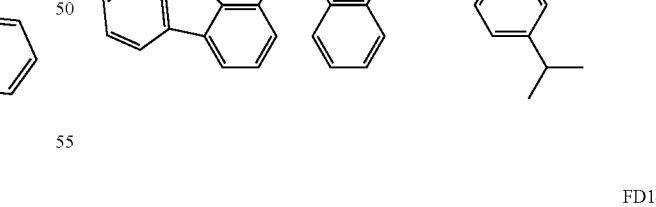
FD14
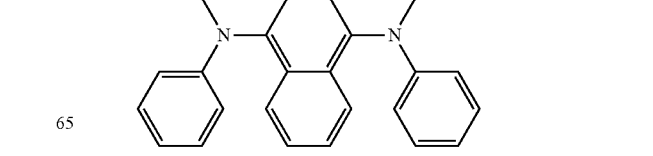

FD15
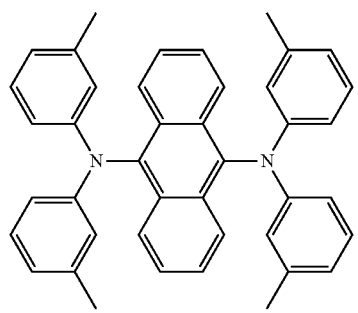
FD16
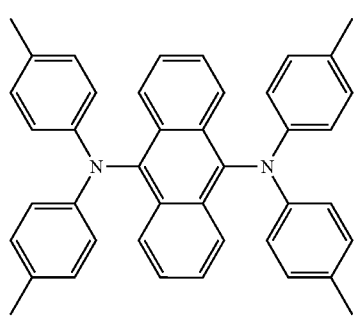
FD17
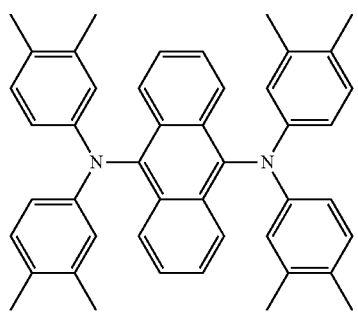
FD18
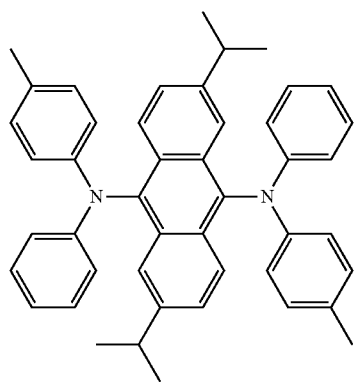
FD19
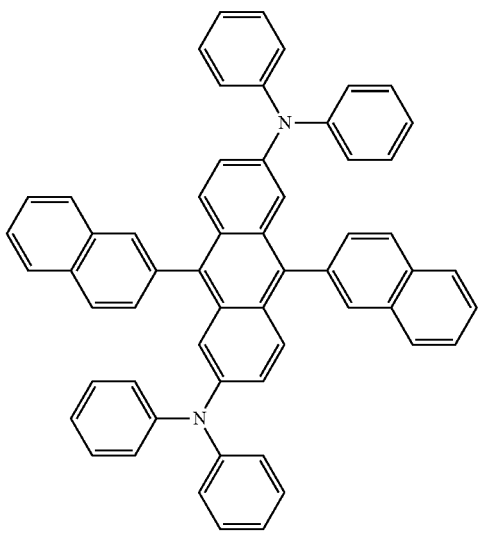
FD20
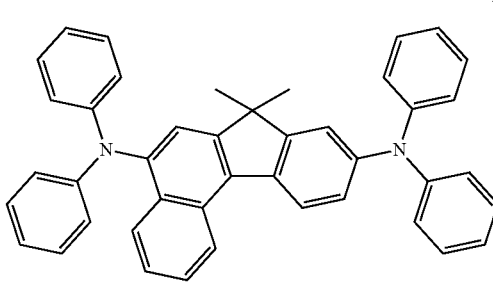
FD21
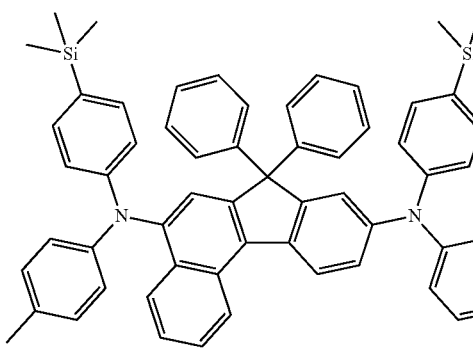
FD22
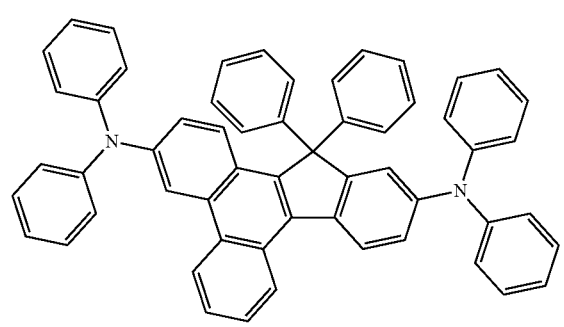

-continued
FD23
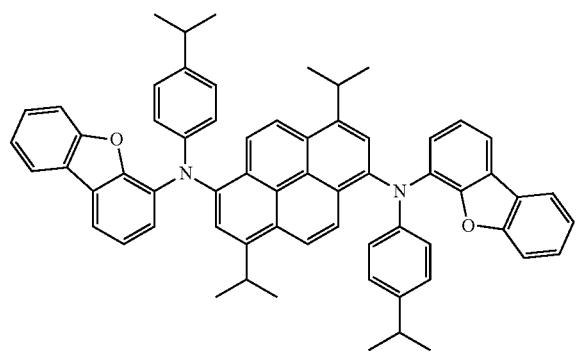
FD27
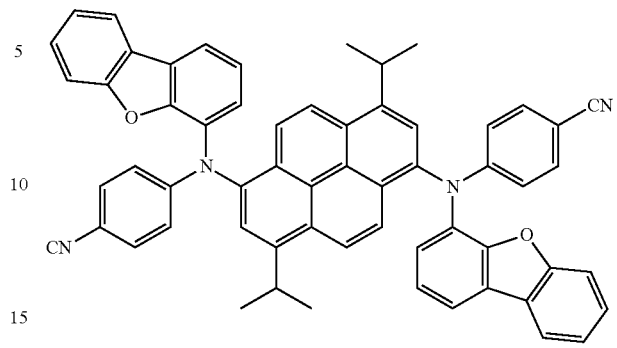
FD24
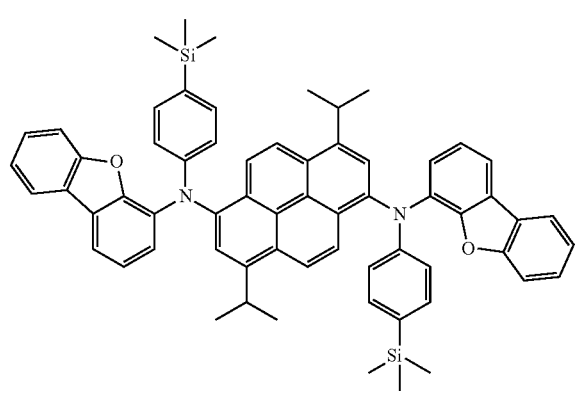
FD28
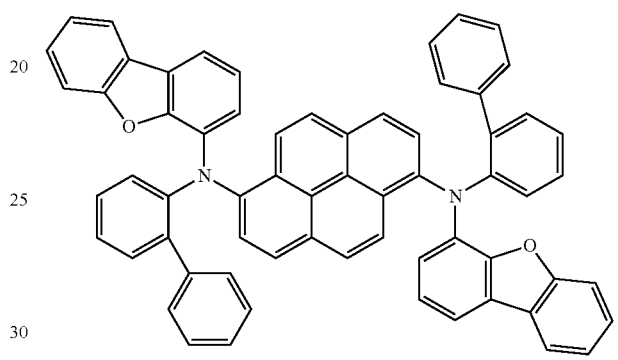
FD25
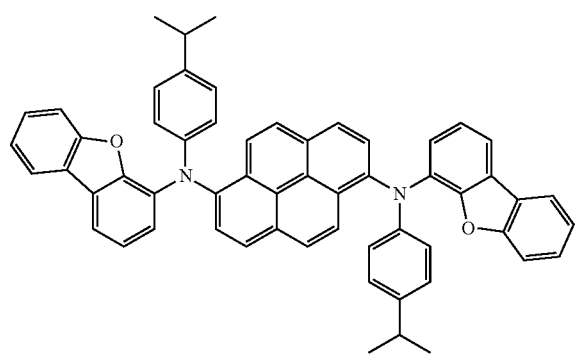
FD29
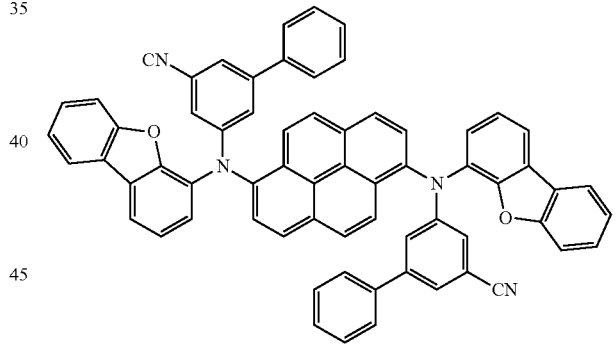
FD26
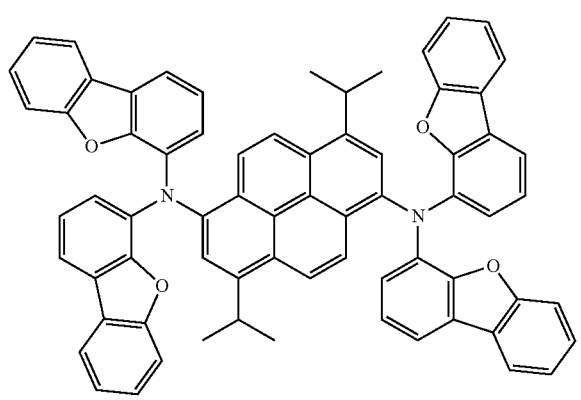
FD30
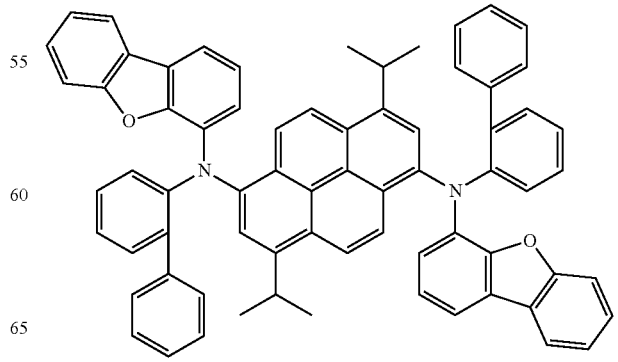

FD31
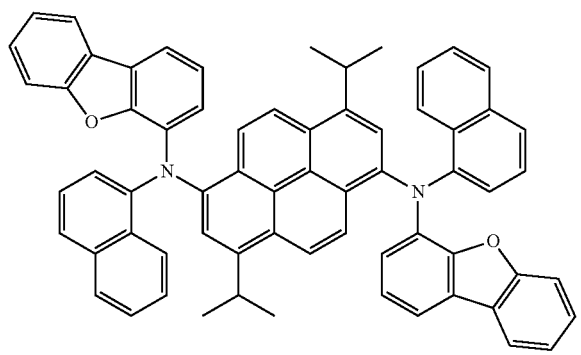

FD32
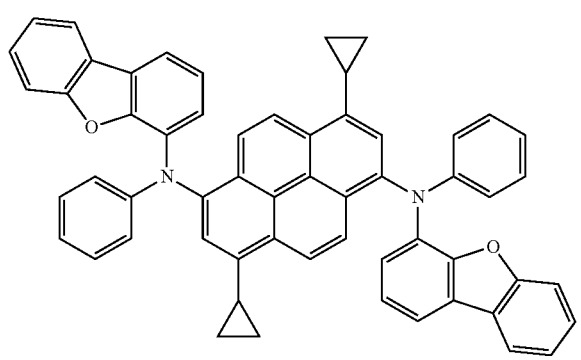

FD33
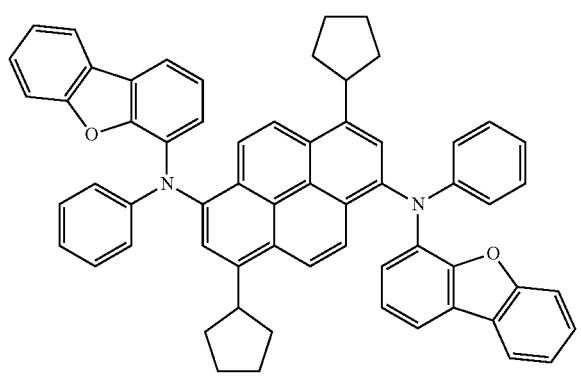

FD34
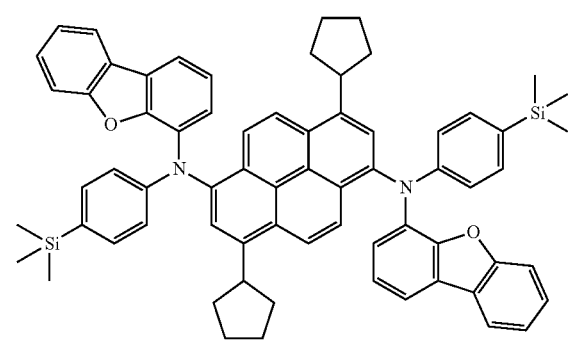

FD35
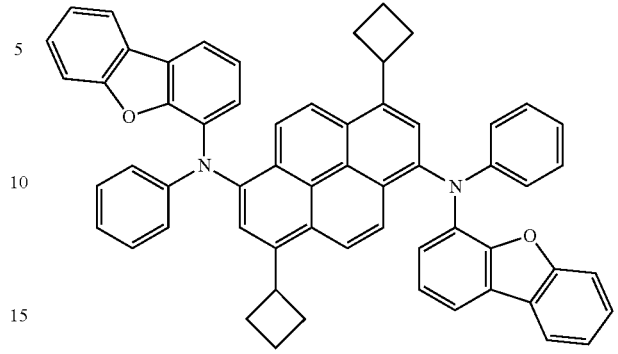

FD36
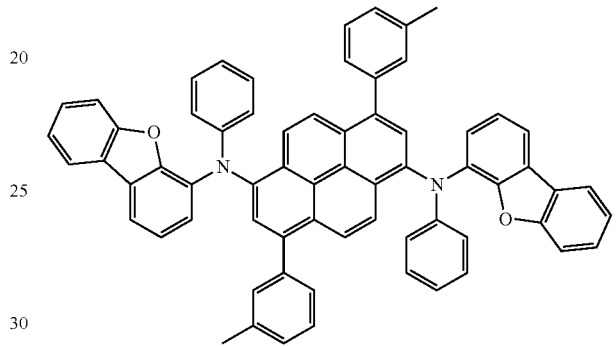

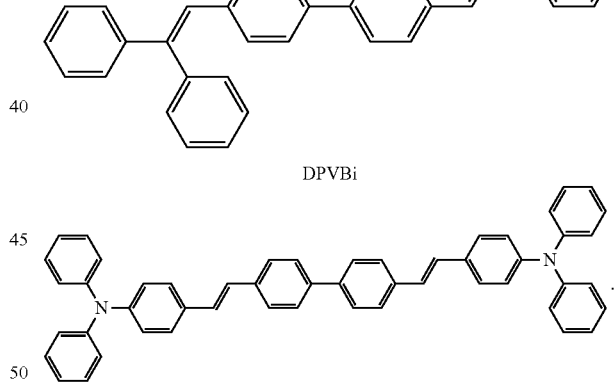

DPVBi

DPAVBi

Delayed Fluorescent Material

The emission layer may include a delayed fluorescent material.

The delayed fluorescent material used herein may be selected from any suitable compound that is capable of emitting delayed fluorescent light based on a delayed fluorescence emission mechanism.

The delayed fluorescent material included in the emission layer may act as a host or a dopant depending on the type (or composition) of other materials included in the emission layer.

In an embodiment, a difference between a triplet energy level (eV) of the delayed fluorescent material and a singlet energy level (eV) of the delayed fluorescent material may be 0 eV or more and 0.5 eV or less. When the difference between the triplet energy level (eV) of the delayed fluorescent material and the singlet energy level (eV) of the delayed fluorescent material satisfies the above-described range, up-conversion from a triplet state to a singlet state of the delayed fluorescent materials may effectively occur, and thus, the luminescence efficiency of the light-emitting device 10 may be improved.

In an embodiment, the delayed fluorescent material may include i) a material that includes at least one electron donor (for example, a π electron-rich $C_3$-$C_{60}$ cyclic group, such as a carbazole group) and at least one electron acceptor (for example, a sulfoxide group, a cyano group, or a π-electron-deficient nitrogen-containing $C_1$-$C_{60}$ cyclic group), ii) a material including a $C_8$-$C_{60}$ polycyclic group in which two or more cyclic groups share boron (B) and are condensed with each other (e.g., combined together with each other).

The delayed fluorescent material may include at least one selected from Compounds DF1 to DF9:

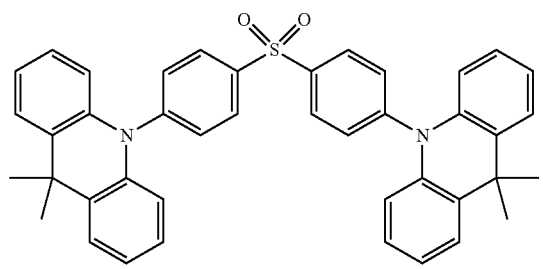

(DMAC-DPS) DF1

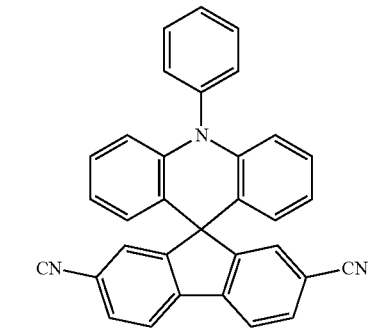

(ACRFLCN) DF2

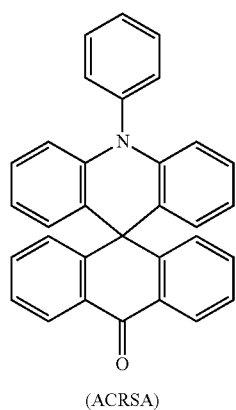

(ACRSA) DF3

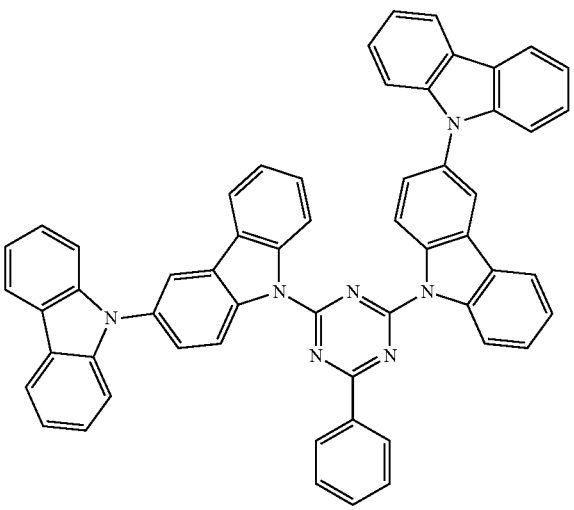

(CC2TA) DF4

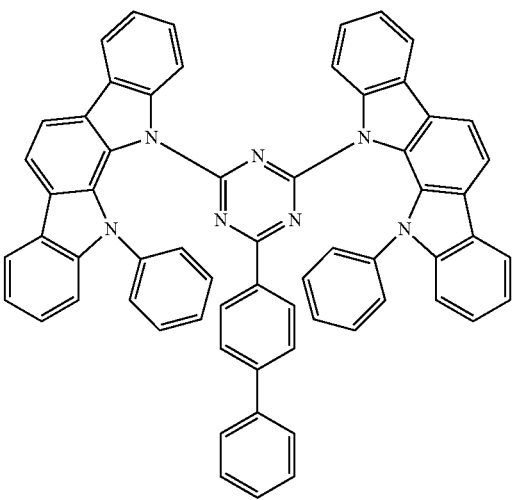

(PIC-TRZ) DF5

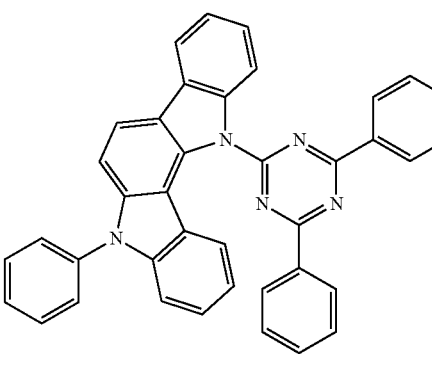

(PIC-TRZ2) DF6

-continued

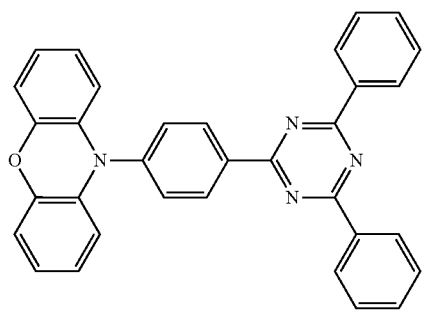

(PXZ-TRZ)

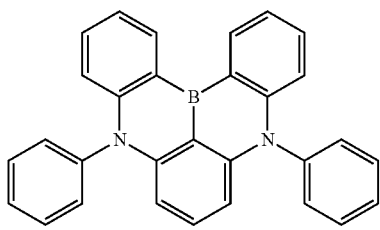

(DABNA-1)

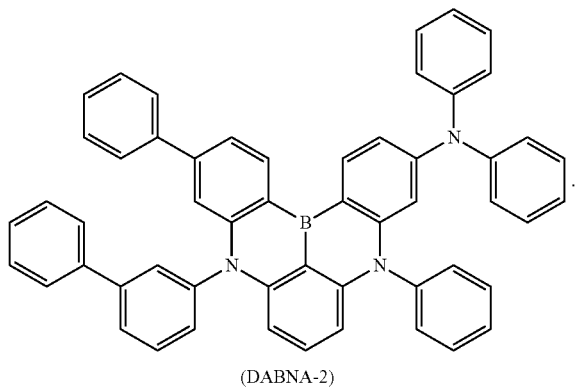

(DABNA-2)

Quantum Dot

The emission layer may include a quantum dot.

The term "quantum dot," as used herein, refers to a crystal of a semiconductor compound, and may include any suitable material that is capable of emitting light of various suitable emission wavelengths depending on a size of the crystal.

A diameter of the quantum dot may be, for example, in a range of about 1 nm to about 10 nm.

The quantum dot may be synthesized by a wet chemical process, an organometallic chemical vapor deposition process, a molecular beam epitaxy process, and/or a process that is similar to these processes.

The wet chemical process refers to a method in which a solvent and a precursor material are mixed, and then, a quantum dot particle crystal is grown. When the crystal grows, the organic solvent acts as a dispersant naturally coordinated on the surface of the quantum dot crystal and controls the growth of the crystal. Accordingly, by using a process that is easily performed at low costs compared to a vapor deposition process, such as a metal organic chemical vapor deposition (MOCVD) process and a molecular beam epitaxy (MBE) process, the growth of quantum dot particles may be controlled.

The quantum dot may include Group II-VI semiconductor compounds, Group III-V semiconductor compounds, Group III-VI semiconductor compounds, Group I—III-VI semiconductor compounds, Group IV-VI semiconductor compounds, a Group IV element or compound; or any combination thereof.

Examples of the Group II-VI semiconductor compound may include: a binary compound, such as CdSe, CdTe, ZnS, ZnSe, ZnTe, ZnO, HgS, HgSe, HgTe, MgSe, and/or MgS; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and/or MgZnS; a quaternary compound, such as CdZnSeS, CdZnSeTe, CdZnSTe, CdHgSeS, CdHgSeTe, CdHgSTe, HgZnSeS, HgZnSeTe, and/or HgZnSTe; or any combination thereof.

Examples of the Group III-V semiconductor compound may include: a binary compound, such as GaN, GaP, GaAs, GaSb, AlN, AlP, AlAs, AlSb, InN, InP, InAs, and/or InSb; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, and/or InPSb; a quaternary compound, such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and/or InAlPSb; or any combination thereof. The Group III-V semiconductor compound may further include a Group II element. Examples of the Group III-V semiconductor compound further including the Group II element may include InZnP, InGaZnP, and/or InAlZnP.

Examples of the Group III-VI semiconductor compound may include: a binary compound, such as GaS, GaSe, $Ga_2Se_3$, GaTe, InS, InSe, $In_2S_3$, $In_2Se_3$, and/or InTe; a ternary compound, such as $InGaS_3$, and/or $InGaSe_3$; or any combination thereof.

Examples of the Group I—III-VI semiconductor compound may include: a ternary compound, such as AgInS, $AgInS_2$, CuInS, $CuInS_2$, $CuGaO_2$, $AgGaO_2$, and/or $AgAlO_2$; or any combination thereof.

Examples of the Group IV-VI semiconductor compound may include: a binary compound, such as SnS, SnSe, SnTe, PbS, PbSe, and/or PbTe; a ternary compound, such as SnSeS, SnSeTe, SnSTe, PbSeS, PbSeTe, PbSTe, SnPbS, SnPbSe, and/or SnPbTe; a quaternary compound, such as SnPbSSe, SnPbSeTe, and/or SnPbSTe; or any combination thereof.

In an embodiment, the Group IV element or compound may include: a single element, such as Si or Ge; a binary compound, such as SiC and/or SiGe; or any combination thereof.

Each element included in the multi-element compound such as the binary compound, ternary compound, and quaternary compound may be present in a particle at a uniform concentration or a non-uniform concentration.

In some embodiments, the quantum dot may have a single structure having a uniform (e.g., substantially uniform) concentration of each element included in the corresponding quantum dot or a dual structure of a core-shell. In an embodiment, the material included in the core may be different from the material included in the shell.

The shell of the quantum dot may function as a protective layer for maintaining semiconductor characteristics by preventing or reducing chemical degeneration of the core and/or may function as a charging layer for imparting electrophoretic characteristics to the quantum dot. The shell may be a single layer or a multilayer. An interface between the core and the shell may have a concentration gradient in which the concentration of elements existing in the shell decreases along a direction toward the center.

Examples of the shell of the quantum dot may be an oxide of a metal, a metalloid, or a non-metal, a semiconductor compound, or any combination thereof. Examples of the oxide of the metal, the metalloid, or the non-metal may include: a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $CO_3O_4$, and/or NiO; a ternary compound, such as $MgAl_2O_4$, $CoFe_2O_4$, $NiFe_2O_4$, and/or $CoMn_2O_4$; or any combination thereof. Examples of the semiconductor compound may include, as described herein, Group II-VI semiconductor compounds, Group III-V semiconductor compounds, Group III-VI semiconductor compounds, Group I—III-VI semiconductor compounds, Group IV-VI semiconductor compounds, or any combination thereof. In an embodiment, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AIAs, AIP, AISb, or any combination thereof.

A full width at half maximum (FWHM) of an emission wavelength spectrum of the quantum dot may be about 45 nm or less, for example, about 40 nm or less, for example, about 30 nm or less. When the FWHM of the emission wavelength spectrum of the quantum dot is within this range, color purity or color reproduction may be improved. In addition, light emitted through such quantum dots is irradiated in omnidirection (e.g., substantially every direction). Accordingly, a wide viewing angle may be increased.

In addition, the quantum dot may be, for example, a spherical, pyramidal, multi-arm, and/or cubic nanoparticle, a nanotube, a nanowire, a nanofiber, and/or a nanoplate.

By adjusting the size of the quantum dot, the energy band gap may also be adjusted, thereby obtaining light of various suitable wavelengths in a quantum dot emission layer. Therefore, by using quantum dots of different sizes, a light-emitting device that emits light of various suitable wavelengths may be implemented. In more detail, the size of the quantum dot may be selected to emit red, green and/or blue light. In addition, the size of the quantum dot may be adjusted such that light of various suitable colors are combined to emit white light.

Electron Transport Region in Interlayer 130

The electron transport region may have: i) a single-layered structure including (e.g., consisting of) a single layer including (e.g., consisting of) a single material, ii) a single-layered structure including (e.g., consisting of) a single layer including a plurality of different materials, or iii) a multi-layered structure including a plurality of layers including different materials.

The electron transport region may include a buffer layer, a hole blocking layer, an electron control layer, an electron transport layer, an electron injection layer, or any combination thereof.

In an embodiment, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein, for each structure, constituting layers are sequentially stacked from an emission layer.

The electron transport region may include phosphineoxide-containing compounds, silyl compounds, or any combination thereof, as described above.

In an embodiment, the electron transport region (for example, the buffer layer, the hole blocking layer, the electron control layer, or the electron transport layer in the electron transport region) may include a metal-free compound including at least one π electron-deficient nitrogen-containing $C_1$-$C_{60}$ cyclic group.

In an embodiment, the electron transport region may include a compound represented by Formula 601 below:

$$[Ar_{601}]_{xe11}-[(L_{601})_{xe1}-R_{601}]_{xe21} \qquad \text{Formula 601}$$

In Formula 601, $Ar_{601}$ and $L_{601}$ may each independently be a $C_3$-$C_{60}$ carbocyclic group unsubstituted or substituted with at least one $R_{10a}$ or a $C_1$-$C_6$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si$(Q_{601})(Q_{602})(Q_{603})$, —C(=O)$(Q_{601})$, —S(=O)$_2(Q_{601})$, or —P(=O)$(Q_{601})(Q_{602})$, $Q_{601}$ to $Q_{603}$ are the same as described in connection with $Q_1$, xe21 may be 1, 2, 3, 4, or 5, and at least one of $Ar_{601}$, $L_{601}$, and $R_{601}$ may each independently be a π electron-deficient nitrogen-containing $C_1$-$C_{60}$ cyclic group unsubstituted or substituted with at least one $R_{10a}$.

In one or more embodiments, when xe11 in Formula 601 is 2 or more, two or more of $Ar_{601}$(s) may be linked to each other via a single bond.

In an embodiment, $Ar_{601}$ in Formula 601 may be a substituted or unsubstituted anthracene group.

In an embodiment, the electron transport region may include a compound represented by Formula 601-1:

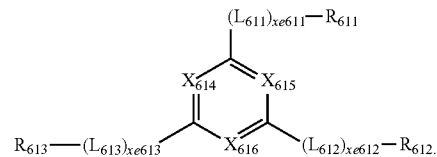

Formula 601-1

In Formula 601-1, $X_{614}$ may be N or C($R_{614}$), $X_{615}$ may be N or C($R_{615}$), $X_{616}$ may be N or C($R_{616}$), and at least one of $X_{614}$ to $X_{616}$ may be N, $L_{611}$ to $L_{613}$ may be understood by referring to the description presented in connection with $L_{601}$, xe611 to xe613 may be understood by referring to the description presented in connection with xe1, $R_{611}$ to $R_{613}$ may be understood by referring to the description presented in connection with $R_{601}$, and $R_{614}$ to $R_{616}$ may each independently be hydrogen, deuterium, —F, —$C_1$, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

In an embodiment, xe1 and xe611 to xe613 in Formula 601 and 601-1 may each independently be 0, 1, or 2.

The electron transport region may include one of Compounds ET1 to ET45, 2, 9-dimethyl-4,7-diphenyl-1, 10-phenanthroline (BCP), 4,7-diphenyl-1,10-phenanthroline (Bphen), Alq$_3$, BAlq, TAZ, NTAZ, diphenyl(4-(triphenylsilyl)phenyl)-phosphine oxide (TSPO1), or any combination thereof:
ET1
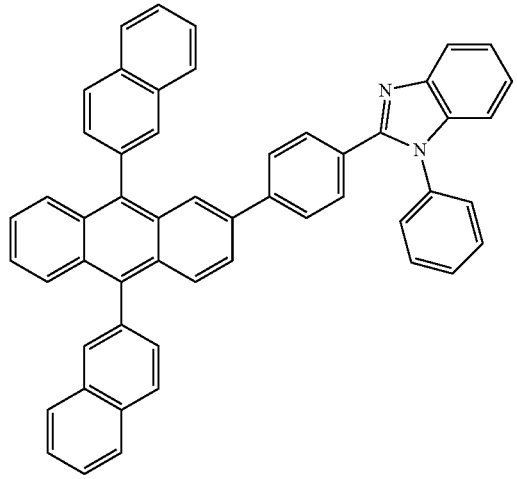
ET3
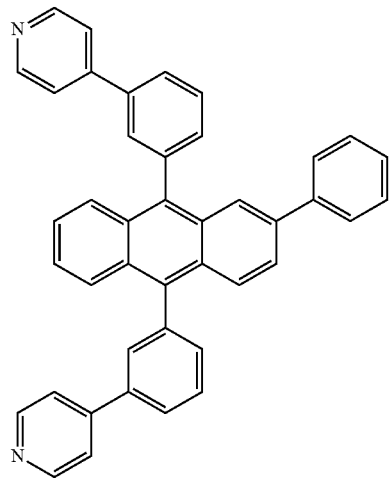
ET2
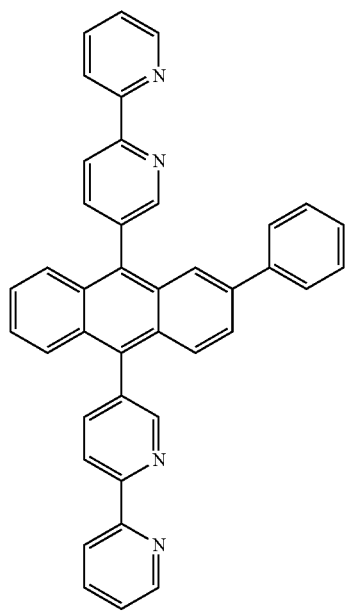
ET4, ET5
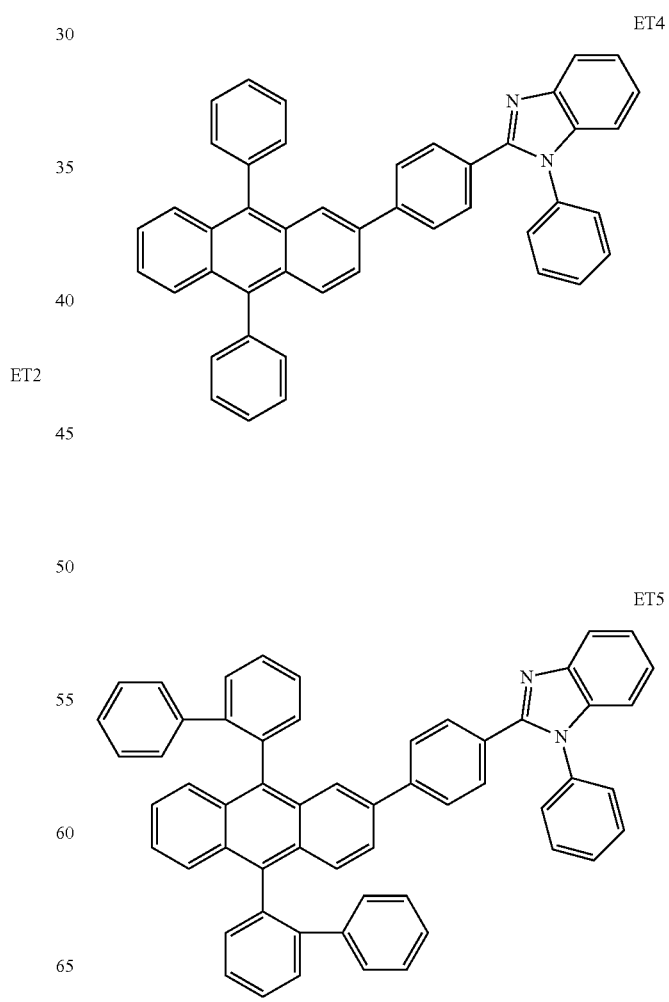

ET6
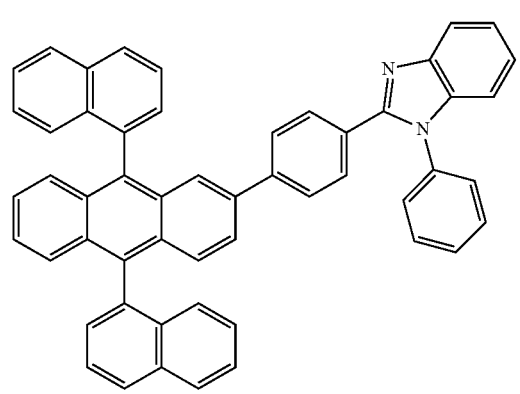
ET7
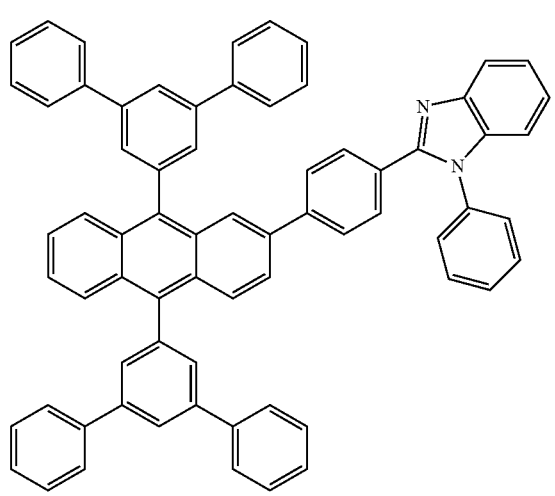
ET8
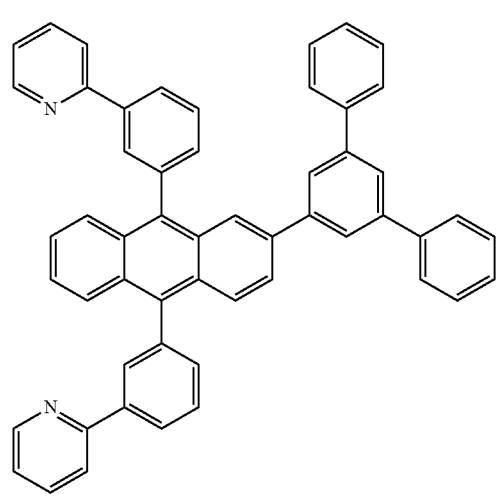
ET9
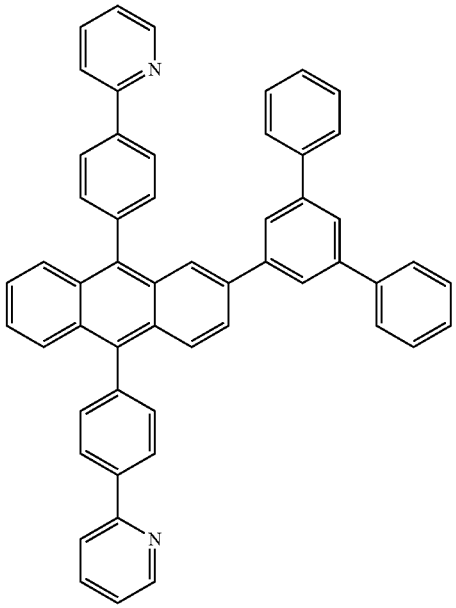
ET10
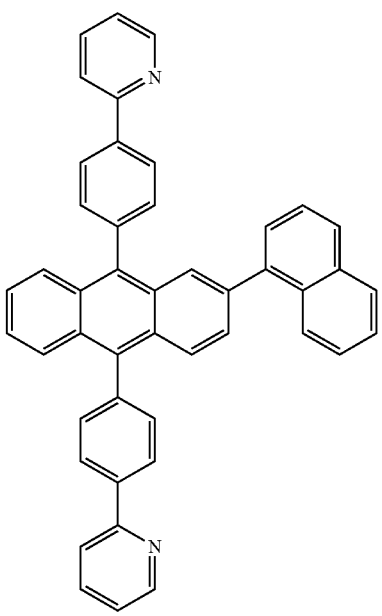

ET11
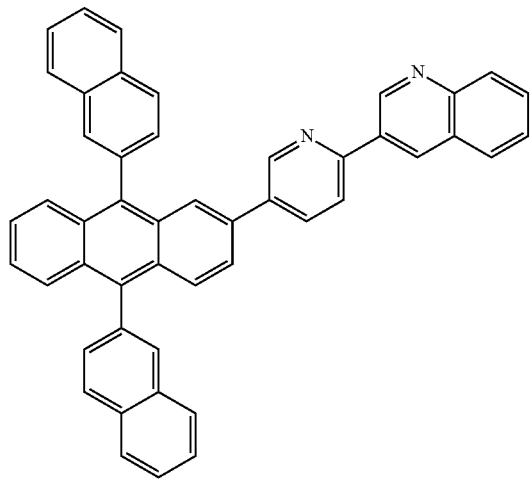
ET12
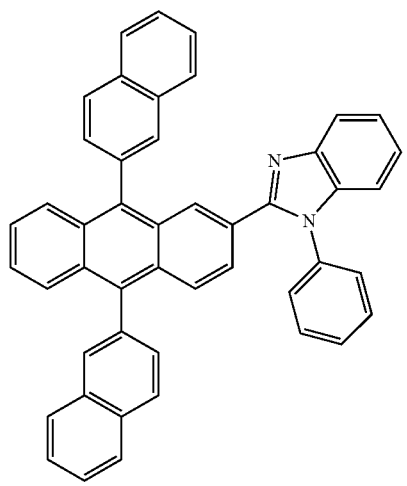
ET13
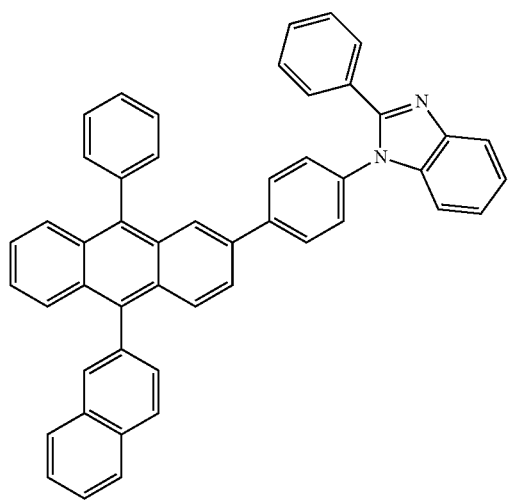
ET14
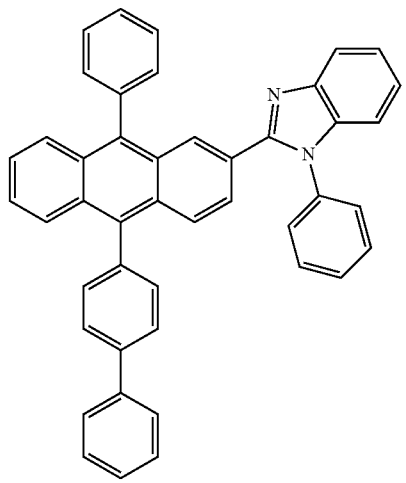
ET15
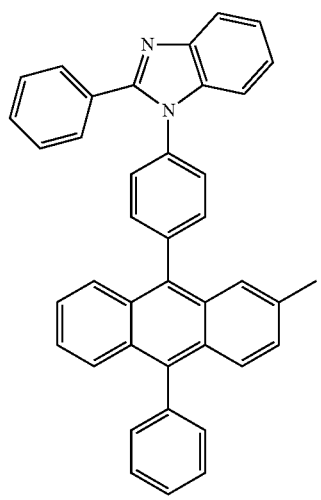
ET16
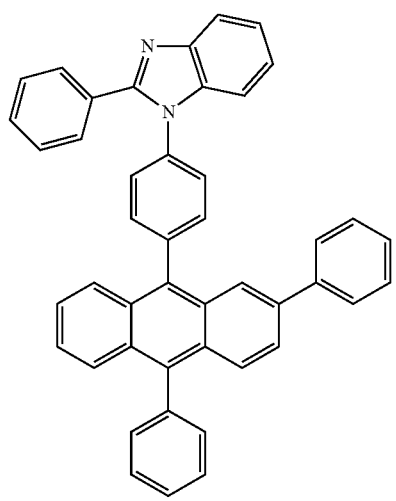

ET17
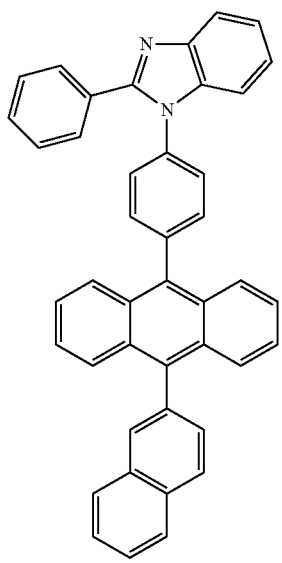
ET18
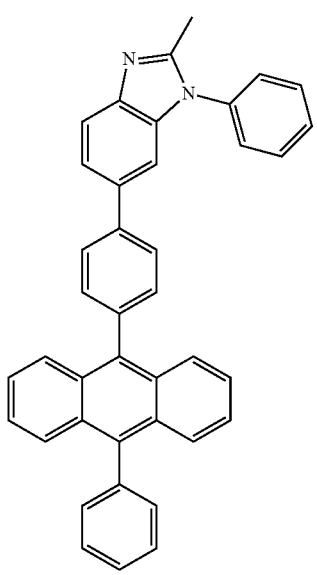
ET19
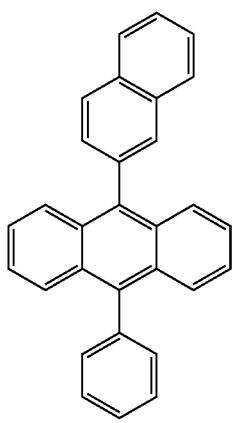
ET20
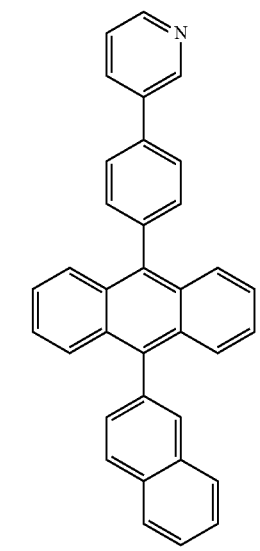
ET21
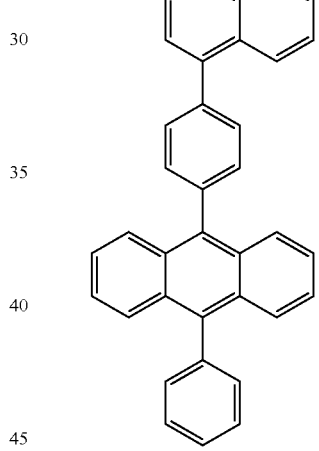
ET22
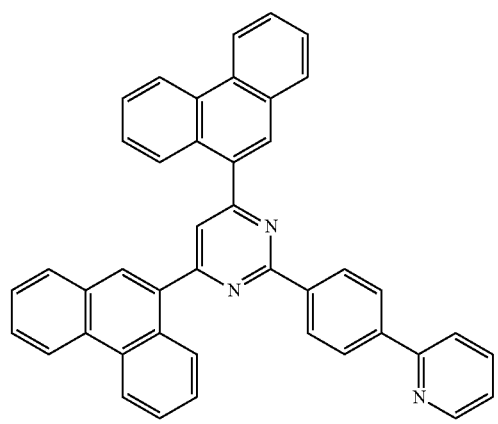

ET23
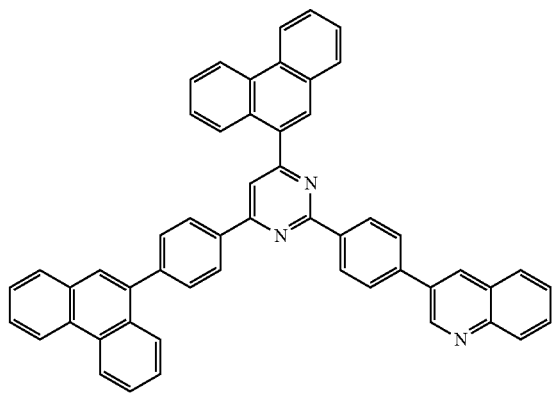
ET24
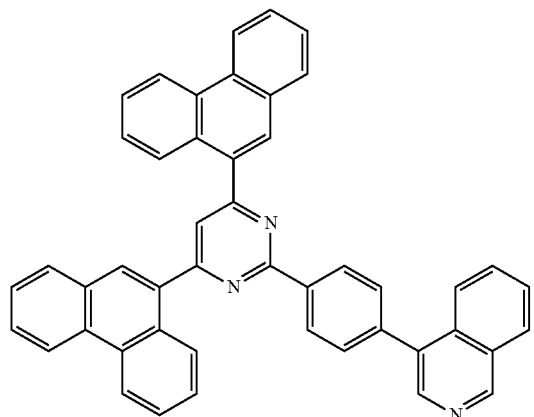
ET25
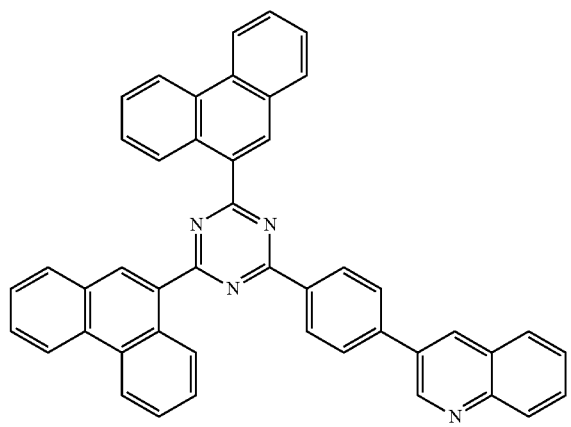
ET26
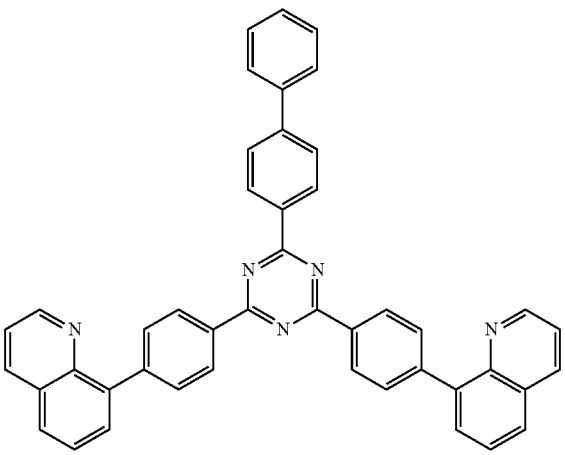
ET27
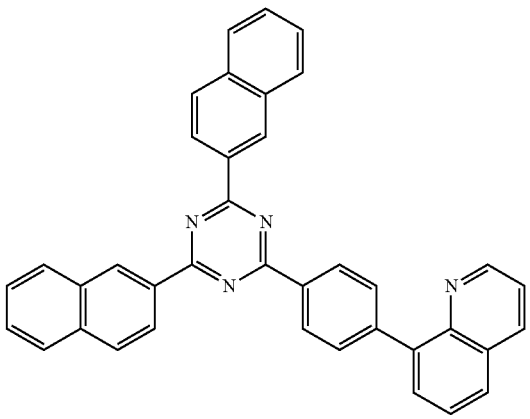
ET28
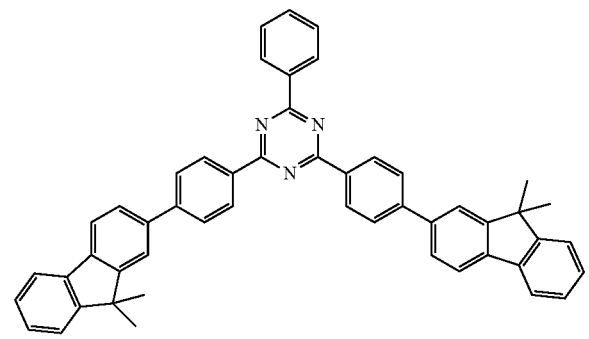

ET29
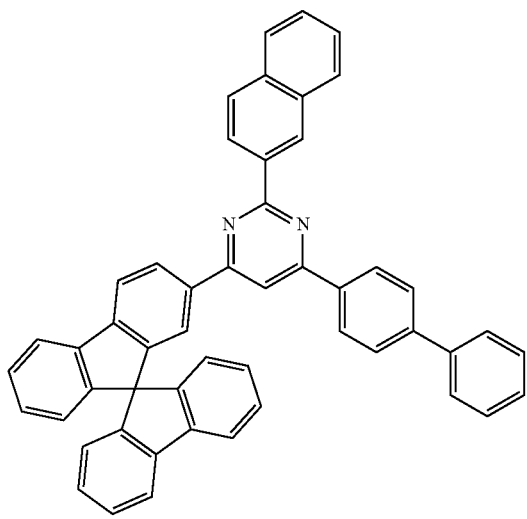
ET32
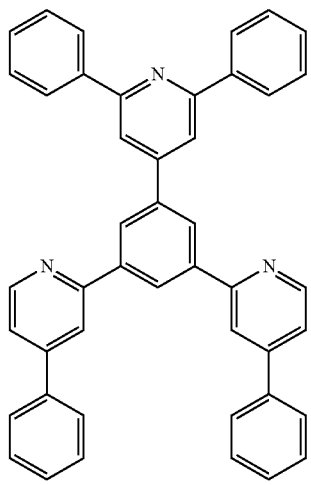
ET30
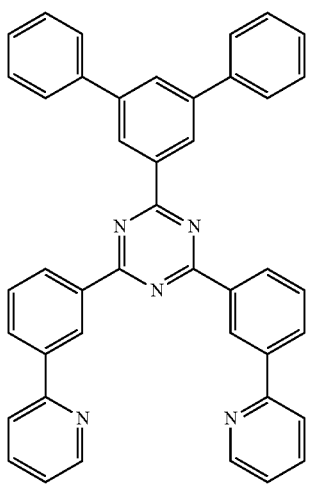
ET33
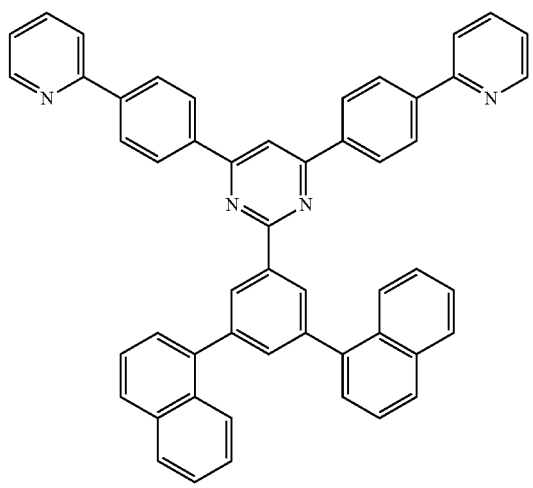
ET31
ET34
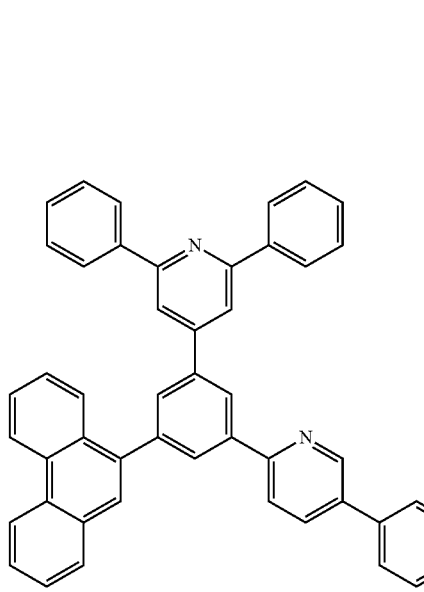

ET35
ET36
ET37
ET38
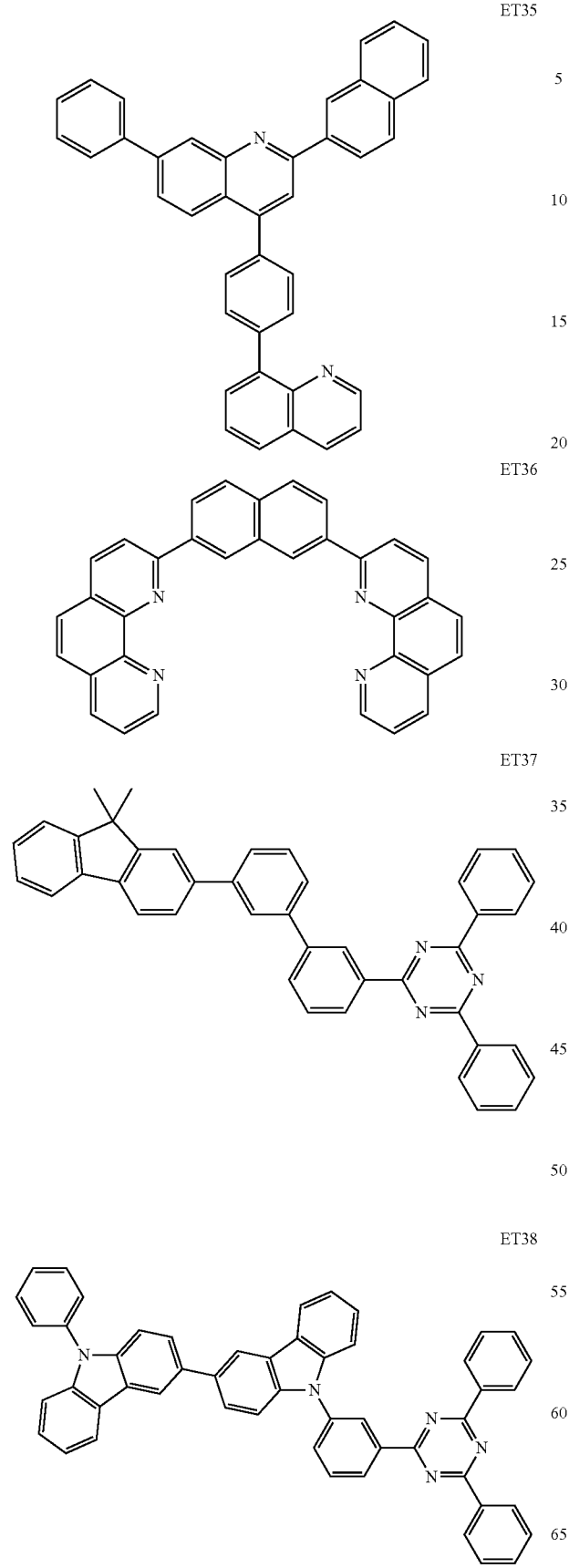
ET39
ET40
ET41
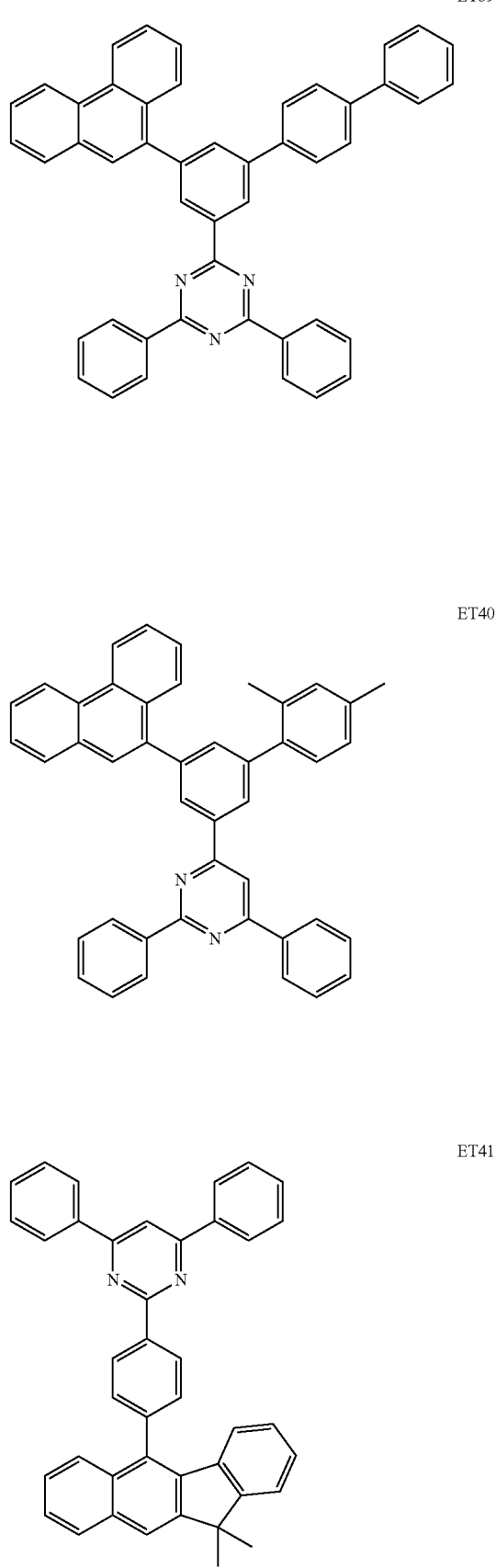

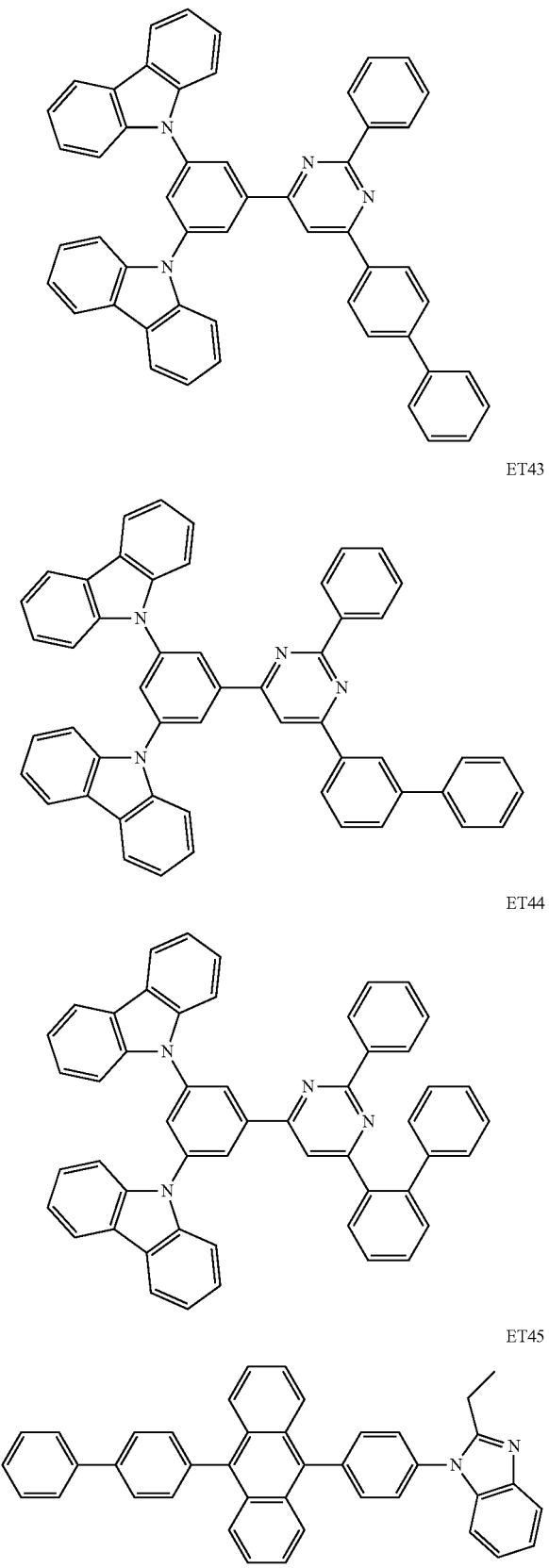

A thickness of the electron transport region may be in a range from about 100 Å to about 5,000 Å, for example, about 160 Å to about 4,000 Å. When the electron transport region includes a buffer layer, a hole blocking layer, an electron control layer, an electron transport layer, or any combination thereof, a thickness of the buffer layer, the hole blocking layer, or the electron control layer may each independently be in a range from about 20 Å to about 1,000 Å, for example, about 30 Å to about 300 Å, and the thickness of the electron transport layer may be in a range from about 100 Å to about 1,000 Å, for example, about 150 Å to about 500 Å. When the thickness of the buffer layer, the hole blocking layer, the electron control layer, the electron transport layer, and/or the electron transport REGION are within these ranges, suitable or satisfactory electron transporting characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth-metal complex, or any combination thereof. A metal ion of the alkali metal complex may be a Li ion, a Na ion, a K ion, a Rb ion, and/or a Cs ion, and a metal ion of the alkaline earth-metal complex may be a Be ion, a Mg ion, a Ca ion, a Sr ion, and/or a Ba ion. A ligand coordinated with the metal ion of the alkali metal complex or the alkaline earth-metal complex may include hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenylbenzimidazole, hydroxyphenylbenzothiazole, bipyridine, phenanthroline, cyclopentadiene, or any combination thereof.

In an embodiment, the metal-containing material may include a Li complex. The Li complex may include, for example, Compound ET-D1 (LiQ) or ET-D2:

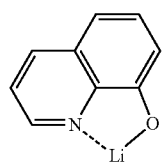

ET-D1

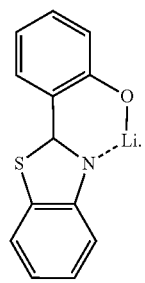

ET-D2

The electron transport region may include an electron injection layer that facilitates the injection of electrons from the second electrode 150. The electron injection layer may directly contact (e.g., physically contact) the second electrode 150.

The electron injection layer may have: i) a single-layered structure including (e.g., consisting of) a single layer including (e.g., consisting of) a single material, ii) a single-layered structure including (e.g., consisting of) a single layer including a plurality of different materials, or iii) a multi-layered structure including a plurality of layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and/or the rare earth metal-containing compound may be oxides and/or halides (for example, fluorides, chlorides, bromides, and/or iodides) of the alkali metal, the alkaline earth metal, and the rare earth metal, telluride, or any combination thereof.

The alkali metal-containing compound may be alkali metal oxides, such as $Li_2O$, $Cs_2O$, and/or $K_2O$, alkali metal halides, such as LiF, NaF, CsF, KF, LiI, NaI, CsI, and/or KI, or any combination thereof. The alkaline earth metal-containing compound may include an alkaline earth metal compound, such as BaO, SrO, CaO, $Ba_xSr_{1-x}O$ (x is a real number that satisfies the condition of 0<x<1), and/or $Ba_xCa_{1-x}O$ (x is a real number that satisfies the condition of 0<x<1). The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In an embodiment, the rare earth metal-containing compound may include lanthanide metal telluride. Examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth-metal complex, and the rare earth metal complex may include i) one of ions of the alkali metal, the alkaline earth metal, and the rare earth metal and ii), a ligand bonded to the metal ion, for example, hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenyl benzimidazole, hydroxyphenylbenzothiazole, bipyridine, phenanthroline, cyclopentadiene, or any combination thereof.

The electron injection layer may include (e.g., consist of) an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof, or may further include an organic material (for example, a compound represented by Formula 601).

In an embodiment, the electron injection layer may include (e.g., consist of) i) an alkali metal-containing compound (for example, an alkali metal halide), or ii) a) an alkali metal-containing compound (for example, an alkali metal halide); and b) alkali metal, alkaline earth metal, rare earth metal, or any combination thereof. In an embodiment, the electron injection layer may be a KI:Yb co-deposited layer and/or a RbI:Yb co-deposited layer.

When the electron injection layer further includes an organic material, an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof may be homogeneously or non-homogeneously dispersed in a matrix including the organic material.

A thickness of the electron injection layer may be in a range of about 1 Å to about 100 Å, for example, about 3 Å to about 90 Å. When the thickness of the electron injection layer is within the range described above, the electron injection layer may have suitable or satisfactory electron injection characteristics without a substantial increase in driving voltage.

Second Electrode 150

The second electrode 150 may be on the interlayer 130 having such a structure. The second electrode 150 may be a cathode, which is an electron injection electrode, and as a material for forming the second electrode 150, a metal, an alloy, an electrically conductive compound, or any combination thereof, each having a low work function, may be used.

The second electrode 150 may include at least one selected from lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, and any combination thereof. The second electrode 150 may be a transmissive electrode, a semi-transmissive electrode, or a reflective electrode.

The second electrode 150 may have a single-layered structure or a multi-layered structure including two or more layers.

Capping Layer

A first capping layer may be located outside the first electrode 110, and/or a second capping layer may be located outside the second electrode 150. In more detail, the light-emitting device 10 may have a structure in which the first capping layer, the first electrode 110, the interlayer 130, and the second electrode 150 are sequentially stacked in this stated order, a structure in which the first electrode 110, the interlayer 130, the second electrode 150, and the second capping layer are sequentially stacked in this stated order, or a structure in which the first capping layer, the first electrode 110, the interlayer 130, the second electrode 150, and the second capping layer are sequentially stacked in this stated order.

Light generated in an emission layer of the interlayer 130 of the light-emitting device 10 may be extracted toward the outside through the first electrode 110, which is a semi-transmissive electrode or a transmissive electrode, and the first capping layer, and light generated in an emission layer of the interlayer 130 of the light-emitting device 10 may be extracted toward the outside through the second electrode 150, which is a semi-transmissive electrode or a transmissive electrode, and the second capping layer.

The first capping layer and the second capping layer may increase external luminescence efficiency according to the principle of constructive interference. Accordingly, the light extraction efficiency of the organic light-emitting device 10 is increased, so that the luminescence efficiency of the organic light-emitting device 10 may be improved.

Each of the first capping layer and the second capping layer may include a material having a refractive index of 1.6 or more (at a wavelength of 589 nm).

The first capping layer and the second capping layer may each independently be an organic capping layer including an organic material, an inorganic capping layer including an inorganic material, or a composite capping layer including an organic material and an inorganic material.

At least one selected from the first capping layer and the second capping layer may each independently include a carbocyclic compound, a heterocyclic compound, an amine group-containing compound, a porphyrine derivative, a phthalocyanine derivative, a naphthalocyanine derivative, an alkali metal complex, an alkaline earth-metal complex, or any combination thereof. The carbocyclic compound, the heterocyclic compound, and the amine group-containing compound may be optionally substituted with a substituent containing O, N, S, Se, Si, F, Cl, Br, I, or any combination thereof. In an embodiment, at least one of the first capping layer and the second capping layer may each independently include an amine group-containing compound.

In an embodiment, at least one selected from the first capping layer and second capping layer may each independently include a compound represented by Formula 201, a compound represented by Formula 202, or any combination thereof.

In one or more embodiments, at least one selected from the first capping layer and the second capping layer may each independently include one of Compounds HT28 to HT33, one of Compounds CP1 to CP6, β-NPB, or any combination thereof:

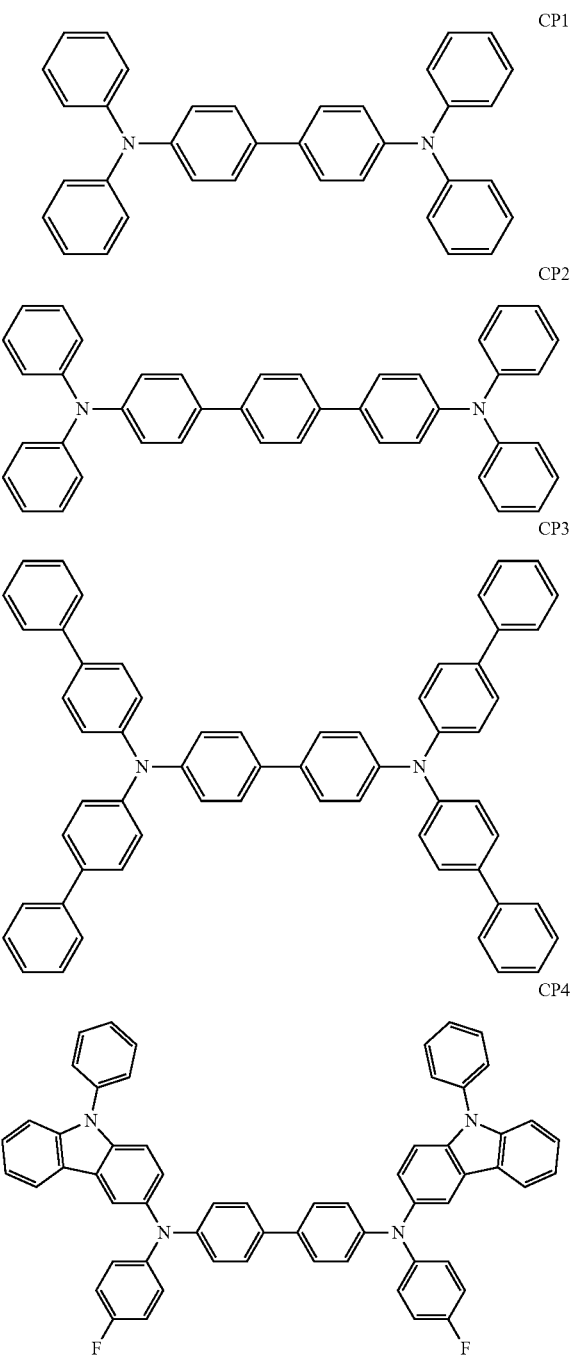

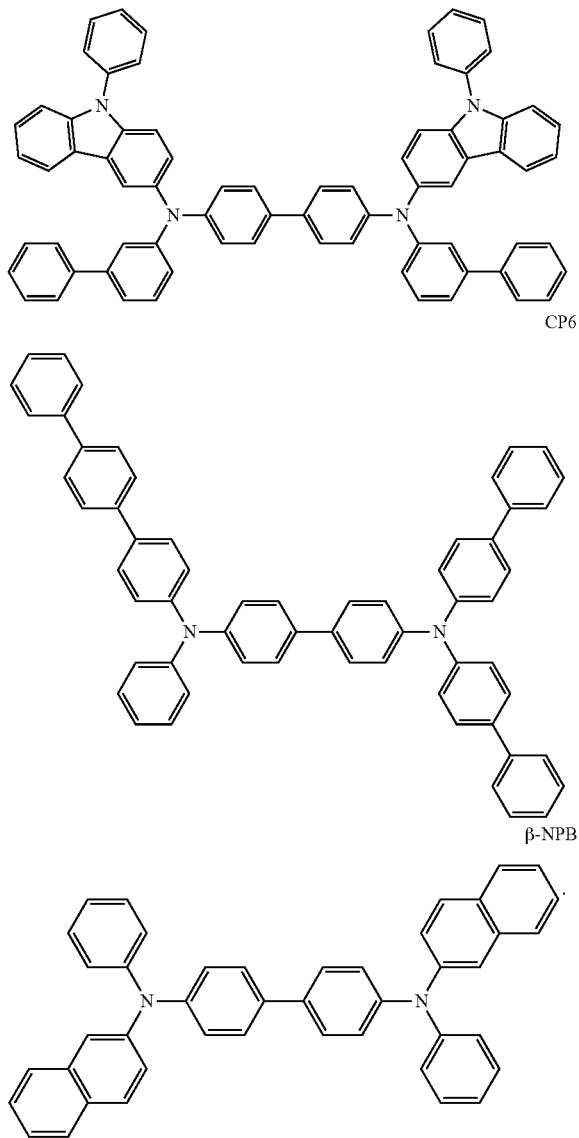

Electronic Apparatus

The light-emitting device may be included in various suitable electronic apparatuses. In an embodiment, the electronic apparatus including the light-emitting device may be a light-emitting apparatus, an authentication apparatus, and/or the like.

The electronic apparatus (for example, light-emitting apparatus) may further include, in addition to the light-emitting device, i) a color filter, ii) a color conversion layer, or iii) a color filter and a color conversion layer. The color filter and/or the color conversion layer may be located in at least one traveling direction of light emitted from the light-emitting device. In an embodiment, light emitted from the light-emitting device may be blue light and/or white light. The light-emitting device may be the same as described above. In an embodiment, the color conversion layer may include a quantum dot. The quantum dot may be, for example, a quantum dot as described herein.

The electronic apparatus may include a first substrate. The first substrate includes a plurality of subpixel areas, the color filter includes a plurality of color filter areas corresponding to the plurality of subpixel areas, respectively, and the color conversion layer may include a plurality of color conversion areas corresponding to the subpixel areas, respectively.

A pixel-defining film may be between the plurality of subpixel areas to define each of the subpixel areas.

The color filter may further include a plurality of color filter areas and a light-blocking pattern between the plurality of color filter areas, and the color conversion layer may further include a plurality of color conversion areas and a light-blocking pattern between the plurality of color conversion areas.

The plurality of color filter areas (or the plurality of color conversion areas) may include a first area emitting first color light, a second area emitting second color light, and/or a third area emitting third color light, and the first color light, the second color light, and/or the third color light may have different maximum emission wavelengths from one another. In an embodiment, the first color light may be red light, the second color light may be green light, and the third color light may be blue light. In an embodiment, the plurality of color filter areas (or the plurality of color conversion areas) may include a quantum dot. In more detail, the first area may include a red quantum dot, the second area may include a green quantum dot, and the third area may not include a quantum dot. The quantum dot is the same as described in the present specification. Each of the first area, the second area and/or the third area may further include a scatterer.

In an embodiment, the light-emitting device may emit a first light, the first area may absorb the first light to emit a first first-color light, the second area may absorb the first light to emit a second first-color light, and the third area may absorb the first light to emit a third first-color light. In this regard, the first first-color light, the second first-color light, and the third first-color light may have different maximum emission wavelengths from one another. In more detail, the first light may be blue light, the first first-color light may be red light, the second first-color light may be green light, and the third first-color light may be blue light.

The electronic apparatus may further include a thin-film transistor in addition to the light-emitting device as described above. The thin-film transistor may include a source electrode, a drain electrode, and an activation layer, wherein any one selected from the source electrode and the drain electrode may be electrically coupled to any one selected from the first electrode and the second electrode of the light-emitting device.

The thin-film transistor may further include a gate electrode, a gate insulating film, and/or the like.

The activation layer may include crystalline silicon, amorphous silicon, organic semiconductor, oxide semiconductor, and/or the like.

The electronic apparatus may further include a sealing portion for sealing the light-emitting device. The sealing portion may be between the color filter and/or the color conversion layer and the light-emitting device. The sealing portion allows light from the light-emitting device to be extracted to the outside, while concurrently (e.g., simultaneously) preventing or reducing penetration of ambient air and/or moisture into the light-emitting device. The sealing portion may be a sealing substrate including a transparent glass substrate and/or a plastic substrate. The sealing portion may be a thin film encapsulation layer including at least one layer of an organic layer and/or an inorganic layer. When the sealing portion is a thin film encapsulation layer, the electronic apparatus may be flexible.

On the sealing portion, in addition to the color filter and/or the color conversion layer, various suitable functional layers may be further located according to the use of the electronic apparatus. The functional layers may include a touch screen layer, a polarizing layer, and/or the like. The touch screen layer may be a pressure-sensitive touch screen layer, a capacitive touch screen layer, and/or an infrared touch screen layer. The authentication apparatus may be, for example, a biometric authentication apparatus for authenticating an individual by using biometric information of a biometric body (for example, a finger tip, a pupil, and/or the like).

The authentication apparatus may further include, in addition to the light-emitting device, a biometric information collector.

The electronic apparatus may be applied to various suitable displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, and/or endoscope displays), fish finders, various suitable measuring instruments, meters (for example, meters for a vehicle, an aircraft, and a vessel), projectors, and/or the like.

Figure 2:
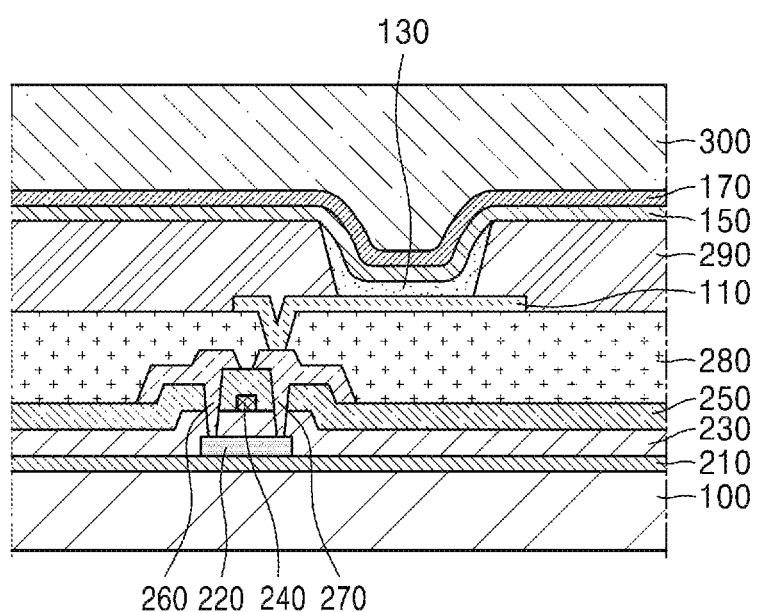
FIGS. 2 and 3 are each a cross-sectional view schematically illustrating a light-emitting apparatus according to an embodiment of the present disclosure.
Figure 3:
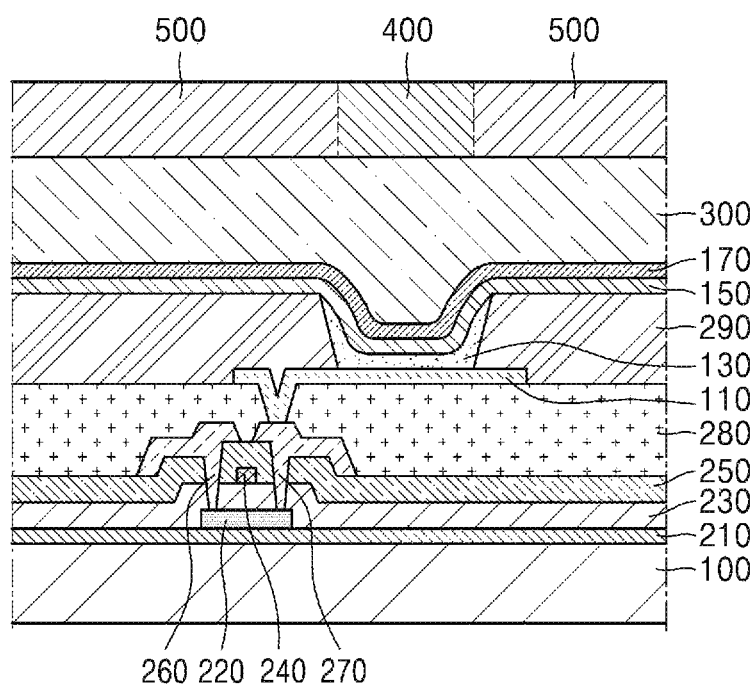

Description of FIGS. 2 and 3

FIG. 2 is a cross-sectional view of a light-emitting apparatus according to an embodiment.

The light-emitting apparatus of FIG. 2 includes a substrate 100, a thin-film transistor (TFT), a light-emitting device, and an encapsulation portion 300 that seals the light-emitting device.

The substrate 100 may be a flexible substrate, a glass substrate, and/or a metal substrate. A buffer layer 210 may be on the substrate 100. The buffer layer 210 prevents or reduces the penetration of impurities through the substrate 100 and may provide a flat surface on the substrate 100.

A TFT may be on the buffer layer 210. The TFT may include an activation layer 220, a gate electrode 240, a source electrode 260, and a drain electrode 270.

The activation layer 220 may include an inorganic semiconductor such as silicon and/or polysilicon, an organic semiconductor, and/or an oxide semiconductor, and may include a source region, a drain region, and a channel region.

A gate insulating film 230 for insulating the activation layer 220 from the gate electrode 240 may be on the activation layer 220, and the gate electrode 240 may be on the gate insulating film 230.

An interlayer insulating film 250 may be on the gate electrode 240. The interlayer insulating film 250 is between the gate electrode 240 and the source electrode 260 to insulate the gate electrode 240 from the source electrode 260 and between the gate electrode 240 and the drain electrode 270 to insulate the gate electrode 240 from the drain electrode 270.

The source electrode 260 and the drain electrode 270 may be on the interlayer insulating film 250. The interlayer insulating film 250 and the gate insulating film 230 may expose the source region and the drain region of the activation layer 220, and the source electrode 260 and the drain electrode 270 may be in contact (e.g., physical contact) with the exposed portions of the source region and the drain region of the activation layer 220.

The TFT may be electrically coupled to a light-emitting device to drive the light-emitting device, and is covered by a passivation layer 280. The passivation layer 280 may include an inorganic insulating film, an organic insulating film, or a combination thereof. A light-emitting device is provided on the passivation layer 280. The light-emitting device includes the first electrode 110, the interlayer 130, and the second electrode 150.

The first electrode 110 may be on the passivation layer 280. The passivation layer 280 does not completely cover the drain electrode 270 and may exposes a certain region of the drain electrode 270, and the first electrode 110 may be coupled to the exposed region of the drain electrode 270.

A pixel defining layer 290 including an insulating material may be on the first electrode 110. The pixel defining layer 290 may expose a certain region of the first electrode 110, and the interlayer 130 may be formed in the exposed region of the first electrode 110. The pixel defining layer 290 may be a polyimide and/or polyacryl-based organic film. In some embodiments, at least some layers of the interlayer 130 may extend beyond the upper portion of the pixel defining layer 290 and may thus be located in the form of a common layer.

The second electrode 150 may be on the interlayer 130, and a capping layer 170 may be additionally formed on the second electrode 150. The capping layer 170 may cover the second electrode 150.

The encapsulation portion 300 may be on the capping layer 170. The encapsulation portion 300 may be on a light-emitting device and protects the light-emitting device from moisture and/or oxygen. The encapsulation portion 300 may include: an inorganic film including silicon nitride ($SiN_x$), silicon oxide ($SiO_x$), indium tin oxide, indium zinc oxide, or a combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate and/or polyacrylic acid), an epoxy-based resin (for example, aliphatic glycidyl ether (AGE)), or a combination thereof; or a combination of an inorganic film and an organic film.

FIG. 3 is a cross-sectional view showing a light-emitting apparatus according to an embodiment of the present disclosure.

The light-emitting apparatus of FIG. 3 is the same as the light-emitting apparatus of FIG. 2, except that a light-blocking pattern 500 and a functional region 400 are additionally on the encapsulation portion 300. The functional region 400 may be i) a color filter area, ii) a color conversion area, or iii) a combination of the color filter area and the color conversion area. In an embodiment, the light-emitting device included in the light-emitting apparatus of FIG. 3 may be a tandem light-emitting device.

Preparation Method

Layers constituting the hole transport region, an emission layer, and layers constituting the electron transport region may be formed in a certain region by using one or more suitable methods selected from vacuum deposition, spin coating, casting, Langmuir-Blodgett (LB) deposition, ink-jet printing, laser-printing, and laser-induced thermal imaging.

When layers constituting the hole transport region, an emission layer, and layers constituting the electron transport region are formed by vacuum deposition, the deposition may be performed at a deposition temperature in a range of about 100° C. to about 500° C., a vacuum degree in a range of about $10^{-8}$ torr to about $10^{-3}$ torr, and a deposition speed in a range of about 0.01 Å/sec to about 100 Å/sec by taking into account a material to be included in a layer to be formed and the structure of a layer to be formed.

Definition of at Least Some of the Terms

The term "$C_3$-$C_{60}$ carbocyclic group," as used herein, refers to a cyclic group that consists of carbon only and has three to sixty carbon atoms, and the term "$C_1$-$C_{60}$ heterocyclic group," as used herein, refers to a cyclic group that has one to sixty carbon atoms and further includes, in addition to carbon, a heteroatom. The $C_3$-$C_{60}$ carbocyclic group and the $C_1$-$C_{60}$ heterocyclic group may each be a monocyclic group that consists of one ring or a polycyclic group in which two or more rings are condensed with (e.g., combined together with) each other. In an embodiment, the number of ring-forming atoms of the $C_1$-$C_{60}$ heterocyclic group may be from 3 to 61.

The term "cyclic group," as used herein, includes the $C_3$-$C_{60}$ carbocyclic group and the $C_1$-$C_{60}$ heterocyclic group.

The term "π electron-rich $C_3$-$C_{60}$ cyclic group," as used herein, refers to a cyclic group that has three to sixty carbon atoms and does not include *—N=*' as a ring-forming moiety, and the term "π-electron-deficient nitrogen-containing $C_1$-$C_{60}$ cyclic group," as used herein, refers to a heterocyclic group that has one to sixty carbon atoms and includes *—N=*' as a ring-forming moiety.

For example, the $C_3$-$C_{60}$ carbocyclic group may be i) a group $T_1$ or ii) a condensed cyclic group in which two or more groups $T_1$ are condensed with (e.g., combined together with) each other (for example, a cyclopentadiene group, an adamantane group, a norbornane group, a benzene group, a pentalene group, a naphthalene group, an azulene group, an indacene group, acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, and/or an indenoanthracene group), the $C_1$-$C_{60}$ heterocyclic group may be i) a group T2, ii) a condensed cyclic group in which two or more groups T2 are condensed with (e.g., combined together with) each other, or iii) a condensed cyclic group in which at least one groups T2 and at least one group T1 are condensed with (e.g., combined together with) each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothieno dibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, and/or an azadibenzofuran group), the π electron-rich $C_3$-$C_{60}$ cyclic group may be i) a group T1, ii) a condensed cyclic group in which two or more groups T1 are condensed with (e.g., combined together with) each other, iii) a group T3, iv) a condensed cyclic group in which two or more groups T3 are condensed with (e.g., combined together with) each other, or v) a condensed cyclic group in which at least one group T3 and at least one group T1 are condensed with (e.g., combined together with) each other (for example, a $C_3$-$C_{60}$ carbocyclic group, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, and/or a benzothienodibenzothiophene group), the π-electron-deficient nitrogen-containing $C_1$-$C_{60}$ cyclic group may be i) a group T4, ii) a condensed cyclic group in which two or more groups T4 are condensed with (e.g., combined together with) each other, iii) a condensed cyclic group in which at least one group T4 and at least one group T1 are condensed with (e.g., combined together with) each other, iv) a condensed cyclic group in which at least one group T4 and at least one group T3 are condensed with (e.g., combined together with) each other, or v) a condensed cyclic group in which at least one group T4, at least one group T1, and at least one group T3 are condensed with (e.g., combined together with) each other (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, and/or an azadibenzofuran group), the group T1 may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane group (or, a bicyclo[2.2.1]heptane group), a norbornene group, a bicyclo[1.1.1]pentane group, a bicyclo[2.1.1]hexane group, a bicyclo[2.2.2]octane group, and/or a benzene group, the group T2 may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, and/or a tetrazine group, the group T3 may be a furan group, a thiophene group, a 1H-pyrrole group, a silole group, and/or a borole group, and the group T4 may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, and/or a tetrazine group.

The terms "the cyclic group," "the $C_3$-$C_{60}$ carbocyclic group," "the $C_1$-$C_{60}$ heterocyclic group," "the π electron-rich $C_3$-$C_{60}$ cyclic group," or "the r-electron-deficient nitrogen-containing $C_1$-$C_{60}$ cyclic group," as used herein, refer to a group that is condensed with (e.g., combined together with) a cyclic group, a monovalent group, a polyvalent group (for example, a divalent group, a trivalent group, a tetravalent group, and/or the like), according to a structure of a formula described with corresponding terms. In one or more embodiments, "a benzene group" may be a benzo group, a phenyl group, a phenylene group, and/or the like, which may be easily understand by one of ordinary skill in the art according to a structure of a formula including the "benzene group."

In an embodiment, examples of the monovalent $C_3$-$C_{60}$ carbocyclic group and the monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_6$ heteroaryl group, a monovalent non-aromatic condensed polycyclic group, and a monovalent non-aromatic condensed heteropolycyclic group, and examples of the divalent $C_3$-$C_{60}$ carbocyclic group and the monovalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a substituted or unsubstituted divalent non-aromatic condensed heteropolycyclic group.

The term "$C_1$-$C_{60}$ alkyl group," as used herein, refers to a linear or branched aliphatic hydrocarbon monovalent group having 1 to 60 carbon atoms, and examples thereof include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group," as used herein, refers to a divalent group having substantially the same structure as the $C_1$-$C_6$ alkyl group.

The term "$C_2$-$C_{60}$ alkenyl group," as used herein, refers to a monovalent hydrocarbon group having at least one carbon-carbon double bond at a main chain (e.g., in the middle) or at a terminal end (e.g., the terminus) of a $C_2$-$C_{60}$ alkyl group, and examples thereof include an ethenyl group, a propenyl group, and a butenyl group. The term "$C_2$-$C_{60}$ alkenylene group," as used herein, refers to a divalent group having substantially the same structure as the $C_2$-$C_{60}$ alkenyl group.

The term "$C_2$-$C_{60}$ alkynyl group," as used herein, refers to a monovalent hydrocarbon group having at least one carbon-carbon triple bond at a main chain (e.g., in the middle) or at a terminal end (e.g., the terminus) of a $C_2$-$C_{60}$ alkyl group, and examples thereof include an ethynyl group and a propynyl group. The term "$C_2$-$C_{60}$ alkynylene group," as used herein, refers to a divalent group having substantially the same structure as the $C_2$-$C_{60}$ alkynyl group.

The term "$C_1$-$C_{60}$ alkoxy group," as used herein, refers to a monovalent group represented by —$OA_{101}$ (wherein $A_{101}$ is the $C_1$-$C_{60}$ alkyl group), and examples thereof include a methoxy group, an ethoxy group, and an isopropyloxy group.

The term "$C_3$-$C_{10}$ cycloalkyl group," as used herein, refers to a monovalent saturated hydrocarbon cyclic group having 3 to 10 carbon atoms, and examples thereof include a cyclopropyl group, a cyclobutyl group, a cyclopentyl group, a cyclohexyl group, a cycloheptyl group, a cyclooctyl group, an adamantanyl group, a norbornanyl group (or a bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group," as used herein, refers to a divalent group having substantially the same structure as the $C_3$-$C_{10}$ cycloalkyl group.

The term "$C_1$-$C_{10}$ heterocycloalkyl group," as used herein, refers to a monovalent cyclic group that further includes, in addition to a carbon atom, at least one heteroatom as a ring-forming atom and has 1 to 10 carbon atoms, and examples thereof include a 1,2,3,4-oxatriazolidinyl group, a tetrahydrofuranyl group, and a tetrahydrothiophenyl group. The term "$C_1$-$C_{10}$ heterocycloalkylene group," as used herein, refers to a divalent group having substantially the same structure as the $C_1$-$C_{10}$ heterocycloalkyl group.

The term "$C_3$-$C_{10}$ cycloalkenyl group," as used herein, refers to a monovalent cyclic group that has 3 to 10 carbon atoms and at least one carbon-carbon double bond in the ring thereof and no aromaticity (e.g., is not aromatic), and examples thereof include a cyclopentenyl group, a cyclohexenyl group, and a cycloheptenyl group. The term "$C_3$-$C_{10}$ cycloalkenylene group," as used herein, refers to a divalent group having substantially the same structure as the $C_3$-$C_{10}$ cycloalkenyl group.

The term "$C_1$-$C_{10}$ heterocycloalkenyl group," as used herein, refers to a monovalent cyclic group that has, in addition to a carbon atom, at least one heteroatom as a ring-forming atom, 1 to 10 carbon atoms, and at least one carbon-carbon double bond in the cyclic structure thereof. Examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group," as used herein, refers to a divalent group having substantially the same structure as the $C_1$-$C_{10}$ heterocycloalkenyl group.

The term "$C_6$-$C_{60}$ aryl group," as used herein, refers to a monovalent group having a carbocyclic aromatic system having 6 to 60 carbon atoms, and the term "$C_6$-$C_{60}$ arylene group," as used herein, refers to a divalent group having a carbocyclic aromatic system having 6 to 60 carbon atoms. Examples of the $C_6$-$C_{60}$ aryl group include a fluorenyl group, a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each include two or more rings, the two or more rings may be fused to each other (e.g., combined together with each other).

The term "$C_1$-$C_{60}$ heteroaryl group," as used herein, refers to a monovalent group having a heterocyclic aromatic system that has, in addition to a carbon atom, at least one heteroatom as a ring-forming atom, and 1 to 60 carbon atoms. The term "$C_1$-$C_{60}$ heteroarylene group," as used herein, refers to a divalent group having a heterocyclic aromatic system that has, in addition to a carbon atom, at least one heteroatom as a ring-forming atom, and 1 to 60 carbon atoms. Examples of the $C_1$-$C_{60}$ heteroaryl group include a carbazolyl group, a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each include two or more rings, the two or more rings may be condensed with each other (e.g., combined together with each other).

The term "monovalent non-aromatic condensed polycyclic group," as used herein, refers to a monovalent group (for example, having 8 to 60 carbon atoms) having two or more rings condensed with each other (e.g., combined together with each other), only carbon atoms as ring-forming atoms, and non-aromaticity in its entire molecular structure (e.g., is not aromatic when considered as a whole). Examples of the monovalent non-aromatic condensed polycyclic group include an indenyl group, a fluorenyl group, a spiro-bifluorenyl group, a benzofluorenyl group, an indenophenanthrenyl group, and an indenoanthracenyl group. The term "divalent non-aromatic condensed polycyclic group," as used herein, refers to a divalent group having substantially the same structure as the monovalent non-aromatic condensed polycyclic group.

The term "monovalent non-aromatic condensed heteropolycyclic group," as used herein, refers to a monovalent group (for example, having 1 to 60 carbon atoms) having two or more rings condensed to each other (e.g., combined together with each other), at least one heteroatom other than carbon atoms, as a ring-forming atom, and non-aromaticity in its entire molecular structure (e.g., is not aromatic when considered as a whole). Examples of the monovalent non-aromatic condensed heteropolycyclic group include a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic condensed heteropolycyclic group," as used herein, refers to a divalent group having substantially the same structure as the monovalent non-aromatic condensed heteropolycyclic group.

The term "$C_6$-$C_{60}$ aryloxy group," as used herein, refers to —$OA_{102}$ (wherein $A_{102}$ is the $C_6$-$C_{60}$ aryl group), and the term "$C_6$-$C_{60}$ arylthio group," as used herein, refers to—$SA_{103}$ (wherein $A_{103}$ is the $C_6$-$C_{60}$ aryl group).

The term "$R_{10a}$," as used herein, refers to:
deuterium (-D), —F, —$C_1$, —Br, —I, a hydroxyl group, a cyano group, or a nitro group;
a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —$C_1$, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;
a $C_3$-$C_{60}$ carbocyclic group, a $C_1$-$C_6$ heterocyclic group, a $C_6$-$C_{60}$ aryloxy group, or a $C_6$-$C_{60}$ arylthio group, each unsubstituted or substituted with deuterium, —F, —$C_1$, —Br, —I, a hydroxyl group, a cyano group, a nitro group, a $C_1$-$C_6$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or [00365]—Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$).

$Q_1$ to $Q_3$, $Q_{11}$ to $Q_{13}$, $Q_{21}$ to $Q_{23}$ and $Q_{31}$ to $Q_{33}$ used herein may each independently be: hydrogen; deuterium; —F; —$C_1$; —Br; —I; a hydroxyl group; a cyano group; a nitro group; a $C_1$-$C_6$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_6$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

The term "heteroatom," as used herein, refers to any atom other than a carbon atom. Examples of the heteroatom include O, S, N, P, Si, B, Ge, Se, and any combination thereof.

The term "Ph," as used herein, refers to a phenyl group, the term "Me," as used herein, refers to a methyl group, the term "Et," as used herein, refers to an ethyl group, the term "ter-Bu" or "Bu$^t$," as used herein, refers to a tert-butyl group, and the term "OMe," as used herein, refers to a methoxy group.

The term "biphenyl group," as used herein, refers to "a phenyl group substituted with a phenyl group." In other words, the "biphenyl group" is a substituted phenyl group having a $C_6$-$C_{60}$ aryl group as a substituent.

The term "terphenyl group," as used herein, refers to "a phenyl group substituted with a biphenyl group." In other words, the "terphenyl group" is a substituted phenyl group having, as a substituent, a $C_6$-$C_{60}$ aryl group substituted with a $C_6$-$C_{60}$ aryl group.

and*', as used herein, unless defined otherwise, each refer to a binding site to a neighboring atom in a corresponding formula.

Hereinafter, a compound according to embodiments and an organic light-emitting device according to embodiments will be described in more detail with reference to Synthesis Examples and Examples. The wording "B was used instead of A" used in describing Synthesis Examples refers to that an identical molar equivalent of B was used in place of A.

Synthesis Example

Synthesis Example 1: Synthesis of Compound 1

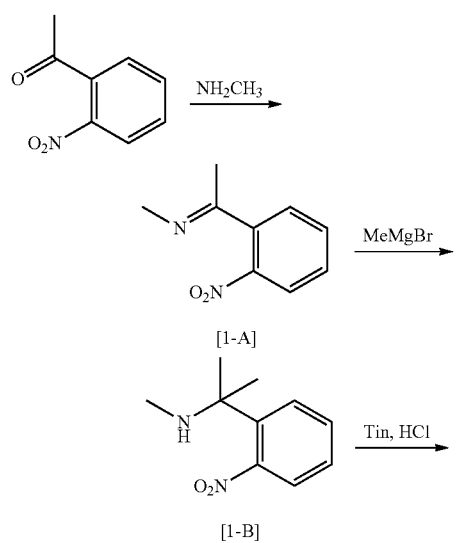

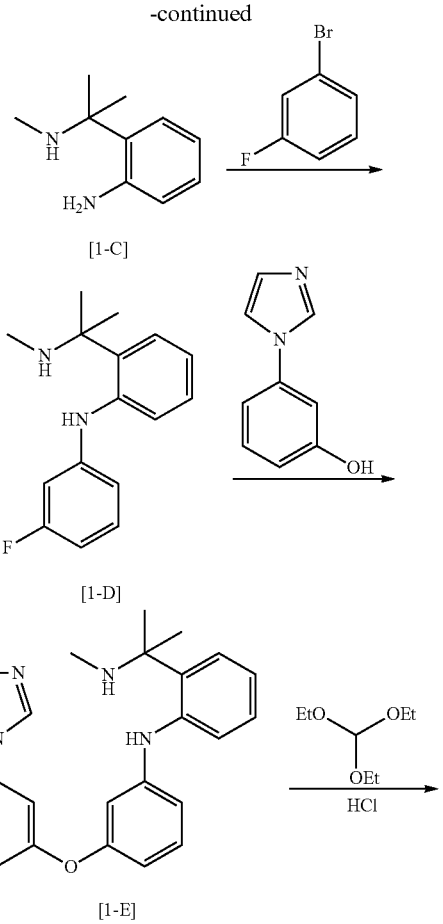

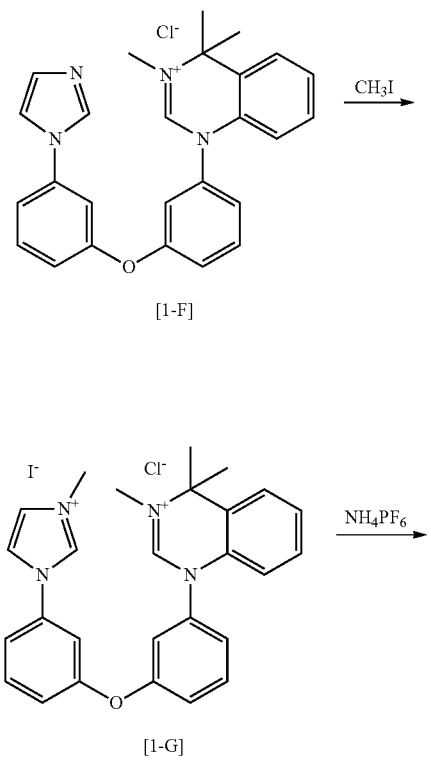

-continued

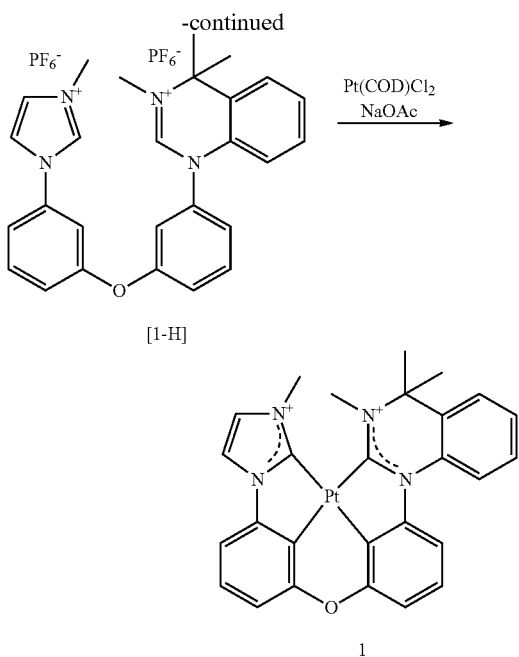

[1-H]

1

1) Synthesis of Intermediate [1-A]

8.3 g (50 mmol) of 2'-nitroacetophenone and 4.7 g (150 mmol) of methylamine were added to a reaction vessel coupled to a Dean-Stark trap and suspended in 250 ml of toluene. Reaction temperature was raised to 110° C., and the resultant mixture was stirred for 24 hours. After completion of the reaction, the mixture was cooled at room temperature and the solvent was removed therefrom, to thereby obtain 8.2 g (46 mmol) of a target compound (Intermediate [1-A]).

2) Synthesis of Intermediate [1-B]

8.2 g (46 mmol) of Intermediate [1-A] was added to a reaction vessel and suspended in 100 ml of tetrahydrofuran. 17 ml of a methylmagnesium bromide solution (3.0 M in diethylether) was slowly added thereto at −78° C. Reaction temperature was raised to room temperature, and the resultant mixture was stirred for 24 hours. After completion of the reaction, 200 ml of distilled water was added thereto and an extraction process was performed thereon using ethyl acetate. An extracted organic layer was washed with a saturated aqueous sodium chloride solution and dried by using sodium sulfate. A residue obtained by removing the solvent therefrom was separated by column chromatography to thereby obtain 7.4 g (38 mmol) of a target compound (Intermediate [1-B]).

3) Synthesis of Intermediate [1-C]

7.4 g (38 mmol) of Intermediate [1-B], 15.8 g (133 mmol) of tin, and 21.8 g (209 mmol) of an HCl 35 wt % solution were added to a reaction vessel suspended in 380 ml of ethanol. Reaction temperature was raised to 80° C., and the resultant mixture was stirred for 12 hours. After completion of the reaction, the reaction product was cooled at room temperature, and then, saturated aqueous sodium bicarbonate solution was used to perform neutralization. Ethyl acetate was used to perform an extraction, and an extracted organic layer was washed with a saturated aqueous sodium chloride solution and dried by using sodium sulfate. A residue obtained by removing the solvent therefrom was separated by column chromatography to thereby obtain 5.6 g (34 mmol) of a target compound (Intermediate [1-C]).

4) Synthesis of Intermediate [1-D]

5.6 g (34 mmol) of Intermediate [1-C], 6.7 g (38 mmol) of 3-bromofluoro benzene, 920 mg (1.0 mmol) of tris(dibenzylideneacetone)dipalladium(0), 700 mg (1.7 mmol) of 2-dicyclohexylphosphino-2',6'-dimethoxybiphenyl, 6.6 g (68 mmol) of sodium tert-butoxide were added to a reaction vessel and suspended in 340 ml of toluene. The resultant reaction mixture was heated, and stirred at the temperature of 110° C. for 12 hours. After completion of the reaction, the reaction product was cooled at room temperature, 200 ml of distilled water was added thereto, and ethyl acetate was used to perform an extraction. An extracted organic layer was washed with a saturated aqueous sodium chloride solution and dried by using sodium sulfate. A residue obtained by removing the solvent therefrom was separated by column chromatography to thereby obtain 6.5 g (25 mmol) of a target compound (Intermediate [1-D]).

5) Synthesis of Intermediate [1-E]

6.5 g (25 mmol) of Intermediate [1-D], 8.0 g (20 mmol) of 3-(1H-imidazol-1-yl)phenol, and 8.5 g (40 mmol) of potassium phosphate were added to a reaction vessel and suspended in 200 ml of dimethylformamide. The resultant reaction mixture was heated, and stirred at the temperature of 160° C. for 12 hours. After completion of the reaction, the reaction product was cooled at room temperature, 200 ml of distilled water was added thereto, and ethyl acetate was used to perform an extraction. An extracted organic layer was washed with a saturated aqueous sodium chloride solution and dried by using sodium sulfate. A residue obtained by removing the solvent therefrom was separated by column chromatography to thereby obtain 6.8 g (17 mmol) of a target compound (Intermediate [1-E]).

6) Synthesis of Intermediate [1-F]

6.8 g (17 mmol) of Intermediate [1-E], 125 ml (850 mmol) of triethyl orthoformate, and 9.7 g (94 mmol) of an HCl 35 wt % solution were added to a reaction vessel, heated, and then stirred at 80° C. for 12 hours. After completion of the reaction, the resultant mixture was cooled at room temperature, and a residue obtained by removing the solvent therefrom was separated by column chromatography to thereby obtain 5.8 g (13 mmol) of a target compound (Intermediate [1-F]).

7) Synthesis of Intermediate [1-G]

5.8 g (13 mmol) of Intermediate [1-F] and 5.5 g (39 mmol) of iodomethane were added to a reaction vessel and suspended in 130 ml of toluene. The resultant reaction mixture was heated, and stirred at the temperature of 110° C. for 12 hours. After completion of the reaction, the reaction product was cooled at room temperature to remove a certain portion of the solvent, and then distilled water was added thereto to filter out a resulting solid. The filtered solid was purified using a recrystallization method to thereby obtain 5.3 g (9.0 mmol) of a target compound (Intermediate [1-G]).

8) Synthesis of Intermediate [1-H]

5.3 g (9.0 mmol) of Intermediate [1-G] and 4.4 g (27 mmol) of ammonium hexafluorophosphate were added to a reaction vessel and suspended in a solution containing methanol and water in a ratio of 2:1. The resultant reaction mixture was stirred at room temperature for 12 hours. A resulting solid was filtered out and purified using a recrystallization method, to thereby obtain 4.4 g (6.1 mmol) of a target compound (Intermediate [1-H]).

9) Synthesis of Compound 1

4.4 g (6.1 mmol) of Intermediate [1-H], 2.5 g (6.7 mmol) of dichloro(1,5-cyclooctadiene)platinum, and 1.0 g (12.2 mmol) of sodium acetate were suspended in 240 ml of dioxane. The resultant reaction mixture was heated, and stirred at the temperature of 110° C. for 72 hours. After completion of the reaction, the reaction product was cooled at room temperature, 220 ml of distilled water was added thereto, and ethyl acetate was used to perform an extraction. An extracted organic layer was washed with a saturated aqueous sodium chloride solution and dried by using sodium sulfate. A residue obtained by removing the solvent therefrom was separated by column chromatography to thereby obtain 430 mg (0.7 mmol) of a target compound (Compound 1).

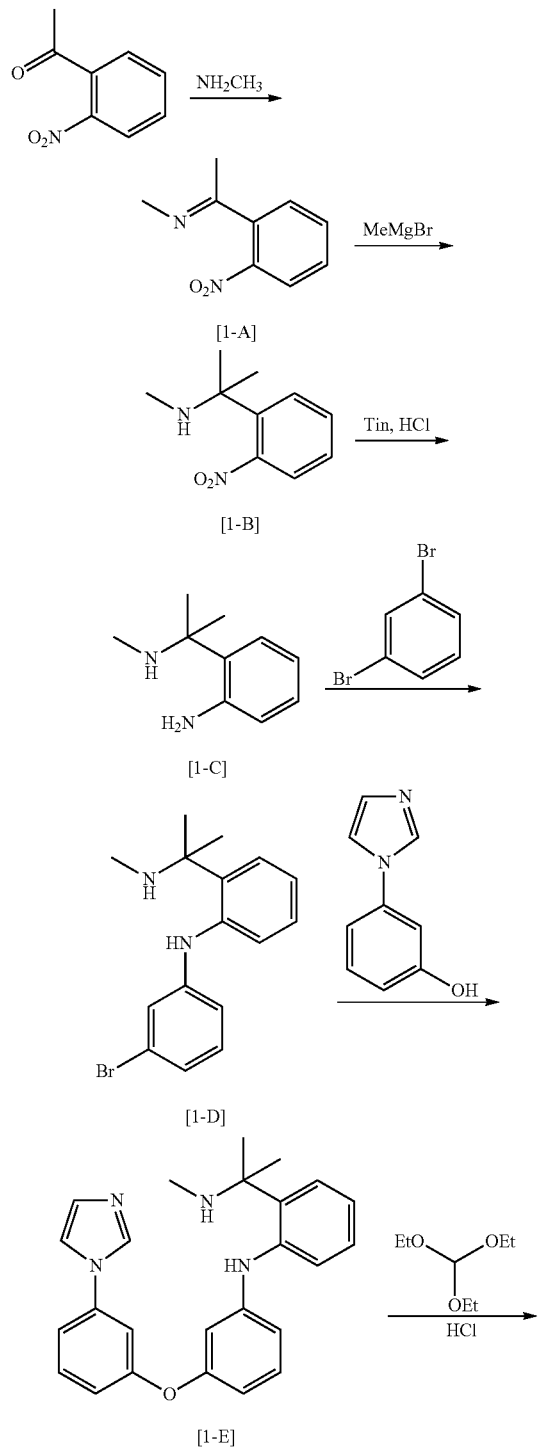

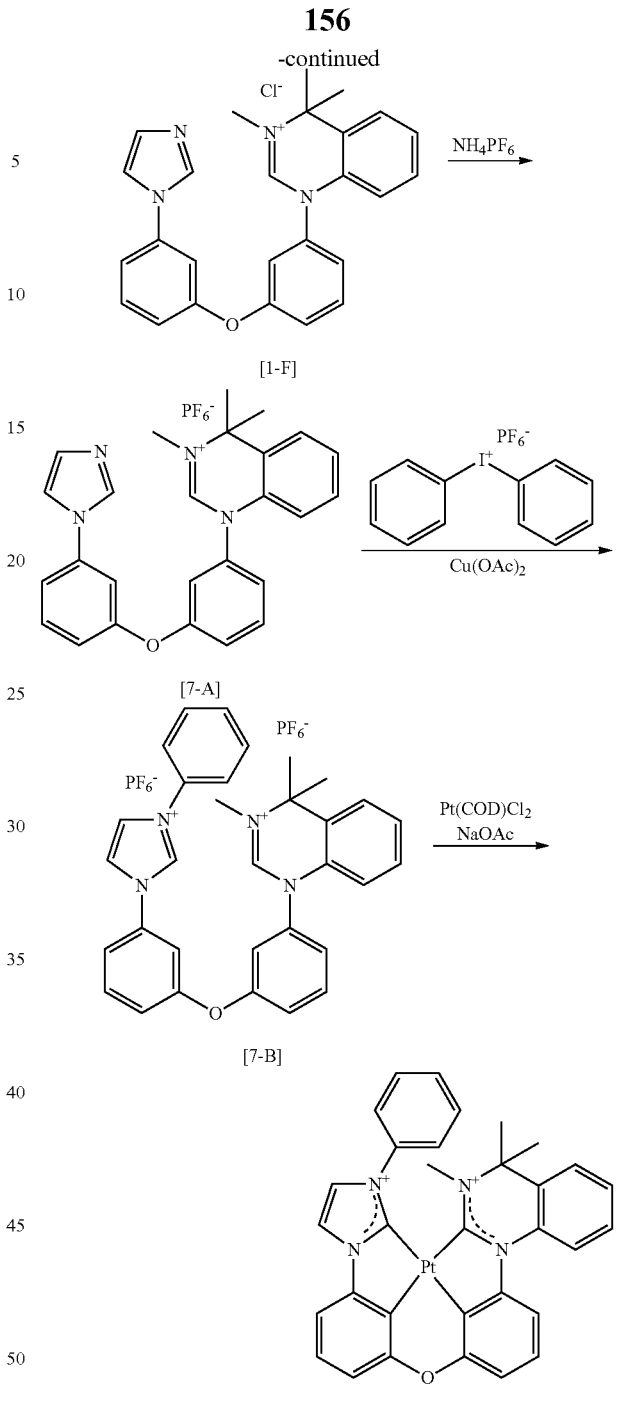

Synthesis Example 2: Synthesis of Compound 7

1) Synthesis of Intermediate [7-A]

5.8 g (13 mmol) of Intermediate [1-F] and 4.2 g (26 mmol) of ammonium hexafluorophosphate were added to a reaction vessel and suspended in a solution containing methanol and water in a ratio of 2:1. The resultant reaction mixture was stirred at room temperature for 12 hours. A resulting solid was filtered out and separated by column chromatography to thereby obtain 6.7 g (12 mmol) of a target compound (Intermediate [7-A]).

2) Synthesis of Intermediate [7-B]

6.7 g (12 mmol) of Intermediate [7-A], 5.5 g (13 mmol) of diphenyliodonium hexafluorophosphate, and 110 mg (0.6 mmol) of copper acetate were suspended in 240 ml of dimethylformamide. The resultant reaction mixture was heated, and stirred at the temperature of 120° C. for 12 hours. After completion of the reaction, the reaction product was cooled at room temperature, 220 ml of distilled water was added thereto, and ethyl acetate was used to perform an extraction. An extracted organic layer was washed with a saturated aqueous sodium chloride solution and dried by using sodium sulfate. A residue obtained by removing the solvent therefrom was separated using a recrystallization method to thereby obtain 5.4 g (7.0 mmol) of a target compound (Intermediate [7-B]).

3) Synthesis of Compound 7

5.4 g (7.0 mmol) of Intermediate [7-B], 2.9 g (7.7 mmol) of dichloro(1,5-cyclooctadiene)platinum, and 1.1 g (14 mmol) of sodium acetate were suspended in 280 ml of dioxane. The resultant reaction mixture was heated, and stirred at the temperature of 110° C. for 72 hours. After completion of the reaction, the reaction product was cooled at room temperature, 280 ml of distilled water was added thereto, and ethyl acetate was used to perform an extraction. An extracted organic layer was washed with a saturated aqueous sodium chloride solution and dried by using sodium sulfate. A residue obtained by removing the solvent therefrom was separated by column chromatography to thereby obtain 610 mg (0.9 mmol) of a target compound (Compound 7).

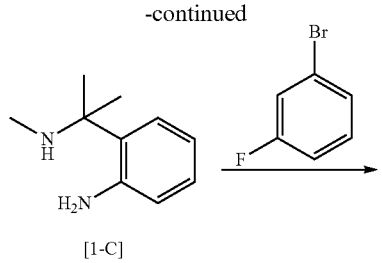

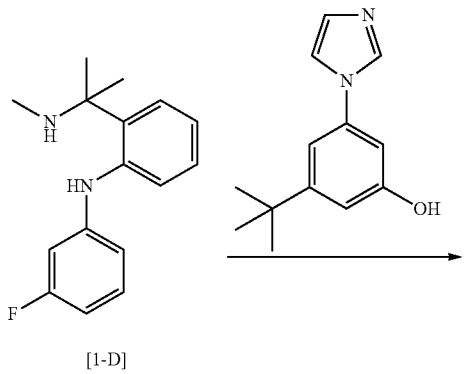

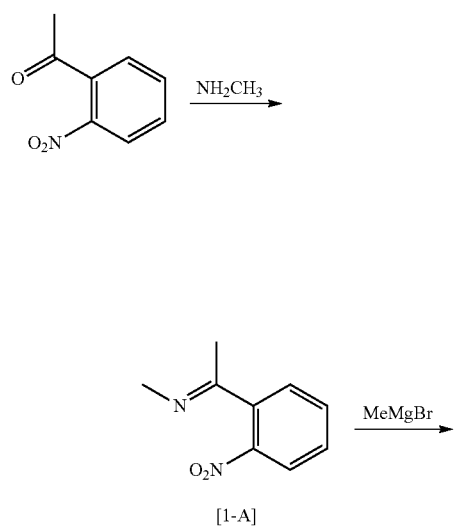

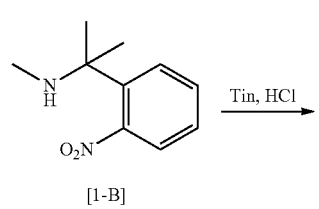

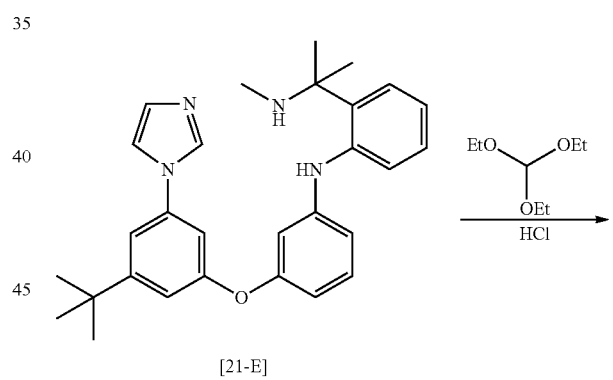

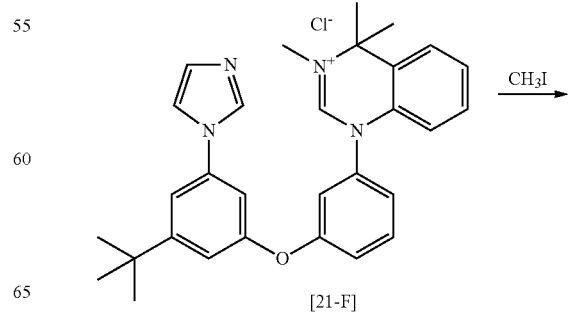

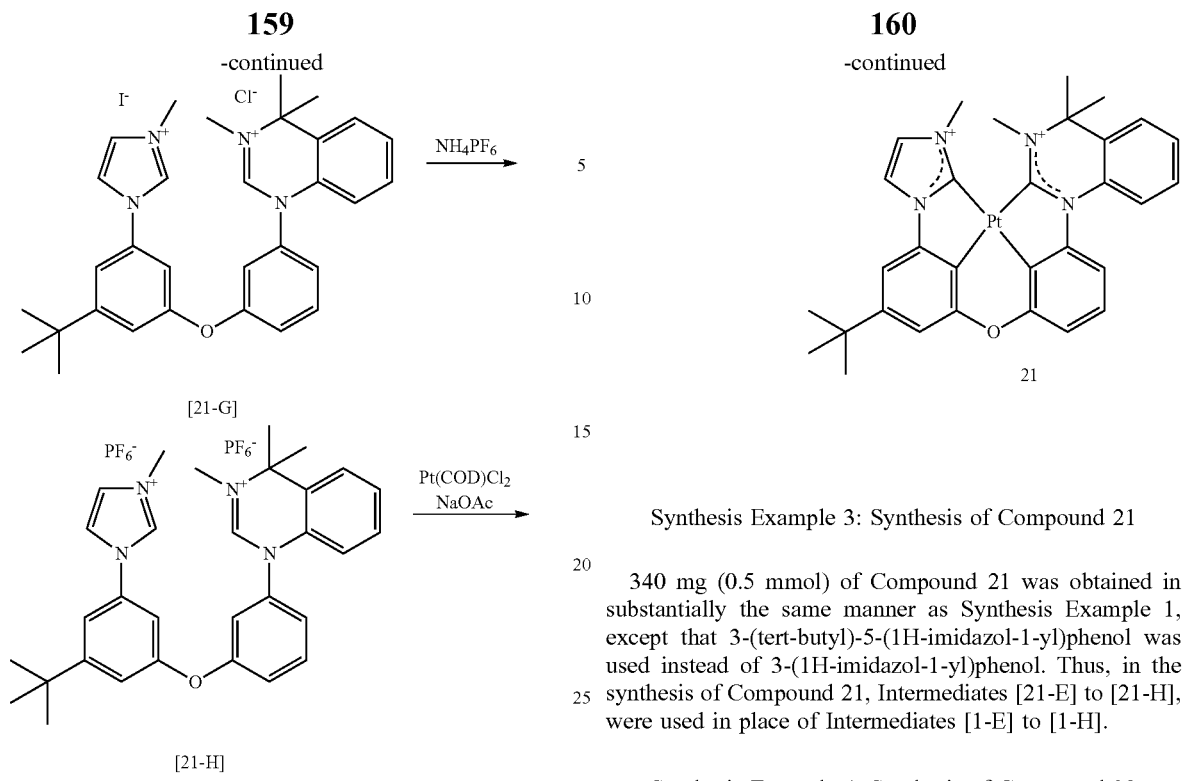
Synthesis Example 3: Synthesis of Compound 21
340 mg (0.5 mmol) of Compound 21 was obtained in substantially the same manner as Synthesis Example 1, except that 3-(tert-butyl)-5-(1H-imidazol-1-yl)phenol was used instead of 3-(1H-imidazol-1-yl)phenol. Thus, in the synthesis of Compound 21, Intermediates [21-E] to [21-H], were used in place of Intermediates [1-E] to [1-H].
Synthesis Example 4: Synthesis of Compound 32

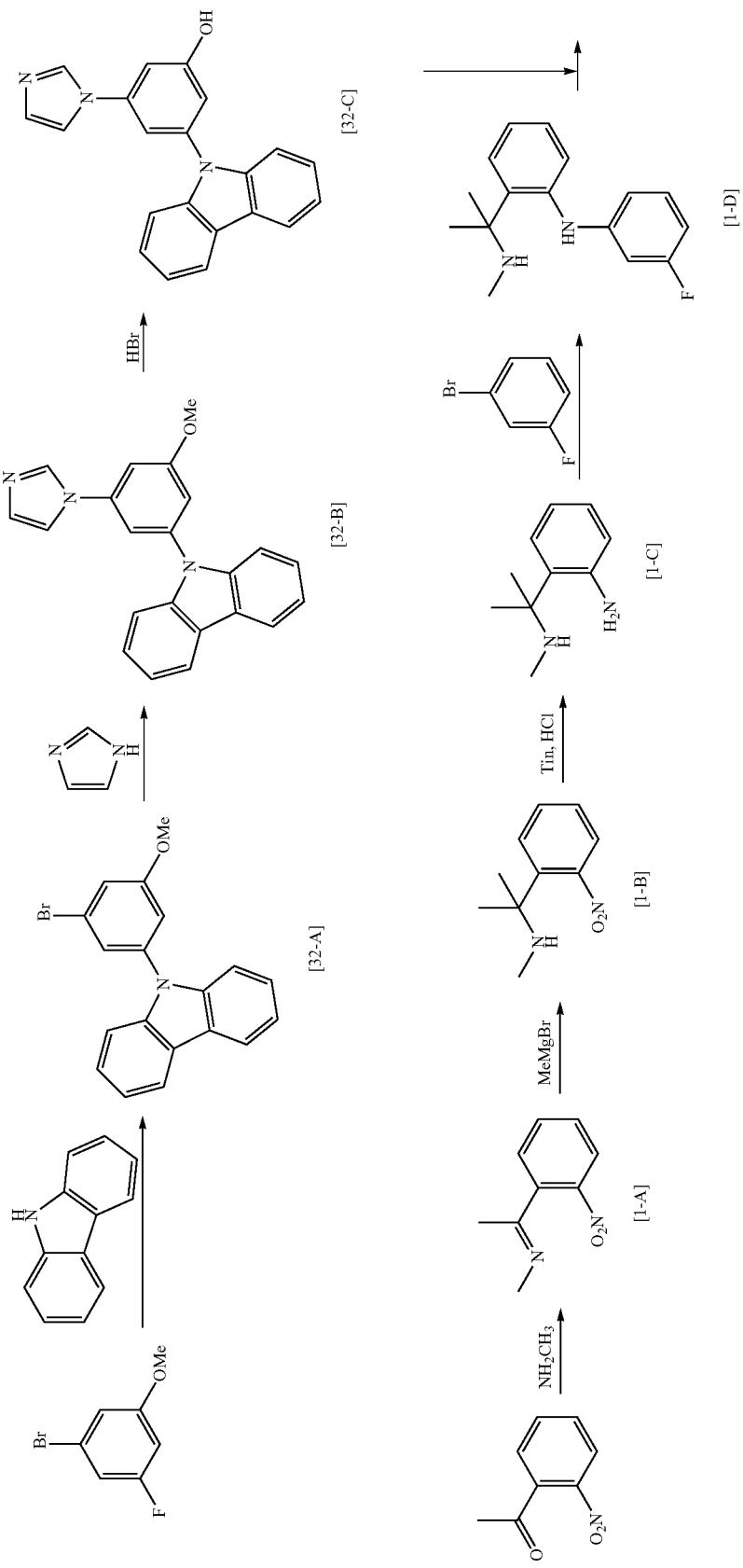

-continued
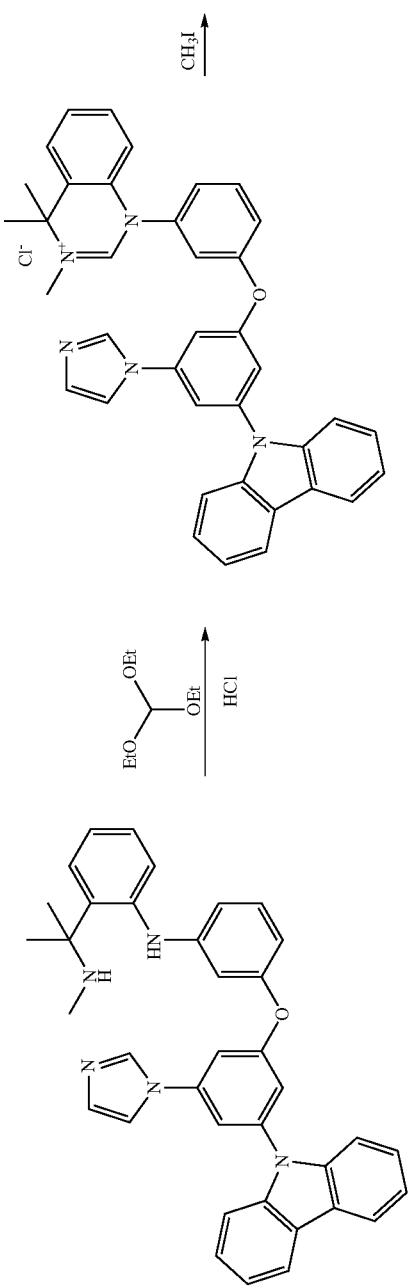
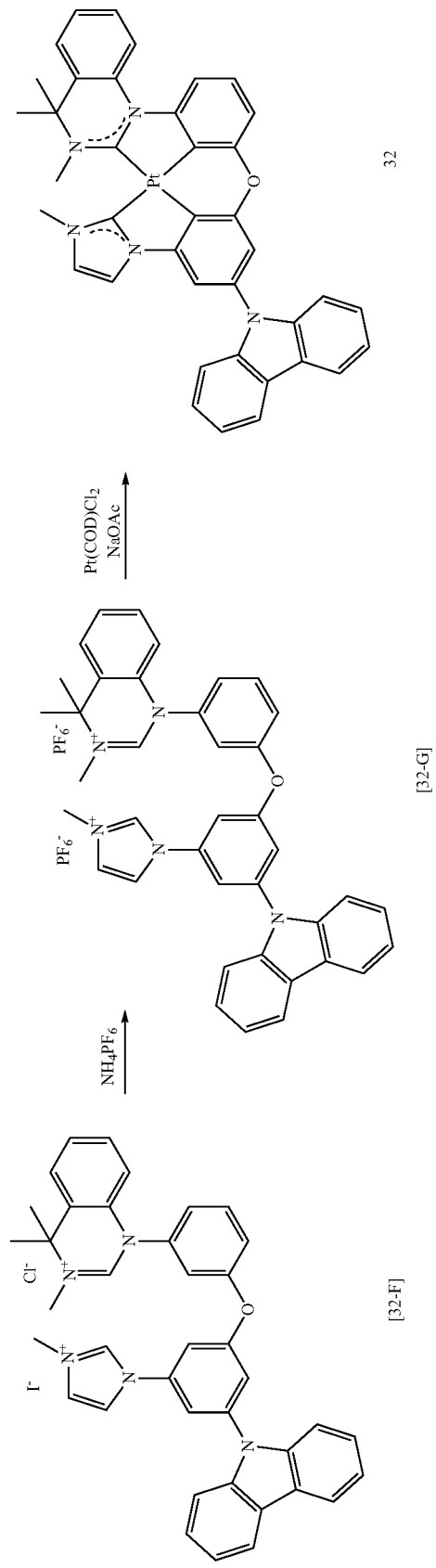

1) Synthesis of Intermediate [32-A]

8.2 g (40 mmol) of 1-bromo-3-fluoro-5-methoxybenzene, 13.4 g (80 mmol) of carbazole, and 17.0 g (80 mmol) of tripotassium phosphate were suspended in 200 ml of dimethylformamide. The resultant reaction mixture was heated, and stirred at the temperature of 160° C. for 12 hours. After completion of the reaction, the reaction product was cooled at room temperature, 200 ml of distilled water was added thereto, and ethyl acetate was used to perform an extraction. An extracted organic layer was washed with a saturated aqueous sodium chloride solution and dried by using sodium sulfate. A residue obtained by removing the solvent therefrom was separated by column chromatography to thereby obtain 12.0 g (34 mmol) of a target compound (Intermediate [32-A]).

2) Synthesis of Intermediate [32-B]

12.0 g (34 mmol) of Intermediate [32-A], 4.6 g (68 mmol) of imidazole, 650 mg (3.4 mmol) of copper(I) iodide, 390 mg (3.4 mmol) of L-Proline, and 14.4 g (68 mmol) of tripotassium phosphate were suspended in 170 ml of dimethylformamide. The resultant reaction mixture was heated, and stirred at the temperature of 160° C. for 12 hours. After completion of the reaction, the reaction product was cooled at room temperature, 170 ml of distilled water was added thereto, and ethyl acetate was used to perform an extraction. An extracted organic layer was washed with a saturated aqueous sodium chloride solution and dried by using sodium sulfate. A residue obtained by removing the solvent therefrom was separated by column chromatography to thereby obtain 8.8 g (26 mmol) of a target compound (Intermediate [32-B]).

3) Synthesis of Intermediate [32-C]

8.8 g (26 mmol) of Intermediate [32-B] was suspended in an excess of bromic acid. The resultant reaction mixture was heated, and stirred at the temperature of 120° C. for 12 hours. After completion of the reaction, the reaction product was cooled at room temperature, a saturated aqueous sodium bicarbonate solution was added thereto to perform neutralization, and ethyl acetate was used to perform an extraction. An extracted organic layer was washed with a saturated aqueous sodium chloride solution and dried by using sodium sulfate. A residue obtained by removing the solvent therefrom was separated by column chromatography to thereby obtain 6.8 g (21 mmol) of a target compound (Intermediate [32-C]).

4) Synthesis of Compound 32

310 mg (0.4 mmol) of Compound 32 was obtained in substantially the same manner as in Synthesis Example 1, except that, after the synthesis of Intermediate [1-D], Intermediate [32-C] was used instead of 3-(1H-imidazol-1-yl)phenol. Thus, in the synthesis of Compound 32, Intermediates [32-D] to [32-G], were used in place of Intermediates [1-E] to [1-H].

Synthesis Example 5: Synthesis of Compound 41

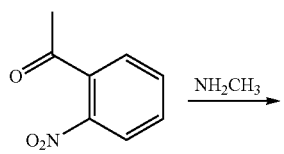

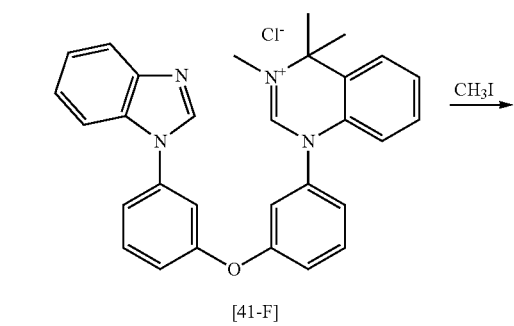

167
-continued
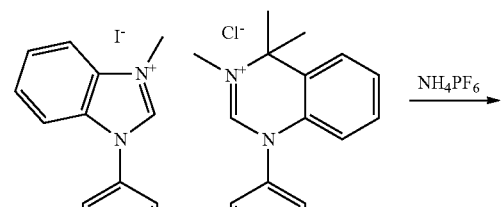
[41-G]
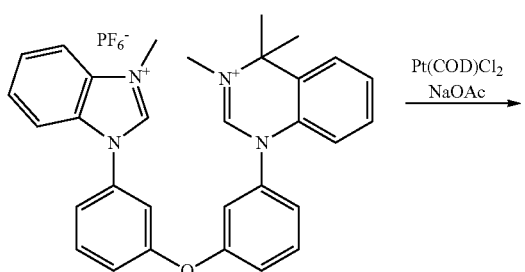
[41-H]
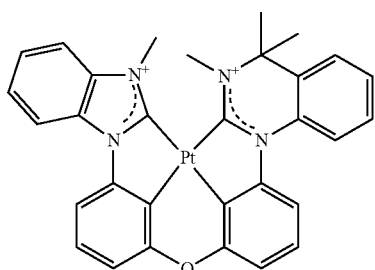
41
270 mg (0.4 mmol) of Compound 41 was obtained in substantially the same manner as in Synthesis Example 1, except that benzimidazole was used instead of imidazole. Thus, in the synthesis of Compound 41, Intermediates [41-E] to [41-H], were used in place of Intermediates [1-E] to [1-H].
Synthesis Example 6: Synthesis of Compound 47
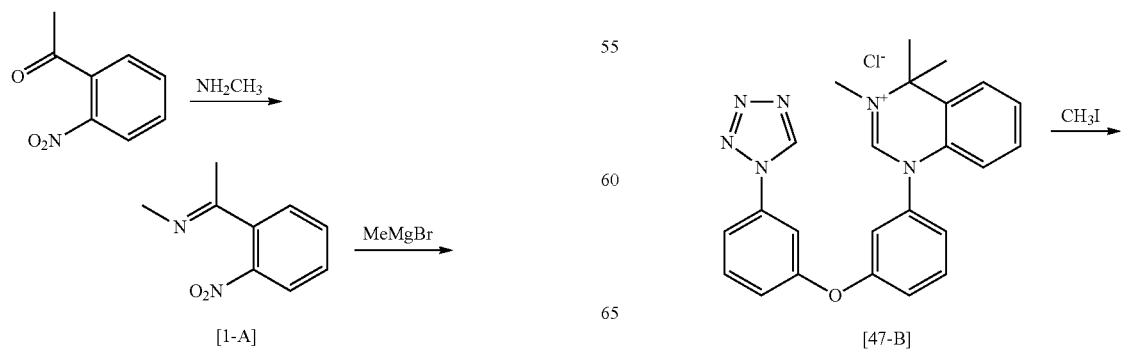
168
-continued
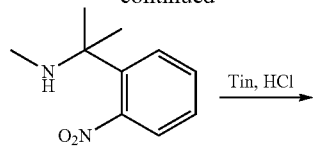
[1-B]
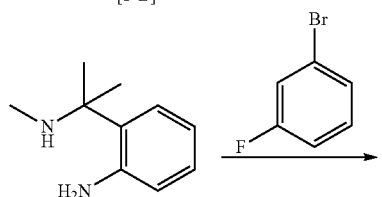
[1-C]
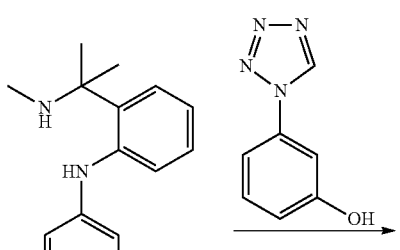
[1-D]
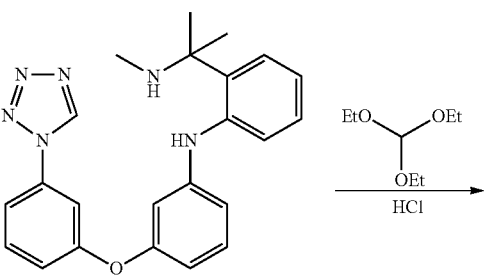
[47-A]
[47-B]

-continued
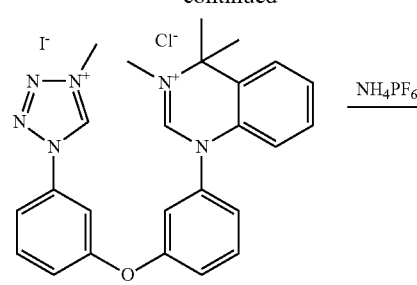
[47-C]
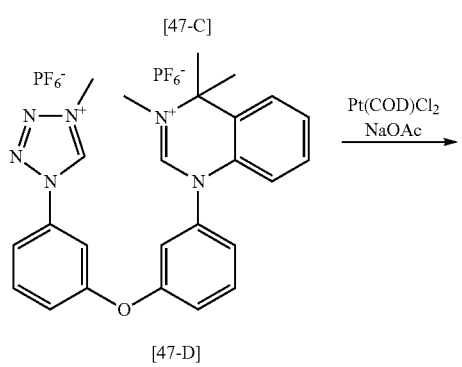
[47-D]
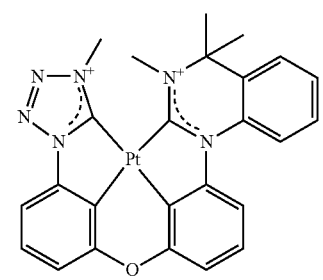
47
190 mg (0.3 mmol) of Compound 47 was obtained in substantially the same manner as in Synthesis Example 1, except that 3-(1H-tetrazol-1-yl)phenol was used instead of 3-(1H-imidazol-1-yl)phenol. Thus, in the synthesis of Compound 47, Intermediates [47-A] to [47-D], were used in place of Intermediates [1-E] to [1-H].
Synthesis Example 7: Synthesis of Compound 61
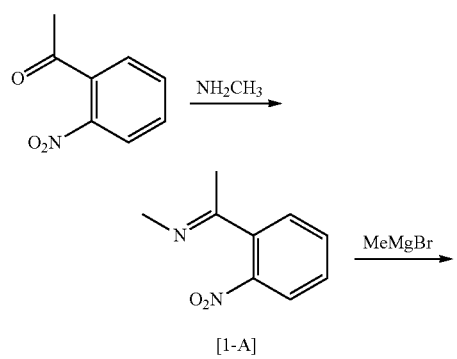
[1-A]
-continued
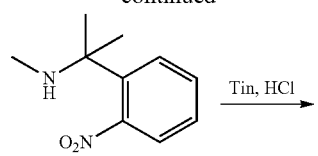
[1-B]
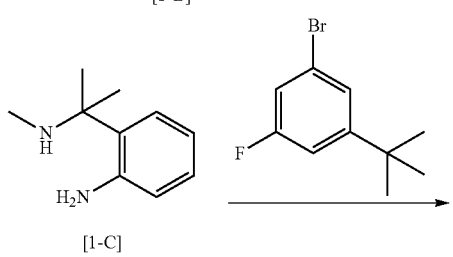
[1-C]
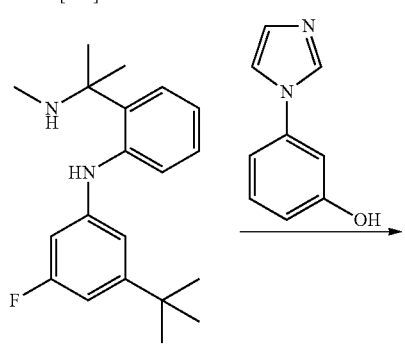
[61-D]
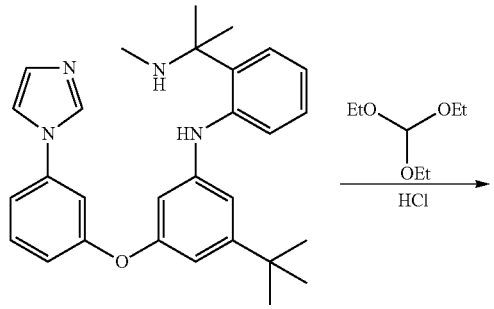
[61-E]
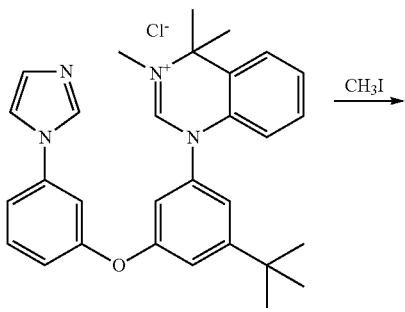
[61-F]

-continued
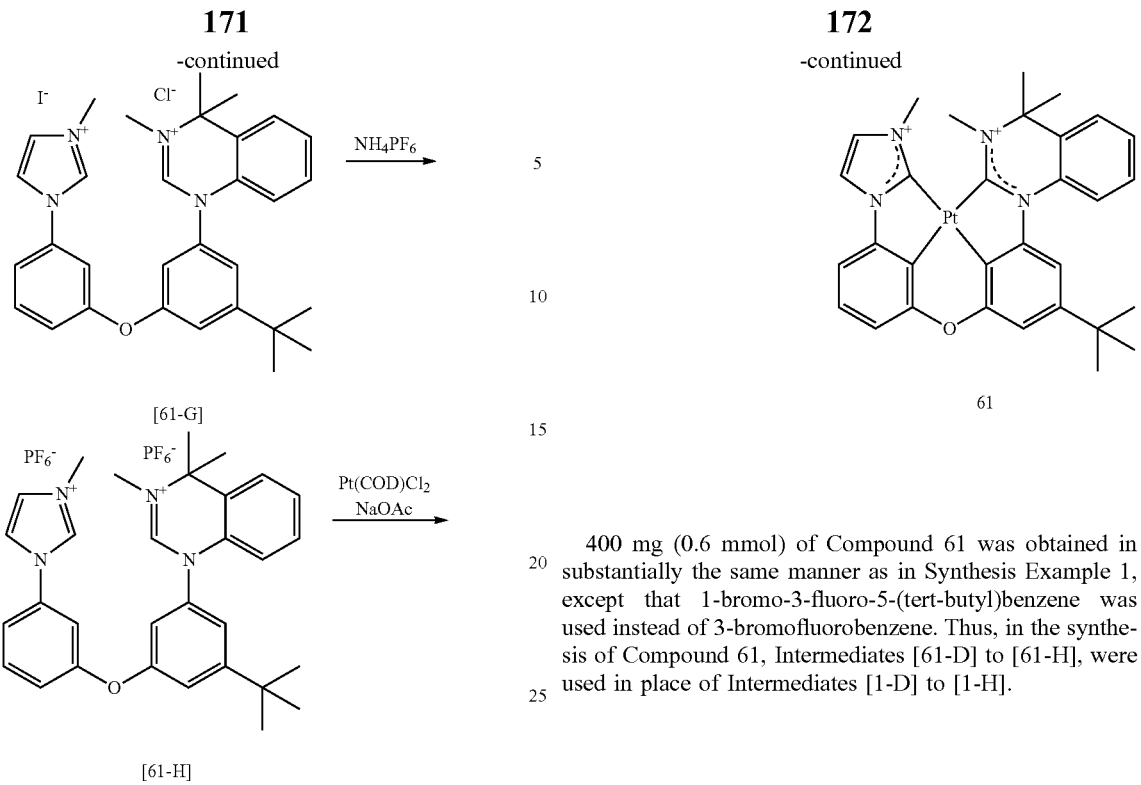
400 mg (0.6 mmol) of Compound 61 was obtained in substantially the same manner as in Synthesis Example 1, except that 1-bromo-3-fluoro-5-(tert-butyl)benzene was used instead of 3-bromofluorobenzene. Thus, in the synthesis of Compound 61, Intermediates [61-D] to [61-H], were used in place of Intermediates [1-D] to [1-H].
Synthesis Example 8: Synthesis of Compound 99
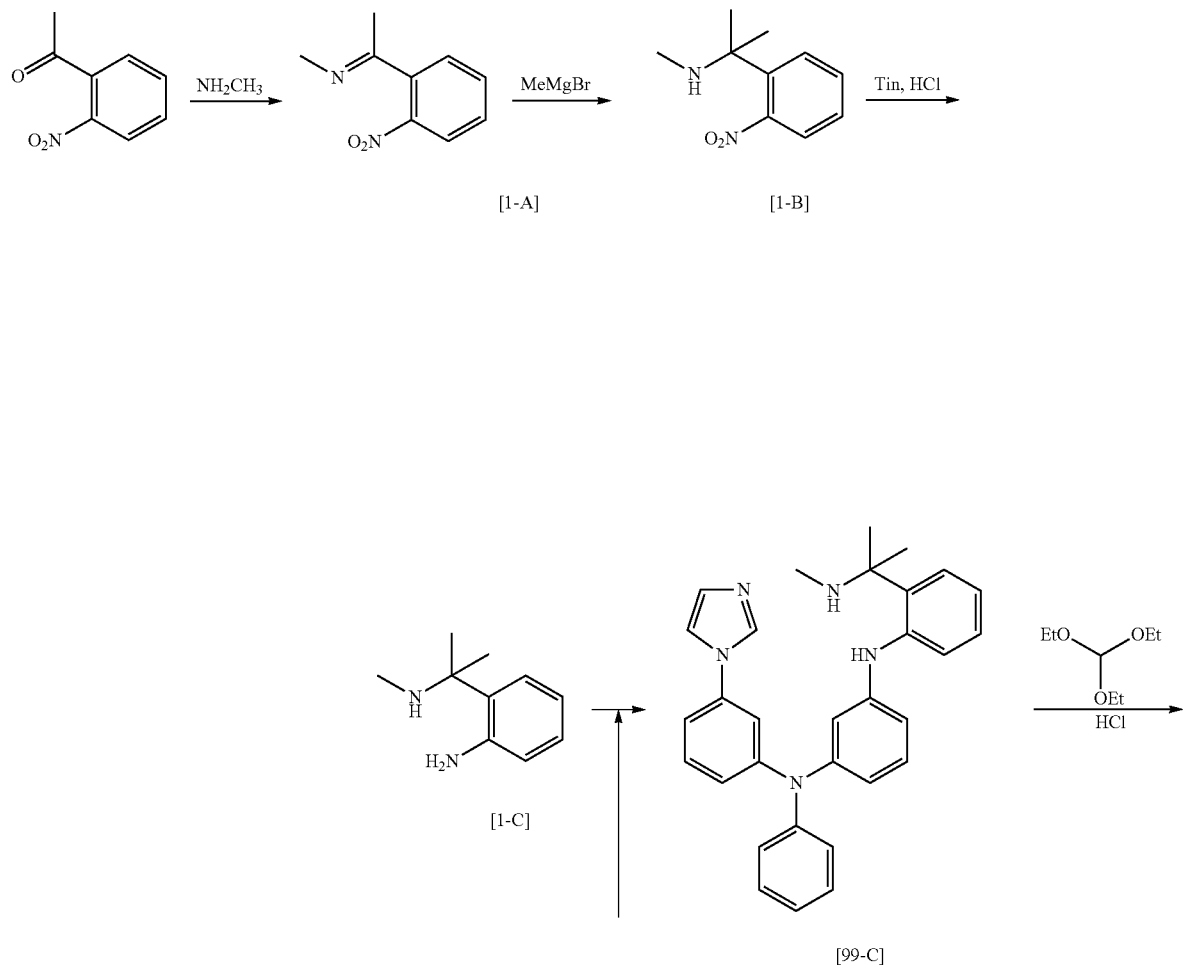

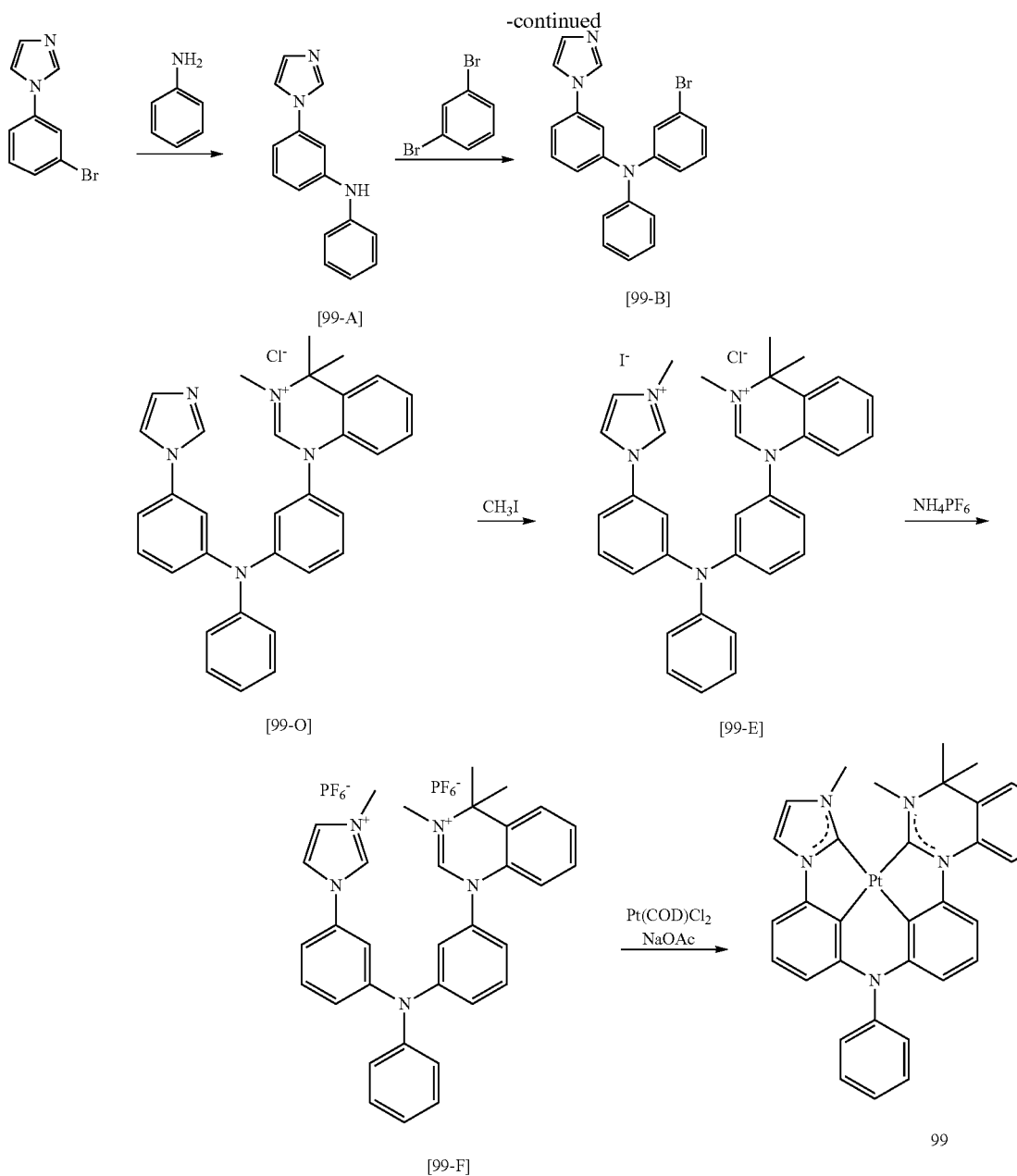

1) Synthesis of Intermediate [99-A]

4.7 g (50 mmol) of aniline, 22.3 g (100 mmol) of 1-(3-bromophenyl)-1H-imidazole, 1.1 g (1.2 mmol) of tris(dibenzylideneacetone)dipalladium(0), 820 mg (2.0 mmol) of 2-dicyclohexylphosphino-2',6'-dimethoxybiphenyl, and 9.7 g (100 mmol) of sodium tert-butoxide were added to a reaction vessel and suspended in 500 ml of toluene. The resultant reaction mixture was heated, and stirred at the temperature of 110° C. for 3 hours. After completion of the reaction, the reaction product was cooled at room temperature, 250 ml of distilled water was added thereto, and ethyl acetate was used to perform an extraction. An extracted organic layer was washed with a saturated aqueous sodium chloride solution and dried by using sodium sulfate. A residue obtained by removing the solvent therefrom was separated by column chromatography to thereby obtain 8.2 g (35 mmol) of a target compound (Intermediate [99-A]).

2) Synthesis of Intermediate [99-B]

8.2 g (35 mmol) of Intermediate [99-A], 16.5 g (70 mmol) of 1,3-dibromobenzene, 1.0 g (1.1 mmol) of tris(dibenzylideneacetone)dipalladium(0), 740 mg (1.8 mmol) of 2-dicyclohexylphosphino-2',6'-dimethoxybiphenyl, and 6.8 g (70 mmol) of sodium tert-butoxide were added to a reaction vessel and suspended in 350 ml of toluene. The resultant reaction mixture was heated, and stirred at the temperature of 110° C. for 3 hours. After completion of the reaction, the reaction product was cooled at room temperature, 180 ml of distilled water was added thereto, and ethyl acetate was used to perform an extraction. An extracted organic layer was washed with a saturated aqueous sodium chloride solution and dried by using sodium sulfate. A residue obtained by removing the solvent therefrom was separated by column chromatography to thereby obtain 10.5 g (27 mmol) of a target compound (Intermediate [99-B]).

3) Synthesis of Intermediate [99-C]

10.5 g (27 mmol) of Intermediate [99-B], 3.0 g (18 mmol) of Intermediate [1-C], 450 mg (0.5 mmol) of tris(dibenzylideneacetone)dipalladium(0), 370 mg (0.9 mmol) of 2-dicyclohexylphosphino-2',6'-dimethoxybiphenyl, and 3.5 g (36 mmol) of sodium tert-butoxide were added to a reaction vessel and suspended in 180 ml of toluene. The resultant reaction mixture was heated, and stirred at the temperature of 110° C. for 3 hours. After completion of the reaction, the reaction product was cooled at room temperature, 90 ml of distilled water was added thereto, and ethyl acetate was used to perform an extraction. An extracted organic layer was washed with a saturated aqueous sodium chloride solution and dried by using sodium sulfate. A residue obtained by removing the solvent therefrom was separated by column chromatography to thereby obtain 6.2 g (13 mmol) of a target compound (Intermediate [99-C]).

4) Synthesis of Intermediate [99-D]

6.2 g (13 mmol) of Intermediate [99-C], 96 ml (650 mmol) of triethyl orthoformate, and 7.4 g (72 mmol) of an HCl 35 wt % solution were added to a reaction vessel, heated, and then stirred at 80° C. for 12 hours. After completion of the reaction, the resultant mixture was cooled at room temperature, and a residue obtained by removing the solvent therefrom was separated by column chromatography to thereby obtain 5.2 g (10 mmol) of a target compound (Intermediate [99-D]).

5) Synthesis of Intermediate [99-E]

5.2 g (10 mmol) of Intermediate [99-D] and 4.2 g (30 mmol) of iodomethane were added to a reaction vessel and suspended in 100 ml of toluene. The resultant reaction mixture was heated, and stirred at the temperature of 110° C. for 12 hours. After completion of the reaction, the reaction product was cooled at room temperature to remove a certain portion of the solvent, and then distilled water was added thereto to filter out a resulting solid. The filtered solid was purified using a recrystallization method to thereby obtain 5.6 g (8.4 mmol) of a target compound (Intermediate [99-E]).

6) Synthesis of Intermediate [99-F]

5.6 g (8.4 mmol) of Intermediate [99-E] and 4.1 g (25 mmol) of ammonium hexafluorophosphate were added to a reaction vessel and suspended in a solution containing methanol and water in a ratio of 2:1. The resultant reaction mixture was stirred at room temperature for 12 hours. A resulting solid was filtered out and purified using a recrystallization method, to thereby obtain 5.2 g (6.6 mmol) of a target compound (Intermediate [99-F]).

7) Synthesis of Compound 99

5.2 g (6.6 mmol) of Intermediate [99-F], 2.7 g (6.9 mmol) of dichloro(1,5-cyclooctadiene)platinum, and 1.1 g (13.2 mmol) of sodium acetate were suspended in 260 ml of dioxane. The resultant reaction mixture was heated, and stirred at the temperature of 110° C. for 72 hours. After completion of the reaction, the reaction product was cooled at room temperature, 260 ml of distilled water was added thereto, and ethyl acetate was used to perform an extraction. An extracted organic layer was washed with a saturated aqueous sodium chloride solution and dried by using sodium sulfate. A residue obtained by removing the solvent therefrom was separated by column chromatography to thereby obtain 410 mg (0.6 mmol) of a target compound (Compound 99).

$^1$NMR and MS/FAB of the compounds synthesized according to Synthesis Examples 1 to 8 are shown in Table 1 below.

Even compounds other than the compounds shown in Table 1 may be easily recognized by those skilled in the art by referring to the above synthesis routes and source materials.

TABLE 1

| Compound number | $^1$H NMR (CDCl$_3$, 400 MHz) | MS/FAB found | MS/FAB calc. |
|---|---|---|---|
| 1 | 8.67 (m, 1H), 7.28-7.15 (m, 4H), 7.07-6.91 (m, 3H), 6.65 (m, 1H), 6.55-6.47 (m, 3H), 3.68 (s, 3H), 3.03 (s, 3H), 1.46 (s, 6H) | 615.1597 | 615.1598 |
| 7 | 7.34-7.32 (m, 2H), 7.26 (m, 1H), 7.24-7.19 (m, 3H), 7.17 (m, 1H), 7.05(m, 1H), 7.00(m, 1H), 6.89 (m, 1H), 6.61-6.59 (m, 3H), 6.50 (m, 1H), 6.45 (m, 1H), 5.51-5.47 (m, 2H), 3.15 (s, 3H), 1.44 (s, 6H) | 677.1751 | 677.1754 |
| 21 | 8.64 (m, 1H), 7.26-7.17 (m, 4H), 6.98-6.91 (m, 2H), 6.75 (m, 1H), 6.65 (m, 1H), 6.49-6.45 (m, 2H), 3.65 (s, 3H), 3.05 (s, 3H), 1.47 (s, 6H), 1.33 (s, 9H) | 671.2220 | 671.2224 |
| 32 | 8.71 (m, 1H), 8.59 (m, 1H), 8.20 (m, 1H), 7.95 (m, 1H), 7.55 (m, 1H), 7.49 (m, 1H), 7.34 (m, 1H), 7.25-7.17 (m, 6H), 6.98 (m, 1H), 6.89 (m, 1H), 6.60-6.55 (m, 3H), 6.50 (m, 1H), 3.69 (s, 3H), 3.03 (s, 3H), 1.40 (s, 6H) | 780.2178 | 780.2176 |
| 41 | 7.45-7.43 (m, 2H), 7.27-7.22 (m ,3H), 7.19-7.16 (m, 2H), 7.09 (m, 1H), 7.00-6.89 (m, 3H), 6.70-6.68 (m, 3H), 3.37 (s, 3H), 3.00 (2, 3H), 1.44 (s, 6H) | 665.1752 | 665.1754 |
| 47 | 7.24-7.18 (m, 4H), 7.05 (m, 1H), 6.95-6.91 (m, 2H), 6.65 (m, 1H), 6.49-6.47 (m, 2H), 3.06 (s, 3H), 2.69 (s, 3H), 1.44 (s, 6H) | 617.1501 | 617.1503 |
| 61 | 8.66 (m, 1H), 7.27-7.19 (m, 3H), 7.11 (m, 1H), 7.04-7.01 (m, 2H), 6.67 (m, 1H), 6.50-6.45 (m, 3H), 3.65 (s, 3H), 3.01 (s, 3H), 1.44 (s, 6H), 1.31 (s, 9H) | 671.2221 | 671.2224 |
| 99 | 8.64 (m, 1H), 7.27-7.26 (m, 2H), 7.23-7.15 (m, 5H), 7.07-7.05 (m, 2H), 7.01-6.68 (m, 2H), 6.86-6.83 (m, 2H), 6.65 (m, 1H), 6.51-6.45 (m, 2H), 3.65 (s, 3H), 3.03 (s, 3H), 1.47 (s, 3H), 1.43 (s, 3H) | 690.2069 | 690.2071 |

EXAMPLES

Example 1

As a substrate and an anode, a glass substrate with 15 Ωcm² (1,200 Å) ITO formed thereon, which was manufactured by Corning Inc., was cut to a size of 50 mm×50 mm×0.7 mm, sonicated by using isopropyl alcohol and pure water for 5 minutes each, and then cleaned by irradiation of ultraviolet rays and exposure of ozone thereto for 30 minutes. Then, the glass substrate was loaded onto a vacuum deposition apparatus.

2-TNATA was vacuum-deposited on the ITO anode formed on the glass substrate to form a hole injection layer having a thickness of 600 Å, and then, NPB was vacuum-deposited on the hole injection layer to form a hole transport layer having a thickness of 300 Å.

mCBP as a host and Compound 1 as a dopant were co-deposited to a weight ratio of 90:10 on the hole transport layer to form an emission layer having a thickness of 300 Å.

Diphenyl(4-(triphenylsilyl)phenyl)-phosphine oxide (TSPO1) was deposited on the emission layer to form a hole blocking layer having a thickness of 50 Å, Alq₃ was deposited on the hole blocking layer to form an electron transport layer having a thickness of 300 Å, LiF was deposited on the electron transport layer to form an electron injection layer having a thickness of 10 Å, and Al was vacuum-deposited on the electron injection layer to form a cathode having a thickness of 3,000 Å, thereby completing the manufacture of an organic light-emitting device.

2-TNATA

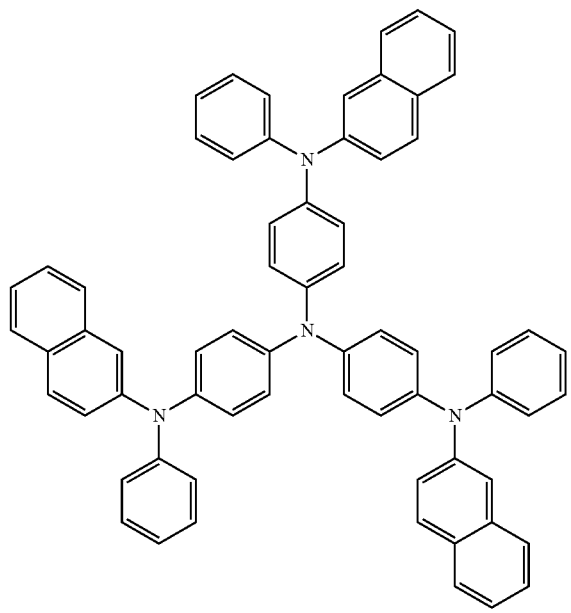

NPB

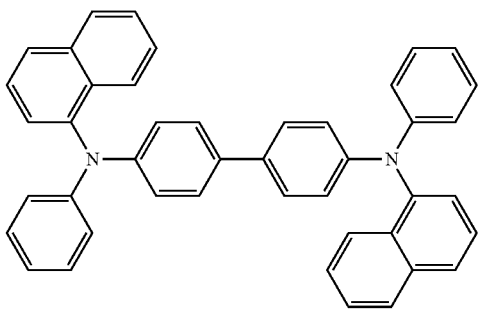

mCBP

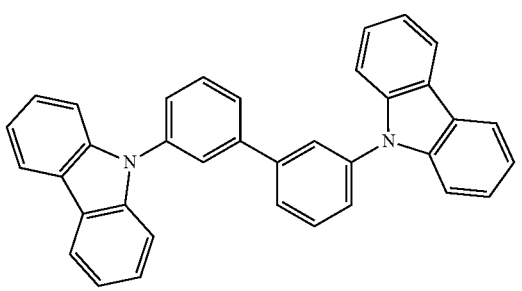

TSPO1

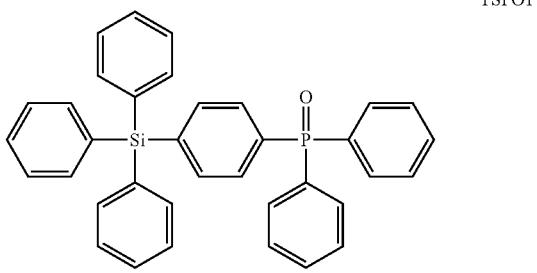

Examples 2 to 8 and Comparative Examples 1 and 2

Organic light-emitting devices were manufactured in substantially the same manner as in Example 1, except that in forming an emission layer, for use as a dopant, corresponding compounds shown in Table 1 were each used instead of Compound 1.

Evaluation Example 1

The driving voltage, current density, luminance, luminescence efficiency, emission color, and maximum emission wavelength of the organic light-emitting devices manufactured according to Examples 1 to 8 and Comparative Examples 1 and were measured using Keithley SMU 236 and a luminance meter PR650, and results thereof are shown in Table 2.

TABLE 2

| | Emission layer | Driving voltage (V) | Current density (mA/cm²) | Luminance (cd/m²) | Luminescence efficiency (cd/A) | Emission color | Emission wavelength (nm) |
|---|---|---|---|---|---|---|---|
| Example 1 | 1 | 5.09 | 50 | 3943 | 7.89 | Blue | 451 |
| Example 2 | 7 | 4.99 | 50 | 4003 | 8.01 | Blue | 461 |
| Example 3 | 21 | 5.01 | 50 | 4001 | 8.00 | Blue | 456 |
| Example 4 | 32 | 4.95 | 50 | 4044 | 8.09 | Blue | 475 |
| Example 5 | 41 | 4.93 | 50 | 4052 | 8.10 | Blue | 454 |
| Example 6 | 47 | 5.10 | 50 | 3911 | 7.82 | Blue | 450 |
| Example 7 | 61 | 5.03 | 50 | 4012 | 8.02 | Blue | 457 |
| Example 8 | 99 | 4.88 | 50 | 4121 | 8.24 | Blue | 489 |
| Comparative Example 1 | CE1 | 5.15 | 50 | 3875 | 7.75 | Blue | 476 |
| Comparative Example 2 | CE2 | 5.22 | 50 | 3543 | 7.09 | Blue | 455 |

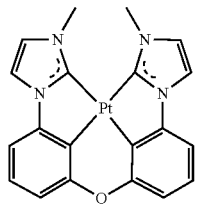

CE1 (Comparative example)

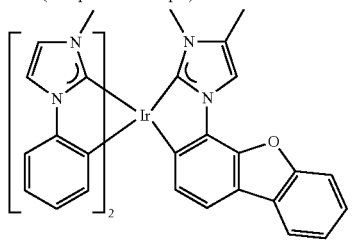

CE2

Referring to Table 2, it can be seen that the organic light-emitting devices of Examples 1 to 8 have low driving voltage, high luminance, and high luminescence efficiency, compared to the organic light-emitting devices of Comparative Examples 1 and 2.

An organic light-emitting device including the organometallic compound may have low driving voltage, high luminance, and high luminescence efficiency.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure as defined by the following claims, and equivalents thereof.

What is claimed is:

1. A light-emitting device comprising:
   a first electrode;
   a second electrode facing the first electrode; and
   an interlayer between the first electrode and the second electrode and including an emission layer,
   wherein the light-emitting device comprises at least one organometallic compound represented by Formula 1:

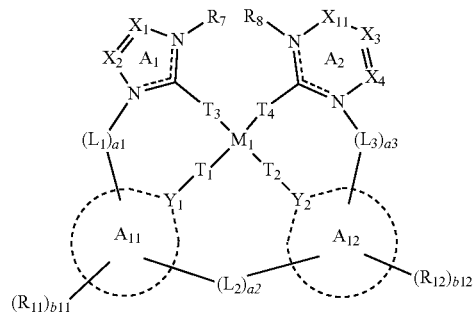

Formula 1 wherein, in Formula 1, $M_1$ is selected from platinum (Pt), palladium (Pd), copper (Cu), silver (Ag), gold (Au), rhodium (Rh), iridium (Ir), ruthenium (Ru), osmium (Os), titanium (Ti), zirconium (Zr), hafnium (Hf), europium (Eu), Terbium (Tb), and thulium (Tm), $Y_1$ and $Y_2$ are each independently selected from a carbon atom (C) and a nitrogen atom (N), $T_1$ to T4 are each independently a chemical bond, O, S, B(R'), N(R'), P(R'), C(R')(R'), Si(R')(R'), Ge(R')(R'), C(=O), B(R')(R'), N(R')(R'), or P(R')(R'), wherein, when T1 is a chemical bond, $Y_1$ and $M_1$ are directly bonded to each other, when T2 is a chemical bond, $Y_2$ and $M_1$ are directly bonded to each other, when T3 is a chemical bond, C in ring $A_1$ is directly bonded to $M_1$, and when T4 is a chemical bond, C in ring $A_2$ is directly bonded to $M_1$, two bonds of a bond between $Y_1$ or T1 and $M_1$, a bond between $Y_2$ or T2 and $M_1$, a bond between C in ring $A_1$ or T3 and $M_1$, and a bond between C in ring $A_2$ or T4 and $M_1$ are each a coordinate bond, and the other two bonds are each a covalent bond, $X_1$ is $C(R_1)$ or N, $X_2$ is $C(R_2)$ or N, $X_3$ is $C(R_3)$ or N, $X_4$ is $C(R_4)$ or N, and $X_{11}$ is $C(R_5)(R_6)$ or $N(R_5)$, ring $A_{11}$ and ring $A_{12}$ are each independently selected from a $C_5$-$C_{60}$ carbocyclic group and a $C_1$-$C_{60}$ heterocyclic group, $L_1$ to $L_3$ are each independently selected from a single bond, a double bond, *—$N(R_9)$—*', *—$B(R_9)$—*', *—$P(R_9)$—*', *—$C(R_9)(R_{10})$—*', *—$Si(R_9)(R_{10})$—*', *—$Ge(R_9)(R_{10})$—*', *—S—*', *Se—*', *—O—*', *—C(=O)—*', *—S(=O)—*', *—$S(=O)_2$*', *—C$(R_9)$=*', *=$C(R_9)$—*', *—$C(R_9)$=$C(R_{10})$—*', *—C(=S)—*', and *—C≡C—*', a1 to a3 are each independently an integer from 0 to 3, when a1 is 0, $A_1$ and $A_{11}$ are not linked to each other, when a2 is 0, $A_{11}$ and $A_{12}$ are not linked to each other, and when a3 is 0, $A_2$ and $A_{12}$ are not linked to each other, R', R", and $R_1$ to $R_{12}$ are each independently selected from hydrogen, deuterium, —F, —$C_1$, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —$Si(Q_1)(Q_2)(Q_3)$, —$B(Q_1)(Q_2)$, —$N(Q_1)(Q_2)$, —$P(Q_1)(Q_2)$, —$C(=O)(Q_1)$, —$S(=O)(Q_1)$, —$S(=O)_2(Q_1)$, —$P(=O)(Q_1)(Q_2)$, and —$P(=S)(Q_1)(Q_2)$, b11 and b12 are each independently an integer from 0 to 20, two neighboring groups of $R_1$ to $R_{12}$ are optionally bonded to form a $C_5$-$C_{60}$ carbocyclic group unsubstituted or substituted with at least one $R_{10a}$ or a $C_1$-$C_{60}$ heterocyclic group unsubstituted or substituted with at least one $R_{10a}$, and *' each indicate a binding site to a neighboring atom, and $R_{10a}$ is:

deuterium (-D), —F, —$C_1$, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —$C_1$, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —$C_1$, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof; or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$, wherein $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —$C_1$; —Br; —I; a hydroxyl group; a cyano group; a nitro group; a $C_1$-$C_6$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

2. The light-emitting device of claim 1, wherein the interlayer further comprises a hole transport region between the first electrode and the emission layer and an electron transport region between the emission layer and the second electrode, the hole transport region comprises a hole injection layer, a hole transport layer, an emission auxiliary layer, an electron blocking layer, or any combination thereof, and the electron transport region comprises a buffer layer, a hole blocking layer, an electron transport layer, an electron injection layer, or any combination thereof.

3. The light-emitting device of claim 1, wherein the emission layer comprises the at least one organometallic compound represented by Formula 1.

4. The light-emitting device of claim 3, wherein the emission layer further comprises a host, and an amount of the at least one organometallic compound represented by Formula 1 is in a range from 0.01 parts by weight to 49.99 parts by weight based on 100 parts by weight of the emission layer.

5. The light-emitting device of claim 4, wherein the host comprises a silicon-containing compound, a phosphine oxide-containing compound, or any combination thereof.

6. The light-emitting device of claim 3, wherein the emission layer emits blue light having a maximum emission wavelength in a range of 410 nm to 500 nm.

7. The light-emitting device of claim 2, wherein the electron transport region comprises a phosphine oxide-containing compound, a silyl compound, or any combination thereof.

8. An electronic apparatus comprising the light-emitting device of claim 1.

9. The electronic apparatus of claim 8, further comprising a thin-film transistor, wherein the thin-film transistor comprises a source electrode and a drain electrode, and the first electrode of the light-emitting device is electrically coupled to at least one selected from the source electrode and the drain electrode of the thin-film transistor.

10. The electronic apparatus of claim 8, further comprising a color filter, a color conversion layer, a touch screen layer, a polarizing layer, or any combination thereof.

11. An organometallic compound represented by Formula 1:

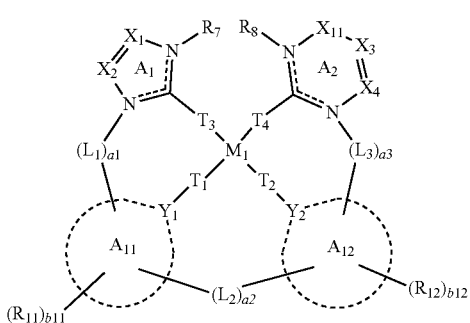

Formula 1 wherein, in Formula 1, $M_1$ is selected from platinum (Pt), palladium (Pd), copper (Cu), silver (Ag), gold (Au), rhodium (Rh), iridium (Ir), ruthenium (Ru), osmium (Os), titanium (Ti), zirconium (Zr), hafnium (Hf), europium (Eu), Terbium (Tb), and thulium (Tm), $Y_1$ and $Y_2$ are each independently selected from a carbon atom (C) and a nitrogen atom (N), $T_1$ to T4 are each independently a chemical bond, O, S, B(R'), N(R'), P(R'), C(R')(R'), Si(R')(R'), Ge(R')(R'), C(=O), B(R')(R'), N(R')(R'), or P(R')(R'), wherein, when T1 is a chemical bond, Yi and $M_1$ are directly bonded to each other, when T2 is a chemical bond, $Y_2$ and $M_1$ are directly bonded to each other, when T3 is a chemical bond, C in ring $A_1$ is directly bonded to $M_1$, and when T4 is a chemical bond, C in ring $A_2$ is directly bonded to $M_1$, two bonds of a bond between Yi or T1 and $M_1$, a bond between $Y_2$ or T2 and $M_1$, a bond between C in ring $A_1$ or T3 and $M_1$, and a bond between C in ring $A_2$ or T4 and $M_1$ are each a coordinate bond, and the other two bonds are each a covalent bond, $X_1$ is $C(R_1)$ or N, $X_2$ is $C(R_2)$ or N, $X_3$ is $C(R_3)$ or N, $X_4$ is $C(R_4)$ or N, and $X_{11}$ is $C(R_5)(R_6)$ or $N(R_5)$, ring $A_{11}$ and ring $A_{12}$ are each independently selected from a $C_5$-$C_{60}$ carbocyclic group and a $C_1$-$C_{60}$ heterocyclic group, $L_1$ to $L_3$ are each independently selected from a single bond, a double bond,*—N($R_9$)—*',*—B($R_9$)—*', *—P($R_9$)—*',*—C($R_9$)($R_{10}$)—*',*—Si($R_9$)($R_{10}$)—*', *—Ge($R_9$)($R_{10}$)—*',*—S—*',*Se—*',*—O—*', *—C(=O)—*',*—S(=O)—*',*—S(=O)$_2$*',*—C ($R_9$)=*',*=C($R_9$)—*',*—C($R_9$)=C($R_{10}$)—*',*—C (=S)—*', and*—C≡C—*', a1 to a3 are each independently an integer from 0 to 3, when a1 is 0, $A_1$ and $A_{11}$ are not linked to each other, when a2 is 0, $A_{11}$ and $A_{12}$ are not linked to each other, and when a3 is 0, $A_2$ and $A_{12}$ are not linked to each other, R', R'', and $R_1$ to $R_{12}$ are each independently selected from hydrogen, deuterium, —F, —$C_1$, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —B($Q_1$)($Q_2$), —N($Q_1$)($Q_2$), —P($Q_1$)($Q_2$), —C(=O)($Q_1$), —S(=O)($Q_1$), —S(=O)$_2$($Q_1$), —P(=O)($Q_1$)($Q_2$), and —P(=S)($Q_1$)($Q_2$), b11 and b12 are each independently an integer from 0 to 20, two neighboring groups of $R_1$ to $R_{12}$ are optionally bonded to form a $C_5$-$C_{60}$ carbocyclic group unsubstituted or substituted with at least one $R_{10a}$ or a $C_1$-$C_{60}$ heterocyclic group unsubstituted or substituted with at least one $R_{10a}$, and*' each indicate a binding site to a neighboring atom, and $R_{10a}$ is:

deuterium (-D), —F, —$C_1$, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —$C_1$, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_6$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —$C_1$; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

12. The organometallic compound of claim 11, wherein $M_1$ is selected from Pt, Pd, Cu, Ag, Au, Rh, Ir, Ru, and Os.

13. The organometallic compound of claim 11, wherein $Y_1$ and $Y_2$ are C.

14. The organometallic compound of claim 11, wherein ring $A_1$ is a group represented by one of Formulae 2-1 and 2-2, and
ring $A_2$ is a group represented by one of Formulae 2-3 and 2-4:

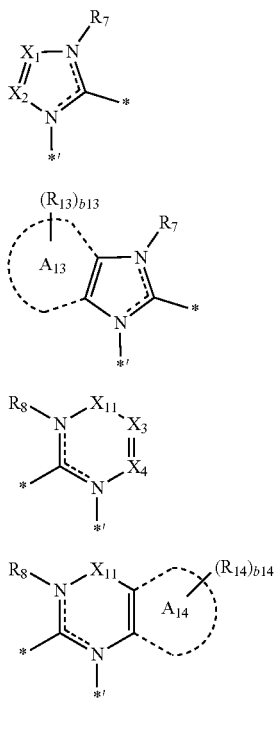

wherein, in Formulae 2-1 to 2-4
$X_1$ to $X_4$, $X_{11}$, $R_7$, and $R_8$ are the same as described in claim 11,
ring $A_{13}$ and ring $A_{14}$ are each independently selected from a $C_5$-$C_{60}$ carbocyclic group and a $C_1$-$C_{60}$ heterocyclic group,
$R_{13}$, $R_{14}$, b13, and b14 are the same as described in connection with R', R', $R_1$ to $R_{12}$, b11, and b12 in claim 11,
*indicates a binding site to neighboring T3 or T4, and*' indicates a binding site to neighboring $L_1$ or $L_3$.

15. The organometallic compound of claim 11, wherein ring $A_1$ is a group represented by one of Formulae 2A-1 to 2A-4, and
ring $A_2$ is a group represented by one of Formulae 2B-1 to 2B-4:

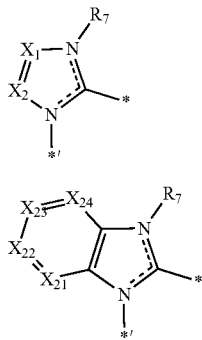

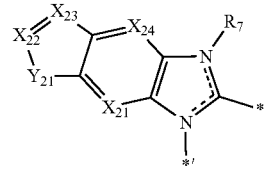

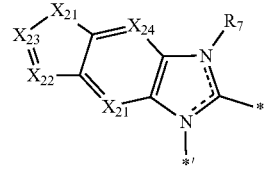

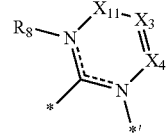

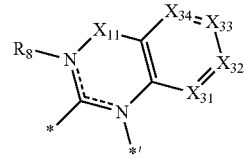

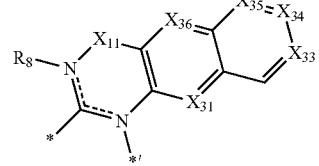

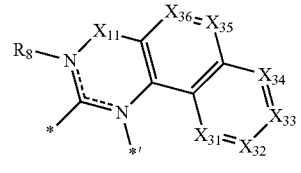

wherein, in Formulae 2A-1 to 2A-4 and 2-1 to 2B-4,
$X_1$ to $X_4$, $X_{11}$, $R_7$, and $R_8$ are the same as described in claim 11,
$X_{21}$ is $C(R_{21})$ or N, $X_{22}$ is $C(R_{22})$ or N, $X_{23}$ is $C(R_{23})$ or N, and $X_{24}$ is $C(R_{24})$ or N,
$Y_{21}$ is $C(R_{25})((R_{26})$, $N(R_{25})$, O, or S,
$X_{31}$ is $C(R_{31})$ or N, $X_{32}$ is $C(R_{32})$ or N, $X_{33}$ is $C(R_{33})$ or N, $X_{34}$ is $C(R_{34})$ or N, $X_{35}$ is $C(R_{35})$ or N, and $X_{36}$ is $C(R_{36})$ or N,
$R_{21}$ to $R_{26}$ and $R_{31}$ to $R_{36}$ are the same as described in connection with R', R', and $R_1$ to $R_{12}$ in claim 11,
*indicates a binding site to neighboring T3 or T4, and*' indicates a binding site to neighboring $L_1$ or $L_3$.

16. The organometallic compound of claim 11, wherein ring $A_{11}$ and ring $A_{12}$ are each independently selected from a benzene group, a naphthalene group, an anthracene group, a phenanthrene group, a triphenylene group, a pyrene group, a chrysene group, a cyclopentane group, a cyclopentadiene group, a cyclohexane group, a cyclohexene group, a 1,2,3,4-tetrahydronaphthalene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an indenopyridine group, an indolopyridine group, a benzofuropyridine group, a benzothienopyridine group, a benzosilolopyridine group, an indenopyrimidine group, an indolopyrimidine group, a benzofuropyrimidine group, a benzothienopyrimidine group, a benzosilolopyrimidine group, a dihydropyridine group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a 2,3-dihydroimidazole group, a triazole group, a 1,2,4-triazole group, a tetrazole group, a 2,3-dihydrotriazole group, an azasilole group, a diazasilole group, a triazasilole group, an oxazole group, an isoxazole group, a thiazole group, an isothiazole group, an oxadiazole group, a thiadiazole group, a benzopyrazole group, a benzimidazole group, a 2,3-dihydrobenzimidazole group, an imidazopyridine group, a 2,3-dihydroimidazopyridine group, an imidazopyrimidine group, a 2,3-dihydroimidazopyrimidine group, an imidazopyrazine group, a 2,3-dihydroimidazopyrazine group, a benzoxazole group, a benzothiazole group, a benzoxadiazole group, a benzothiadiazole group, a pyridopyrrolopyridine group, a dihydropyranoindole group, a dibenzoxaborinine group, a dihydrodibenzoazaborinine group, a 5,6,7,8-tetrahydroisoquinoline group, and a 5,6,7,8-tetrahydroquinoline group.

17. The organometallic compound of claim 11, wherein a1 to a3 are each 1,
$L_1$ and $L_3$ are each a single bond, and $L_2$ is *—N($R_9$)—*',*—B($R_9$)—*',*—C($R_9$)($R_{10}$)—*',*—Si($R_9$)($R_{10}$)—*',*—S—*', or*—O—*'.

18. The organometallic compound of claim 11, wherein R', R', and $R_1$ to $R_{12}$ are each independently selected from:
hydrogen, deuterium, —F, —$C_1$, —Br, —I, a hydroxyl group, a cyano group, a nitro group, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —$C_1$, —Br, —I, a hydroxyl group, a cyano group, a nitro group, a $C_1$-$C_{20}$ alkyl group, and a $C_1$-$C_{20}$ alkoxy group;

a cyclopentyl group, a cyclohexyl group, an adamantanyl group, a norbornanyl group, a norbornenyl group, a phenyl group, a naphthyl group, a pyridinyl group, a pyrimidinyl group, a pyrazinyl group, a pyridazinyl group, a pyrrolyl group, an indolyl group, an isoindolyl group, an indazolyl group, a quinolinyl group, an isoquinolinyl group, a quinoxalinyl group, a quinazolinyl group, a cinnolinyl group, a triazinyl group, a pyridopyrrolopyridinyl group, a dihydropyranoindolyl group, a dibenzoxabolinyl group, and a dihydrodibenzoazaborinyl group;

a cyclopentyl group, a cyclohexyl group, an adamantanyl group, a norbornanyl group, a norbornenyl group, a phenyl group, a naphthyl group, a pyridinyl group, a pyrimidinyl group, a pyrazinyl group, a pyridazinyl group, an indolyl group, an isoindolyl group, an indazolyl group, a quinolinyl group, an isoquinolinyl group, a quinoxalinyl group, a quinazolinyl group, a cinnolinyl group, a triazinyl group, a pyridopyrrolopyridinyl group, a dihydropyranoindolyl group, a dibenzoxabolinyl group, and a dihydrodibenzoazaborinyl group, each substituted with at least one selected from —F, —$C_1$, —Br, —I, a hydroxyl group, a cyano group, a nitro group, a $C_1$-$C_{20}$ alkyl group, a $C_1$-$C_{20}$ alkoxy group, a cyclopentyl group, a cyclohexyl group, an adamantanyl group, a norbornanyl group, a norbornenyl group, a phenyl group, a naphthyl group, a pyridinyl group, a pyrimidinyl group, a pyrazinyl group, a pyridazinyl group, an indolyl group, an isoindolyl group, an indazolyl group, a quinolinyl group, an isoquinolinyl group, a quinoxalinyl group, a quinazolinyl group, a cinnolinyl group, a triazinyl group, a pyridopyrrolopyridinyl group, a dihydropyranoindolyl group, a dibenzoxabolinyl group, a dihydrodibenzoazaborinyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$);

a cyclopentyl group, a cyclohexyl group, an adamantanyl group, a norbornanyl group, a norbornenyl group, a phenyl group, a naphthyl group, a pyridinyl group, a pyrimidinyl group, a pyrazinyl group, a pyridazinyl group, an indolyl group, an isoindolyl group, an indazolyl group, a quinolinyl group, an isoquinolinyl group, a quinoxalinyl group, a quinazolinyl group, a cinnolinyl group, a triazinyl group, a pyridopyrrolopyridinyl group, a dihydropyranoindolyl group, a dibenzoxabolinyl group, and a dihydrodibenzoazaborinyl group, each substituted with at least one selected from a $C_1$-$C_{20}$ alkyl group, a $C_1$-$C_{20}$ alkoxy group, a cyclopentyl group, a cyclohexyl group, an adamantanyl group, a norbornanyl group, a norbornenyl group, a phenyl group, a naphthyl group, a pyridinyl group, a pyrimidinyl group, a pyrazinyl group, a pyridazinyl group, an indolyl group, an isoindolyl group, an indazolyl group, a quinolinyl group, an isoquinolinyl group, a quinoxalinyl group, a quinazolinyl group, a cinnolinyl group, a triazinyl group, a pyridopyrrolopyridinyl group, a dihydropyranoindolyl group, a dibenzoxabolinyl group, and a dihydrodibenzoazaborinyl group, each substituted with at least one selected from deuterium, —F, —$C_1$, —Br, —I, a hydroxyl group, a cyano group, a nitro group, a $C_1$-$C_{20}$ alkyl group, a $C_1$-$C_{20}$ alkoxy group, a cyclopentyl group, a cyclohexyl group, an adamantanyl group, a norbornanyl group, a norbornenyl group, a phenyl group, a naphthyl group, a pyridinyl group, a pyrimidinyl group, a pyrazinyl group, a pyridazinyl group, an indolyl group, an isoindolyl group, an indazolyl group, a quinolinyl group, an isoquinolinyl group, a quinoxalinyl group, a quinazolinyl group, a cinnolinyl group, a triazinyl group, a pyridopyrrolopyridinyl group, a dihydropyranoindolyl group, a dibenzoxabolinyl group, and a dihydrodibenzoazaborinyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$); and —Si($Q_1$)($Q_2$)($Q_3$), —N($Q_1$)($Q_2$), —B($Q_1$)($Q_2$), —C(=O)($Q_1$), —S(=O)$_2$($Q_1$), —P(=O)($Q_1$)($Q_2$), and —P(=S)($Q_1$)($Q_2$), wherein $Q_1$ to $Q_3$ and $Q_{31}$ to $Q_{33}$ are each independently selected from hydrogen, deuterium, —F, —$C_1$, —Br, —I, a cyano group, a $C_1$-$C_{20}$ alkyl group, a $C_2$-$C_{20}$ alkenyl group, a $C_2$-$C_{20}$ alkynyl group, a $C_1$-$C_{20}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{20}$ aryl group, a $C_1$-$C_{20}$ heteroaryl group, a monovalent non-aromatic condensed polycyclic group, and a monovalent non-aromatic condensed heteropolycyclic group.

19. The organometallic compound of claim 11, wherein the organometallic compound is represented by Formula 1-1:

Formula 1-1

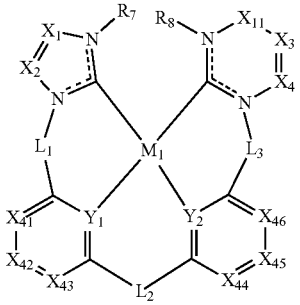

wherein, in Formula 1-1, $M_1$, $X_1$ to $X_4$, $X_{11}$, $Y_1$, $Y_2$, $L_1$ to $L_3$, $R_7$, and $R_8$ are the same as described in claim 11, $X_{41}$ is $C(R_{41})$ or N, $X_{42}$ is $C(R_{42})$ or N, $X_{43}$ is $C(R_{43})$ or N, $X_{44}$ is $C(R_{44})$ or N, $X_{45}$ is $C(R_{45})$ or N, and $X_{46}$ is $C(R_{46})$ or N, and $R_{41}$ to $R_{46}$ are the same as described in connection with R', R', and $R_1$ to $R_{12}$ in claim 11.

20. The organometallic compound of claim 11, wherein the organometallic compound represented by Formula 1 is selected from Compounds 1 to 120:

1

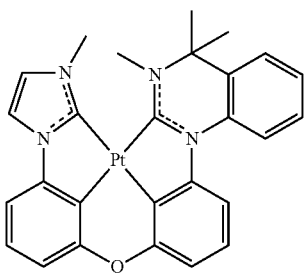

2

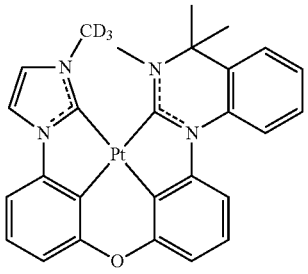

3

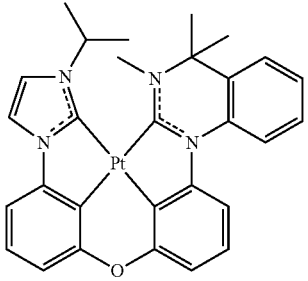

4

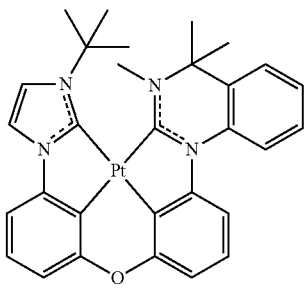

5

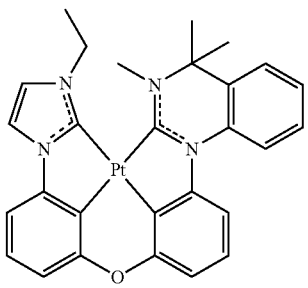

6

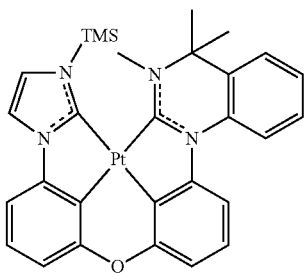

7

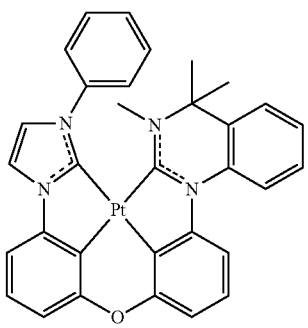

8

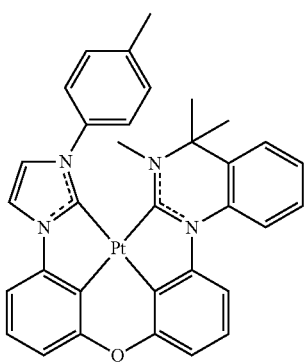

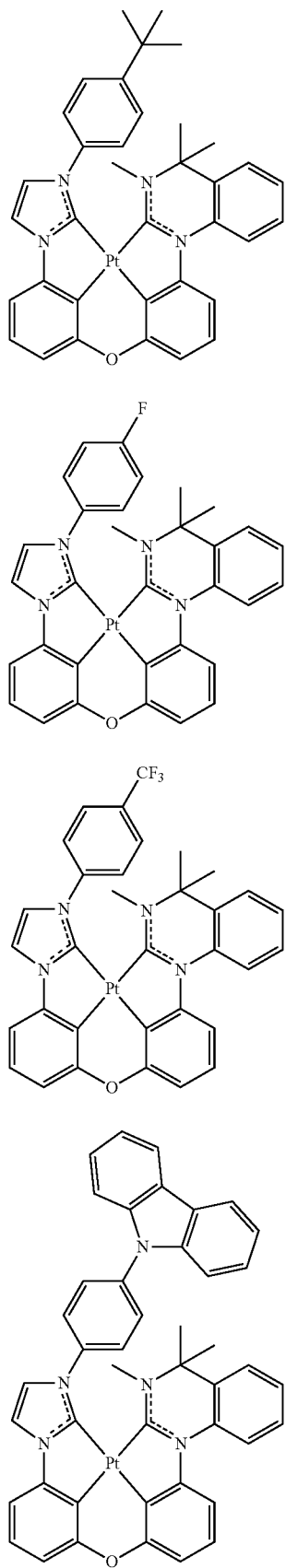
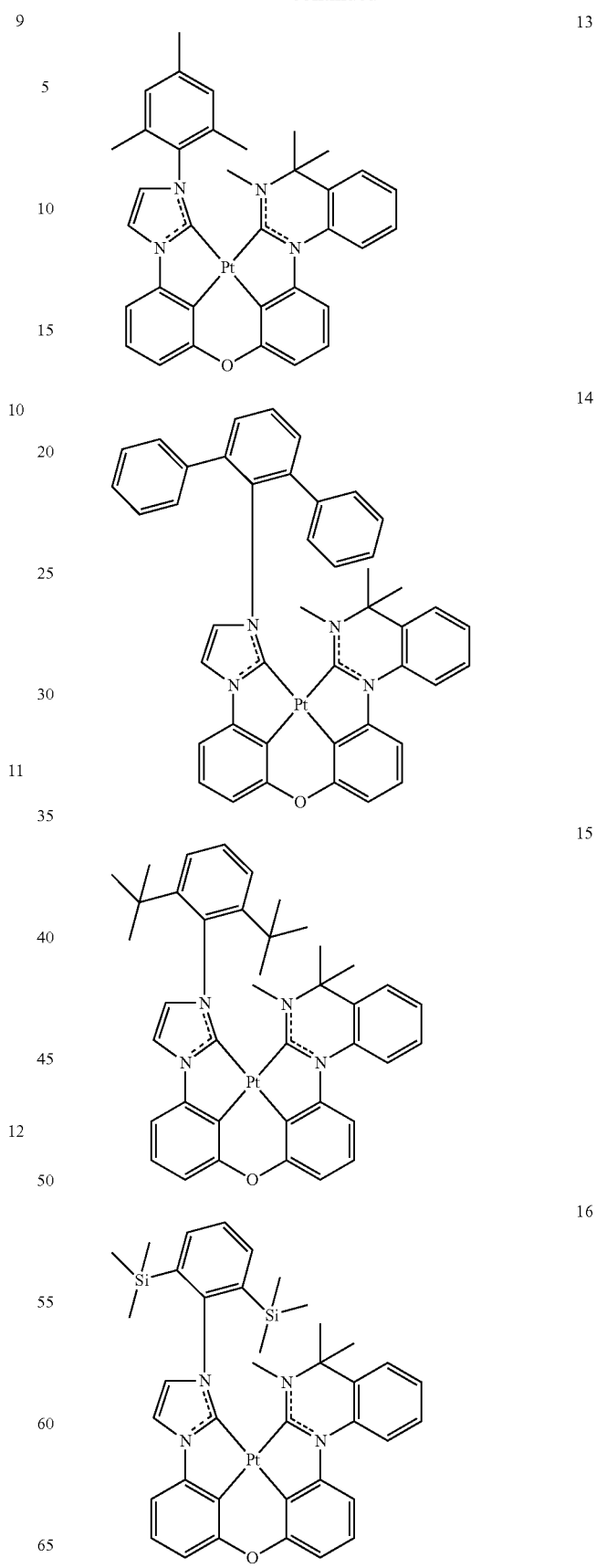

17
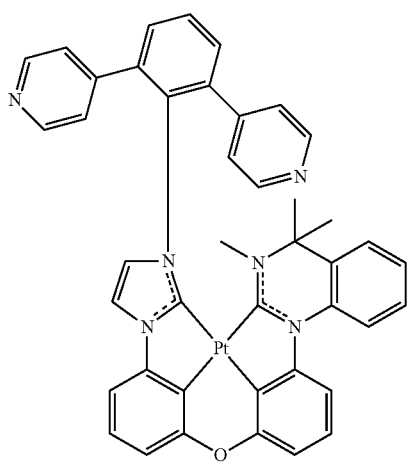
18
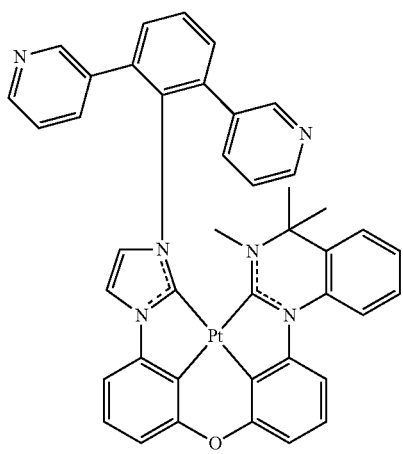
19
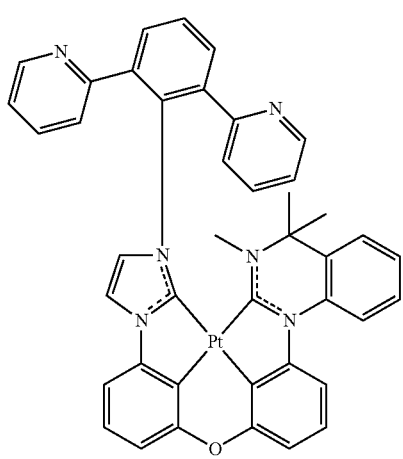
20
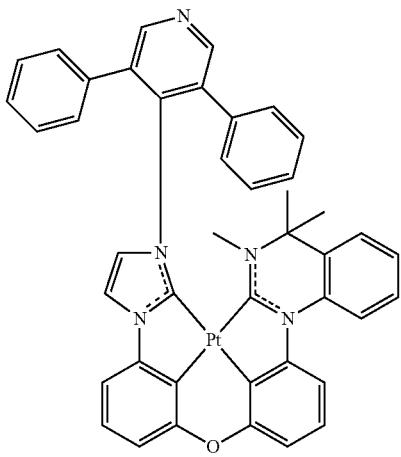
21
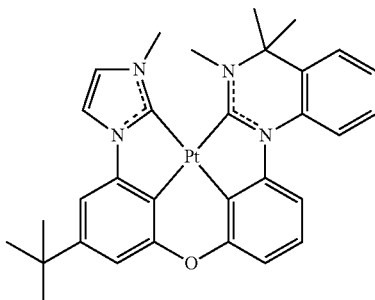
22
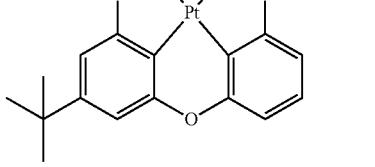
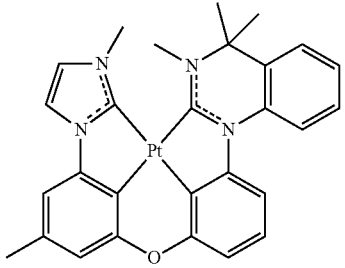
23
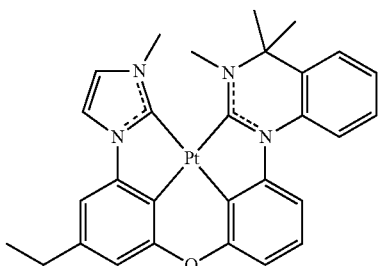
24
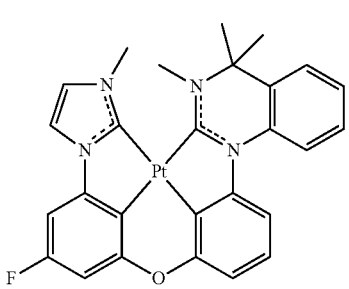

25
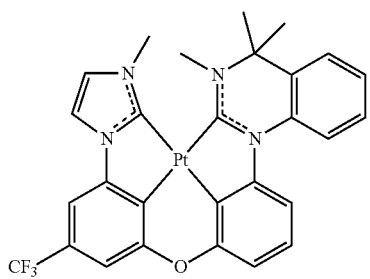
26
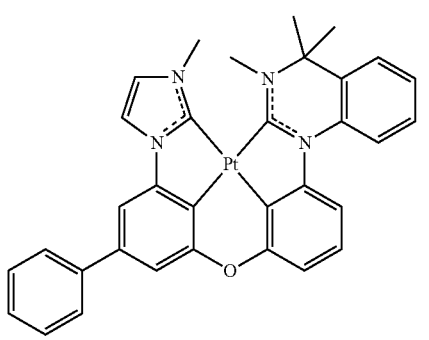
27
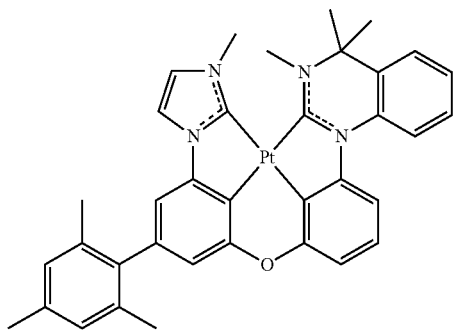
28
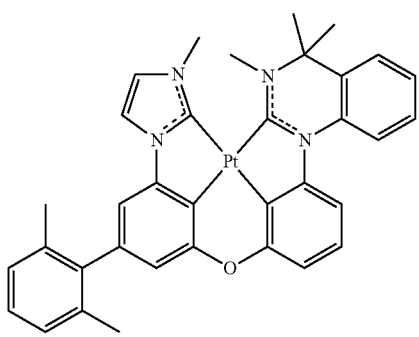
29
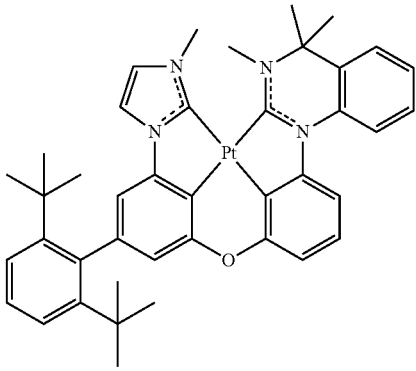
30
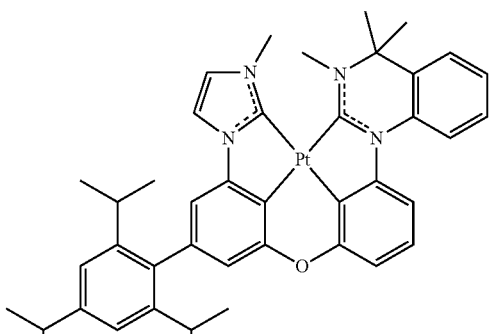
31
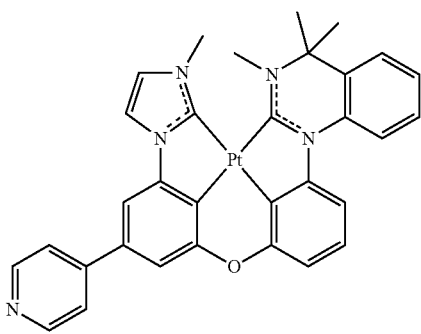
32
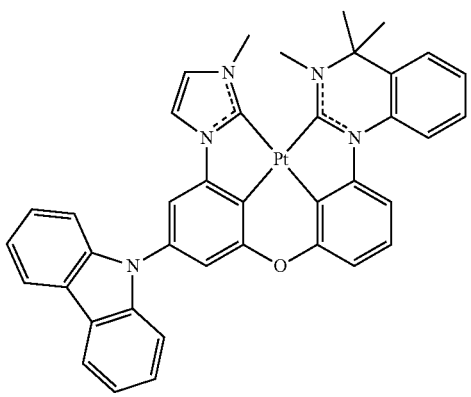

33
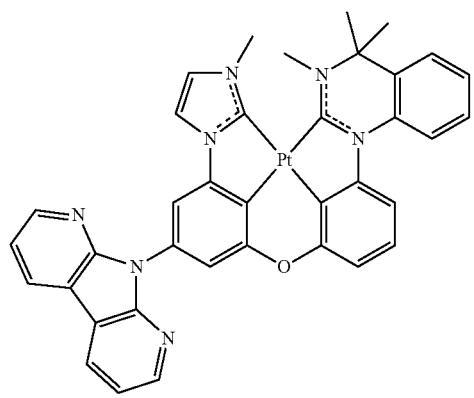
34
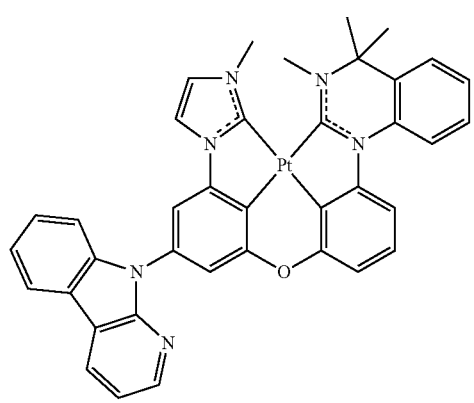
35
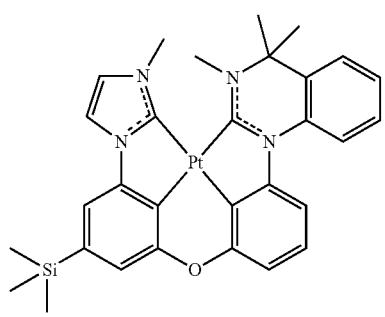
36
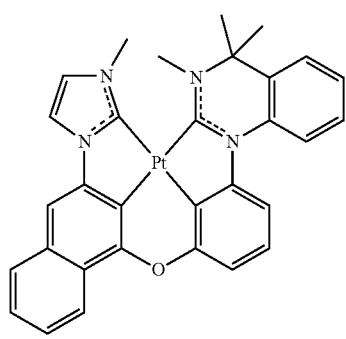
37
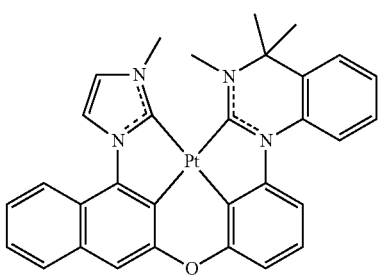
38
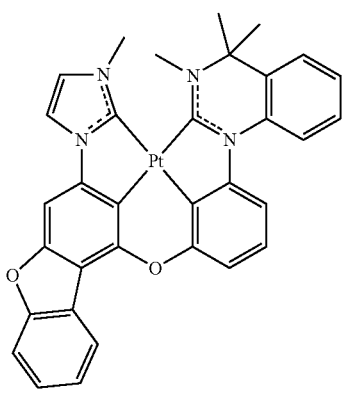
39
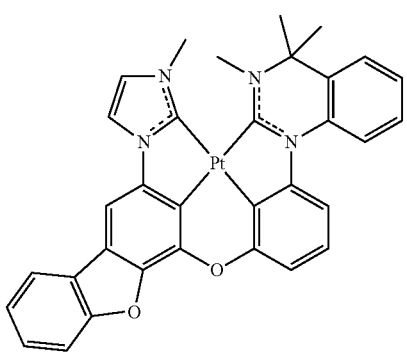
40
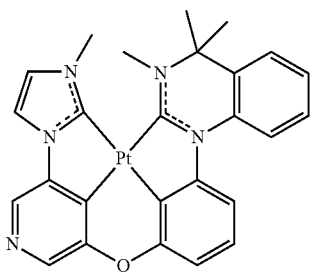
41
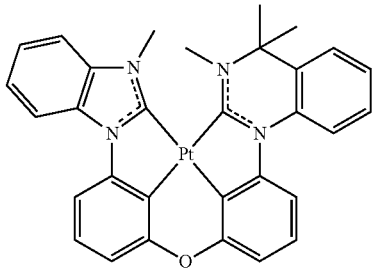

42
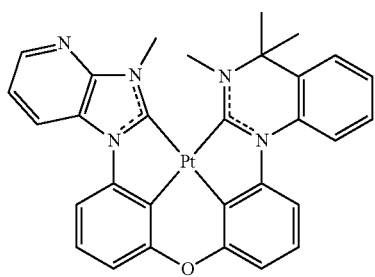
43
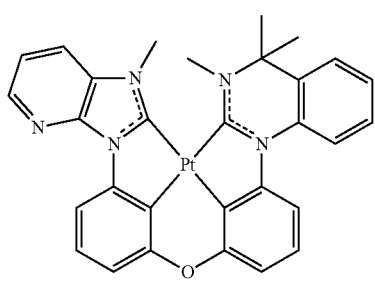
44
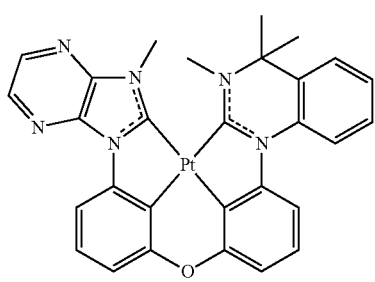
45
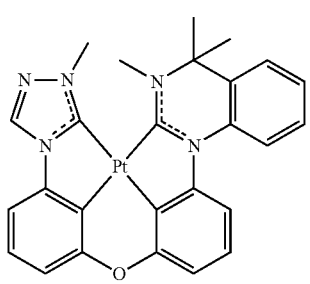
46
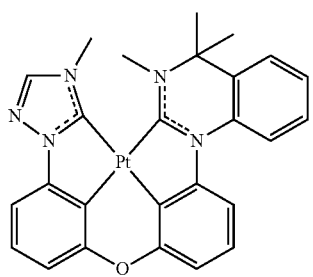
47
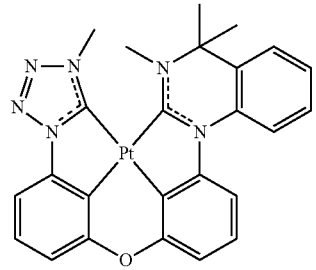
48
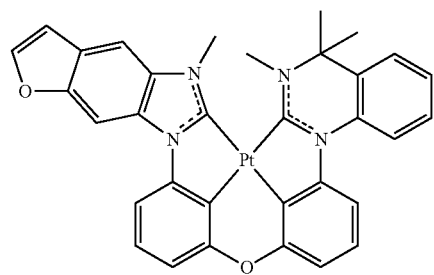
49
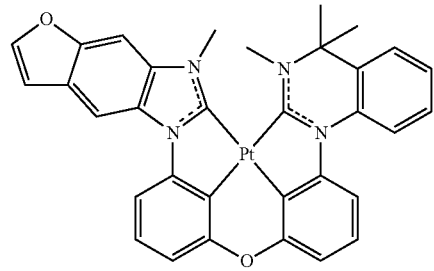
50
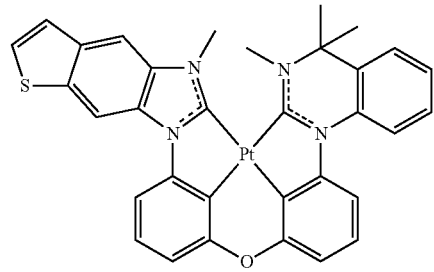
51
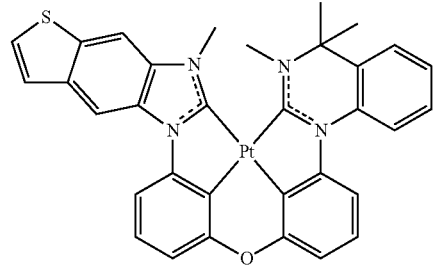

201
-continued
52
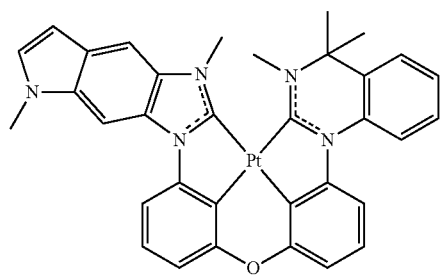
53
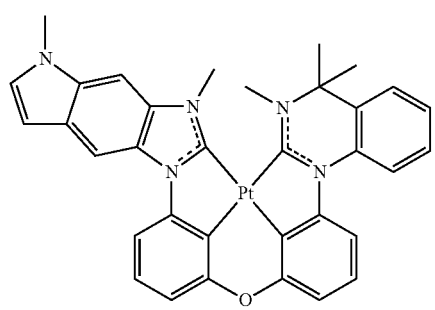
54
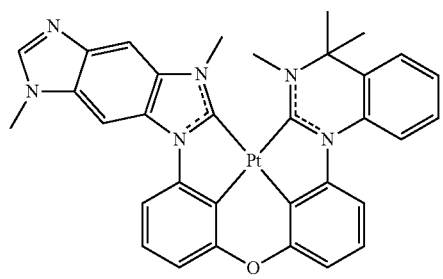
55
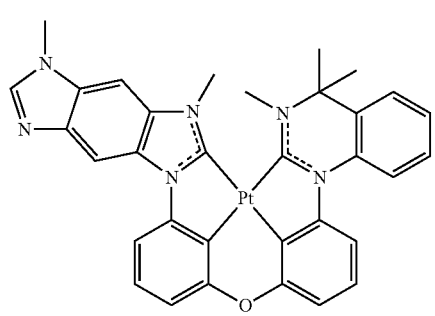
56
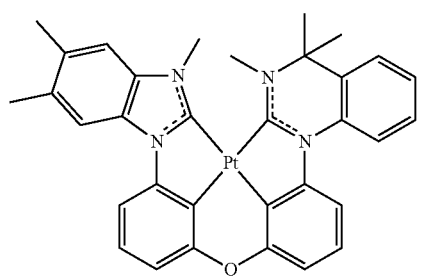
202
-continued
57
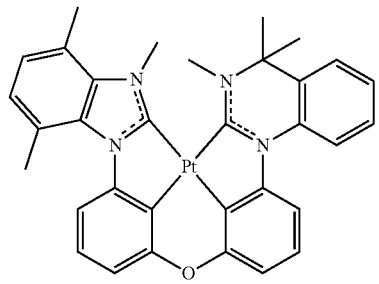
58
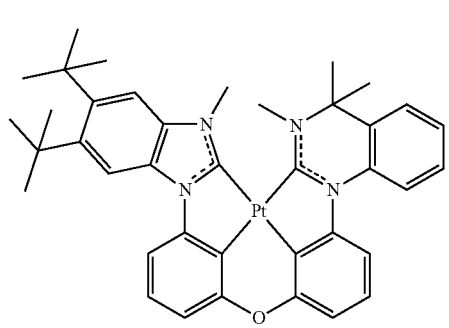
59
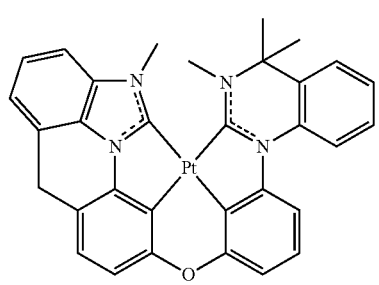
60
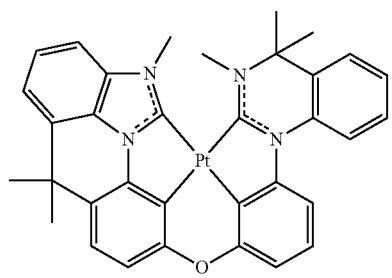
61
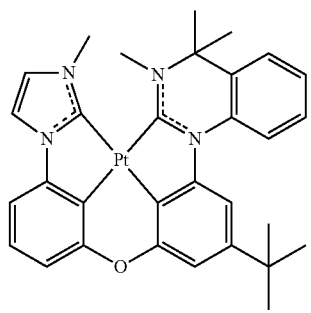

62
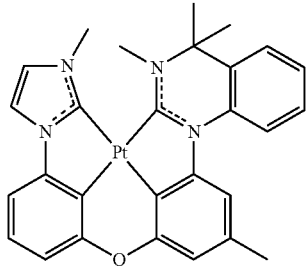
63
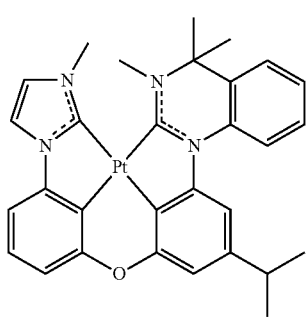
64
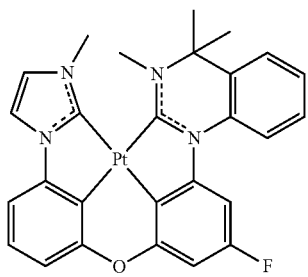
65
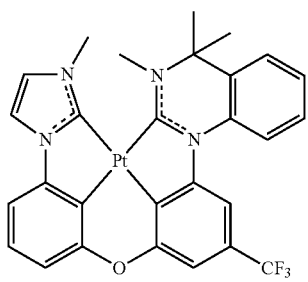
66
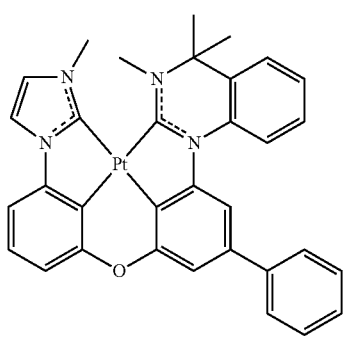
67
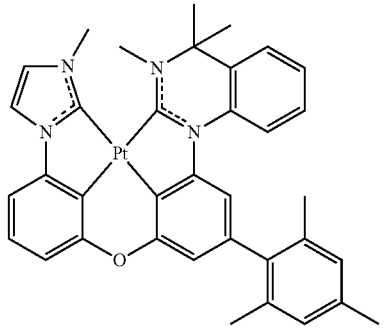
68
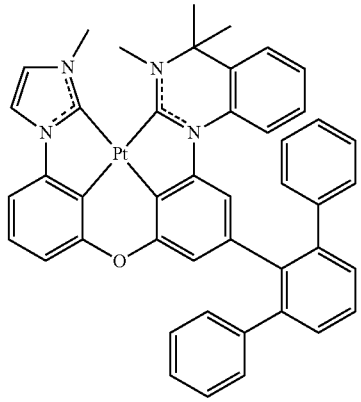
69
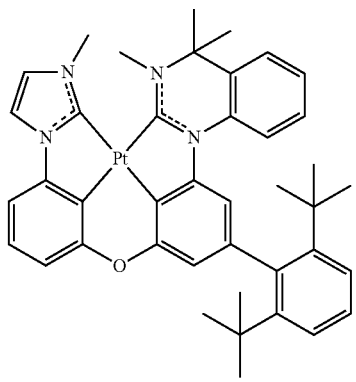
70
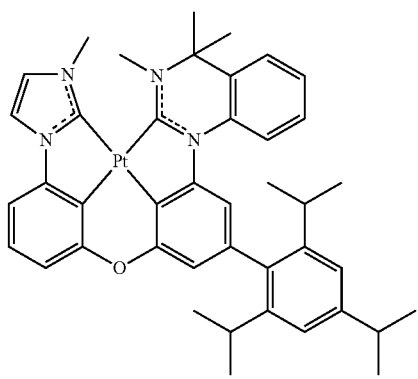

71
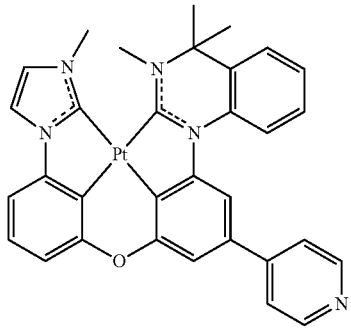
72
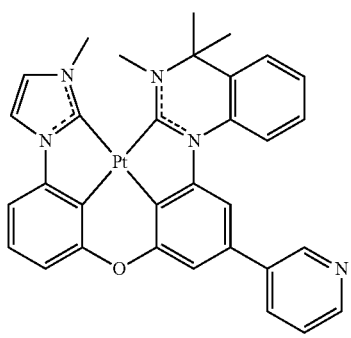
73
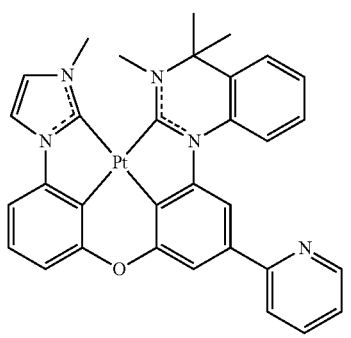
74
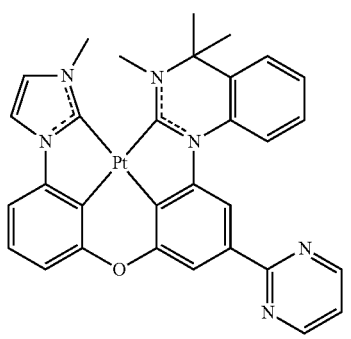
75
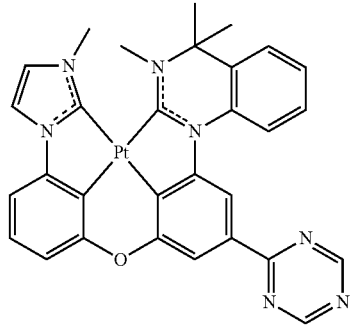
76
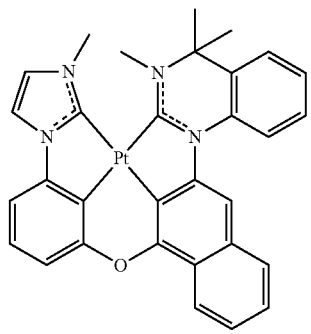
77
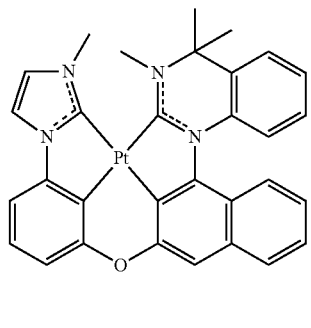
78
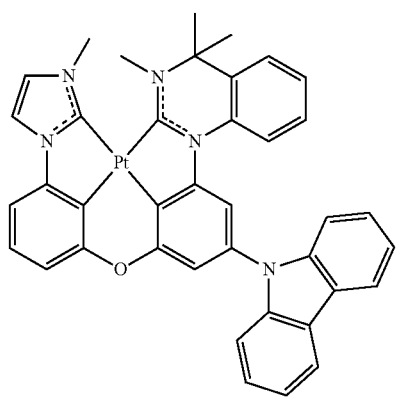

79
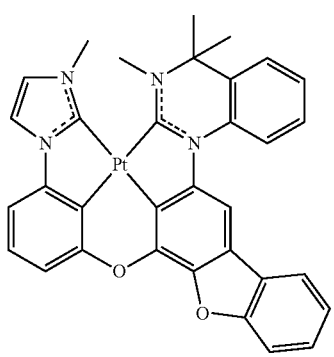
80
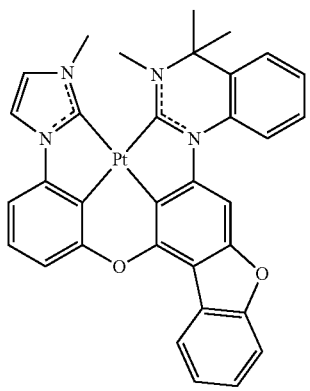
81
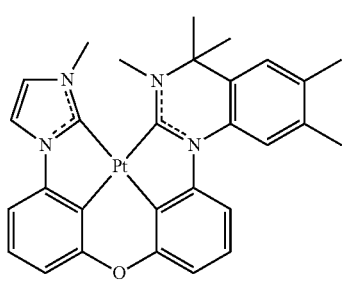
82
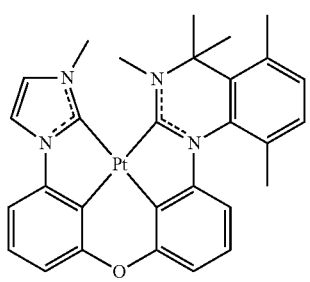
83
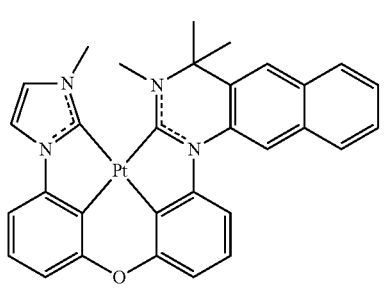
84
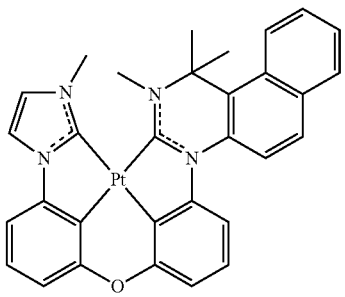
85
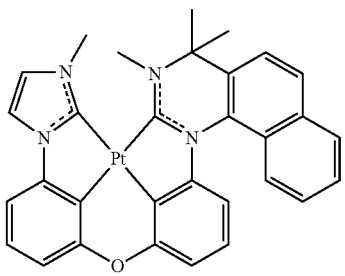
86
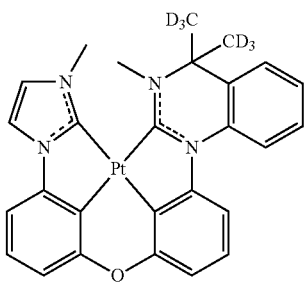
87
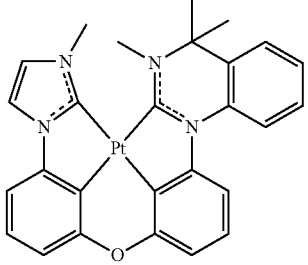

88
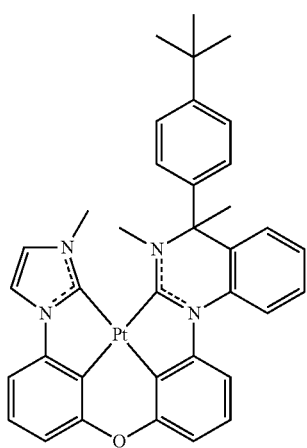
89
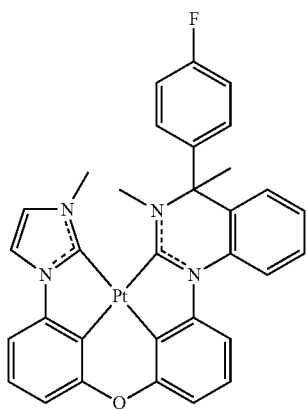
90
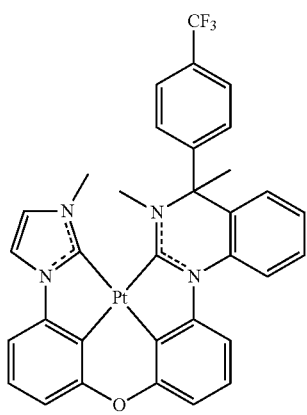
91
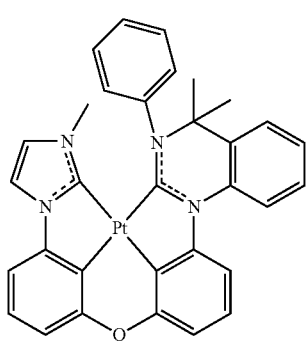
92
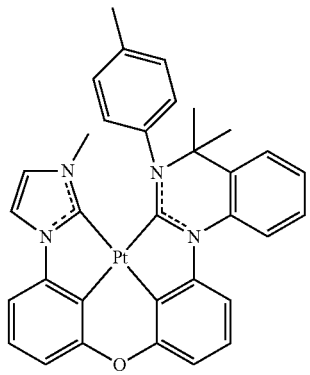
93
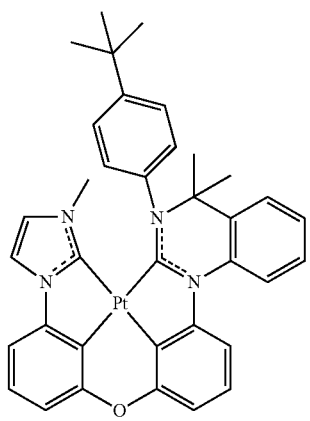
94
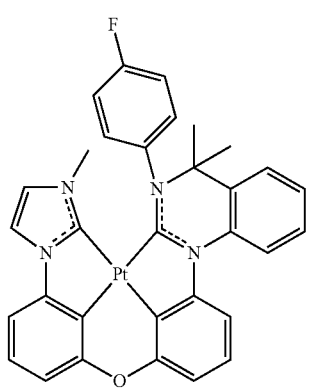
95
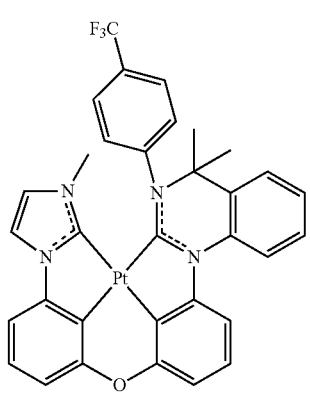

96
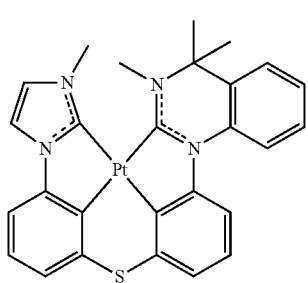
97
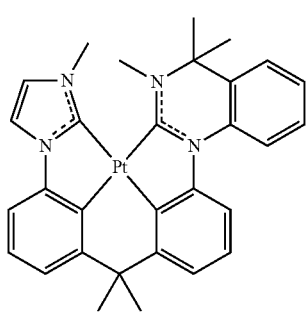
98
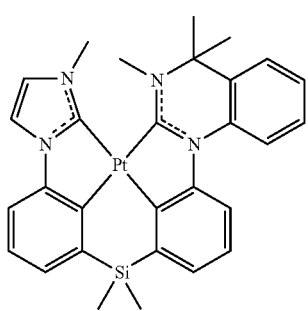
99
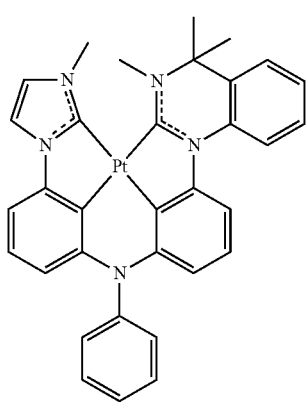
100
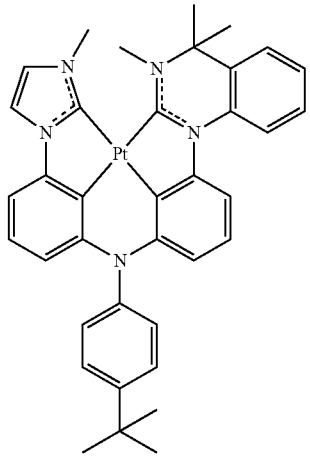
101
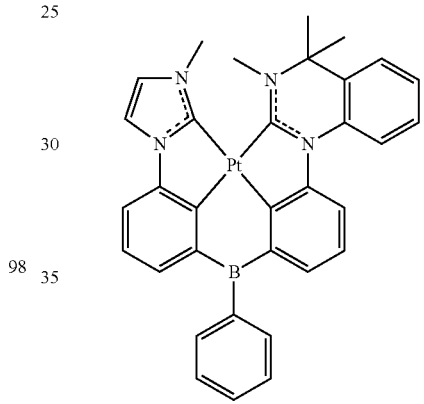
102
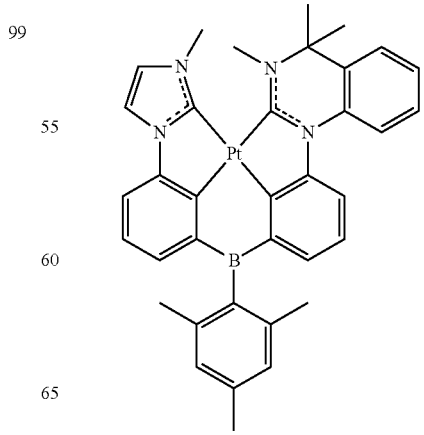

-continued
103 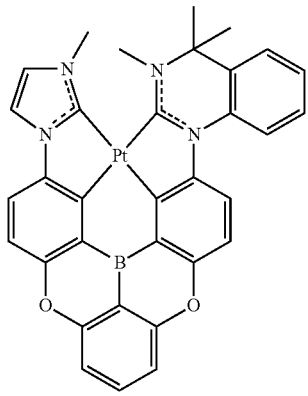
104 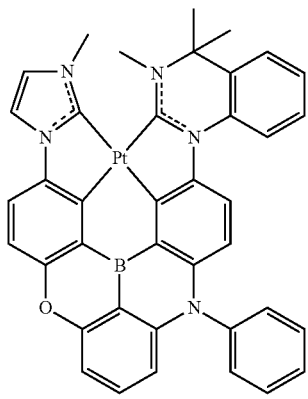
105 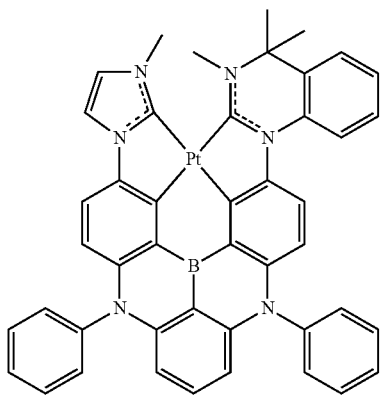
106 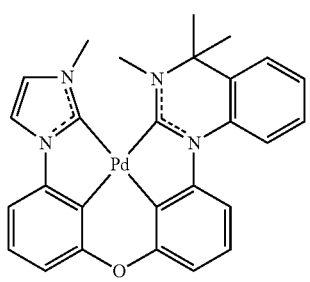
-continued
107 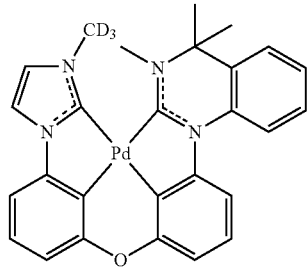
108 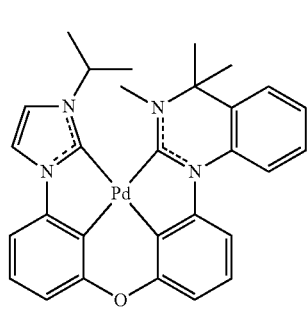
109 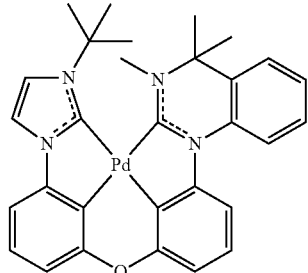
110 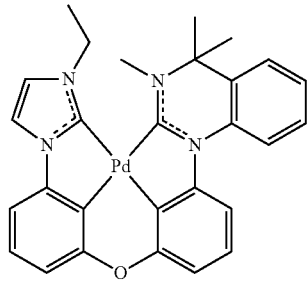
111 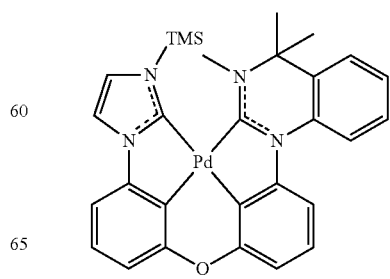

215
-continued
112
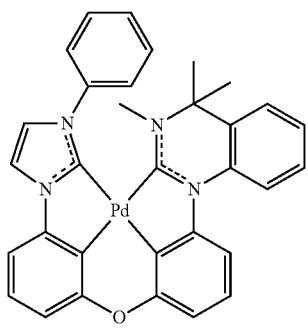
113
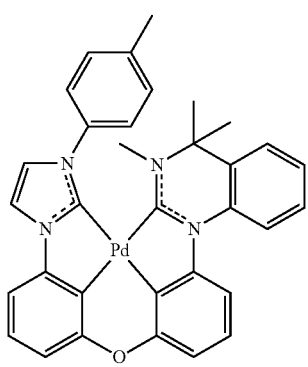
114
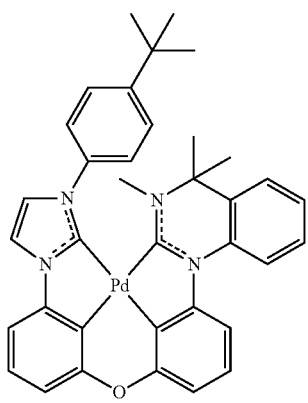
115
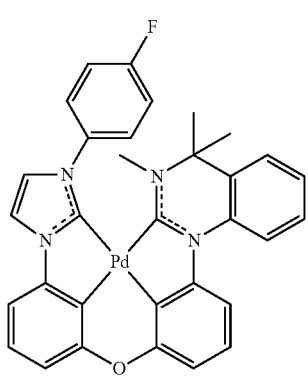
216
-continued
116
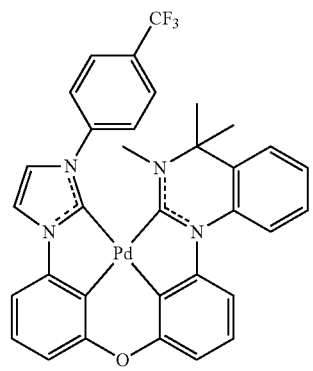
117
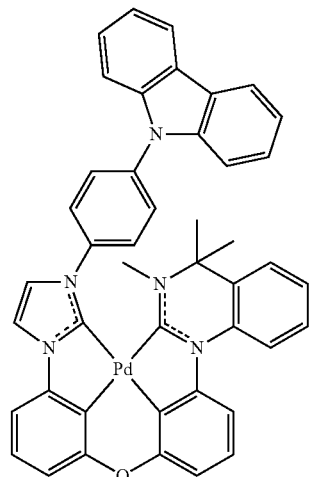
118
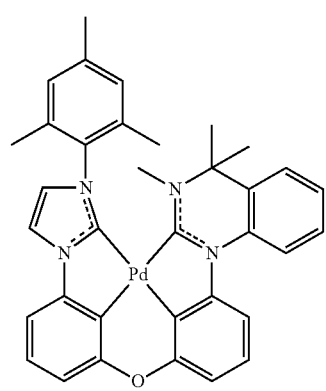

217
-continued
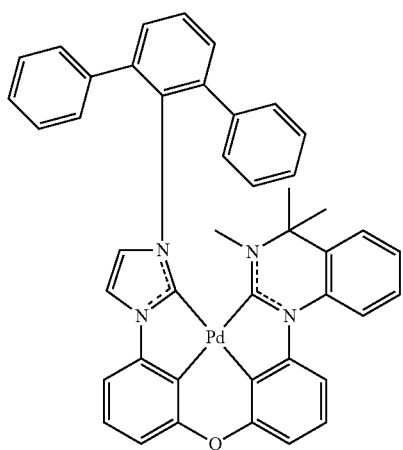
119
218
-continued
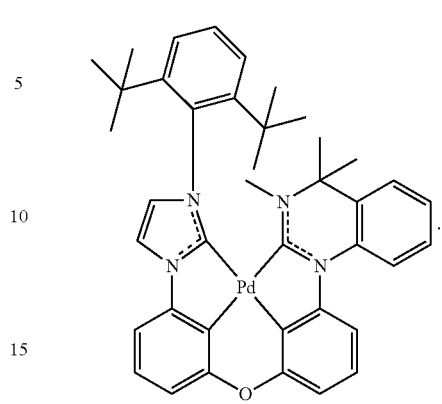
120
* * * * *